US009876504B2

(12) United States Patent
Masuoka et al.

(10) Patent No.: US 9,876,504 B2
(45) **Date of Patent: *Jan. 23, 2018**

(54) SEMICONDUCTOR DEVICE

(71) Applicant: Unisantis Electronics Singapore Pte. Ltd., Singapore (SG)

(72) Inventors: Fujio Masuoka, Tokyo (JP); Masamichi Asano, Musashino (JP)

(73) Assignee: UNISANTIS ELECTRONICS SINGAPORE PTE. LTD., Singapore (SG)

(*) Notice: Subject to any disclaimer, the term of this patent is extended or adjusted under 35 U.S.C. 154(b) by 0 days.

This patent is subject to a terminal disclaimer.

(21) Appl. No.: 15/214,912

(22) Filed: Jul. 20, 2016

(65) Prior Publication Data

US 2016/0329899 A1 Nov. 10, 2016

Related U.S. Application Data

(63) Continuation of application No. PCT/JP2014/060360, filed on Apr. 10, 2014.

(51) Int. Cl.
*H03K 19/0948* (2006.01)
*H01L 27/02* (2006.01)
(Continued)

(52) U.S. Cl.
CPC ....... *H03K 19/0948* (2013.01); *H01L 23/528* (2013.01); *H01L 23/53209* (2013.01);
(Continued)

(58) Field of Classification Search
CPC ................. G11C 13/0004; G11C 7/04; H01L 21/823487; H01L 21/823828;
(Continued)

(56) References Cited

U.S. PATENT DOCUMENTS 4,881,105 A 11/1989 Davari et al.
5,416,350 A 5/1995 Watanabe
(Continued)

FOREIGN PATENT DOCUMENTS

EP 2239771 A1 * 10/2010 .............. H01L 27/11
JP H02-26063 A 1/1990
(Continued)

OTHER PUBLICATIONS

Neil Weste and Kamran Eshraghian, "Principles of CMOS Design", 2nd Edition, Addison-Wesley, 1992, pp. 12.*
(Continued)

*Primary Examiner* — Alexander H Taningco
*Assistant Examiner* — Seokjin Kim
(74) *Attorney, Agent, or Firm* — Brinks Gilson & Lione

(57) ABSTRACT

A semiconductor device includes a 3-input NAND decoder having six MOS transistors arranged in a line. The MOS transistors of the decoder are formed in a planar silicon layer disposed on a substrate and each have a structure in which a drain, a gate, and a source are arranged vertically and the gate surrounds a silicon pillar. The planar silicon layer includes a first active region having a first conductivity type and a second active region having a second conductivity type. The first and second active regions are connected to each other via a silicon layer on a surface of the planar silicon layer.

36 Claims, 80 Drawing Sheets

101 (3-INPUT NAND DECODER)

101 (3-INPUT NAND DECODER)

(51) Int. Cl.

| | |
|---|---|
| ***H01L 29/786*** | (2006.01) |
| ***H01L 23/528*** | (2006.01) |
| ***H01L 23/532*** | (2006.01) |
| ***H01L 27/092*** | (2006.01) |
| ***H03K 19/20*** | (2006.01) |
| *H01L 21/8238* | (2006.01) |

(52) U.S. Cl.
CPC ........ *H01L 27/0207* (2013.01); *H01L 27/092* (2013.01); *H01L 29/78642* (2013.01); *H03K 19/20* (2013.01); *H01L 21/823885* (2013.01)

(58) Field of Classification Search
CPC ........... H01L 21/823885; H01L 23/528; H01L 23/53209; H01L 27/0207; H01L 27/092; H01L 27/088; H01L 27/0925; H01L 27/11; H01L 27/1104; H01L 27/11807; H01L 27/1203; H01L 27/1207; H01L 27/24; H01L 29/42392; H01L 29/66666; H01L 29/78; H01L 29/7827; H01L 29/7841; H01L 29/7843; H01L 29/78642; H03K 19/0948; H03K 19/20
See application file for complete search history.

(56) References Cited

U.S. PATENT DOCUMENTS

2005/0201182 A1* 9/2005 Osada .................... H01L 27/24
365/230.03
2010/0207201 A1* 8/2010 Masuoka ........... H01L 27/0207
257/329

FOREIGN PATENT DOCUMENTS

| | | | |
|---|---|---|---|
| JP | H03-285352 | A | 12/1991 |
| JP | 06-268173 | A | 9/1994 |
| JP | 2005-260014 | A | 9/2005 |
| JP | 4756221 | B | 8/2011 |
| JP | 5031809 | B | 9/2012 |
| JP | 5130596 | B | 1/2013 |
| WO | WO 2009/096465 | A1 | 8/2009 |
| WO | WO 2011/043402 | A1 | 4/2011 |

OTHER PUBLICATIONS

English language translation of International Preliminary Report on Patentability in corresponding International Application No. PCT/JP2014/060360, dated Oct. 20, 2016, 7 pages.
Yoshizawa, H., "CMOS OP AMP Kairo Jitsumu Sekkei No Kiso", *CMOS OP Amplifier Circuit, Basis of Practical Design*, CQ Publishing Co., Ltd., May 15, 2007, 8 pages. (English language translation included).
International Search Report, and English language translation thereof, in corresponding International Application No. PCT/JP2014/060360, dated Jul. 15, 2014, 9 pages.

* cited by examiner

8-DECODER CONFIGURATION WITH ADDRESS SIGNAL LINES A1 TO A6

FIG. 8

ADDRESS MAP FOR ADDRESS SIGNAL LINES A1 TO A6

| | A1 | A2 | A3 | A4 | A5 | A6 |
|---|---|---|---|---|---|---|
| DEC1 / SEL1 | ○ | - | ○ | - | ○ | - |
| DEC2 / SEL2 | - | ○ | ○ | - | ○ | - |
| DEC3 / SEL3 | ○ | - | - | ○ | ○ | - |
| DEC4 / SEL4 | - | ○ | - | ○ | ○ | - |
| DEC5 / SEL5 | ○ | - | ○ | - | - | ○ |
| DEC6 / SEL6 | - | ○ | ○ | - | - | ○ |
| DEC7 / SEL7 | ○ | - | - | ○ | - | ○ |
| DEC8 / SEL8 | - | ○ | - | ○ | - | ○ |

○ : Contact

BLOCKS 100-1 TO 100-4 AMONG 8 BLOCKS

FIG. 9B BLOCKS 100-5 TO 100-8 AMONG 8 BLOCKS
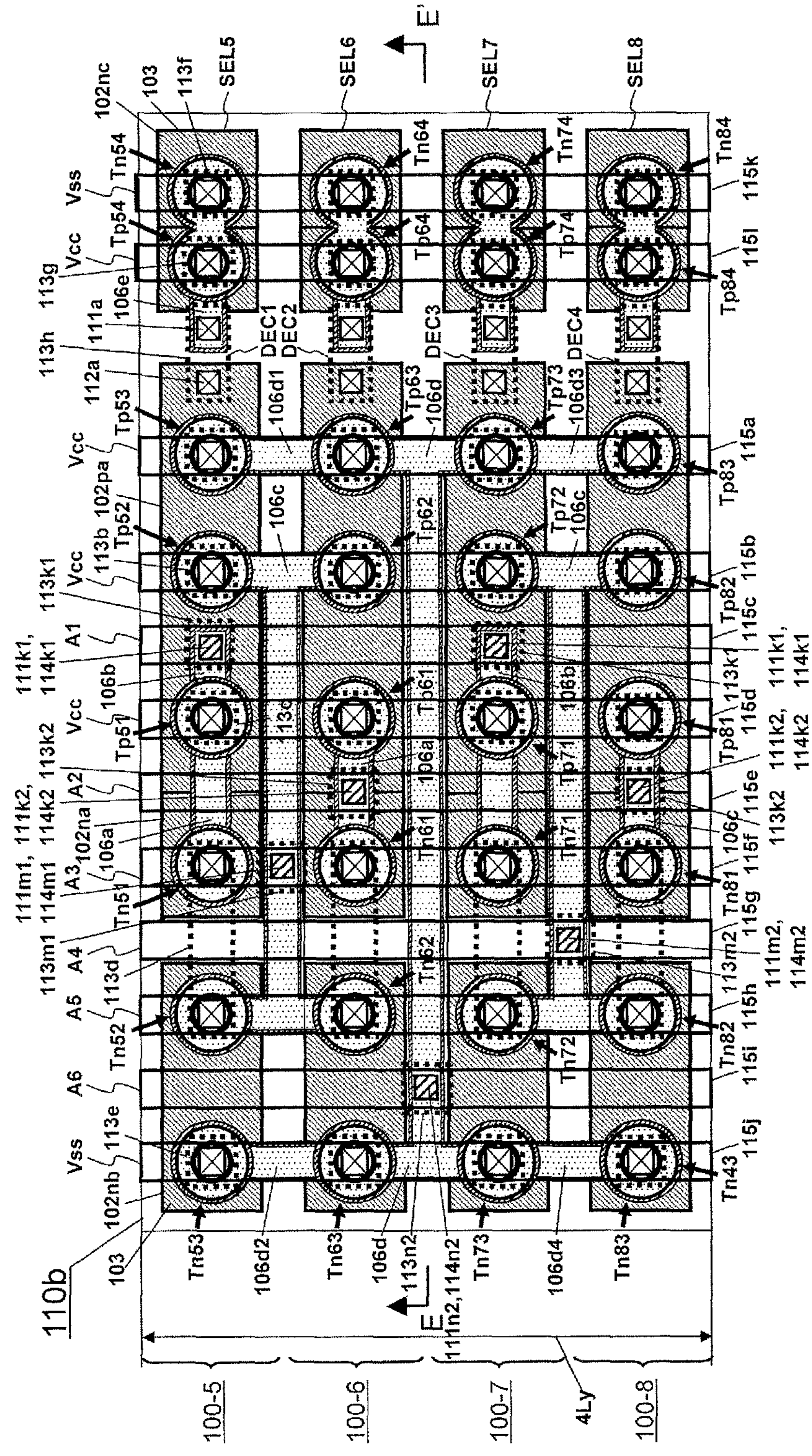

BLOCKS 100-1 TO 100-4 AMONG 8 BLOCKS

BLOCKS 100-5 TO 100-8 AMONG 8 BLOCKS 201 (3-INPUT NAND DECODER)

FIG. 18A

ADDRESS MAP FOR ADDRESS SIGNAL LINES A1 TO A12

| | | A1 | A2 | A3 | A4 | A5 | A6 | A7 | A8 | A9 | A10 | A11 | A12 |
|---|---|---|---|---|---|---|---|---|---|---|---|---|---|
| DECODER 200-1 | DEC1 / SEL1 | ○ | · | · | · | ○ | · | · | · | ○ | · | · | · |
| DECODER 200-2 | DEC2 / SEL2 | · | ○ | · | · | ○ | · | · | · | ○ | · | · | · |
| DECODER 200-3 | DEC3 / SEL3 | · | · | ○ | · | ○ | · | · | · | ○ | · | · | · |
| DECODER 200-4 | DEC4 / SEL4 | · | · | · | ○ | ○ | · | · | · | ○ | · | · | · |
| DECODER 200-5 | DEC5 / SEL5 | ○ | · | · | · | · | ○ | · | · | ○ | · | · | · |
| DECODER 200-6 | DEC6 / SEL6 | · | ○ | · | · | · | ○ | · | · | ○ | · | · | · |
| DECODER 200-7 | DEC7 / SEL7 | · | · | ○ | · | · | ○ | · | · | ○ | · | · | · |
| DECODER 200-8 | DEC8 / SEL8 | · | · | · | ○ | · | ○ | · | · | ○ | · | · | · |
| DECODER 200-9 | DEC9 / SEL9 | ○ | · | · | · | · | · | ○ | · | ○ | · | · | · |
| DECODER 200-10 | DEC10 / SEL10 | · | ○ | · | · | · | · | ○ | · | ○ | · | · | · |
| DECODER 200-11 | DEC11 / SEL11 | · | · | ○ | · | · | · | ○ | · | ○ | · | · | · |
| DECODER 200-12 | DEC12 / SEL12 | · | · | · | ○ | · | · | ○ | · | ○ | · | · | · |
| DECODER 200-13 | DEC13 / SEL13 | ○ | · | · | · | · | · | · | ○ | ○ | · | · | · |
| DECODER 200-14 | DEC14 / SEL14 | · | ○ | · | · | · | · | · | ○ | ○ | · | · | · |
| DECODER 200-15 | DEC15 / SEL15 | · | · | ○ | · | · | · | · | ○ | ○ | · | · | · |
| DECODER 200-16 | DEC16 / SEL16 | · | · | · | ○ | · | · | · | ○ | ○ | · | · | · |
| DECODER 200-17 | DEC17 / SEL17 | ○ | · | · | · | ○ | · | · | · | · | ○ | · | · |
| DECODER 200-18 | DEC18 / SEL18 | · | ○ | · | · | ○ | · | · | · | · | ○ | · | · |
| DECODER 200-19 | DEC19 / SEL19 | · | · | ○ | · | ○ | · | · | · | · | ○ | · | · |
| DECODER 200-20 | DEC20 / SEL20 | · | · | · | ○ | ○ | · | · | · | · | ○ | · | · |
| DECODER 200-21 | DEC21 / SEL21 | ○ | · | · | · | · | ○ | · | · | · | ○ | · | · |
| DECODER 200-22 | DEC22 / SEL22 | · | ○ | · | · | · | ○ | · | · | · | ○ | · | · |
| DECODER 200-23 | DEC23 / SEL23 | · | · | ○ | · | · | ○ | · | · | · | ○ | · | · |
| DECODER 200-24 | DEC24 / SEL24 | · | · | · | ○ | · | ○ | · | · | · | ○ | · | · |
| DECODER 200-25 | DEC25 / SEL25 | ○ | · | · | · | · | · | ○ | · | · | ○ | · | · |
| DECODER 200-26 | DEC26 / SEL26 | · | ○ | · | · | · | · | ○ | · | · | ○ | · | · |
| DECODER 200-27 | DEC27 / SEL27 | · | · | ○ | · | · | · | ○ | · | · | ○ | · | · |
| DECODER 200-28 | DEC28 / SEL28 | · | · | · | ○ | · | · | ○ | · | · | ○ | · | · |
| DECODER 200-29 | DEC29 / SEL29 | ○ | · | · | · | · | · | · | ○ | · | ○ | · | · |
| DECODER 200-30 | DEC30 / SEL30 | · | ○ | · | · | · | · | · | ○ | · | ○ | · | · |
| DECODER 200-31 | DEC31 / SEL31 | · | · | ○ | · | · | · | · | ○ | · | ○ | · | · |
| DECODER 200-32 | DEC32 / SEL32 | · | · | · | ○ | · | · | · | ○ | · | ○ | · | · |

○: Contact

FIG. 18B ADDRESS MAP FOR ADDRESS SIGNAL LINES A1 TO A12

| | | A1 | A2 | A3 | A4 | A5 | A6 | A7 | A8 | A9 | A10 | A11 | A12 |
|---|---|---|---|---|---|---|---|---|---|---|---|---|---|
| DECODER 200-33 | DEC33 / SEL33 | ○ | - | - | - | ○ | - | - | - | - | - | ○ | - |
| DECODER 200-34 | DEC34 / SEL34 | - | ○ | - | - | ○ | - | - | - | - | - | ○ | - |
| DECODER 200-35 | DEC35 / SEL35 | - | - | ○ | - | ○ | - | - | - | - | - | ○ | - |
| DECODER 200-36 | DEC36 / SEL36 | - | - | - | ○ | ○ | - | - | - | - | - | ○ | - |
| DECODER 200-37 | DEC37 / SEL37 | ○ | - | - | - | - | ○ | - | - | - | - | ○ | - |
| DECODER 200-38 | DEC38 / SEL38 | - | ○ | - | - | - | ○ | - | - | - | - | ○ | - |
| DECODER 200-39 | DEC39 / SEL39 | - | - | ○ | - | - | ○ | - | - | - | - | ○ | - |
| DECODER 200-40 | DEC40 / SEL40 | - | - | - | ○ | - | ○ | - | - | - | - | ○ | - |
| DECODER 200-41 | DEC41 / SEL41 | ○ | - | - | - | - | - | ○ | - | - | - | ○ | - |
| DECODER 200-42 | DEC42 / SEL42 | - | ○ | - | - | - | - | ○ | - | - | - | ○ | - |
| DECODER 200-43 | DEC43 / SEL43 | - | - | ○ | - | - | - | ○ | - | - | - | ○ | - |
| DECODER 200-44 | DEC44 / SEL44 | - | - | - | ○ | - | - | ○ | - | - | - | ○ | - |
| DECODER 200-45 | DEC45 / SEL45 | ○ | - | - | - | - | - | - | ○ | - | - | ○ | - |
| DECODER 200-46 | DEC46 / SEL46 | - | ○ | - | - | - | - | - | ○ | - | - | ○ | - |
| DECODER 200-47 | DEC47 / SEL47 | - | - | ○ | - | - | - | - | ○ | - | - | ○ | - |
| DECODER 200-48 | DEC48 / SEL48 | - | - | - | ○ | - | - | - | ○ | - | - | ○ | - |
| DECODER 200-49 | DEC49 / SEL49 | ○ | - | - | - | ○ | - | - | - | - | - | - | ○ |
| DECODER 200-50 | DEC50 / SEL50 | - | ○ | - | - | ○ | - | - | - | - | - | - | ○ |
| DECODER 200-51 | DEC51 / SEL51 | - | - | ○ | - | ○ | - | - | - | - | - | - | ○ |
| DECODER 200-52 | DEC52 / SEL52 | - | - | - | ○ | ○ | - | - | - | - | - | - | ○ |
| DECODER 200-53 | DEC53 / SEL53 | ○ | - | - | - | - | ○ | - | - | - | - | - | ○ |
| DECODER 200-54 | DEC54 / SEL54 | - | ○ | - | - | - | ○ | - | - | - | - | - | ○ |
| DECODER 200-55 | DEC55 / SEL55 | - | - | ○ | - | - | ○ | - | - | - | - | - | ○ |
| DECODER 200-56 | DEC56 / SEL56 | - | - | - | ○ | - | ○ | - | - | - | - | - | ○ |
| DECODER 200-57 | DEC57 / SEL57 | ○ | - | - | - | - | - | ○ | - | - | - | - | ○ |
| DECODER 200-58 | DEC58 / SEL58 | - | ○ | - | - | - | - | ○ | - | - | - | - | ○ |
| DECODER 200-59 | DEC59 / SEL59 | - | - | ○ | - | - | - | ○ | - | - | - | - | ○ |
| DECODER 200-60 | DEC60 / SEL60 | - | - | - | ○ | - | - | ○ | - | - | - | - | ○ |
| DECODER 200-61 | DEC61 / SEL61 | ○ | - | - | - | - | - | - | ○ | - | - | - | ○ |
| DECODER 200-62 | DEC62 / SEL62 | - | ○ | - | - | - | - | - | ○ | - | - | - | ○ |
| DECODER 200-63 | DEC63 / SEL63 | - | - | ○ | - | - | - | - | ○ | - | - | - | ○ |
| DECODER 200-64 | DEC64 / SEL64 | - | - | - | ○ | - | - | - | ○ | - | - | - | ○ |

○ : Contact

210c

SUPPLY PATHS OF ADDRESS SIGNAL LINES

SEMICONDUCTOR DEVICE

RELATED APPLICATIONS

The present application is a continuation of International Application PCT/JP2014/060360, with an international filing date of Apr. 10, 2014, the entire contents of which are incorporated herein by reference.

BACKGROUND OF THE INVENTION

1. Field of the Invention

The present invention relates to a semiconductor device.

2. Description of the Related Art

With the recent increase in the integration of semiconductor integrated circuits, semiconductor chips having as large a number of transistors as 1,000,000,000 (1 Giga (G)), have been developed for state-of-the-art micro-processing units (MPUs). As disclosed by Hirokazu YOSHIZAWA in "Shi mosu opi anpu kairo jitsumu sekkei no kiso (Fundamentals on CMOS OP amp circuit design for practical use)", CQ Publishing Co., Ltd., Aug. 1, 2007, p. 23, traditional transistors formed in a planar manner, called planar transistors, require complete isolation of an n-well region that forms a p-channel metal-oxide semiconductor (PMOS) and a p-type silicon substrate (or p-well region) that forms an n-channel metal-oxide semiconductor (NMOS) from each other. In addition, the n-well region and the p-type silicon substrate require body terminals for applying potentials thereto, which will contribute to a further increase in the area of the transistors.

To address the issues described above, a surrounding gate transistor (SGT) having a structure in which a source, a gate, and a drain are arranged in a direction perpendicular to a substrate and in which the gate surrounds an island-shaped semiconductor layer has been proposed, and a method for manufacturing an SGT and a complementary metal-oxide semiconductor (CMOS) inverter, a NAND circuit, or a static random access memory (SRAM) cell which employs SGTs are disclosed (see, for example, Japanese Patent No. 5130596, Japanese Patent No. 5031809, Japanese Patent No. 4756221, and International Publication No. WO2009/096465).

FIGS. 21, 22, and 23 illustrate a circuit diagram and layout diagrams of an inverter that employs SGTs.

FIG. 21 is a circuit diagram of the inverter. The symbol Qp denotes a p-channel MOS transistor (hereinafter referred to as a "PMOS transistor"), the symbol Qn denotes an n-channel MOS transistor (hereinafter referred to as an "NMOS transistor"), the symbol IN denotes an input signal, the symbol OUT denotes an output signal, the symbol Vcc denotes a power supply, and the symbol Vss denotes a reference power supply.

FIG. 22 illustrates a plan view of the layout of the inverter illustrated in FIG. 21, which is formed by SGTs. FIG. 23 illustrates a cross-sectional view taken along the cut-line A-A' in the plan view of FIG. 22.

In FIGS. 22 and 23, planar silicon layers 2*p* and 2*n* are formed on top of an insulating film such as a buried oxide (BOX) film layer 1 disposed on a substrate. The planar silicon layers 2*p* and 2*n* are formed as a p+ diffusion layer and an n+ diffusion layer, respectively, through impurity implantation or the like. Reference numeral 3 denotes a silicide layer disposed on surfaces of the planar silicon layers (2*p* and 2*n*). The silicide layer 3 connects the planar silicon layers 2*p* and 2*n* to each other. Reference numeral 4*n* denotes an n-type silicon pillar, and reference numeral 4*p* denotes a p-type silicon pillar. Reference numeral 5 denotes a gate insulating film that surrounds the silicon pillars 4*n* and 4*p*. Reference numeral 6 denotes a gate electrode, and reference numeral 6*a* denotes a gate line. A p+ diffusion layer 7*p* and an n+ diffusion layer 7*n* are formed in top portions of the silicon pillars 4*n* and 4*p*, respectively, through impurity implantation or the like. Reference numeral 8 denotes a silicon nitride film for protecting the gate insulating film 5 and the like, and reference numerals 9*p* and 9*n* denote silicide layers for connection to the p+ diffusion layer 7*p* and the n+ diffusion layer 7*n*, respectively. Reference numerals 10*p* and 10*n* denote contacts that respectively connect the silicide layers 9*p* and 9*n* to metal lines 13*a* and 13*b*. Reference numeral 11 denotes a contact that connects the gate line 6*a* to a metal line 13*c*.

The silicon pillar 4*n*, the diffusion layer 2*p*, the diffusion layer 7*p*, the gate insulating film 5, and the gate electrode 6 constitute the PMOS transistor Qp. The silicon pillar 4*p*, the diffusion layer 2*n*, the diffusion layer 7*n*, the gate insulating film 5, and the gate electrode 6 constitute the NMOS transistor Qn. The diffusion layers 7*p* and 7*n* serve as sources, and the diffusion layers 2*p* and 2*n* serve as drains. The power supply Vcc is supplied to the metal line 13*a*, and the reference power supply Vss is supplied to the metal line 13*b*. The input signal IN is connected to the metal line 13*c*. The output signal OUT is output from the silicide layer 3, which connects the drain of the PMOS transistor Qp, or the diffusion layer 2*p*, to the drain of the NMOS transistor Qn, or the diffusion layer 2*n*.

In the inverter illustrated in FIGS. 21, 22, and 23, which employs SGTs, the PMOS transistor and the NMOS transistor are structurally isolated completely from each other. This configuration eliminates the need for isolation of wells, unlike planar transistors. In addition, the silicon pillars act as floating bodies. This configuration eliminates the need for any body terminals for supplying potentials to the wells unlike planar transistors. The layout (arrangement) of the inverter is thus compact.

SUMMARY OF THE INVENTION

The present invention provides a semiconductor device that takes advantage of the features of SGTs described above and that includes a decoder with a minimum area, in which a NAND decoder that adopts a 3-input NAND circuit and an inverter are arranged in a line.

(1) To this end, according to an aspect of the present invention, a semiconductor device includes a NAND decoder. The NAND decoder includes six transistors, each having a source, a drain, and a gate arranged in a layered manner in a direction perpendicular to a substrate, the six transistors being arranged on the substrate in a line in a first direction. Each of the six transistors includes a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located. The six transistors include a first p-channel MOS transistor, a second p-channel MOS transistor, a third p-channel MOS transistor, a first n-channel MOS transistor, a second n-channel MOS transistor, and a third n-channel MOS transistor. The gate of the first p-channel MOS transistor and the gate of the first n-channel MOS transistor are connected to each other. The gate of the second p-channel MOS transistor and the gate of the second n-channel MOS transistor are connected to each other. The gate of the third p-channel MOS transistor and the gate of the third n-channel MOS transistor are connected to each other. The drain regions of the first p-channel MOS transistor, the second p-channel MOS transistor, the third p-channel MOS transistor, and the first n-channel MOS transistor are located closer to the substrate than the silicon pillars of the first p-channel MOS transistor, the second p-channel MOS transistor, the third p-channel MOS transistor, and the first n-channel MOS transistor, respectively, and are connected to one another to form an output terminal. The source region of the second n-channel MOS transistor and the drain region of the third n-channel MOS transistor are located closer to the substrate than the silicon pillars of the second n-channel MOS transistor and the third n-channel MOS transistor. The source region of the first n-channel MOS transistor is connected to the drain region of the second n-channel MOS transistor. The source region of the second n-channel MOS transistor is connected to the drain region of the third n-channel MOS transistor. The source regions of the first p-channel MOS transistor, the second p-channel MOS transistor, and the third p-channel MOS transistor are connected to a power supply line. The source region of the third n-channel MOS transistor is connected to a reference power supply line. The decoder further includes a first address signal line, a second address signal line, and a third address signal line. The gate of the first p-channel MOS transistor and the gate of the first n-channel MOS transistor, which are connected to each other, are connected to the first address signal line. The gate of the second p-channel MOS transistor and the gate of the second n-channel MOS transistor, which are connected to each other, are connected to the second address signal line. The gate of the third p-channel MOS transistor and the gate of the third n-channel MOS transistor, which are connected to each other, are connected to the third address signal line. The power supply line, the reference power supply line, the first address signal line, the second address signal line, and the third address signal line are arranged to extend in a second direction perpendicular to the first direction.

(2) The drain regions of the first p-channel MOS transistor, the second p-channel MOS transistor, the third p-channel MOS transistor, and the first n-channel MOS transistor may be located closer to the substrate than the silicon pillars of the first p-channel MOS transistor, the second p-channel MOS transistor, the third p-channel MOS transistor, and the first n-channel MOS transistor, respectively, and may be connected to one another via silicide regions to form the output terminal. The source region of the first n-channel MOS transistor may be connected to the drain region of the second n-channel MOS transistor via a contact. The source region of the second n-channel MOS transistor may be connected to the drain region of the third n-channel MOS transistor via a lower diffusion layer and a silicide layer. The source regions of the first p-channel MOS transistor, the second p-channel MOS transistor, and the third p-channel MOS transistor may be connected to the power supply line via contacts. The source region of the third n-channel MOS transistor may be connected to the reference power supply line via a contact.

(3) The six transistors may be arranged in a line in an order of the third p-channel MOS transistor, the second p-channel MOS transistor, the first p-channel MOS transistor, the first n-channel MOS transistor, the second n-channel MOS transistor, and the third n-channel MOS transistor.

(4) At least the gates of the first p-channel MOS transistor and the first n-channel MOS transistor, the gates of the second p-channel MOS transistor and the second n-channel MOS transistor, or the gates of the third p-channel MOS transistor and the third n-channel MOS transistor may be connected to the corresponding one of the first to third address signal lines, each of which is formed of a line of a second metal wiring layer arranged to extend in the second direction, at least via a line of a first metal wiring layer arranged to extend in the first direction.

(5) According to another aspect of the present invention, a semiconductor device includes a first address signal lines, the number of which is equal to a, b second address signal lines, the number of which is equal to b, c third address signal lines, the number of which is equal to c, and a×b×c NAND decoders, the number of which is given by a×b×c. Each of the a×b×c NAND decoders includes six transistors, each having a source, a drain, and a gate arranged in a layered manner in a direction perpendicular to a substrate, the six transistors being arranged on the substrate in a line in a first direction. Each of the six transistors includes a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located. The six transistors at least include a first p-channel MOS transistor, a second p-channel MOS transistor, a third p-channel MOS transistor, a first n-channel MOS transistor, a second n-channel MOS transistor, and a third n-channel MOS transistor. The gate of the first p-channel MOS transistor and the gate of the first n-channel MOS transistor are connected to each other. The gate of the second p-channel MOS transistor and the gate of the second n-channel MOS transistor are connected to each other. The gate of the third p-channel MOS transistor and the gate of the third n-channel MOS transistor are connected to each other. The drain regions of the first p-channel MOS transistor, the second p-channel MOS transistor, the third p-channel MOS transistor, and the first n-channel MOS transistor are located closer to the substrate than the silicon pillars of the first p-channel MOS transistor, the second p-channel MOS transistor, the third p-channel MOS transistor, and the first n-channel MOS transistor, respectively, and are connected to one another to form an output terminal. The source region of the second n-channel MOS transistor and the drain region of the third n-channel MOS transistor are located closer to the substrate than the silicon pillars of the second n-channel MOS transistor and the third n-channel MOS transistor. The source region of the first n-channel MOS transistor is connected to the drain region of the second n-channel MOS transistor. The source region of the second n-channel MOS transistor is connected to the drain region of the third n-channel MOS transistor. The source regions of the first p-channel MOS transistor, the second p-channel MOS transistor, and the third p-channel MOS transistor are connected to a power supply line. The source region of the third n-channel MOS transistor is connected to a reference power supply line. Each of the a×b×c NAND decoders is configured such that the gate of the first p-channel MOS transistor and the gate of the first n-channel MOS transistor, which are connected to each other, are connected to any one of the a first address signal lines, the gate of the second p-channel MOS transistor and the gate of the second n-channel MOS transistor, which are connected to each other, are connected to any one of the b second address signal lines, and the gate of the third p-channel MOS transistor and the gate of the third n-channel MOS transistor, which are connected to each other, are connected to any one of the c third address signal lines. The power supply line, the reference power supply line, the a first address signal lines, the b second address signal lines, and the c third address signal lines are arranged to extend in a second direction perpendicular to the first direction.

(6) The drain regions of the first p-channel MOS transistor, the second p-channel MOS transistor, the third p-channel MOS transistor, and the first n-channel MOS transistor may be located closer to the substrate than the silicon pillars of the first p-channel MOS transistor, the second p-channel MOS transistor, the third p-channel MOS transistor, and the first n-channel MOS transistor, respectively, and may be connected to one another via silicide regions to form the output terminal. The source region of the first n-channel MOS transistor may be connected to the drain region of the second n-channel MOS transistor via a contact. The source region of the second n-channel MOS transistor may be connected to the drain region of the third n-channel MOS transistor via a lower diffusion layer and a silicide layer. The source regions of the first p-channel MOS transistor, the second p-channel MOS transistor, and the third p-channel MOS transistor may be connected to the power supply line via contacts. The source region of the third n-channel MOS transistor may be connected to the reference power supply line via a contact.

(7) The six transistors may be arranged in a line in an order of the third p-channel MOS transistor, the second p-channel MOS transistor, the first p-channel MOS transistor, the first n-channel MOS transistor, the second n-channel MOS transistor, and the third n-channel MOS transistor.

(8) In each of the a×b×c NAND decoders, at least the gates of the first p-channel MOS transistor and the first n-channel MOS transistor, the gates of the second p-channel MOS transistor and the second n-channel MOS transistor, or the gates of the third p-channel MOS transistor and the third n-channel MOS transistor may be connected to the corresponding one of the first to third address signal lines, each of which is formed of a line of a second metal wiring layer arranged to extend in the second direction, at least via a line of a first metal wiring layer arranged to extend in the first direction.

(9) According to still another aspect of the present invention, a semiconductor device includes a NAND decoder. The NAND decoder includes six transistors, each having a source, a drain, and a gate arranged in a layered manner in a direction perpendicular to a substrate, the six transistors being arranged on the substrate in a line in a first direction. Each of the six transistors includes a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located. The six transistors include a first p-channel MOS transistor, a second p-channel MOS transistor, a third p-channel MOS transistor, a first n-channel MOS transistor, a second n-channel MOS transistor, and a third n-channel MOS transistor. The gate of the first p-channel MOS transistor and the gate of the first n-channel MOS transistor are connected to each other. The gate of the second p-channel MOS transistor and the gate of the second n-channel MOS transistor are connected to each other. The gate of the third p-channel MOS transistor and the gate of the third n-channel MOS transistor are connected to each other. The source regions of the first p-channel MOS transistor, the second p-channel MOS transistor, the third p-channel MOS transistor, and the first n-channel MOS transistor are located closer to the substrate than the silicon pillars of the first p-channel MOS transistor, the second p-channel MOS transistor, the third p-channel MOS transistor, and the first n-channel MOS transistor. The drain region of the second n-channel MOS transistor and the source region of the third n-channel MOS transistor are located closer to the substrate than the silicon pillars of the second n-channel MOS transistor and the third n-channel MOS transistor. The drain regions of the first p-channel MOS transistor, the second p-channel MOS transistor, the third p-channel MOS transistor, and the first re-channel MOS transistor are connected to one another to form an output terminal. The source regions of the first p-channel MOS transistor, the second p-channel MOS transistor, and the third p-channel MOS transistor are connected to a power supply line. The source region of the first n-channel MOS transistor is connected to the drain region of the second n-channel MOS transistor. The source region of the second n-channel MOS transistor is connected to the drain region of the third n-channel MOS transistor. The source region of the third n-channel MOS transistor is connected to a reference power supply line. The NAND decoder further includes a first address signal line, a second address signal line, and a third address signal line. The gate of the first p-channel MOS transistor and the gate of the first n-channel MOS transistor, which are connected to each other, are connected to the first address signal line. The gate of the second p-channel MOS transistor and the gate of the second n-channel MOS transistor, which are connected to each other, are connected to the second address signal line. The gate of the third p-channel MOS transistor and the gate of the third n-channel MOS transistor, which are connected to each other, are connected to the third address signal line. The power supply line, the reference power supply line, the first address signal line, the second address signal line, and the third address signal line are arranged to extend in a second direction perpendicular to the first direction.

(10) The drain regions of the first p-channel MOS transistor, the second p-channel MOS transistor, the third p-channel MOS transistor, and the first n-channel MOS transistor may be connected to one another via contacts to form the output terminal. The source regions of the first p-channel MOS transistor, the second p-channel MOS transistor, and the third p-channel MOS transistor may be connected to the power supply line via lower diffusion layers and silicide regions. The source region of the first n-channel MOS transistor may be connected to the drain region of the second n-channel MOS transistor via a lower diffusion layer and a silicide region. The source region of the second n-channel MOS transistor may be connected to the drain region of the third n-channel MOS transistor via a contact. The source region of the third n-channel MOS transistor may be connected to the reference power supply line via a lower diffusion layer and a silicide region.

(11) The six transistors may be arranged in a line in an order of the third p-channel MOS transistor, second p-channel MOS transistor, the first p-channel MOS transistor, the first n-channel MOS transistor, the second n-channel MOS transistor, and the third n-channel MOS transistor.

(12) At least the gates of the first p-channel MOS transistor and the first n-channel MOS transistor, the gates of the second p-channel MOS transistor and the second n-channel MOS transistor, or the gates of the third p-channel MOS transistor and the third n-channel MOS transistor may be connected to the corresponding one of the first to third address signal lines, each of which is formed of a line of a second metal wiring layer arranged to extend in the second direction, at least via a line of a first metal wiring layer arranged to extend in the first direction.

(13) According to still another aspect of the present invention, a semiconductor device includes a first address signal lines, the number of which is equal to a, b second address signal lines, the number of which is equal to b, c third address signal lines, the number of which is equal to c, and a×b×c NAND decoders, the number of which is given by a×b×c. Each of the a×b×c NAND decoders includes six transistors, each having a source, a drain, and a gate arranged in a layered manner in a direction perpendicular to a substrate, the six transistors being arranged on the substrate in a line in a first direction. Each of the six transistors includes a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located. The six transistors at least include a first p-channel MOS transistor, a second p-channel MOS transistor, a third p-channel MOS transistor, a first n-channel MOS transistor, a second n-channel MOS transistor, and a third n-channel MOS transistor. The gate of the first p-channel MOS transistor and the gate of the first n-channel MOS transistor are connected to each other. The gate of the second p-channel MOS transistor and the gate of the second n-channel MOS transistor are connected to each other. The gate of the third p-channel MOS transistor and the gate of the third n-channel MOS transistor are connected to each other. The source regions of the first p-channel MOS transistor, the second p-channel MOS transistor, the third p-channel MOS transistor, and the first n-channel MOS transistor are located closer to the substrate than the silicon pillars of the first p-channel MOS transistor, the second p-channel MOS transistor, the third p-channel MOS transistor, and the first n-channel MOS transistor. The drain region of the second n-channel MOS transistor and the source region of the third n-channel MOS transistor are located closer to the substrate than the silicon pillars of the second n-channel MOS transistor and the third n-channel MOS transistor. The drain regions of the first p-channel MOS transistor, the second p-channel MOS transistor, the third p-channel MOS transistor, and the first n-channel MOS transistor are connected to one another to form an output terminal. The source regions of the first p-channel MOS transistor, the second p-channel MOS transistor, and the third p-channel MOS transistor are connected to a power supply line. The source region of the first n-channel MOS transistor is connected to the drain region of the second n-channel MOS transistor. The source region of the second n-channel MOS transistor is connected to the drain region of the third n-channel MOS transistor. The source region of the third n-channel MOS transistor is connected to a reference power supply line. Each of the a×b×c NAND decoders is configured such that the gate of the first p-channel MOS transistor and the gate of the first n-channel MOS transistor, which are connected to each other, are connected to any one of the a first address signal lines, the gate of the second p-channel MOS transistor and the gate of the second n-channel MOS transistor, which are connected to each other, are connected to any one of the b second address signal lines, and the gate of the third p-channel MOS transistor and the gate of the third n-channel MOS transistor, which are connected to each other, are connected to any one of the c third address signal lines. The power supply line, the reference power supply line, the a first address signal lines, the b second address signal lines, and the c third address signal lines are arranged to extend in a second direction perpendicular to the first direction.

(14) The drain regions of the first p-channel MOS transistor, the second p-channel MOS transistor, the third p-channel MOS transistor, and the first n-channel MOS transistor may be connected to one another via contacts to form the output terminal. The source regions of the first p-channel MOS transistor, the second p-channel MOS transistor, and the third p-channel MOS transistor may be connected to the power supply line via lower diffusion layers and silicide layers. The source region of the first n-channel MOS transistor may be connected to the drain region of the second n-channel MOS transistor via a lower diffusion layer and a silicide layer. The source region of the second n-channel MOS transistor may be connected to the drain region of the third n-channel MOS transistor via a contact. The source region of the third n-channel MOS transistor may be connected to the reference power supply line via a lower diffusion layer and a silicide layer.

(15) The six transistors may be arranged in a line in an order of the third p-channel MOS transistor, the second p-channel MOS transistor, the first p-channel MOS transistor, the first n-channel MOS transistor, the second n-channel MOS transistor, and the third n-channel MOS transistor.

(16) The source regions of the first p-channel MOS transistors, the second p-channel MOS transistors, and the third p-channel MOS transistors in the a×b×c NAND decoders may be connected in common via a silicide layer.

(17) In each of the a×b×c NAND decoders, at least the gates of the first p-channel MOS transistor and the first n-channel MOS transistor, the gates of the second p-channel MOS transistor and the second n-channel MOS transistor, or the gates of the third p-channel MOS transistor and the third n-channel MOS transistor may be connected to the corresponding one of the first to third address signal lines, each of which is formed of a line of a second metal wiring layer arranged to extend in the second direction, at least via a line of a first metal wiring layer arranged to extend in the first direction.

(18) According to still another aspect of the present invention, a semiconductor device includes a NAND decoder and an inverter. The NAND decoder and the inverter include eight transistors, each having a source, a drain, and a gate arranged in a layered manner in a direction perpendicular to a substrate, the eight transistors being arranged on the substrate in a line in a first direction. Each of the eight transistors includes a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located. The eight transistors include a first p-channel MOS transistor, a second p-channel MOS transistor, a third p-channel MOS transistor, a fourth p-channel MOS transistor, a first n-channel MOS transistor, a second n-channel MOS transistor, a third n-channel MOS transistor, and a fourth n-channel MOS transistor. The NAND decoder includes the first p-channel MOS transistor, the second p-channel MOS transistor, the third p-channel MOS transistor, the first n-channel MOS transistor, the second n-channel MOS transistor, and the third n-channel MOS transistor. The inverter includes the fourth p-channel MOS transistor and the fourth n-channel MOS transistor. The gate of the first p-channel MOS transistor and the gate of the first n-channel MOS transistor are connected to each other. The gate of the second p-channel MOS transistor and the gate of the second n-channel MOS transistor are connected to each other. The gate of the third p-channel MOS transistor and the gate of the third n-channel MOS transistor are connected to each other. The drain regions of the first p-channel MOS transistor, the second p-channel MOS transistor, the third p-channel MOS transistor, and the first n-channel MOS transistor are located closer to the substrate than the silicon pillars of the first p-channel MOS transistor, the second p-channel MOS transistor, the third p-channel MOS transistor, and the first n-channel MOS transistor, respectively, and are connected to one another to form a first output terminal. The source region of the second n-channel MOS transistor and the drain region of the third n-channel MOS transistor are located closer to the substrate than the silicon pillars of the second n-channel MOS transistor and the third n-channel MOS transistor. The source regions of the first p-channel MOS transistor, the second p-channel MOS transistor, and the third p-channel MOS transistor are connected to a power supply line. The source region of the first n-channel MOS transistor is connected to the drain region of the second n-channel MOS transistor. The source region of the second n-channel MOS transistor is connected to the drain region of the third n-channel MOS transistor. The source region of the third n-channel MOS transistor is connected to a reference power supply line. The gate of the fourth p-channel MOS transistor and the gate of the fourth n-channel MOS transistor are connected to each other and are connected to the first output terminal. The drain region of the fourth p-channel MOS transistor and the drain region of the fourth n-channel MOS transistor are connected to each other to form a second output terminal. The source region of the fourth p-channel MOS transistor and the source region of the fourth n-channel MOS transistor are respectively connected to the power supply line and the reference power supply line. The NAND decoder further includes a first address signal line, a second address signal line, and a third address signal line. The gate of the first p-channel MOS transistor and the gate of the first n-channel MOS transistor, which are connected to each other, are connected to the first address signal line. The gate of the second p-channel MOS transistor and the gate of the second n-channel MOS transistor, which are connected to each other, are connected to the second address signal line. The gate of the third p-channel MOS transistor and the gate of the third n-channel MOS transistor, which are connected to each other, are connected to the third address signal line. The power supply line, the reference power supply line, the first address signal line, the second address signal line, and the third address signal line are arranged to extend in a second direction perpendicular to the first direction.

(19) The drain regions of the first p-channel MOS transistor, the second p-channel MOS transistor, the third p-channel MOS transistor, and the first n-channel MOS transistor may be located closer to the substrate than the silicon pillars of the first p-channel MOS transistor, the second p-channel MOS transistor, the third p-channel MOS transistor, and the first n-channel MOS transistor, respectively, and may be connected to one another via silicide layers to form the first output terminal. The source regions of the first p-channel MOS transistor, the second p-channel MOS transistor, and the third p-channel MOS transistor may be connected to the power supply line via contacts. The source region of the first n-channel MOS transistor may be connected to the drain region of the second n-channel MOS transistor via a contact. The source region of the second n-channel MOS transistor may be connected to the drain region of the third n-channel MOS transistor via a silicide layer. The source region of the third n-channel MOS transistor may be connected to the reference power supply line via a contact.

(20) The eight transistors may be arranged in a line in an order of one of the fourth n-channel MOS transistor and the fourth p-channel MOS transistor, the other of the fourth n-channel MOS transistor and the fourth p-channel MOS transistor, the third p-channel MOS transistor, the second p-channel MOS transistor, the first p-channel MOS transistor, the first n-channel MOS transistor, the second n-channel MOS transistor, and the third n-channel MOS transistor.

(21) At least the gates of the first p-channel MOS transistor and the first n-channel MOS transistor, the gates of the second p-channel MOS transistor and the second n-channel MOS transistor, or the gates of the third p-channel MOS transistor and the third n-channel MOS transistor may be connected to the corresponding one of the first to third address signal lines, each of which is formed of a line of a second metal wiring layer arranged to extend in the second direction, at least via a line of a first metal wiring layer arranged to extend in the first direction.

(22) According to still another aspect of the present invention, a semiconductor device includes a first address signal lines, the number of which is equal to a, b second address signal lines, the number of which is equal to b, c third address signal lines, the number of which is equal to c, and a×b×c pairs of NAND decoders and inverters, the number of which is given by a×b×c. Each of the a×b×c pairs of NAND decoders and inverters includes eight transistors, each having a source, a drain, and a gate arranged in a layered manner in a direction perpendicular to a substrate, the eight transistors being arranged on the substrate in a line in a first direction. Each of the eight transistors includes a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located. The eight transistors include a first p-channel MOS transistor, a second p-channel MOS transistor, a third p-channel MOS transistor, a fourth p-channel MOS transistor, a first n-channel MOS transistor, a second n-channel MOS transistor, a third n-channel MOS transistor, and a fourth n-channel MOS transistor. The decoder at least includes the first p-channel MOS transistor, the second p-channel MOS transistor, the third p-channel MOS transistor, the first n-channel MOS transistor, the second n-channel MOS transistor, and the third n-channel MOS transistor. The inverter includes the fourth p-channel MOS transistor and the fourth n-channel MOS transistor. The gate of the first p-channel MOS transistor and the gate of the first n-channel MOS transistor are connected to each other. The gate of the second p-channel MOS transistor and the gate of the second re-channel MOS transistor are connected to each other. The gate of the third p-channel MOS transistor and the gate of the third n-channel MOS transistor are connected to each other. The drain regions of the first p-channel MOS transistor, the second p-channel MOS transistor, the third p-channel MOS transistor, and the first n-channel MOS transistor are located closer to the substrate than the silicon pillars of the first p-channel MOS transistor, the second p-channel MOS transistor, the third p-channel MOS transistor, and the first n-channel MOS transistor, respectively, and are connected to one another to form a first output terminal. The source region of the second n-channel MOS transistor and the drain region of the third n-channel MOS transistor are located closer to the substrate than the silicon pillars of the second n-channel MOS transistor and the third n-channel MOS transistor. The source regions of the first p-channel MOS transistor, the second p-channel MOS transistor, and the third p-channel MOS transistor are connected to a power supply line. The source region of the first n-channel MOS transistor is connected to the drain region of the second n-channel MOS transistor. The source region of the second n-channel MOS transistor is connected to the drain region of the third n-channel MOS transistor. The source region of the third n-channel MOS transistor is connected to a reference power supply line. The gate of the fourth p-channel MOS transistor and the gate of the fourth n-channel MOS transistor are connected to each other and are connected to the first output terminal. The drain region of the fourth p-channel MOS transistor and the drain region of the fourth re-channel MOS transistor are connected to each other to form a second output terminal. The source region of the fourth p-channel MOS transistor and the source region of the fourth n-channel MOS transistor are respectively connected to the power supply line and the reference power supply line. Each of the a×b×c pairs of NAND decoders and inverters is configured such that the gate of the first p-channel MOS transistor and the gate of the first n-channel MOS transistor, which are connected to each other, are connected to any one of the a first address signal lines, the gate of the second p-channel MOS transistor and the gate of the second n-channel MOS transistor, which are connected to each other, are connected to any one of the b second address signal lines, and the gate of the third p-channel MOS transistor and the gate of the third n-channel MOS transistor, which are connected to each other, are connected to any one of the c third address signal lines. The power supply line, the reference power supply line, the a first address signal lines, the b second address signal lines, and the c third address signal lines are arranged to extend in a second direction perpendicular to the first direction.

(23) The drain regions of the first p-channel MOS transistor, the second p-channel MOS transistor, the third p-channel MOS transistor, and the first n-channel MOS transistor may be located closer to the substrate than the silicon pillars of the first p-channel MOS transistor, the second p-channel MOS transistor, the third p-channel MOS transistor, and the first n-channel MOS transistor, respectively, and may be connected to one another via silicide layers to form the first output terminal. The source regions of the first p-channel MOS transistor, the second p-channel MOS transistor, and the third p-channel MOS transistor may be connected to the power supply line via contacts. The source region of the first n-channel MOS transistor may be connected to the drain region of the second n-channel MOS transistor via a contact. The source region of the second n-channel MOS transistor may be connected to the drain region of the third n-channel MOS transistor via a silicide layer. The source region of the third n-channel MOS transistor may be connected to the reference power supply line via a contact.

(24) The eight transistors may be arranged in a line in an order of one of the fourth n-channel MOS transistor and the fourth p-channel MOS transistor, the other of the fourth n-channel MOS transistor and the fourth p-channel MOS transistor, the third p-channel MOS transistor, the second p-channel MOS transistor, the first p-channel MOS transistor, first n-channel MOS transistor, the second n-channel MOS transistor, and the third n-channel MOS transistor.

(25) In each of the a×b×c pairs of NAND decoders and inverters, at least the gates of the first p-channel MOS transistor and the first n-channel MOS transistor, the gates of the second p-channel MOS transistor and the second re-channel MOS transistor, or the gates of the third p-channel MOS transistor and the third n-channel MOS transistor may be connected to the corresponding one of the first to third address signal lines, each of which is formed of a line of a second metal wiring layer arranged to extend in the second direction, at least via a line of a first metal wiring layer arranged to extend in the first direction.

(26) According to still another aspect of the present invention, a semiconductor device includes a NAND decoder and an inverter. The NAND decoder and the inverter include eight transistors, each having a source, a drain, and a gate arranged in a layered manner in a direction perpendicular to a substrate, the eight transistors being arranged on the substrate in a line in a first direction. Each of the eight transistors includes a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located. The eight transistors include a first p-channel MOS transistor, a second p-channel MOS transistor, a third p-channel MOS transistor, a fourth p-channel MOS transistor, a first n-channel MOS transistor, a second n-channel MOS transistor, a third n-channel MOS transistor, and a fourth n-channel MOS transistor. The NAND decoder includes the first p-channel MOS transistor, the second p-channel MOS transistor, the third p-channel MOS transistor, the first n-channel MOS transistor, the second n-channel MOS transistor, and the third n-channel MOS transistor. The inverter includes the fourth p-channel MOS transistor and the fourth n-channel MOS transistor. The gate of the first p-channel MOS transistor and the gate of the first n-channel MOS transistor are connected to each other. The gate of the second p-channel MOS transistor and the gate of the second n-channel MOS transistor are connected to each other. The gate of the third p-channel MOS transistor and the gate of the third n-channel MOS transistor are connected to each other. The source regions of the first p-channel MOS transistor, the second p-channel MOS transistor, the third p-channel MOS transistor, and the first n-channel MOS transistor are located closer to the substrate than the silicon pillars of the first p-channel MOS transistor, the second p-channel MOS transistor, the third p-channel MOS transistor, and the first n-channel MOS transistor. The drain region of the second n-channel MOS transistor and the source region of the third n-channel MOS transistor are located closer to the substrate than the silicon pillars of the second n-channel MOS transistor and the third n-channel MOS transistor. The drain regions of the first p-channel MOS transistor, the second p-channel MOS transistor, the third p-channel MOS transistor, and the first n-channel MOS transistor are connected to one another to form a first output terminal. The source regions of the first p-channel MOS transistor, the second p-channel MOS transistor, and the third p-channel MOS transistor are connected to a power supply line. The source region of the first n-channel MOS transistor is connected to the drain region of the second re-channel MOS transistor. The source region of the second n-channel MOS transistor is connected to the drain region of the third n-channel MOS transistor. The source region of the third n-channel MOS transistor is connected to a reference power supply line. The gate of the fourth p-channel MOS transistor and the gate of the fourth n-channel MOS transistor are connected to each other and are connected to the first output terminal. The drain region of the fourth p-channel MOS transistor and the drain region of the fourth n-channel MOS transistor are connected to each other to form a second output terminal. The source region of the fourth p-channel MOS transistor and the source region of the fourth n-channel MOS transistor are respectively connected to the power supply line and the reference power supply line. The NAND decoder further includes a first address signal line, a second address signal line, and a third address signal line. The gate of the first p-channel MOS transistor and the gate of the first n-channel MOS transistor, which are connected to each other, are connected to the first address signal line. The gate of the second p-channel MOS transistor and the gate of the second n-channel MOS transistor, which are connected to each other, are connected to the second address signal line. The gate of the third p-channel MOS transistor and the gate of the third n-channel MOS transistor, which are connected to each other, are connected to the third address signal line. The power supply line, the reference power supply line, the first address signal line, the second address signal line, and the third address signal line are arranged to extend in a second direction perpendicular to the first direction.

(27) The drain regions of the first p-channel MOS transistor, the second p-channel MOS transistor, the third p-channel MOS transistor, and the first n-channel MOS transistor may be connected to one another via contacts to form the first output terminal. The source regions of the first p-channel MOS transistor, the second p-channel MOS transistor, and the third p-channel MOS transistor may be connected to the power supply line via silicide regions. The source region of the first n-channel MOS transistor may be connected to the drain region of the second n-channel MOS transistor via a silicide layer. The source region of the second n-channel MOS transistor may be connected to the drain region of the third n-channel MOS transistor via a contact. The source region of the third n-channel MOS transistor may be connected to the reference power supply line via a silicide layer.

(28) The eight transistors may be arranged in a line in an order of one of the fourth n-channel MOS transistor and the fourth p-channel MOS transistor, the other of the fourth n-channel MOS transistor and the fourth p-channel MOS transistor, the third p-channel MOS transistor, the second p-channel MOS transistor, the first p-channel MOS transistor, the first n-channel MOS transistor, the second n-channel MOS transistor, and the third n-channel MOS transistor.

(29) The source regions of the fourth p-channel MOS transistor and the fourth n-channel MOS transistor may be located closer to the substrate than the silicon pillars of the fourth p-channel MOS transistor and the fourth n-channel MOS transistor, and the eight transistors may be arranged in a line in an order of the fourth n-channel MOS transistor, the fourth p-channel MOS transistor, the third p-channel MOS transistor, the second p-channel MOS transistor, the first p-channel MOS transistor, the first n-channel MOS transistor, the second n-channel MOS transistor, and the third n-channel MOS transistor.

(30) At least the gates of the first p-channel MOS transistor and the first n-channel MOS transistor, the gates of the second p-channel MOS transistor and the second n-channel MOS transistor, or the gates of the third p-channel MOS transistor and the third n-channel MOS transistor may be connected to the corresponding one of the first to third address signal lines, each of which is formed of a line of a second metal wiring layer arranged to extend in the second direction, at least via a line of a first metal wiring layer arranged to extend in the first direction.

(31) According to still another aspect of the present invention, a semiconductor device includes a first address signal lines, the number of which is equal to a, b second address signal lines, the number of which is equal to b, c third address signal lines, the number of which is equal to c, and a×b×c pairs of NAND decoders and inverters, the number of which is given by a×b×c. Each of the a×b×c pairs of NAND decoders and inverters includes eight transistors, each having a source, a drain, and a gate arranged in a layered manner in a direction perpendicular to a substrate, the eight transistors being arranged on the substrate in a line in a first direction. Each of the eight transistors includes a silicon pillar, an insulator that surrounds a side surface of the silicon pillar, a gate that surrounds the insulator, a source region disposed in an upper portion or a lower portion of the silicon pillar, and a drain region disposed in the upper portion or the lower portion of the silicon pillar, the drain region being located on a side of the silicon pillar opposite to a side of the silicon pillar on which the source region is located. The eight transistors include a first p-channel MOS transistor, a second p-channel MOS transistor, a third p-channel MOS transistor, a fourth p-channel MOS transistor, a first n-channel MOS transistor, a second n-channel MOS transistor, a third n-channel MOS transistor, and a fourth n-channel MOS transistor. Each of the a×b×c NAND decoders includes the first p-channel MOS transistor, the second p-channel MOS transistor, the third p-channel MOS transistor, the first n-channel MOS transistor, the second n-channel MOS transistor, and the third n-channel MOS transistor. Each of the a×b×c inverters includes the fourth p-channel MOS transistor, and the fourth n-channel MOS transistor. The gate of the first p-channel MOS transistor and the gate of the first n-channel MOS transistor are connected to each other. The gate of the second p-channel MOS transistor and the gate of the second n-channel MOS transistor are connected to each other. The gate of the third p-channel MOS transistor and the gate of the third n-channel MOS transistor are connected to each other. The source regions of the first p-channel MOS transistor, the second p-channel MOS transistor, the third p-channel MOS transistor, and the first n-channel MOS transistor are located closer to the substrate than the silicon pillars of the first p-channel MOS transistor, the second p-channel MOS transistor, the third p-channel MOS transistor, and the first n-channel MOS transistor. The drain region of the second n-channel MOS transistor and the source region of the third n-channel MOS transistor are located closer to the substrate than the silicon pillars of the second n-channel MOS transistor and the third n-channel MOS transistor. The drain regions of the first p-channel MOS transistor, the second p-channel MOS transistor, the third p-channel MOS transistor, and the first n-channel MOS transistor are connected to one another to form a first output terminal. The source regions of the first p-channel MOS transistor, the second p-channel MOS transistor, and the third p-channel MOS transistor are connected to a power supply line. The source region of the first n-channel MOS transistor is connected to the drain region of the second n-channel MOS transistor. The source region of the second n-channel MOS transistor is connected to the drain region of the third n-channel MOS transistor. The source region of the third n-channel MOS transistor is connected to a reference power supply line. The gate of the fourth p-channel MOS transistor and the gate of the fourth n-channel MOS transistor are connected to each other and are connected to the first output terminal. The drain region of the fourth p-channel MOS transistor and the drain region of the fourth n-channel MOS transistor are connected to each other to form a second output terminal. The source region of the fourth p-channel MOS transistor and the source region of the fourth n-channel MOS transistor are respectively connected to the power supply line and the reference power supply line. Each of the a×b×c pairs of NAND decoders and inverters is configured such that the gate of the first p-channel MOS transistor and the gate of the first re-channel MOS transistor, which are connected to each other, are connected to any one of the a first address signal lines, the gate of the second p-channel MOS transistor and the gate of the second n-channel MOS transistor, which are connected to each other, are connected to any one of the b second address signal lines, and the gate of the third p-channel MOS transistor and the gate of the third n-channel MOS transistor, which are connected to each other, are connected to any one of the c third address signal lines. The power supply line, the reference power supply line, the a first address signal lines, the b second address signal lines, and the c third address signal lines are arranged to extend in a second direction perpendicular to the first direction.

(32) The drain regions of the first p-channel MOS transistor, the second p-channel MOS transistor, the third p-channel MOS transistor, and the first n-channel MOS transistor may be connected to one another via contacts to form the first output terminal. The source regions of the first p-channel MOS transistor, the second p-channel MOS transistor, and the third p-channel MOS transistor may be connected to the power supply line via silicide regions. The source region of the first n-channel MOS transistor may be connected to the drain region of the second n-channel MOS transistor via a silicide layer. The source region of the second n-channel MOS transistor may be connected to the drain region of the third n-channel MOS transistor via a contact. The source region of the third n-channel MOS transistor may be connected to the reference power supply line via a silicide layer.

(33) The eight transistors may be arranged in a line in an order of one of the fourth n-channel MOS transistor and the fourth p-channel MOS transistor, the other of the fourth n-channel MOS transistor and the fourth p-channel MOS transistor, the third p-channel MOS transistor, the second p-channel MOS transistor, the first p-channel MOS transistor, the first n-channel MOS transistor, the second n-channel MOS transistor, and the third n-channel MOS transistor.

(34) In each of the a×b×c pairs of NAND decoders and inverters, the source regions of the fourth p-channel MOS transistor and the fourth n-channel MOS transistor may be located closer to the substrate than the silicon pillars of the fourth p-channel MOS transistor and the fourth n-channel MOS transistor, and the eight transistors may be arranged in a line in an order of the fourth n-channel MOS transistor, the fourth p-channel MOS transistor, the third p-channel MOS transistor, the second p-channel MOS transistor, the first p-channel MOS transistor, the first n-channel MOS transistor, the second n-channel MOS transistor, and the third n-channel MOS transistor.

(35) The source regions of the first p-channel MOS transistors, the second p-channel MOS transistors, the third p-channel MOS transistors, and the fourth p-channel MOS transistors in the a×b×c NAND decoders and the a×b×c inverters may be connected in common via a silicide layer.

(36) In each of the a×b×c pairs of NAND decoders and inverters, at least the gates of the first p-channel MOS transistor and the first n-channel MOS transistor, the gates of the second p-channel MOS transistor and the second re-channel MOS transistor, or the gates of the third p-channel MOS transistor and the third n-channel MOS transistor may be connected to the corresponding one of the first to third address signal lines, each of which is formed of a line of a second metal wiring layer arranged to extend in the second direction, at least via a line of a first metal wiring layer arranged to extend in the first direction.

BRIEF DESCRIPTION OF THE DRAWINGS

FIG. 8 is an address map of the decoder according to the third exemplary embodiment of the present invention.

FIG. 9B is a plan view of the decoder according to the third exemplary embodiment of the present invention.

FIG. 18A is an address map of the decoder according to the sixth exemplary embodiment of the present invention.

FIG. 18B is an address map of the decoder according to the sixth exemplary embodiment of the present invention.

DETAILED DESCRIPTION OF THE PREFERRED EMBODIMENTS

First Exemplary Embodiment

Equivalent Circuit Applicable to Exemplary Embodiment of Present Invention

Figure 1:
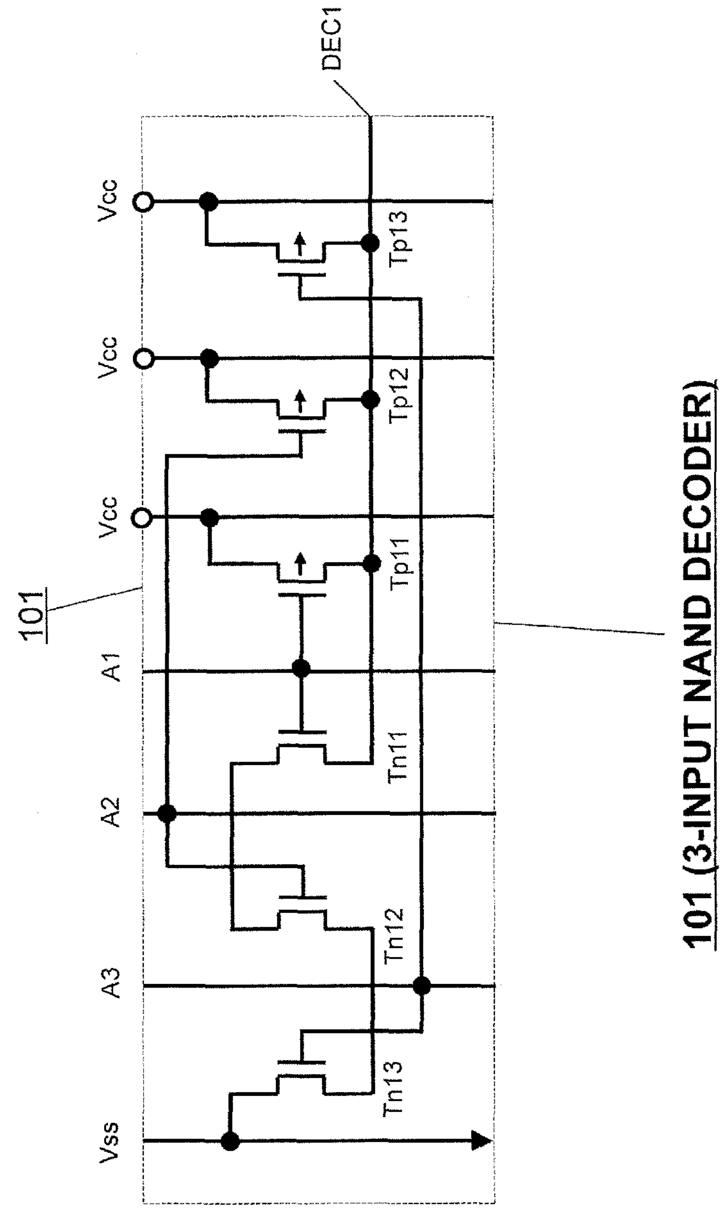
FIG. 1 is an equivalent circuit diagram illustrating a decoder according to a first exemplary embodiment of the present invention.

FIG. 1 illustrates a circuit diagram of transistors arranged in accordance with an arrangement according to an exemplary embodiment. The transistors constitute a 3-input NAND decoder including a 3-input NAND circuit applicable to the present invention. Reference numerals Tp11, Tp12, and Tp13 denote PMOS transistors formed of SGTs, and reference numerals Tn11, Tn12, and Tn13 denote NMOS transistors formed of SGTs. The sources of the PMOS transistors Tp11, Tp12, and Tp13 are connected to a power supply Vcc, and the drains of the PMOS transistors Tp1, Tp12, and Tp13 are connected in common to an output terminal DEC1. The drain of the NMOS transistor Tn11 is connected to the output terminal DEC1, and the source of the NMOS transistor Tn11 is connected to the drain of the NMOS transistor Tn12. The source of the NMOS transistor Tn12 is connected to the drain of the NMOS transistor Tn13, and the source of the NMOS transistor Tn13 is connected to a reference power supply Vss. An address signal line A1 is connected to the gate of the PMOS transistor Tp11 and the gate of the NMOS transistor Tn11, an address signal line A2 is connected to the gate of the PMOS transistor Tp12 and the gate of the NMOS transistor Tn12, and an address signal line A3 is connected to the gate of the PMOS transistor Tp13 and the gate of the NMOS transistor Tn13.

The PMOS transistors Tp11, Tp12, and Tp13 and the NMOS transistors Tn11, Tn12, and Tn13 constitute a 3-input NAND decoder 101. The NAND decoder 101 is a decoder with a negative logic output (the output of a selected decoder is logic "0"). In a case where a positive logic output (the output of a selected decoder is logic "1") is necessary, as described below, a combination of inverters may be used.

Figure 2A:
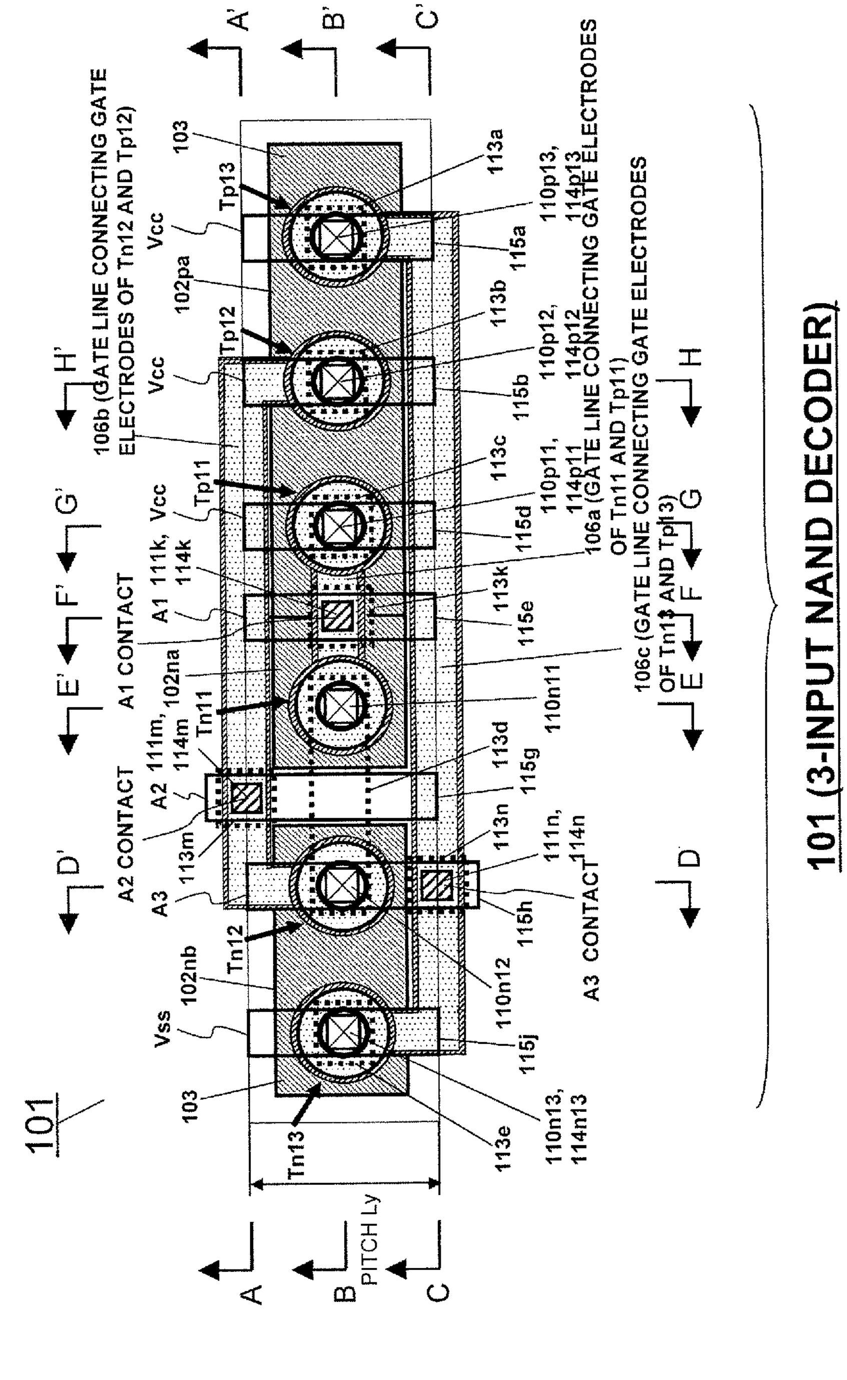
FIG. 2A is a plan view of the decoder according to the first exemplary embodiment of the present invention.
Figure 2B:
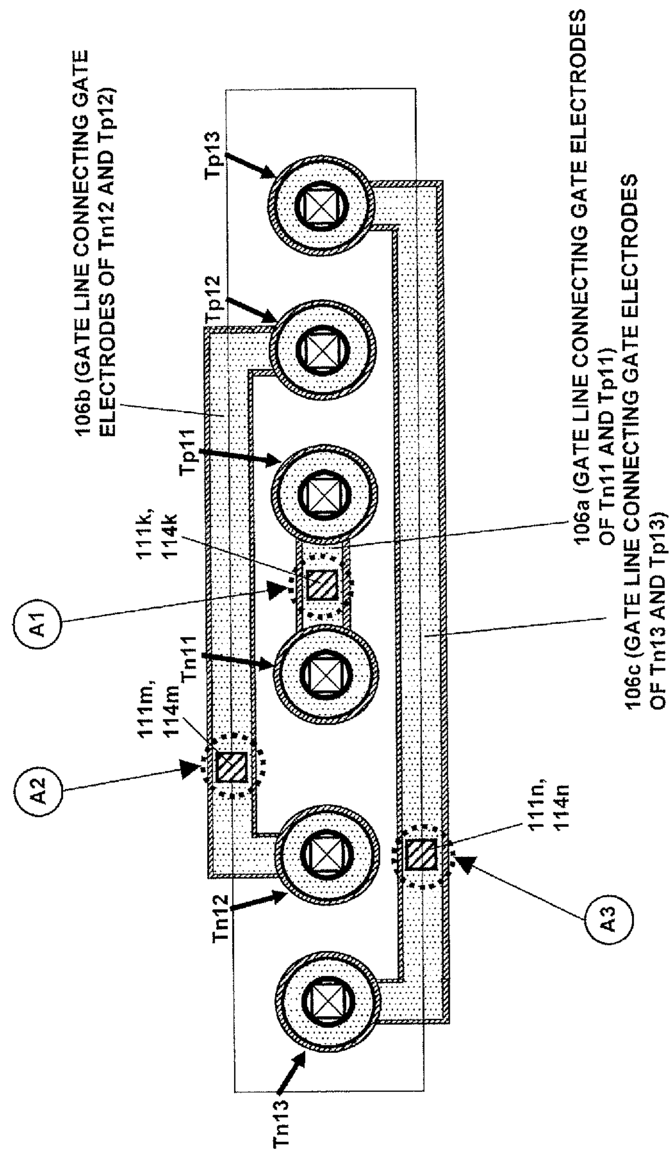
FIG. 2B is a plan view of the decoder according to the first exemplary embodiment of the present invention.
Figure 3A:
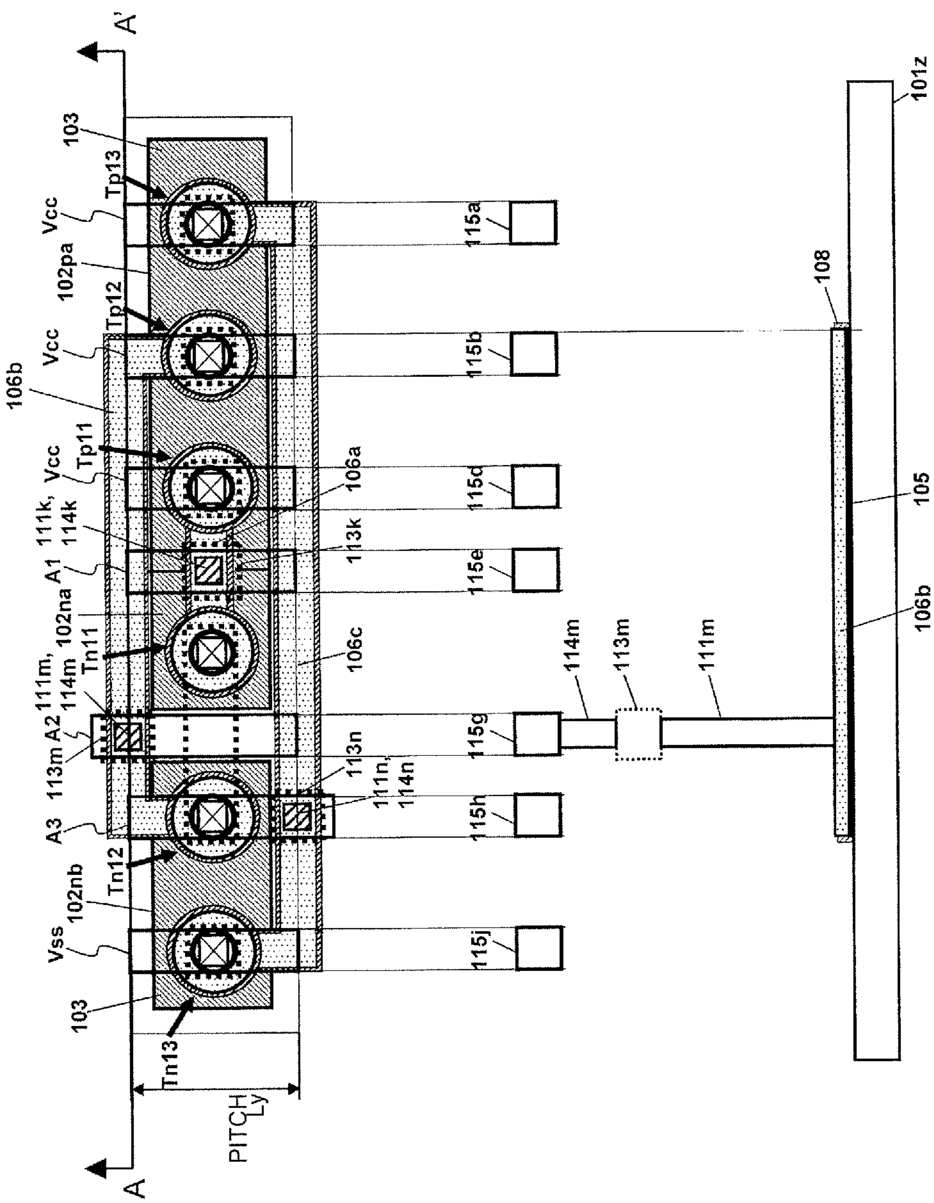
FIG. 3A is a cross-sectional view of the decoder according to the first exemplary embodiment of the present invention.
Figure 3B:
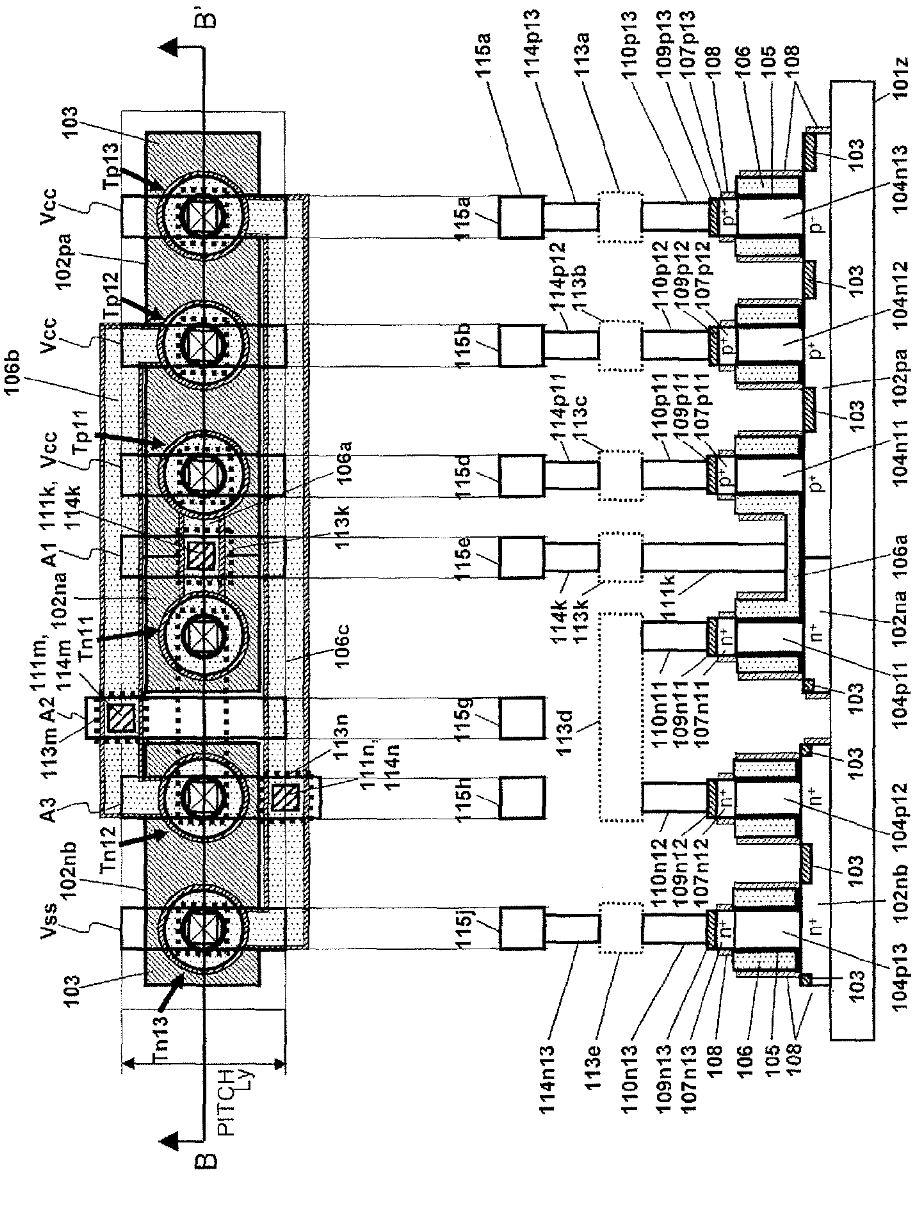
FIG. 3B is a cross-sectional view of the decoder according to the first exemplary embodiment of the present invention.
Figure 3C:
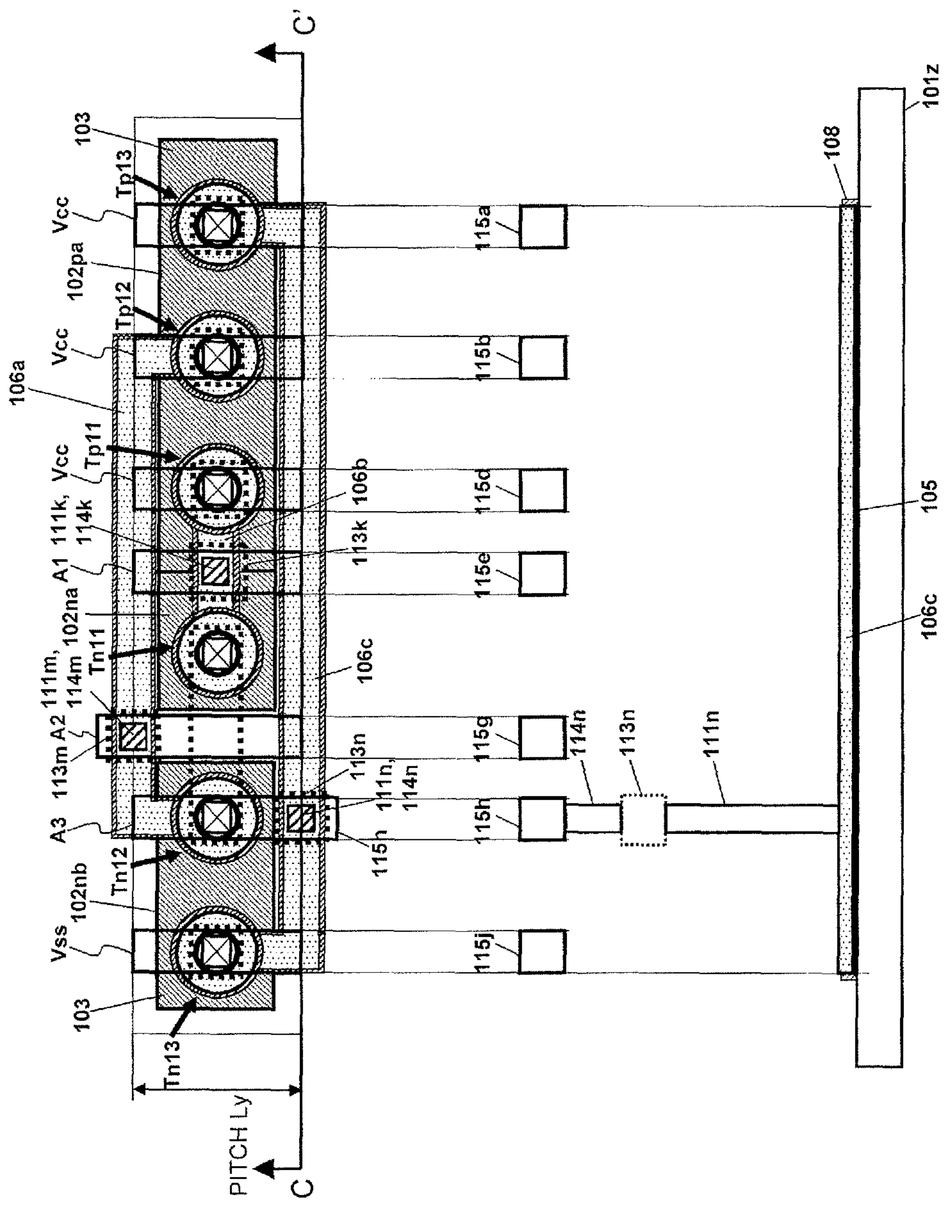
FIG. 3C is a cross-sectional view of the decoder according to the first exemplary embodiment of the present invention.
Figure 3D:
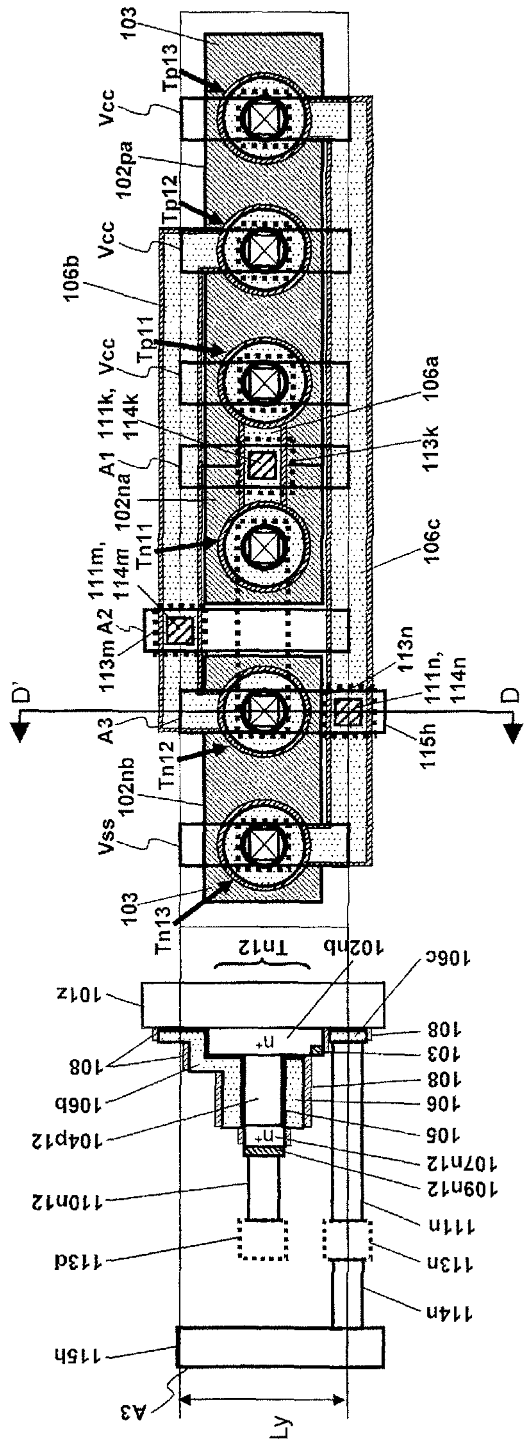
FIG. 3D is a cross-sectional view of the decoder according to the first exemplary embodiment of the present invention.
Figure 3E:
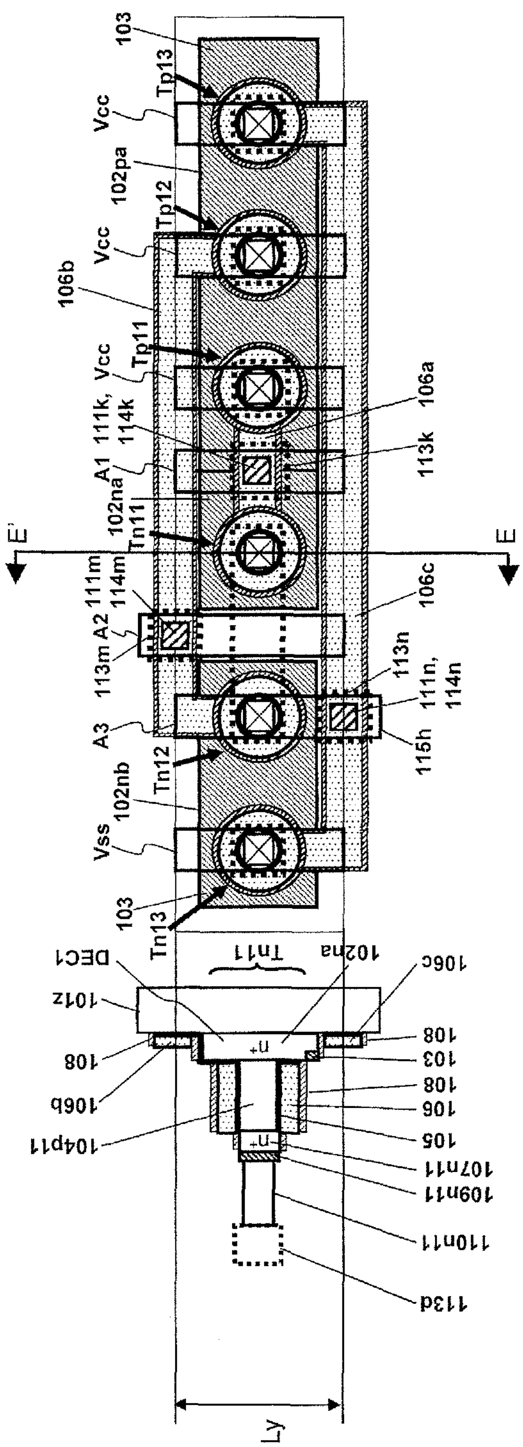
FIG. 3E is a cross-sectional view of the decoder according to the first exemplary embodiment of the present invention.
Figure 3F:
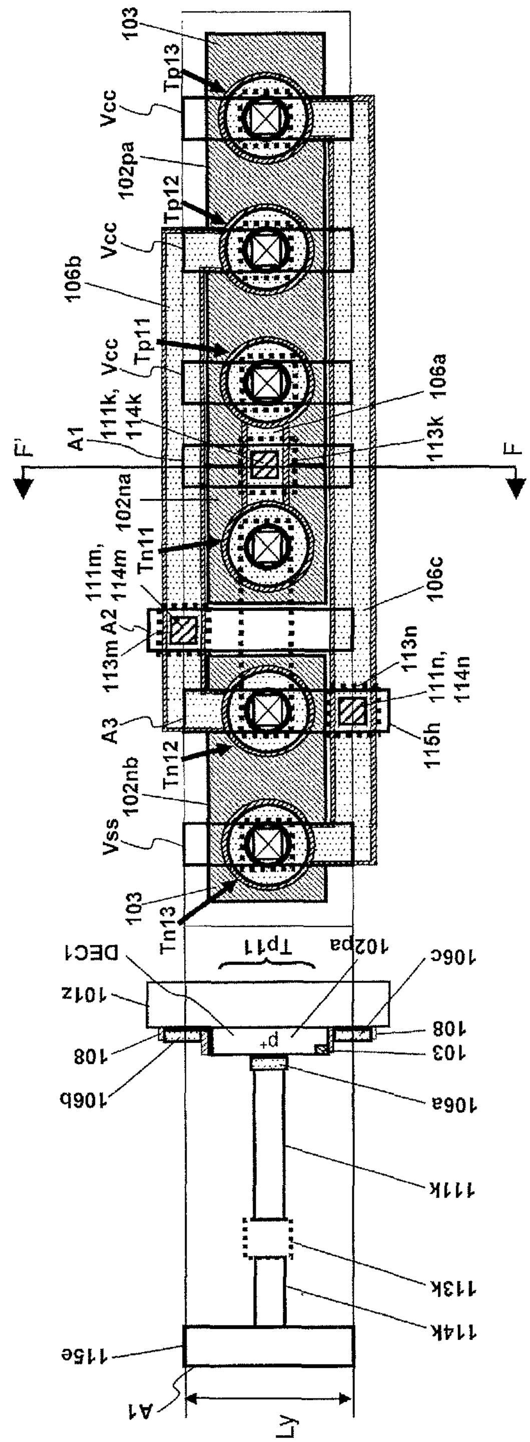
FIG. 3F is a cross-sectional view of the decoder according to the first exemplary embodiment of the present invention.
Figure 3G:
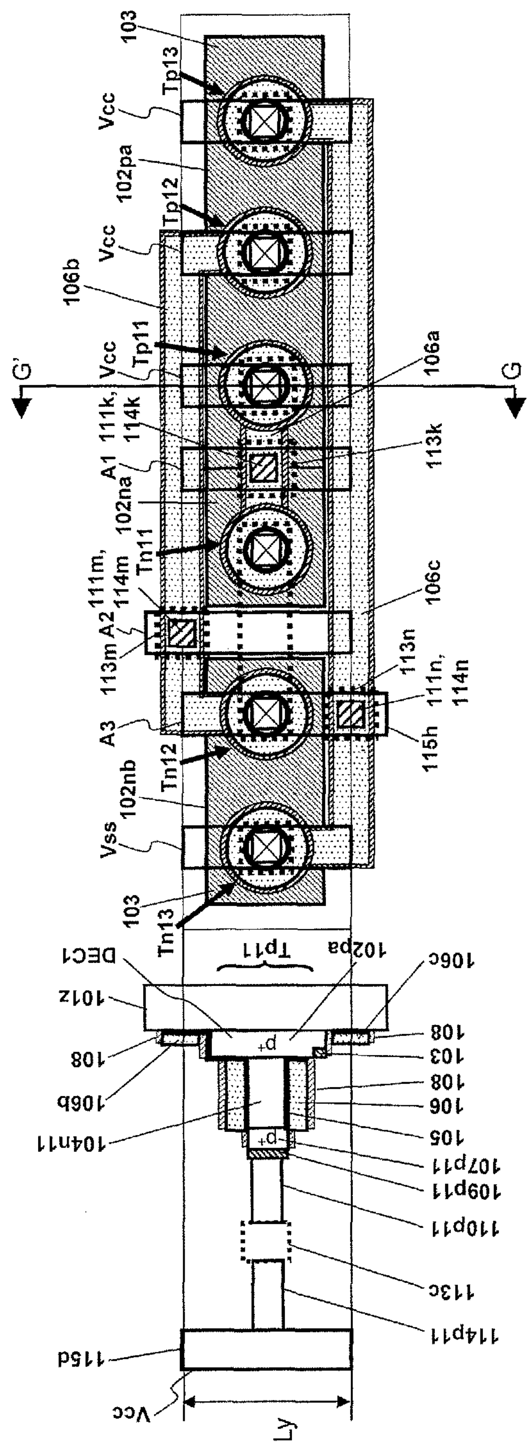
FIG. 3G is a cross-sectional view of the decoder according to the first exemplary embodiment of the present invention.
Figure 3H:
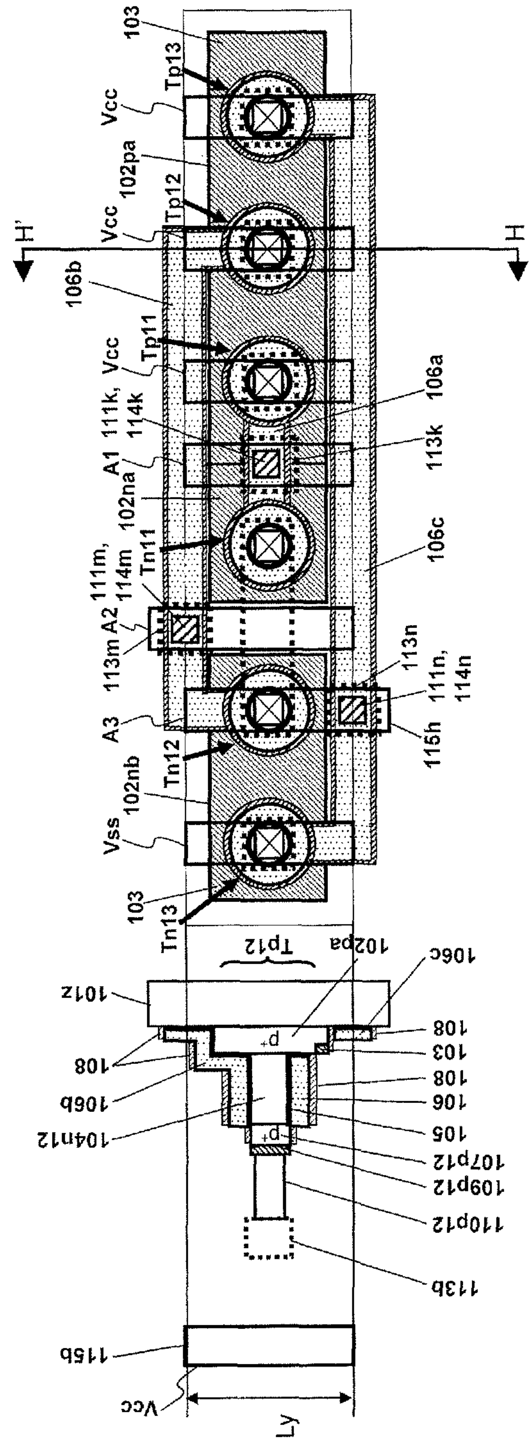
FIG. 3H is a cross-sectional view of the decoder according to the first exemplary embodiment of the present invention.

FIGS. 2A and 2B and FIGS. 3A to 3H illustrate a first exemplary embodiment as an exemplary embodiment in which the equivalent circuit illustrated in FIG. 1 is applied to the present invention. FIG. 2A is a plan view of the layout (arrangement) of the 3-input NAND decoder 101 according to this exemplary embodiment. FIG. 2B is a plan view of transistors and gate lines and illustrates connection relationships between the address signal lines and the gate lines, in particular. FIG. 3A is a cross-sectional view taken along the cut-line A-A' in FIG. 2A, FIG. 3B is a cross-sectional view taken along the cut-line B-B' in FIG. 2A, FIG. 3C is a cross-sectional view taken along the cut-line C-C' in FIG. 2A, FIG. 3D is a cross-sectional view taken along the cut-line D-D' in FIG. 2A, FIG. 3E is a cross-sectional view taken along the cut-line E-E' in FIG. 2A, FIG. 3F is a cross-sectional view taken along the cut-line F-F' in FIG. 2A, FIG. 3G is a cross-sectional view taken along the cut-line G-G' in FIG. 2A, and FIG. 3H is a cross-sectional view taken along the cut-line H-H' in FIG. 2A.

Figure 21:
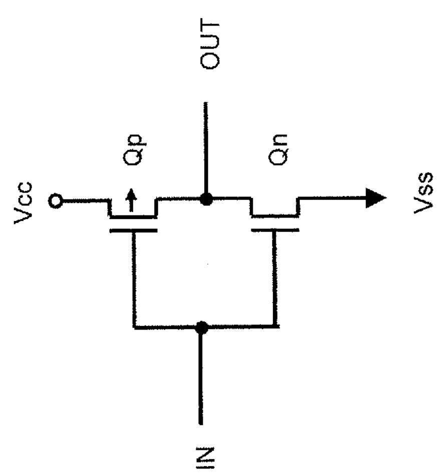
FIG. 21 illustrates an equivalent circuit of an inverter of related art.
Figure 22:
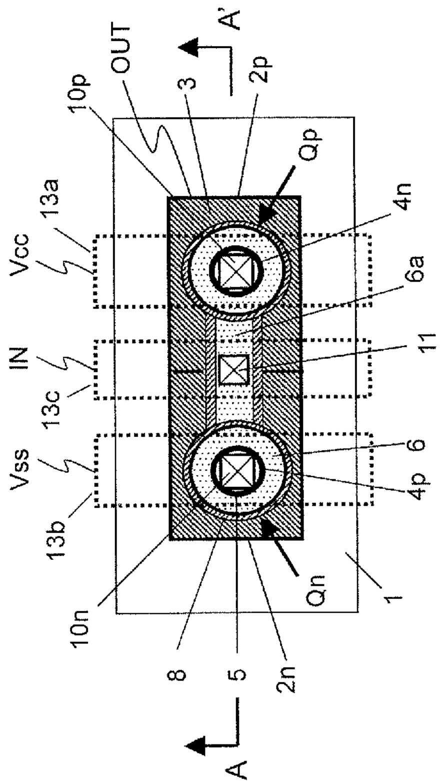
FIG. 22 is a plan view of a traditional inverter constituted by SGTs.
Figure 23:
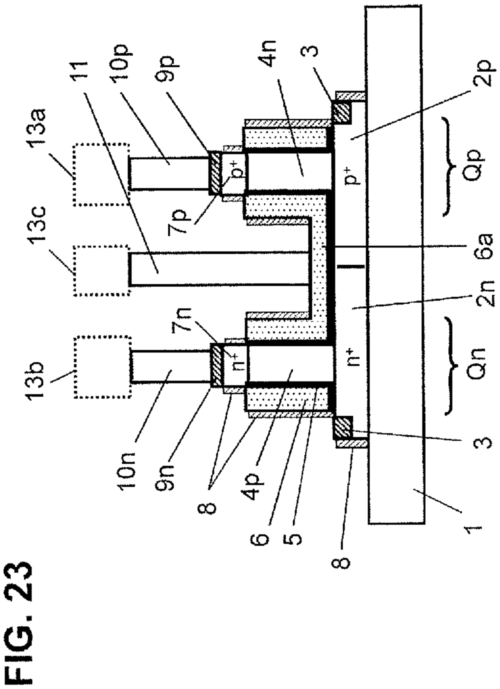
FIG. 23 is a cross-sectional view of the traditional inverter constituted by SGTs.

In FIGS. 2A and 2B and FIGS. 3A to 3H, portions having the same or substantially the same structures as those illustrated in FIGS. 21, 22, and 23 are denoted by equivalent reference numerals in the 100s.

In FIG. 2A, the PMOS transistors Tp13, Tp12, and Tp11 and the NMOS transistors Tn11, Tn12, and Tn13, which are six SGTs constituting the NAND decoder 101 illustrated in FIG. 1, are arranged in a line in a lateral direction (defined as a "first direction") from right to left in this figure.

Further provided in a longitudinal direction (defined as a "second direction perpendicular to the first direction") in this figure are lines 115*a*, 115*b*, 115*d*, 115*e*, 115*g*, 115*h*, and 115*j* of a second metal wiring layer described below. The lines 115*a*, 115*b*, 115*d*, 115*e*, 115*g*, 115*h*, and 115*j* of the second metal wiring layer are arranged to extend in the longitudinal direction (the second direction) and respectively form a power supply line Vcc, a power supply line Vcc, a power supply line Vcc, an address signal line A1, an address signal line A2, an address signal line A3, and a reference power supply line Vss. A feature of this exemplary embodiment is that six transistors constituting a 3-input NAND decoder are arranged in a line to provide efficient circuit connections so as to minimize the area of the arrangement of the transistors. As is apparent from FIGS. 2A and 2B, a gate electrode 106 of the PMOS transistor Tp11 and a gate electrode 106 of the NMOS transistor Tn11 are directly connected to each other by using a gate line 106*a*, a gate electrode 106 of the PMOS transistor Tp12 and a gate electrode 106 of the NMOS transistor Tn12 are directly connected to each other by using a gate line 106*b* (located in an upper portion of FIGS. 2A and 2B), and a gate electrode 106 of the PMOS transistor Tp13 and a gate electrode 106 of the NMOS transistor Tn13 are directly connected to each other by using a gate line 106*c* (located in a lower portion of FIGS. 2A and 2B). This configuration enables a 3-input NAND decoder to be arranged in a line. In addition, address signal lines are connected to gate lines by using lines of the second metal wiring layer that are arranged to extend vertically (in the second direction). Specifically, the address signal line A1, which is connected to the line 115*e* of the second metal wiring layer, is connected to the gate line 106*a* via an A1-contact portion formed of a contact 111*k*, a line 113*k* of a first metal wiring layer, and a contact 114*k*, the address signal line A2, which is connected to the line 115*g* of the second metal wiring layer, is connected to the gate line 106*b* via an A2-contact portion formed of a contact 111*m*, a line 113*m* of the first metal wiring layer, and a contact 114*m*, and the address signal line A3, which is connected to the line 115*h* of the second metal wiring layer, is connected to the gate line 106*c* via an A3-contact portion formed of a contact 111*n*, a line 113*n* of the first metal wiring layer, and a contact 114*n*.

While this exemplary embodiment provides a single 3-input NAND decoder, a plurality of 3-input NAND decoders are arranged in the longitudinal direction at a repeating pitch (size) Ly. The pitch Ly is set because, as described below, the upper gate line 106*b* is shared with an upper adjacent decoder and the lower gate line 106*c* is shared with a lower adjacent decoder. That is, the upper and lower adjacent decoders are each constructed by arranging the 3-input NAND decoder according to this exemplary embodiment in an inverted configuration, which results in the area of the arrangement being minimized. This exemplary embodiment will be described in detail hereinafter.

Planar silicon layers 102*pa*, 102*na*, and 102*nb* are formed on top of an insulating film such as a buried oxide (BOX) film layer 101*z* disposed on a substrate. The planar silicon layers 102*pa*, 102*na*, and 102*nb* are formed as a p+ diffusion layer, an n+ diffusion layer, and an n+ diffusion layer, respectively, through impurity implantation or the like. Reference numeral 103 denotes a silicide layer disposed on surfaces of the planar silicon layers (102*pa*, 102*na*, and 102*nb*). The silicide layer 103 connects the planar silicon layers 102*pa* and 102*na* to each other. Reference numerals 104*n*11, 104*n*12, and 104*n*13 denote n-type silicon pillars, and reference numerals 104*p*11, 104*p*12, and 104*p*13 denote p-type silicon pillars. Reference numeral 105 denotes a gate insulating film that surrounds the silicon pillars 104*n*11, 104*n*12, 104*n*13, 104*p*11, 104*p*12, and 104*p*13. Reference numeral 106 denotes a gate electrode, and reference numerals 106*a*, 106*b*, and 106*c* denote gate lines. The gate insulating film 105 is also formed to underlie the gate electrode 106 and the gate lines 106*a*, 106*b*, and 106*c*.

In top portions of the silicon pillars 104*n*11, 104*n*12, and 104*n*13, p+ diffusion layers 107*p*11, 107*p*12, and 107*p*13 are respectively formed through impurity implantation or the like. In top portions of the silicon pillars 104*p*11, 104*p*12, and 104*p*13, n+ diffusion layers 107*n*11, 107*n*12, and 107*n*13 are respectively formed through impurity implantation or the like. Reference numeral 108 denotes a silicon nitride film for protecting the gate insulating film 105, and reference numerals 109*p*11, 109*p*12, 109*p*13, 109*n*11, 109*n*12, and 109*n*13 denote silicide layers to be respectively connected to the p+ diffusion layers 107*p*11, 107*p*12, and 107*p*13 and the n+ diffusion layers 107*n*11, 107*n*12, and 107*n*13.

Reference numerals 110*p*11, 110*p*12, 110*p*13, 110*n*11, 110*n*12, and 110*n*13 denote contacts that respectively connect the silicide layers 109*p*11, 109*p*12, 109*p*13, 109*n*11, 109*n*12, and 109*n*13 to lines 113*c*, 113*b*, 113*a*, 113*d*, 113 *d*, and 113*e* of a first metal wiring layer. Reference numeral 111*k* denotes a contact that connects the gate line 106*a* to the line 113*k* of the first metal wiring layer, reference numeral 111*m* denotes a contact that connects the gate line 106*b* to the line 113*m* of the first metal wiring layer, and reference numeral 111*n* denotes a contact that connects the gate line 106*c* to the line 113*n* of the first metal wiring layer. Reference numeral 114*p*11 denotes a contact that connects the line 113*c* of the first metal wiring layer to the line 115*d* of the second metal wiring layer, reference numeral 114*p*12 denotes a contact that connects the line 113*b* of the first metal wiring layer to the line 115*b* of the second metal wiring layer, reference numeral 114*p*13 denotes a contact that connects the line 113*a* of the first metal wiring layer to the line 115*a* of the second metal wiring layer, reference numeral 114*n*13 denotes a contact that connects the line 113*e* of the first metal wiring layer to the line 115*j* of the second metal wiring layer, reference numeral 114*k* denotes a contact that connects the line 113*k* of the first metal wiring layer to the line 115*e* of the second metal wiring layer, reference numeral 114*m* denotes a contact that connects the line 113*m* of the first metal wiring layer to the line 115*g* of the second metal wiring layer, and reference numeral 114*n* denotes a contact that connects the line 113*n* of the first metal wiring layer to the line 115*h* of the second metal wiring layer.

The silicon pillar 104*n*11, the lower diffusion layer 102*pa*, the upper diffusion layer 107*p*11, the gate insulating film 105, and the gate electrode 106 constitute the PMOS transistor Tp11. The silicon pillar 104*n*12, the lower diffusion layer 102*pa*, the upper diffusion layer 107*p*12, the gate insulating film 105, and the gate electrode 106 constitute the PMOS transistor Tp12. The silicon pillar 104*n*13, the lower diffusion layer 102*pa*, the upper diffusion layer 107*p*13, the gate insulating film 105, and the gate electrode 106 constitute the PMOS transistor Tp13. The silicon pillar 104*p*11, the lower diffusion layer 102*na*, the upper diffusion layer 107*n*11, the gate insulating film 105, and the gate electrode 106 constitute the NMOS transistor Tn11. The silicon pillar 104*p*12, the lower diffusion layer 102*nb*, the upper diffusion layer 107*n*12, the gate insulating film 105, and the gate electrode 106 constitute the NMOS transistor Tn12. The silicon pillar 104*p*13, the lower diffusion layer 102*nb*, the upper diffusion layer 107*n*13, the gate insulating film 105, and the gate electrode 106 constitute the NMOS transistor Tn13.

Further, the gate line 106*a* is connected to the gate electrode 106 of the PMOS transistor Tp11 and the gate electrode 106 of the NMOS transistor Tn11, the gate line 106*b* is connected to the gate electrode 106 of the PMOS transistor Tp12 and the gate electrode 106 of the NMOS transistor Tn12, and the gate line 106*c* is connected to the gate electrode 106 of the PMOS transistor Tp13 and the gate electrode 106 of the NMOS transistor Tn13.

The lower diffusion layers 102*pa* and 102*na* are connected to each other by using the silicide layer 103 to serve as a common drain of the PMOS transistor Tp11, the PMOS transistor Tp12, the PMOS transistor Tp13 and the NMOS transistor Tn11, and are connected to an output DEC1. The upper diffusion layer 107*p*11, which is the source of the PMOS transistor Tp11, is connected to the line 113*c* of the first metal wiring layer via the silicide layer 109*p*11 and the contact 110*p*11. The line 113*c* of the first metal wiring layer is connected to the line 115*d* of the second metal wiring layer via the contact 114*p*11. The power supply Vcc is supplied to the line 115*d* of the second metal wiring layer.

The upper diffusion layer 107*p*12, which is the source of the PMOS transistor Tp12, is connected to the line 113*b* of the first metal wiring layer via the silicide layer 109*p*12 and the contact 110*p*12. The line 113*b* of the first metal wiring layer is connected to the line 115*b* of the second metal wiring layer via the contact 114$p$12. The power supply Vcc is supplied to the line 115$b$ of the second metal wiring layer.

The upper diffusion layer 107$p$13, which is the source of the PMOS transistor Tp13, is connected to the line 113$a$ of the first metal wiring layer via the silicide layer 109$p$13 and the contact 110$p$13. The line 113$a$ of the first metal wiring layer is connected to the line 115$a$ of the second metal wiring layer via the contact 114$p$13. The power supply Vcc is supplied to the line 115$a$ of the second metal wiring layer.

The upper diffusion layer 107$n$11, which is the source of the NMOS transistor Tn11, is connected to the line 113$d$ of the first metal wiring layer via the silicide layer 109$n$11 and the contact 110$n$11. The upper diffusion layer 107$n$12, which is the drain of the NMOS transistor Tn12, is connected to the line 113$d$ of the first metal wiring layer via the silicide layer 109$n$12 and the contact 110$n$12. Here, the source of the NMOS transistor Tn11 and the drain of the NMOS transistor Tn12 are connected to each other via the line 113$d$ of the first metal wiring layer. Further, the lower diffusion layer 102$nb$, which is covered with the silicide layer 103, serves as a source region of the NMOS transistor Tn12 and a drain region of the NMOS transistor Tn13, to which the source of the NMOS transistor Tn12 and the drain of the NMOS transistor Tn13 are connected, respectively. The upper diffusion layer 107$n$13, which is the source of the NMOS transistor Tn13, is connected to the line 115$j$ of the second metal wiring layer via the silicide layer 109$n$13, the contact 110$n$13, the line 113$e$ of the first metal wiring layer, and the contact 114$n$13. The reference power supply Vss is supplied to the line 115$j$ of the second metal wiring layer.

The line 115$e$ of the second metal wiring layer is supplied with an address signal A1. The line 115$e$ of the second metal wiring layer is connected to the gate line 106$a$ via the contact 114$k$, the line 113$k$ of the first metal wiring layer, and the contact 111$k$, and accordingly the address signal A1 is supplied to the gate electrode 106 of the PMOS transistor Tp11 and the gate electrode 106 of the NMOS transistor Tn11.

The line 115$g$ of the second metal wiring layer is supplied with an address signal A2. The line 115$g$ of the second metal wiring layer is connected to the gate line 106$b$ via the contact 114$m$, the line 113$m$ of the first metal wiring layer, and the contact 111$m$, and accordingly the address signal A2 is supplied to the gate electrode 106 of the PMOS transistor Tp12 and the gate electrode 106 of the NMOS transistor Tn12.

The line 115$h$ of the second metal wiring layer is supplied with an address signal A3. The line 115$h$ of the second metal wiring layer is connected to the gate line 106$c$ via the contact 114$n$, the line 113$n$ of the first metal wiring layer, and the contact 111$n$, and accordingly the address signal A3 is supplied to the gate electrode 106 of the PMOS transistor Tp13 and the gate electrode 106 of the NMOS transistor Tn13.

It is to be noted that, in FIG. 2A, a size in the longitudinal direction (the second direction) is a minimum processing size determined by the size of an SGT, a margin between an SGT and a lower diffusion layer, and an interval between diffusion layers, and is defined as Ly. That is, a plurality of 3-input NAND decoders, each of which is the 3-input NAND decoder 101 according to this exemplary embodiment, can be arranged vertically adjacent to one another at a minimum pitch (minimum interval) Ly.

According to this exemplary embodiment, six SGTs constituting a 3-input NAND decoder are arranged in a line in a first direction and the power supply line Vcc, the reference power supply line Vss, and the address signal lines A1, A2, and A3 are arranged to extend in a second direction perpendicular to the first direction. This configuration provides a semiconductor device including a 3-input NAND decoder with a reduced area without using any extra lines or contact regions.

Second Exemplary Embodiment

Equivalent Circuit Applicable to Exemplary Embodiment of Present Invention

Figure 4:
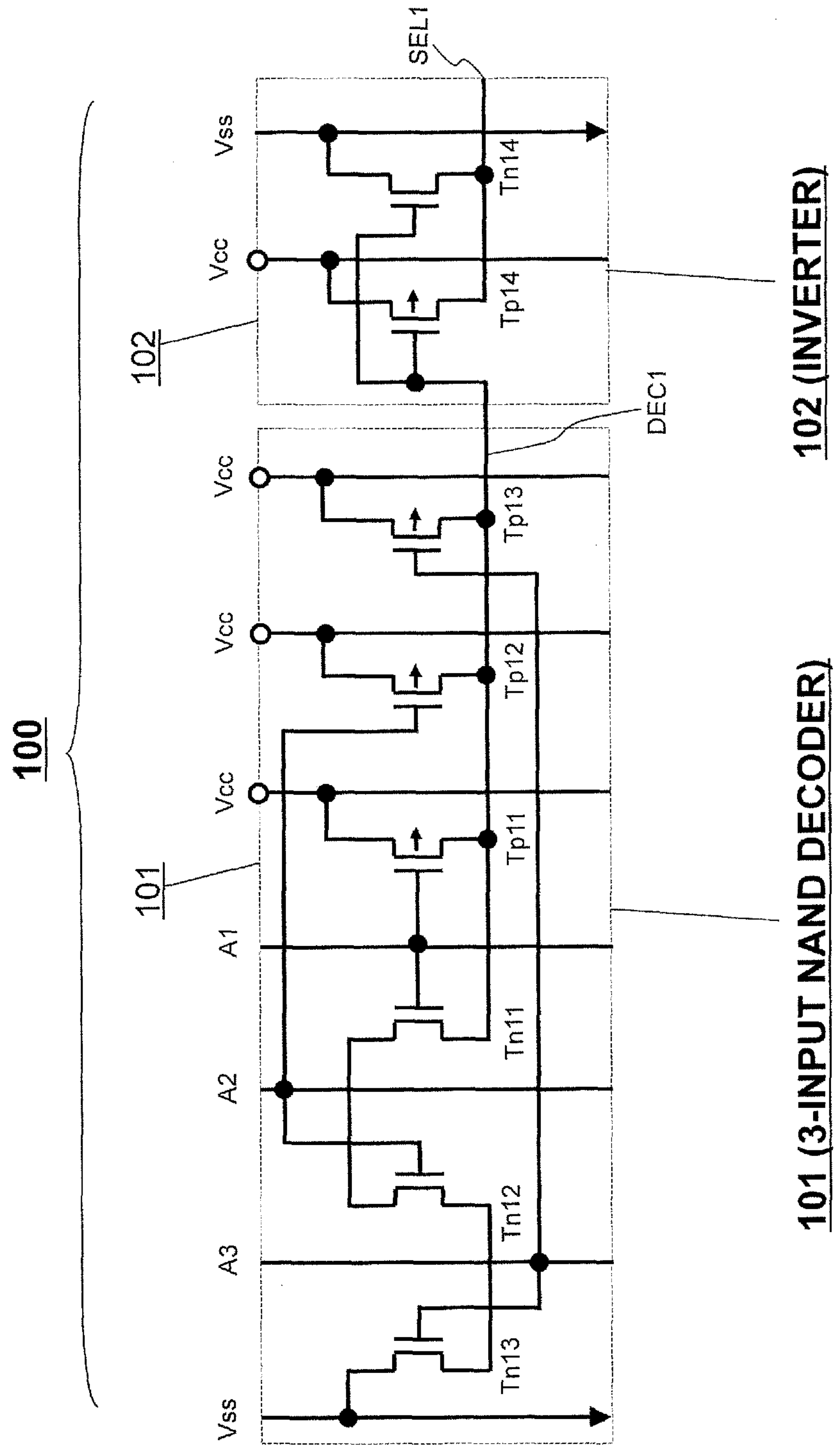
FIG. 4 is an equivalent circuit diagram illustrating a decoder according to a second exemplary embodiment of the present invention.

FIG. 4 illustrates a circuit diagram of a decoder arranged in accordance with an arrangement according to an exemplary embodiment. The decoder includes a 3-input NAND decoder and an inverter applicable to the present invention.

In FIG. 4, a 3-input NAND decoder 101 is the same or substantially the same as that illustrated in FIG. 1. An inverter 102 including a PMOS transistor Tp14 and an NMOS transistor Tn14 is added to the configuration illustrated in FIG. 1 to form a decoder 100. The gate of the PMOS transistor Tp14 and the gate of the NMOS transistor Tn14 are connected in common to the output terminal DEC1 of the 3-input NAND decoder 101. The drain of the PMOS transistor Tp14 and the drain of the NMOS transistor Tn14 are connected in common to serve as a decoder output SEL1. The source of the PMOS transistor Tp14 and the source of the NMOS transistor Tn14 are respectively connected to a power supply Vcc and a reference power supply Vss.

As described above, the addition of the inverter 102 to the NAND decoder 101 with a negative logic output results in the output SEL1 of the decoder 100 being a positive logic output (the output of a selected decoder is logic "1"). Here, the inverter 102 has both a logic inversion function and a buffer function (for amplifying the driving capability of the NAND decoder 101).

Figure 5:
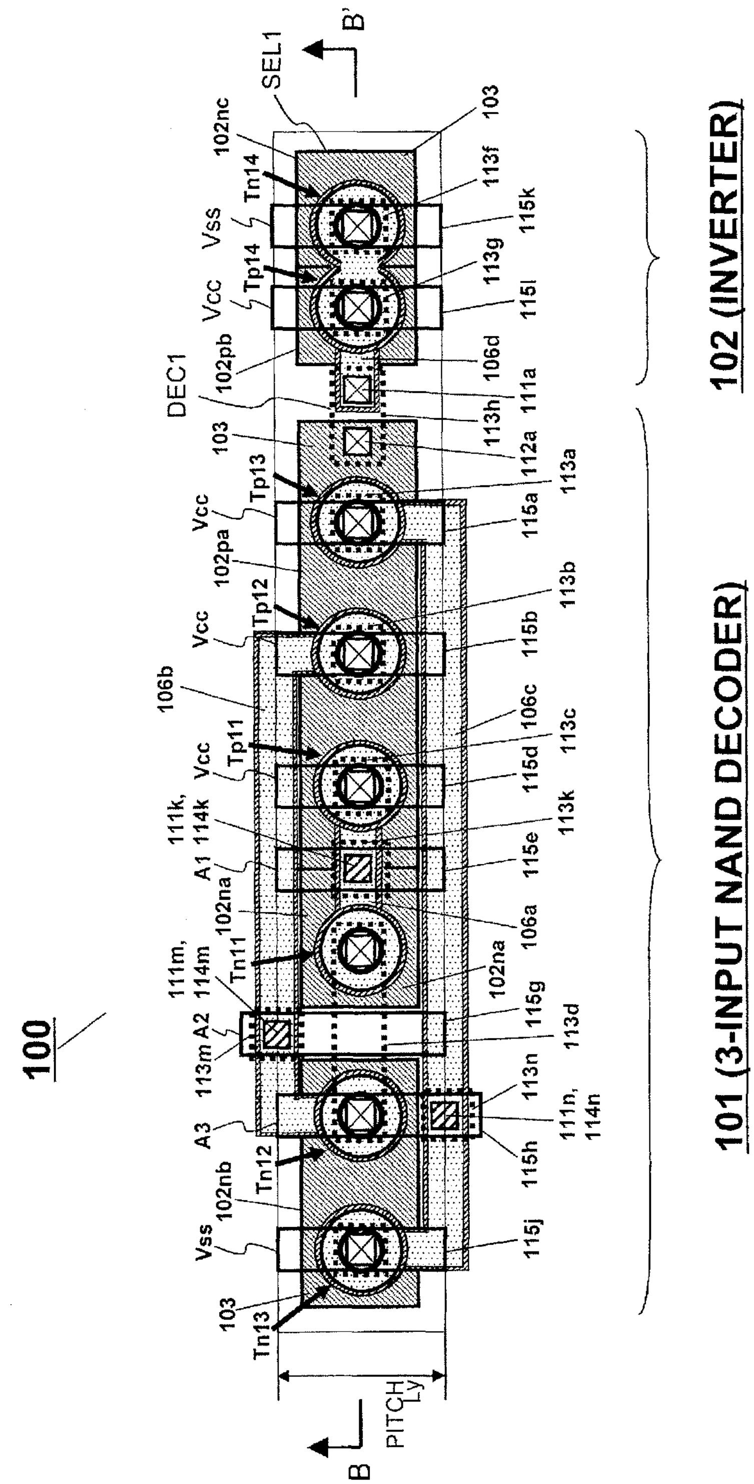
FIG. 5 is a plan view of the decoder according to the second exemplary embodiment of the present invention.
Figure 6:
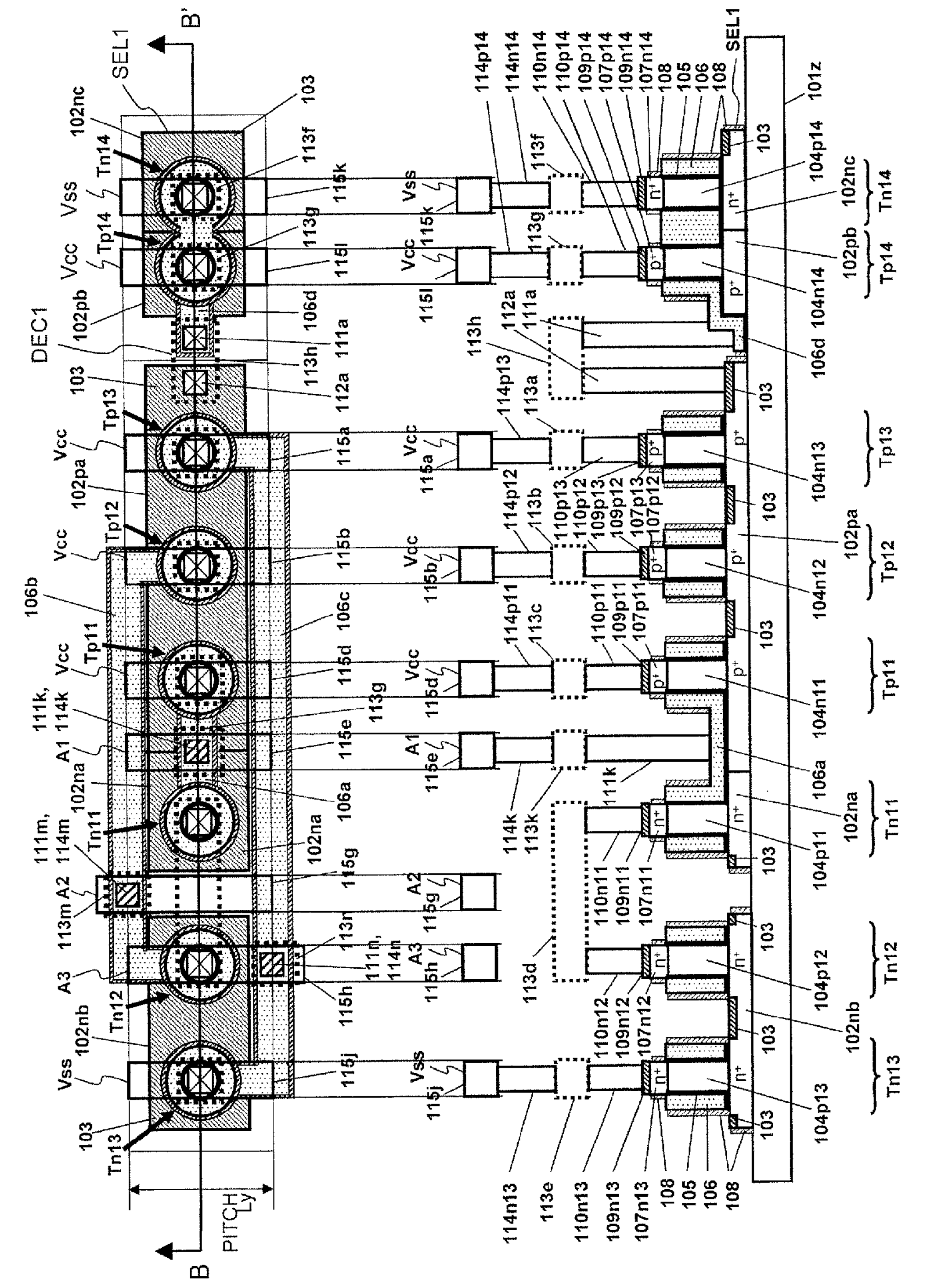
FIG. 6 is a cross-sectional view of the decoder according to the second exemplary embodiment of the present invention.

FIGS. 5 and 6 illustrate a second exemplary embodiment as an exemplary embodiment in which the equivalent circuit illustrated in FIG. 4 is applied to the present invention. FIG. 5 is a plan view of the layout (arrangement) of the 3-input NAND decoder 101 and the inverter 102 according to this exemplary embodiment. FIG. 6 is a cross-sectional view taken along the cut-line B-B' in FIG. 5 and corresponds to FIG. 3B.

In FIGS. 5 and 6, portions having the same or substantially the same structures as those illustrated in FIGS. 2A and 3B are denoted by equivalent reference numerals in the 100s.

In FIG. 5, the NMOS transistor Tn14 and the PMOS transistor Tp14, which constitute the inverter 102, and the six SGTs constituting the 3-input NAND decoder 101, namely, the PMOS transistors Tp13, Tp12, and Tp11 and the NMOS transistors Tn11, Tn12, and Tn13, are arranged in a line in a lateral direction (a first direction) from right to left in this figure.

The 3-input NAND decoder 101 illustrated in FIG. 5 is the same or substantially the same as that illustrated in FIG. 2A, and the inverter 102, which is not illustrated in FIG. 2A, will be described in detail.

Planar silicon layers 102$pb$ and 102$nc$ are formed on top of the insulating film such as the buried oxide (BOX) film layer 101$z$ disposed on the substrate. The planar silicon layers 102$pb$ and 102$nc$ are formed as a p+ diffusion layer and an n+ diffusion layer, respectively, through impurity implantation or the like. Reference numeral 103 denotes a silicide layer disposed on surfaces of the planar silicon layers (102$pb$ and 102$nc$). The silicide layer 103 connects the planar silicon layers 102$pb$ and 102$nc$ to each other. Reference numeral 104$n$14 denotes an n-type silicon pillar, and reference numeral 104_p_14 denotes a p-type silicon pillar. Reference numeral 105 denotes a gate insulating film that surrounds the silicon pillars 104_n_14 and 104_p_14. Reference numeral 106 denotes a gate electrode, and reference numeral 106_d_ denotes a gate line.

In top portion of the silicon pillar 104_n_14, a p+ diffusion layer 107_p_14 is formed through impurity implantation or the like. In top portion of the silicon pillar 104_p_14, an n+ diffusion layer 107_n_14 is formed through impurity implantation or the like. Reference numeral 108 denotes a silicon nitride film for protecting the gate insulating film 105, and reference numerals 109_p_14 and 109_n_14 denote silicide layers to be respectively connected to the p+ diffusion layer 107_p_14 and the n+ diffusion layer 107_n_14.

Reference numerals 110_p_14 and 110_n_14 denote contacts that respectively connect the silicide layers 109_p_14 and 109_n_14 to lines 113_g_ and 113_f_ of the first metal wiring layer. Reference numeral 111_a_ denotes a contact that connects the gate line 106_d_ to a line 113_h_ of the first metal wiring layer. Reference numeral 112_a_ denotes a contact that connects the silicide layer 103, which is the output DEC1 of the 3-input NAND decoder 101, to the line 113_h_ of the first metal wiring layer. Reference numeral 114_p_14 denotes a contact that connects the line 113_g_ of the first metal wiring layer to a line 115_l_ of the second metal wiring layer, and reference numeral 114_n_14 denotes a contact that connects the line 113_f_ of the first metal wiring layer to a line 115_k_ of the second metal wiring layer.

The silicon pillar 104_n_14, the lower diffusion layer 102_pb_, the upper diffusion layer 107_p_14, the gate insulating film 105, and the gate electrode 106 constitute the PMOS transistor Tp14. The silicon pillar 104_p_14, the lower diffusion layer 102_nc_, the upper diffusion layer 107_n_14, the gate insulating film 105, and the gate electrode 106 constitute the NMOS transistor Tn14.

Further, the gate electrode 106 of the PMOS transistor Tp14 and the gate electrode 106 of the NMOS transistor Tn14 are connected in common, to which the gate line 106_d_ is connected.

The lower diffusion layers 102_pb_ and 102_nc_ are connected to each other by using the silicide layer 103 to serve as a common drain of the PMOS transistor Tp14 and the NMOS transistor Tn14, and are connected to the output SEL1.

The upper diffusion layer 107_p_14, which is a source region of the PMOS transistor Tp14, is connected to the line 113_g_ of the first metal wiring layer via the silicide layer 109_p_14 and the contact 110_p_14. The line 113_g_ of the first metal wiring layer is connected to the line 115_l_ of the second metal wiring layer via the contact 114_p_14. The power supply Vcc is supplied to the line 115_l_ of the second metal wiring layer.

The upper diffusion layer 107_n_14, which is a source region of the NMOS transistor Tn14, is connected to the line 113_f_ of the first metal wiring layer via the silicide layer 109_n_14 and the contact 110_n_14. The line 113_f_ of the first metal wiring layer is connected to the line 115_k_ of the second metal wiring layer via the contact 114_n_14. The reference power supply Vss is supplied to the line 115_k_ of the second metal wiring layer.

The line 115_e_ of the second metal wiring layer is supplied with an address signal A1. The line 115_e_ of the second metal wiring layer is connected to the gate line 106_a_ via the contact 114_k_, the line 113_k_ of the first metal wiring layer, and the contact 111_k_, and accordingly the address signal A1 is supplied to the gate electrode 106 of the PMOS transistor Tp11 and the gate electrode 106 of the NMOS transistor Tn11.

The line 115_g_ of the second metal wiring layer is supplied with an address signal A2. The line 115_g_ of the second metal wiring layer is connected to the gate line 106_b_ via the contact 114_m_, the line 113_m_ of the first metal wiring layer, and the contact 111_m_, and accordingly the address signal A2 is supplied to the gate electrode 106 of the PMOS transistor Tp12 and the gate electrode 106 of the NMOS transistor Tn12.

The line 115_h_ of the second metal wiring layer is supplied with an address signal A3. The line 115_h_ of the second metal wiring layer is connected to the gate line 106_c_ via the contact 114_n_, the line 113_n_ of the first metal wiring layer, and the contact 111_n_, and accordingly the address signal A3 is supplied to the gate electrode 106 of the PMOS transistor Tp13 and the gate electrode 106 of the NMOS transistor Tn13.

It is to be noted that, in FIG. 5, as in FIG. 2A, a size in the longitudinal direction (the second direction) is a minimum processing size determined by the size of an SGT, a margin between an SGT and a lower diffusion layer, and an interval between diffusion layers, and is defined as Ly. That is, a plurality of decoders 100, each of which is the decoder 100 (the 3-input NAND decoder 101 and the inverter 102) according to this exemplary embodiment, can be arranged vertically adjacent to one another at a minimum pitch (minimum interval) Ly.

According to this exemplary embodiment, six SGTs constituting a 3-input NAND decoder and two SGTs constituting an inverter are arranged in a line in a first direction and the power supply line Vcc, the reference power supply line Vss, and the address signal lines A1, A2, and A3 are arranged to extend in a second direction perpendicular to the first direction. This configuration provides a semiconductor device including a decoder (a 3-input NAND decoder and an inverter) with a reduced area without using any extra lines or contact regions.

Third Exemplary Embodiment

Equivalent Circuit Applicable to Exemplary Embodiment of Present Invention

Figure 7:
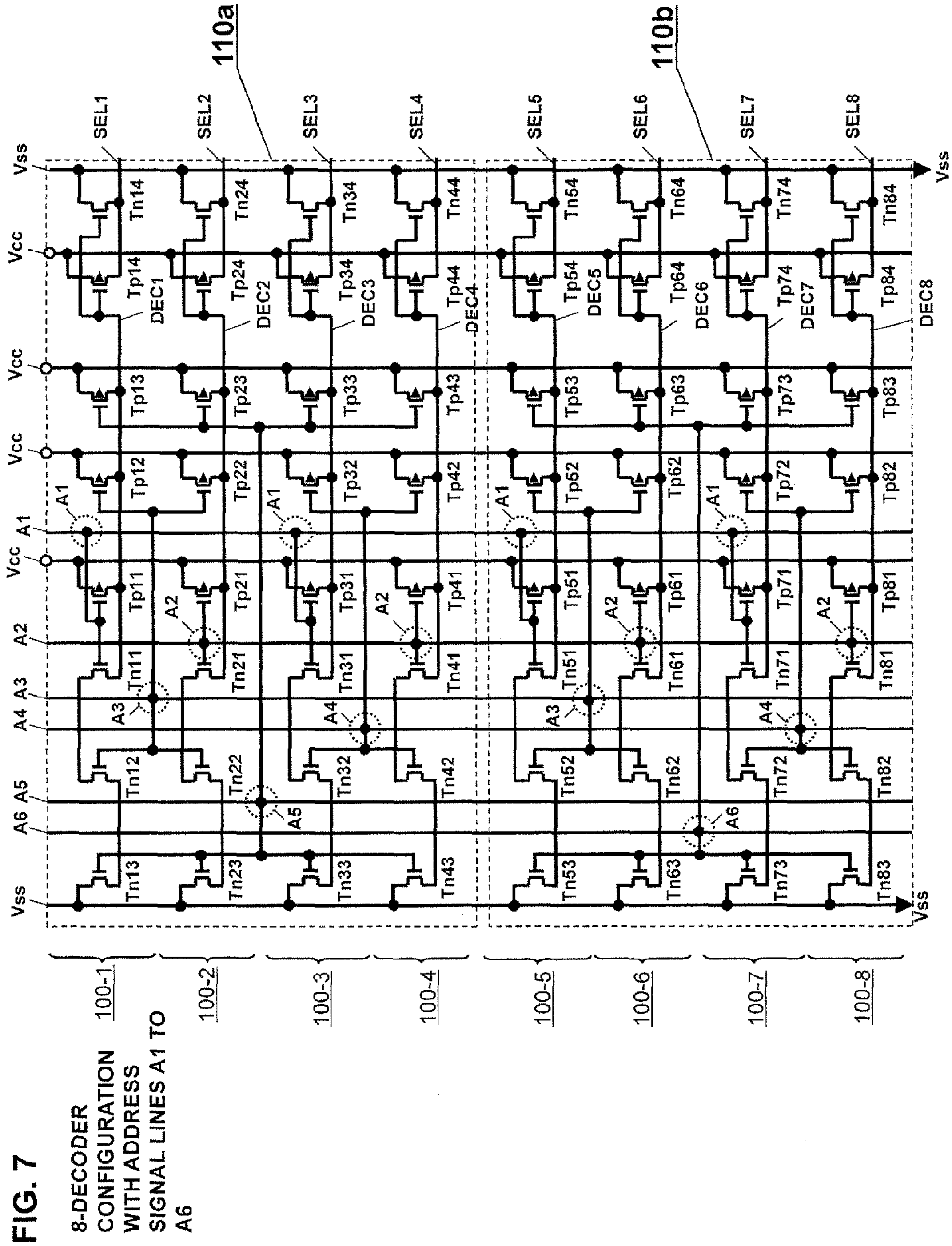
FIG. 7 is an equivalent circuit diagram illustrating a decoder according to a third exemplary embodiment of the present invention.

FIG. 7 illustrates an equivalent circuit diagram of decoders, each constructed by arranging a plurality of 3-input NAND decoders and a plurality of inverters applicable to the present invention.

Six address signal lines A1, A2, A3, A4, A5, and A6 are provided, in which the address signal lines A1 and A2 are selectively connected to the gate of a PMOS transistor Tpk1 (where k denotes a natural number) and the gate of an NMOS transistor Tnk1, the address signal lines A3 and A4 are selectively connected to the gate of a PMOS transistor Tpk2 and the gate of an NMOS transistor Tnk2, and the address signal lines A5 and A6 are selectively connected to the gate of a PMOS transistor Tpk3 and the gate of an NMOS transistor Tnk3. Eight decoders 100-1 to 100-8 are formed by using the six address signals A1 to A6. The address signal lines A1, A3, and A5 are connected to the decoder 100-1. The address signal lines A2, A3, and A5 are connected to the decoder 100-2. The address signal lines A1, A4, and A5 are connected to the decoder 100-3. The address signal lines A2, A4, and A5 are connected to the decoder 100-4. The address signal lines A1, A3, and A6 are connected to the decoder 100-5. The address signal lines A2, A3, and A6 are connected to the decoder 100-6. The address signal lines A1, A4, and A6 are connected to the decoder 100-7. The address signal lines A2, A4, and A6 are connected to the decoder 100-8.

Portions at which address signal lines are connected are indicated by the broken-line circles.

As described below, the address signal line A3 is connected in common to the decoders 100-1 and 100-2 and is also connected in common to the decoder 100-5 and the decoder 100-6. The address signal line A4 is connected in common to the decoders 100-3 and 100-4 and is also connected in common to the decoders 100-7 and 100-8. The address signal line A5 is connected in common to the decoders 100-1 to 100-4, and the address signal line A6 is connected in common to the decoders 100-5 to 100-8.

FIG. 8 illustrates an address map of the eight decoders illustrated in FIG. 7. An address signal line to be connected to each of the decoder outputs DEC1/SEL1 to DEC8/SEL8 is marked with a circle. Connections are made by using contacts, as described below.

Figure 9A:
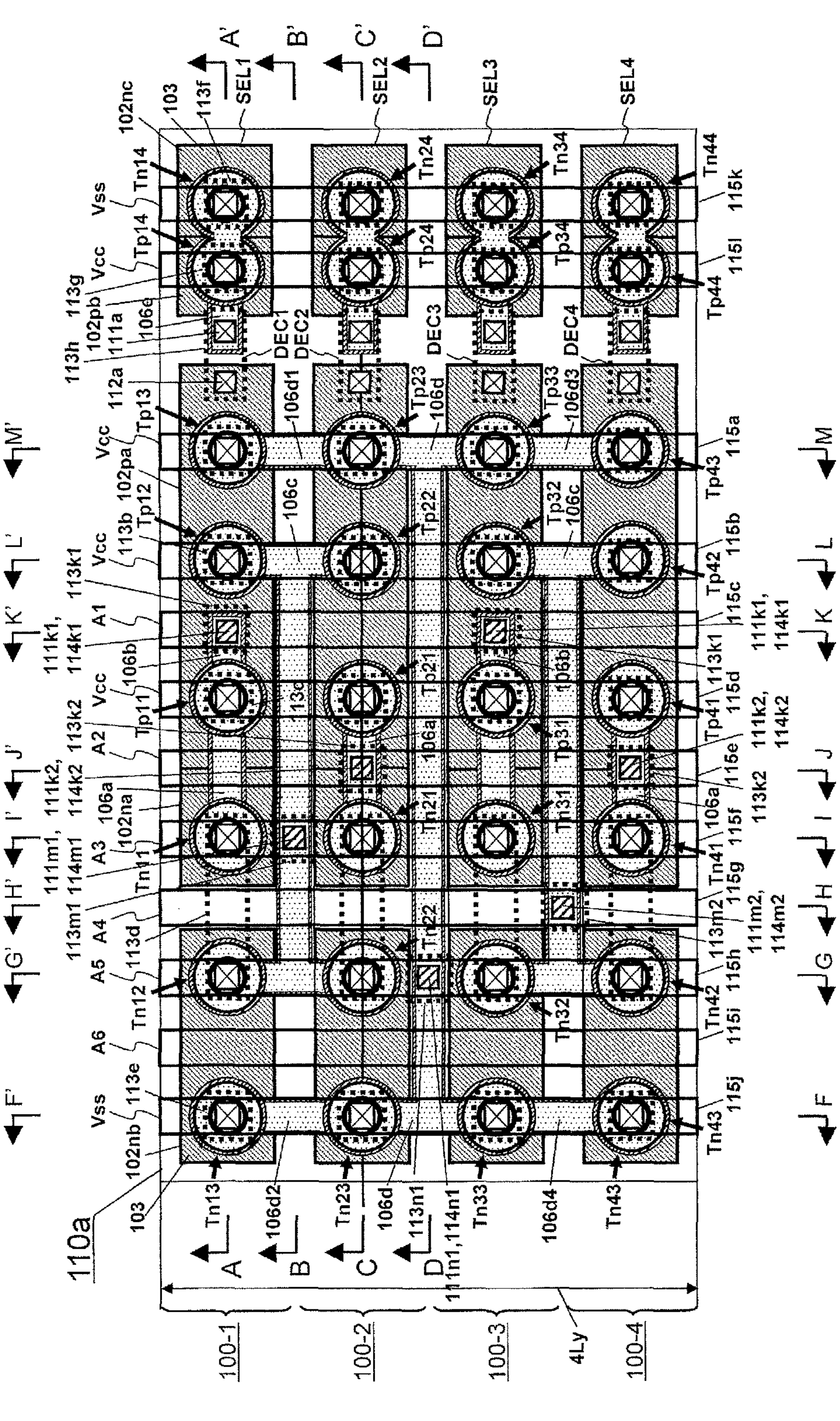
FIG. 9A is a plan view of the decoder according to the third exemplary embodiment of the present invention.
Figure 9C:
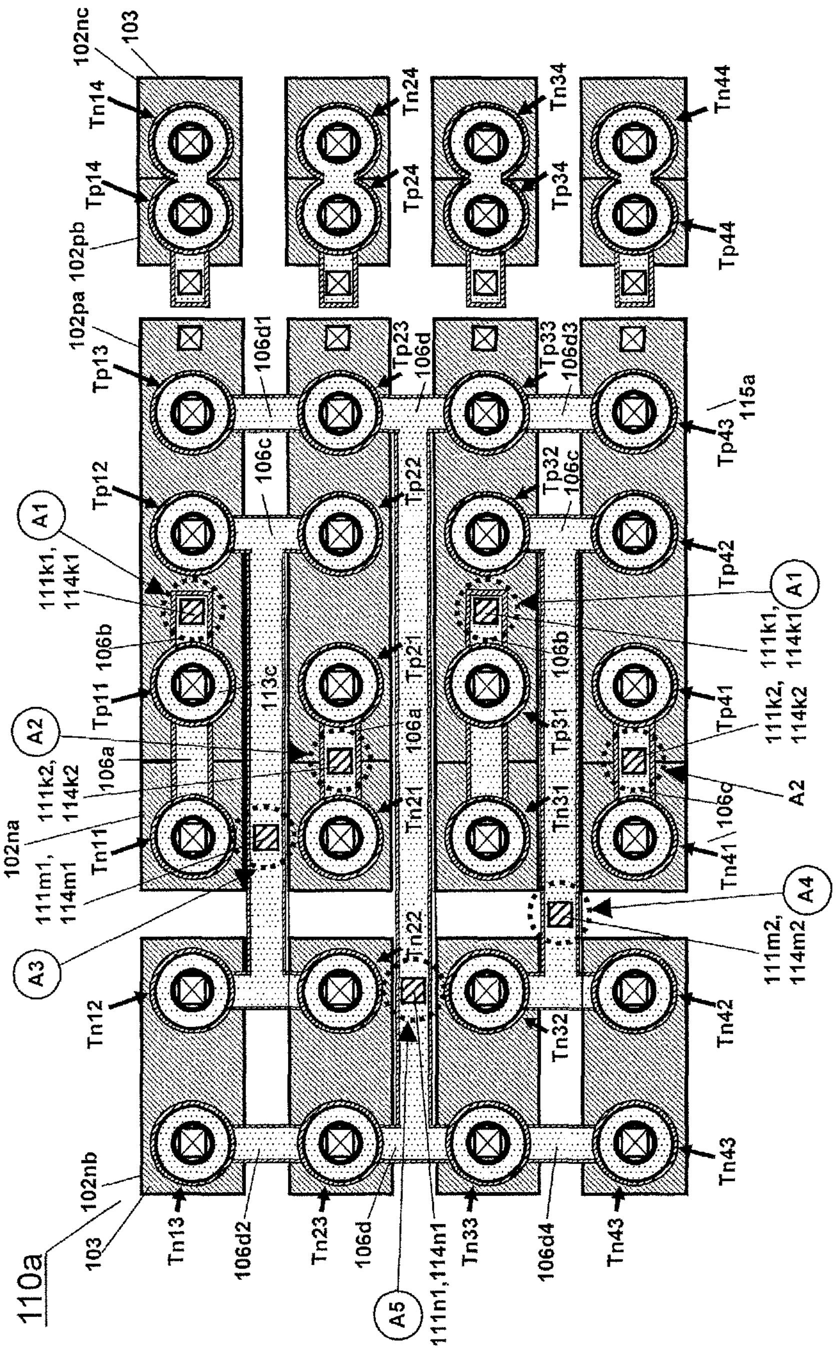
FIG. 9C is a plan view of the decoder according to the third exemplary embodiment of the present invention.
Figure 9D:
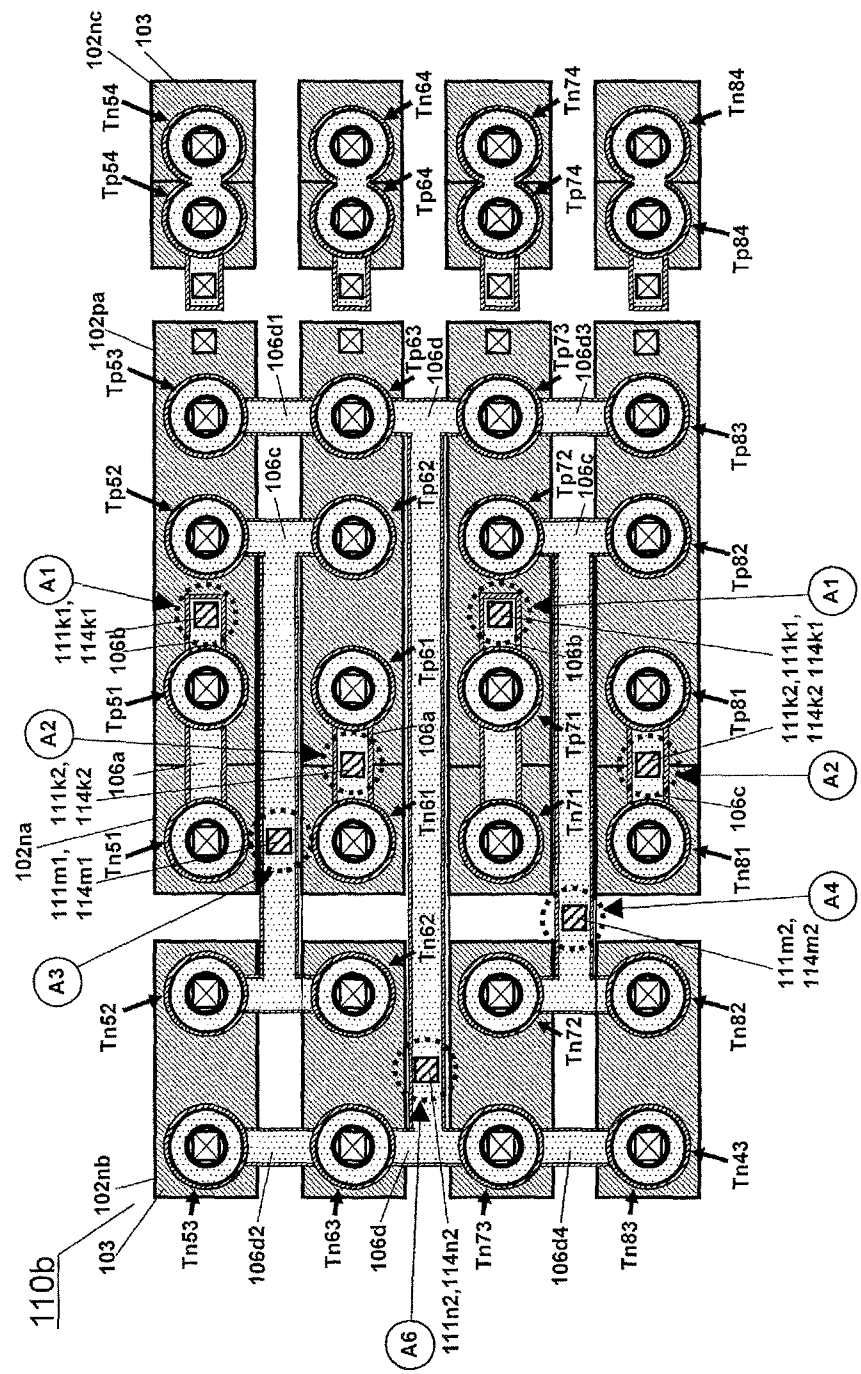
FIG. 9D is a plan view of the decoder according to the third exemplary embodiment of the present invention.

FIGS. 9A to 9D and FIGS. 10A to 10M illustrate a third exemplary embodiment. This exemplary embodiment illustrates an implementation of the equivalent circuit illustrated in FIG. 7, in which the eight decoders 100-1 to 100-8, each of which is the decoder 100 illustrated in FIG. 5, are arranged vertically (in the second direction) in the figures adjacent to one another at a minimum pitch Ly. In the arrangement, the decoders 100-1, 100-3, 100-5, and 100-7 are each constructed by arranging the decoder 100 illustrated in FIG. 5 in a vertically inverted configuration, and the decoders 100-2, 100-4, 100-6, and 100-8 are each constructed by arranging the decoder 100 illustrated in FIG. 5 in a non-inverted configuration. This configuration allows each decoder to share the gate line 106*c* or the gate line 106*d* of an adjacent decoder and can result in the pitch in the longitudinal direction being minimized. FIGS. 9A and 9B are plan views of the layout (arrangement) of the 3-input NAND decoders and the inverters according to the third exemplary embodiment of the present invention, and FIGS. 9C and 9D illustrate only the lower diffusion layers, the transistors, and the gate lines depicted in the plan views of FIGS. 9A and 9B to facilitate the understanding of the connections between the address signal lines and the gate lines.

Figure 10A:
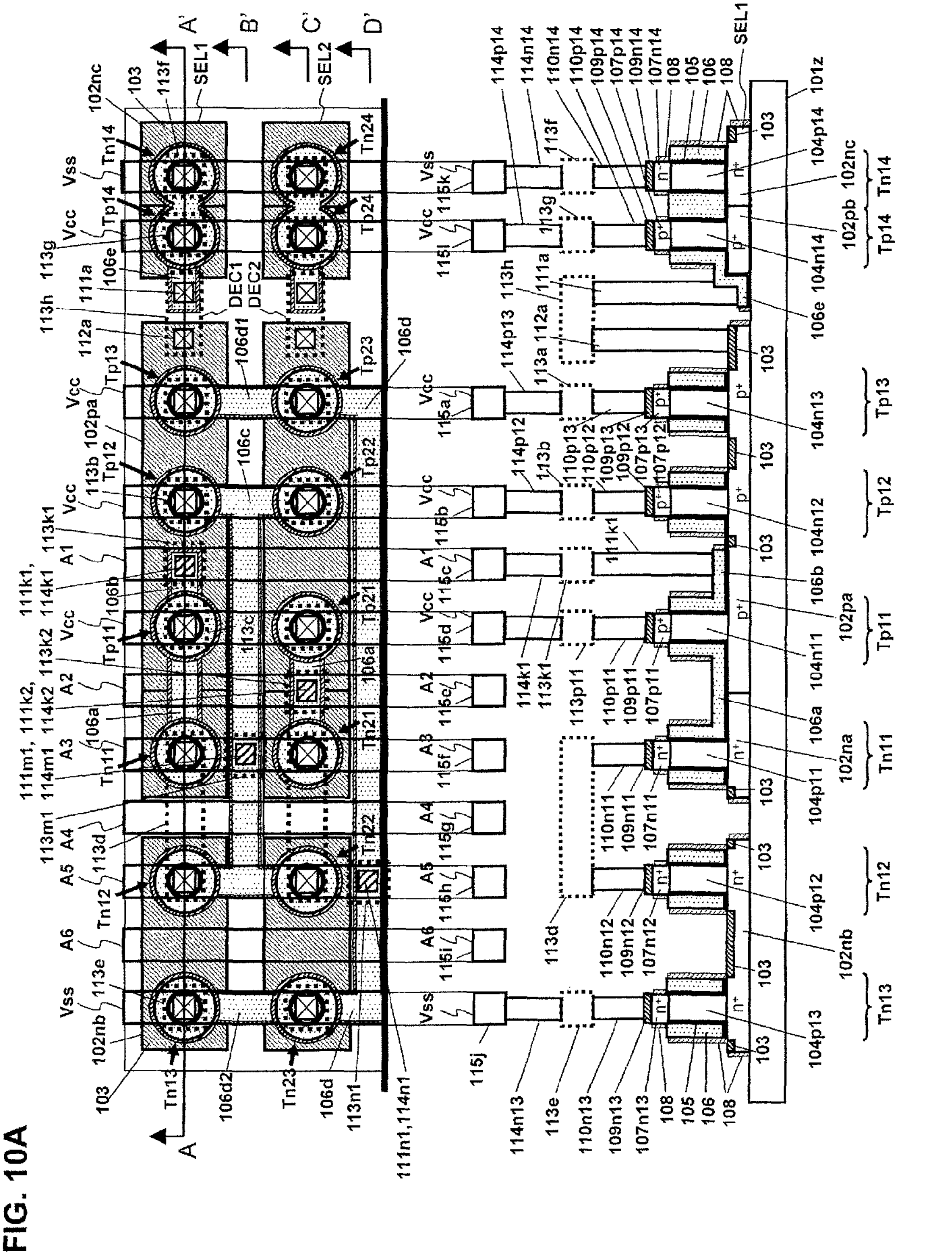
FIG. 10A is a cross-sectional view of the decoder according to the third exemplary embodiment of the present invention.
Figure 10B:
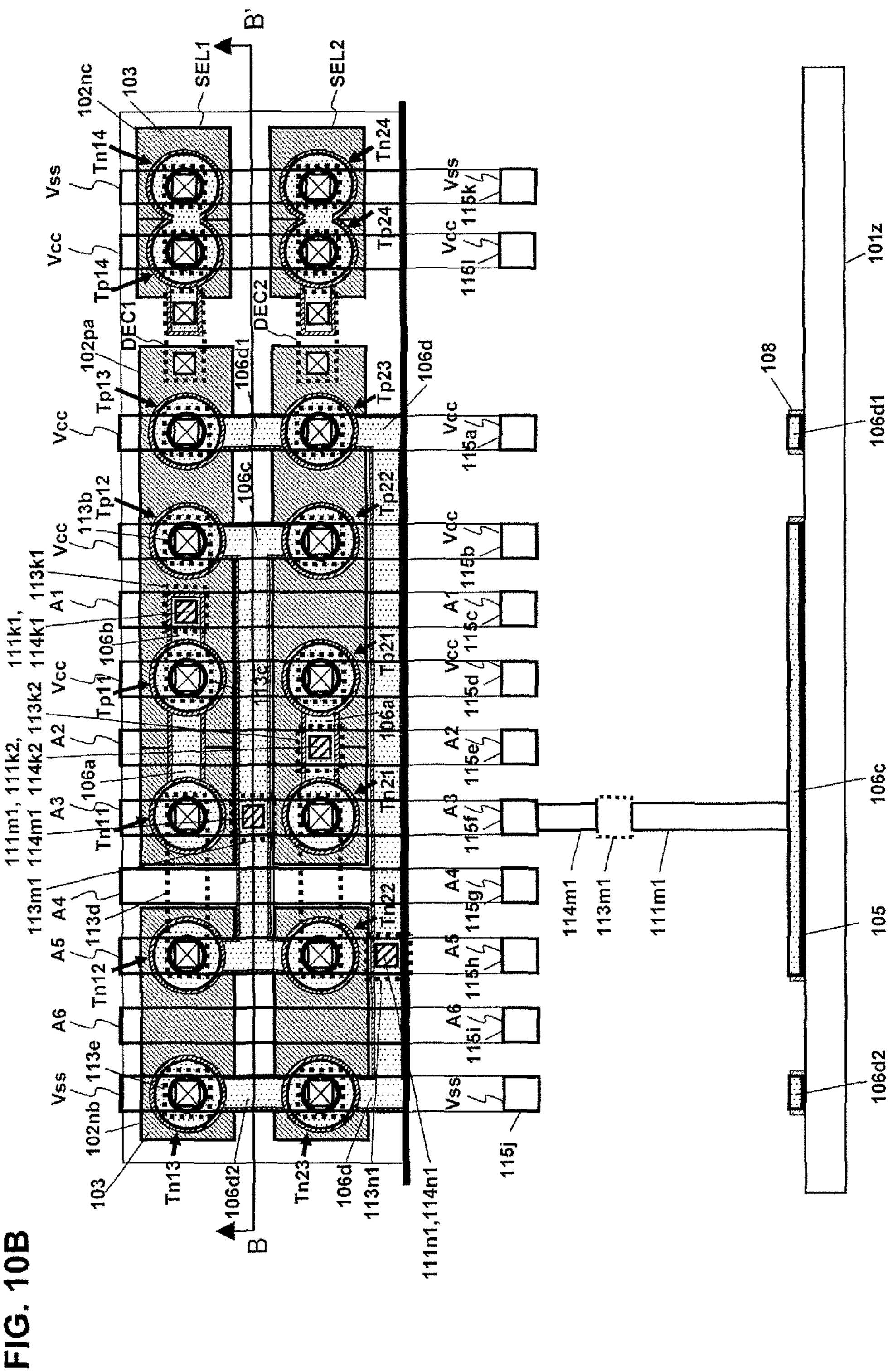
FIG. 10B is a cross-sectional view of the decoder according to the third exemplary embodiment of the present invention.
Figure 10C:
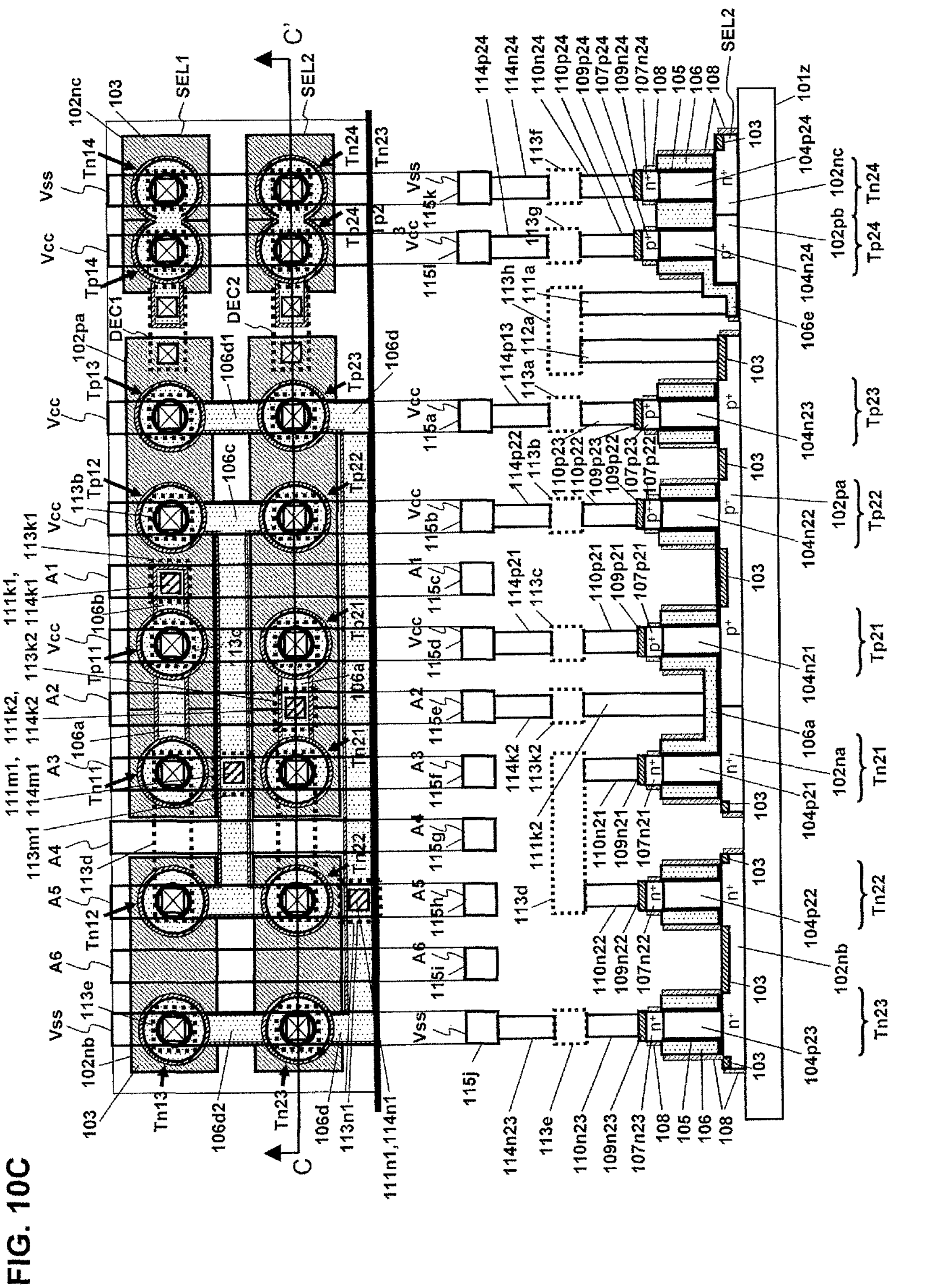
FIG. 10C is a cross-sectional view of the decoder according to the third exemplary embodiment of the present invention.
Figure 10D:
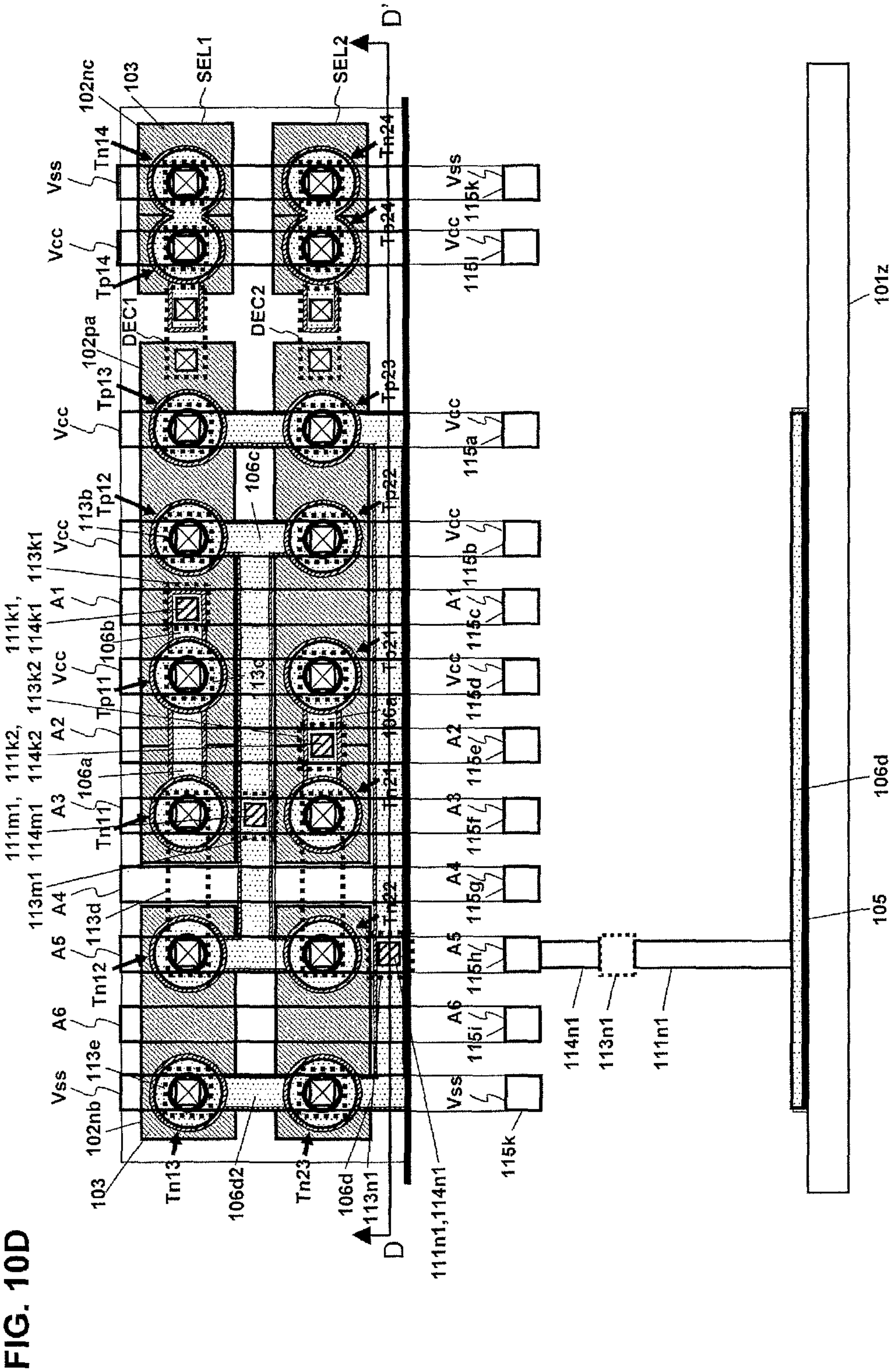
FIG. 10D is a cross-sectional view of the decoder according to the third exemplary embodiment of the present invention.
Figure 10E:
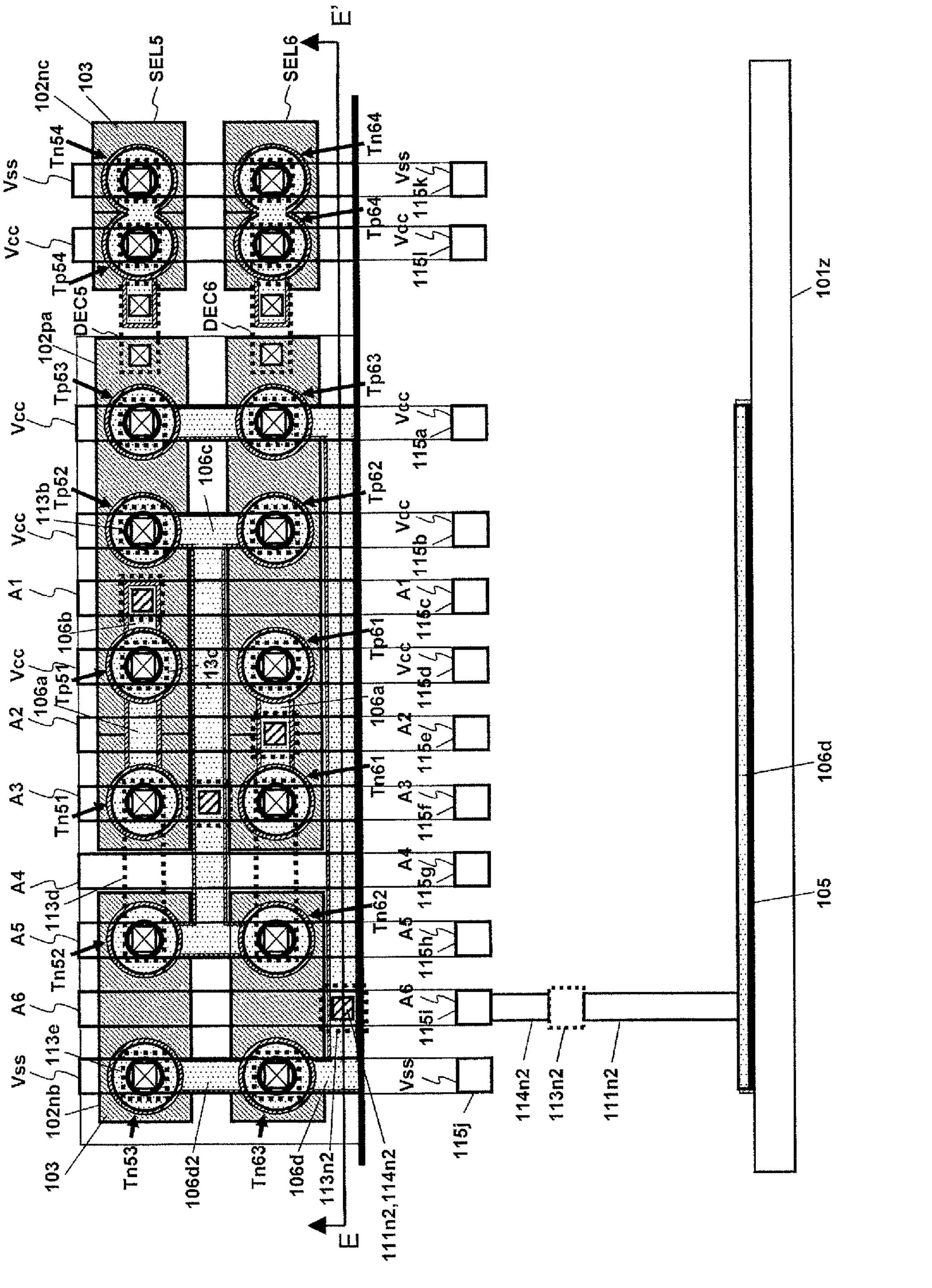
FIG. 10E is a cross-sectional view of the decoder according to the third exemplary embodiment of the present invention.
Figure 10F:
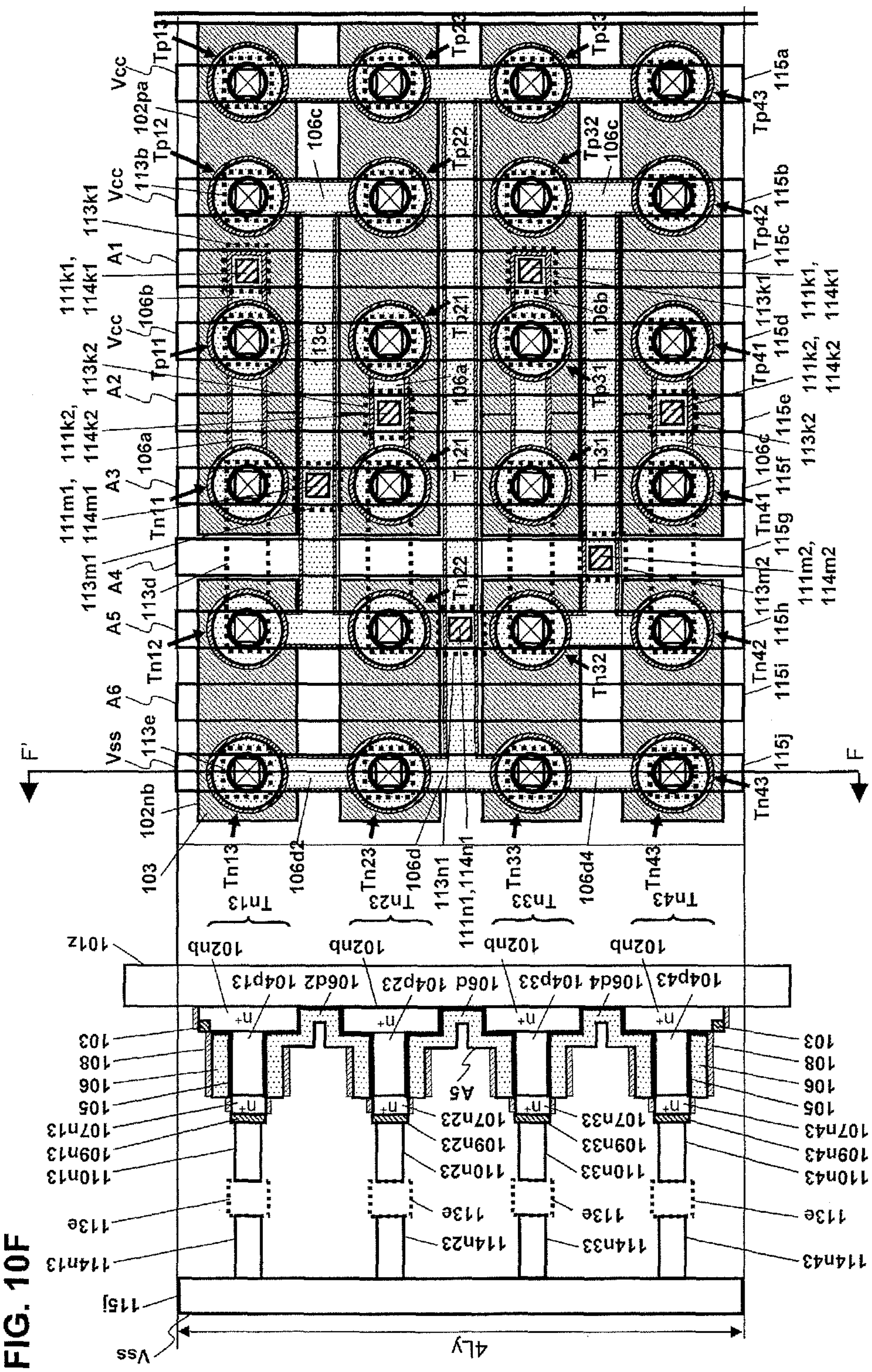
FIG. 10F is a cross-sectional view of the decoder according to the third exemplary embodiment of the present invention.
Figure 10G:
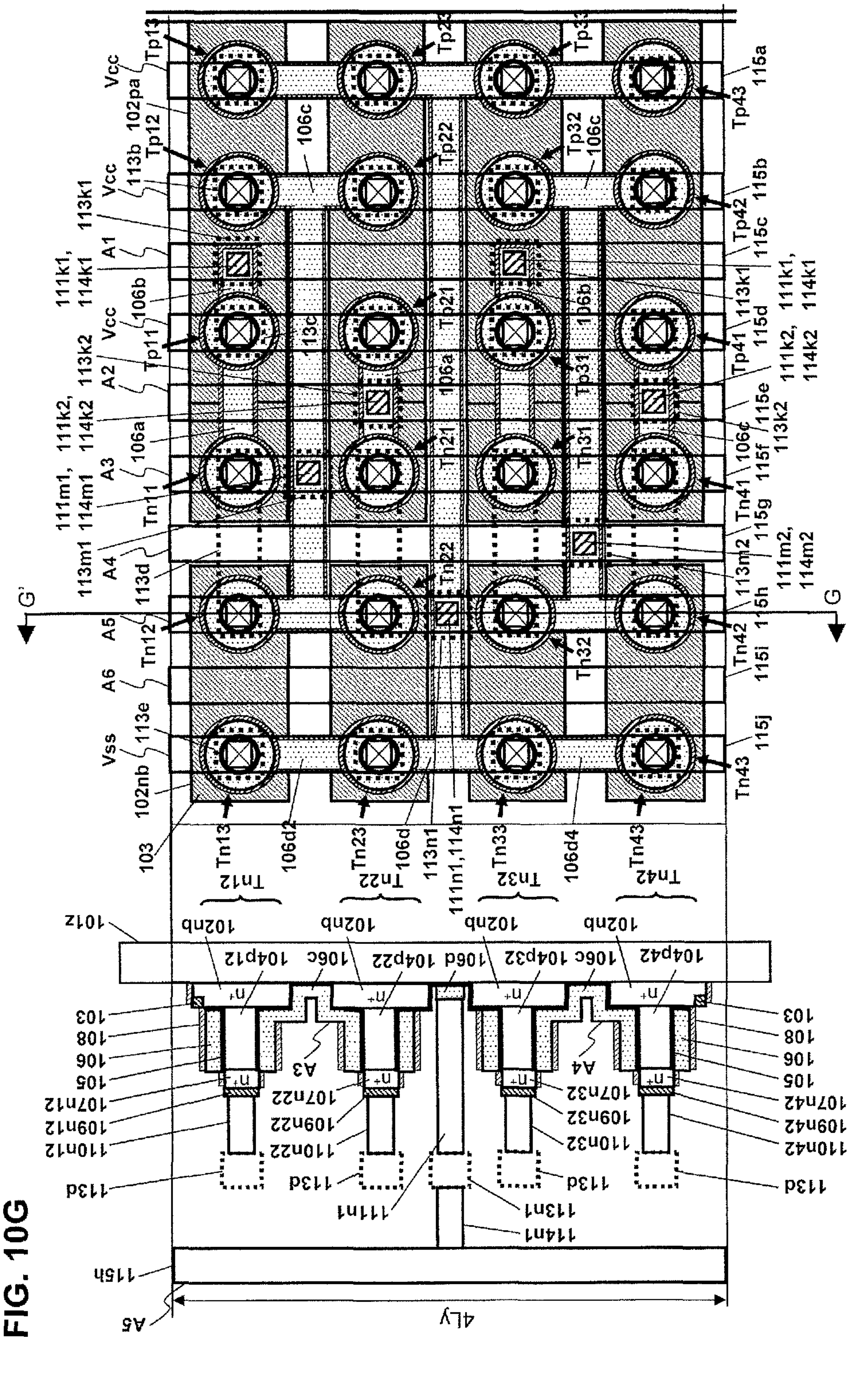
FIG. 10G is a cross-sectional view of the decoder according to the third exemplary embodiment of the present invention.
Figure 10H:
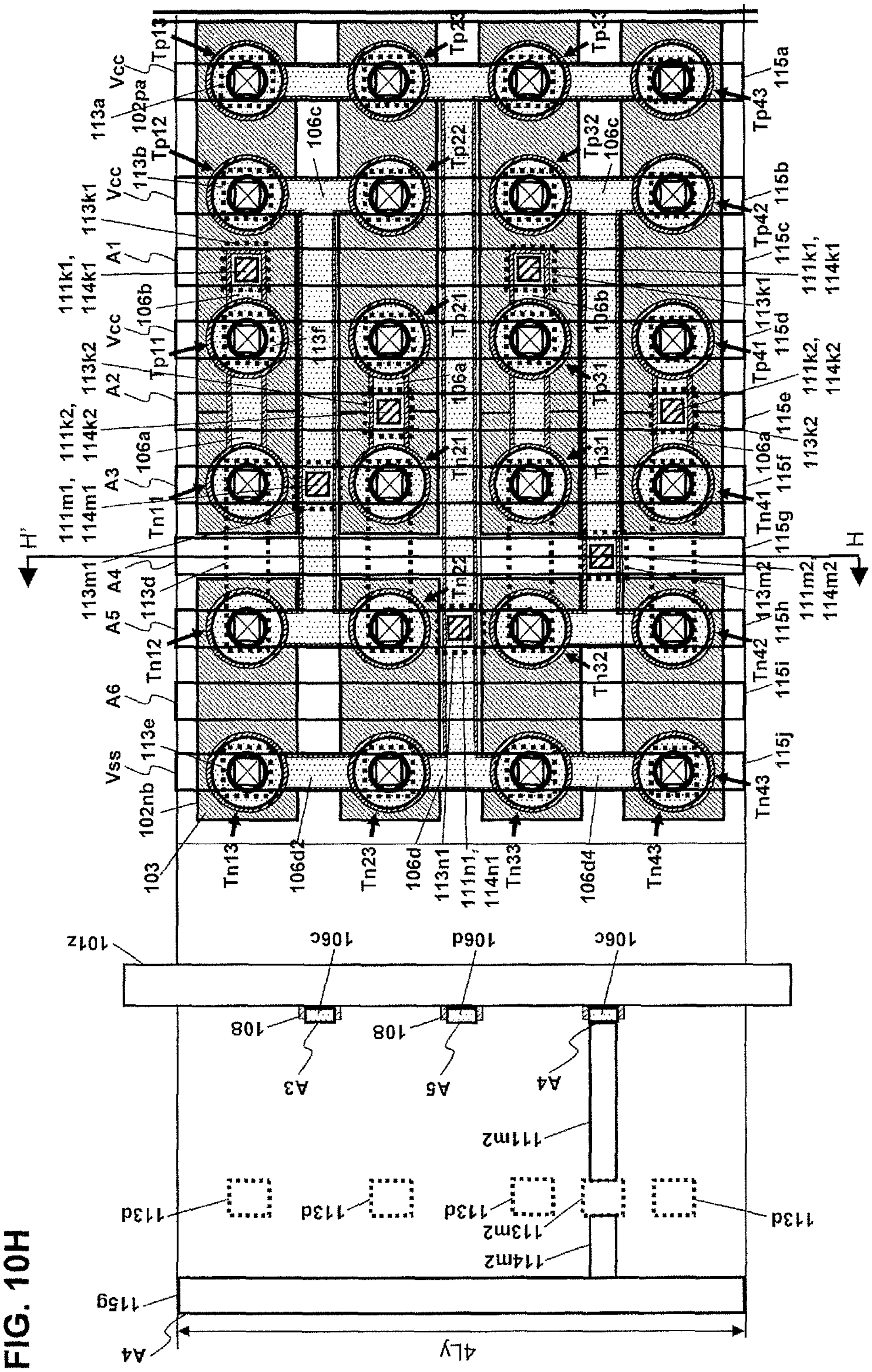
FIG. 10H is a cross-sectional view of the decoder according to the third exemplary embodiment of the present invention.
Figure 10I:
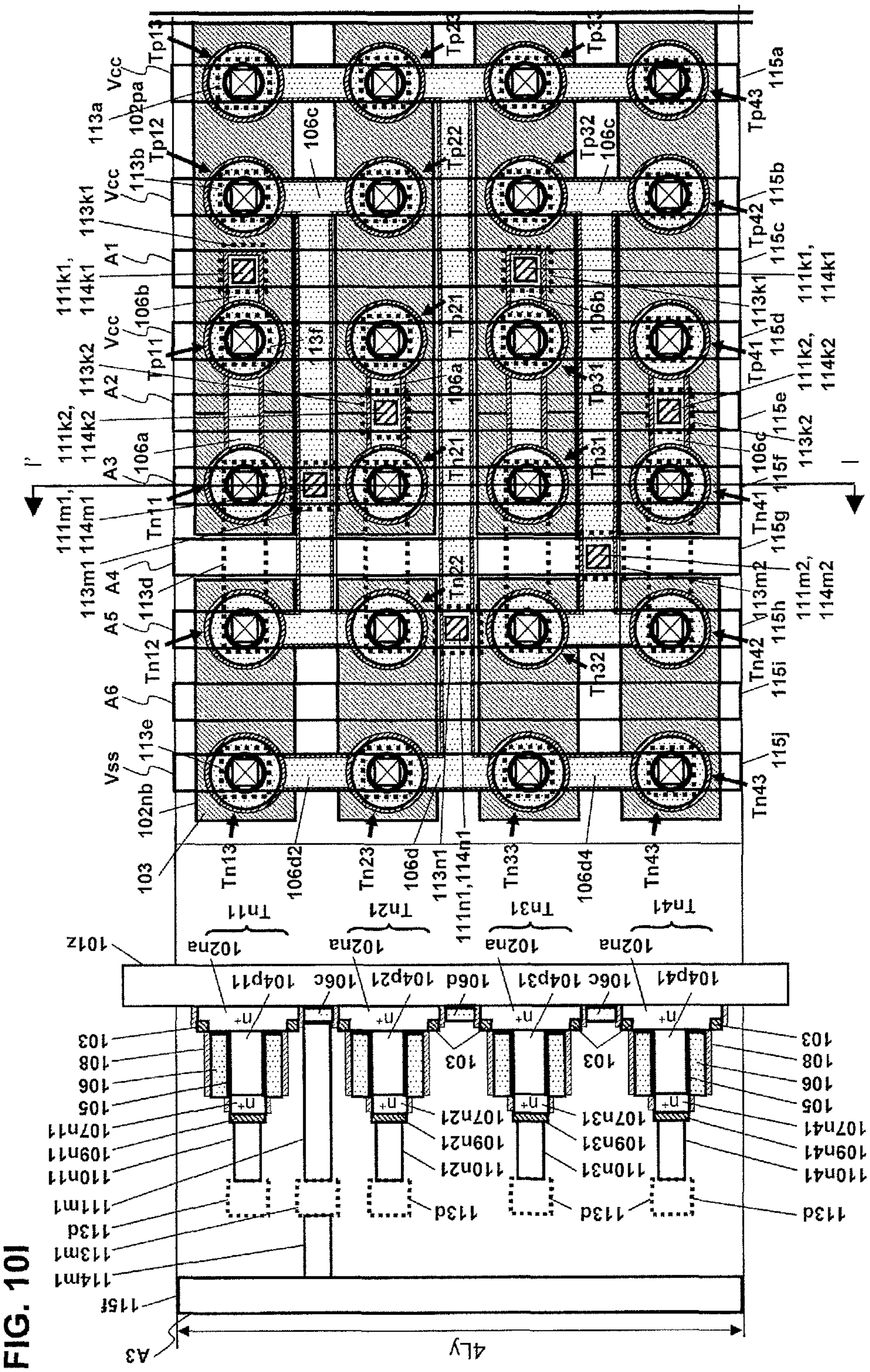
FIG. 10I is a cross-sectional view of the decoder according to the third exemplary embodiment of the present invention.
Figure 10J:
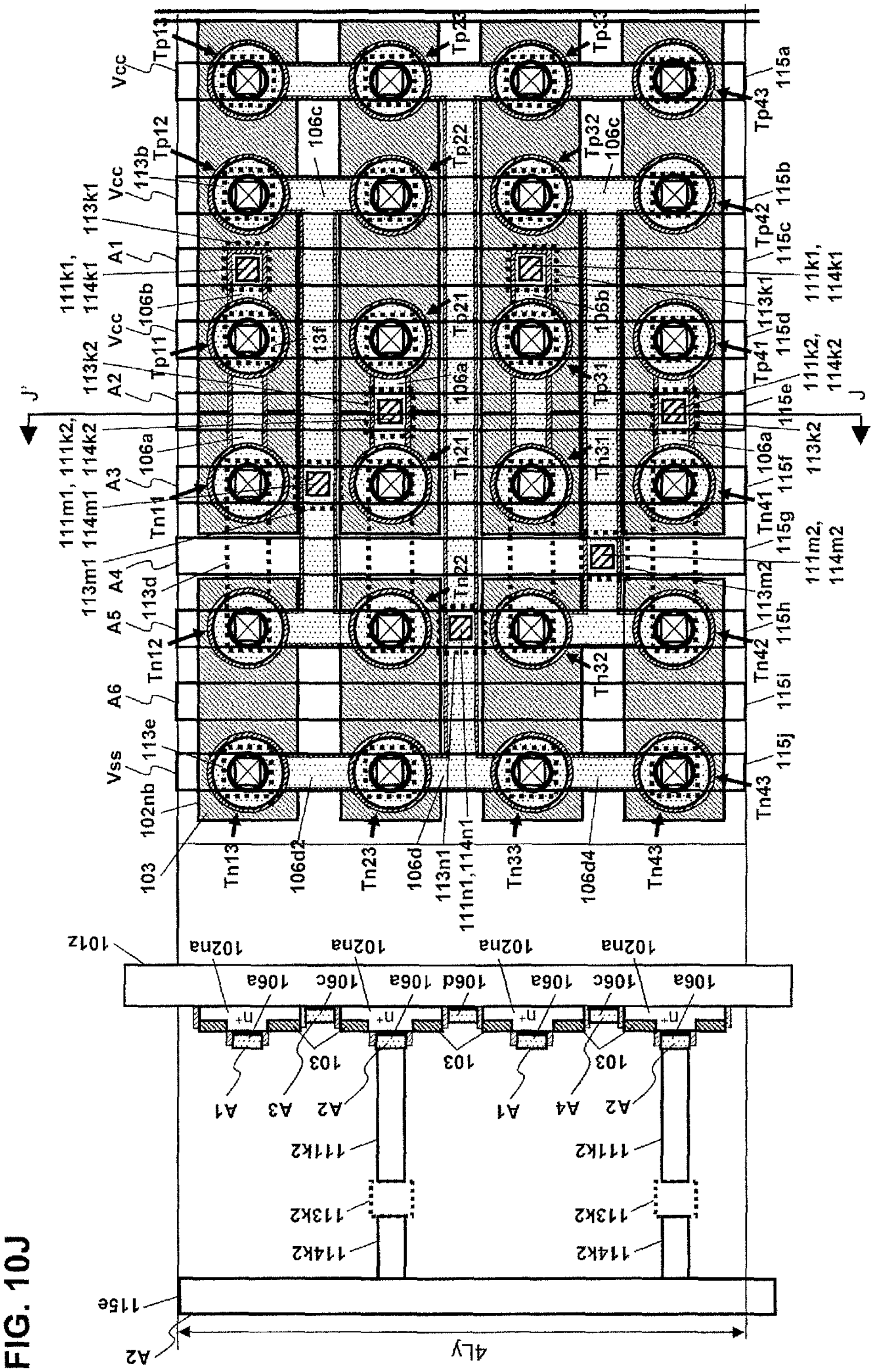
FIG. 10J is a cross-sectional view of the decoder according to the third exemplary embodiment of the present invention.
Figure 10K:
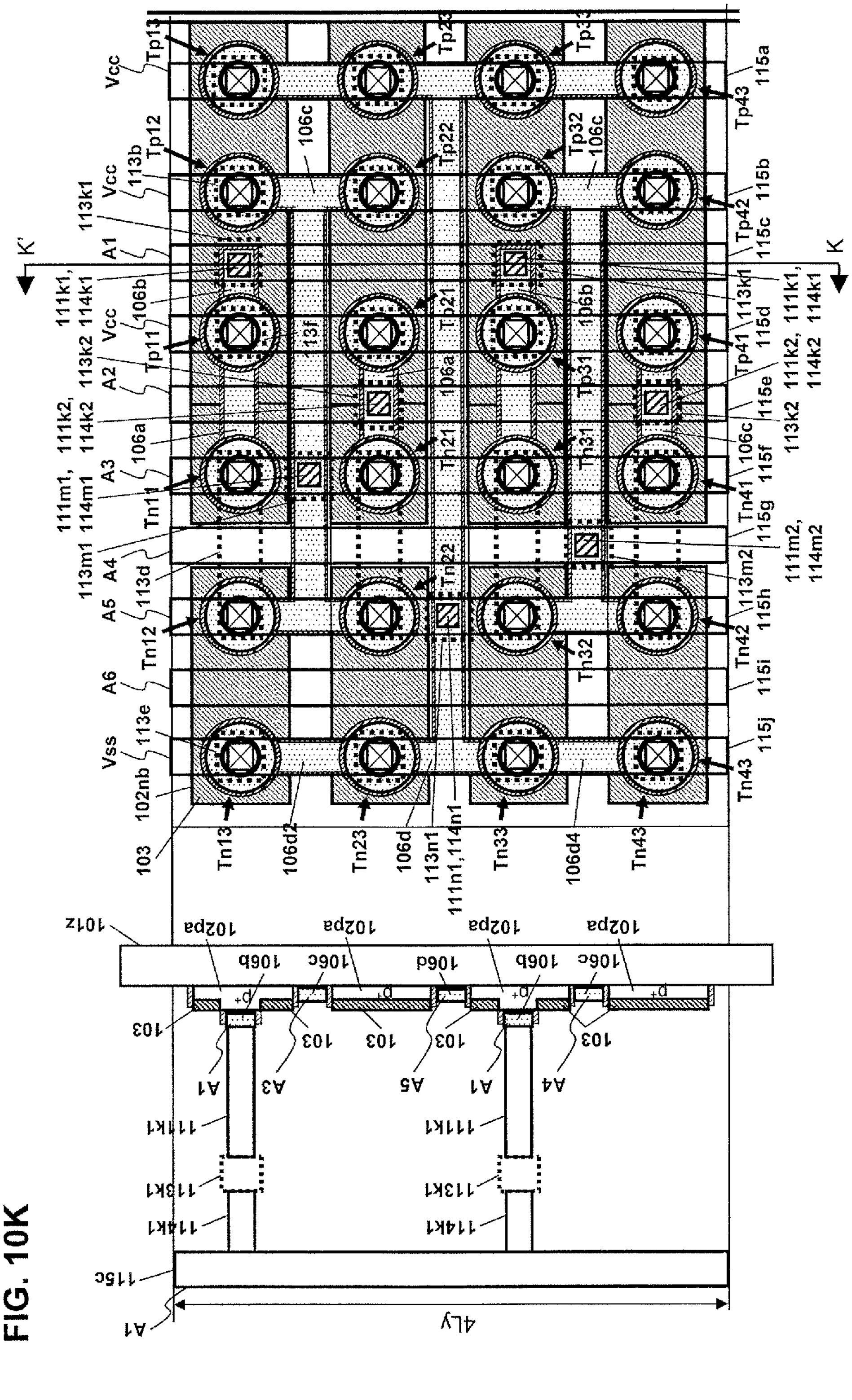
FIG. 10K is a cross-sectional view of the decoder according to the third exemplary embodiment of the present invention.
Figure 10L:
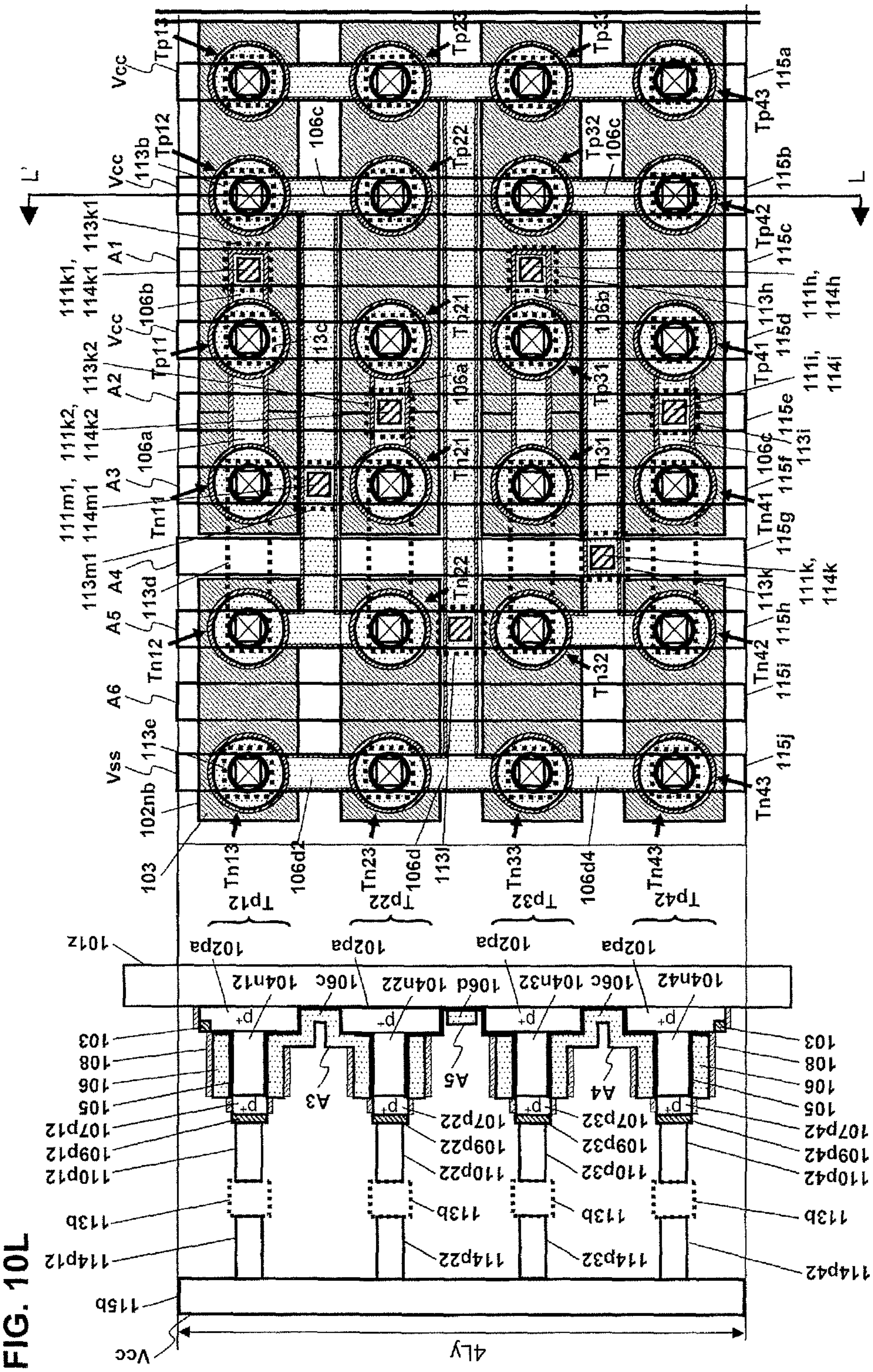
FIG. 10L is a cross-sectional view of the decoder according to the third exemplary embodiment of the present invention.
Figure 10M:
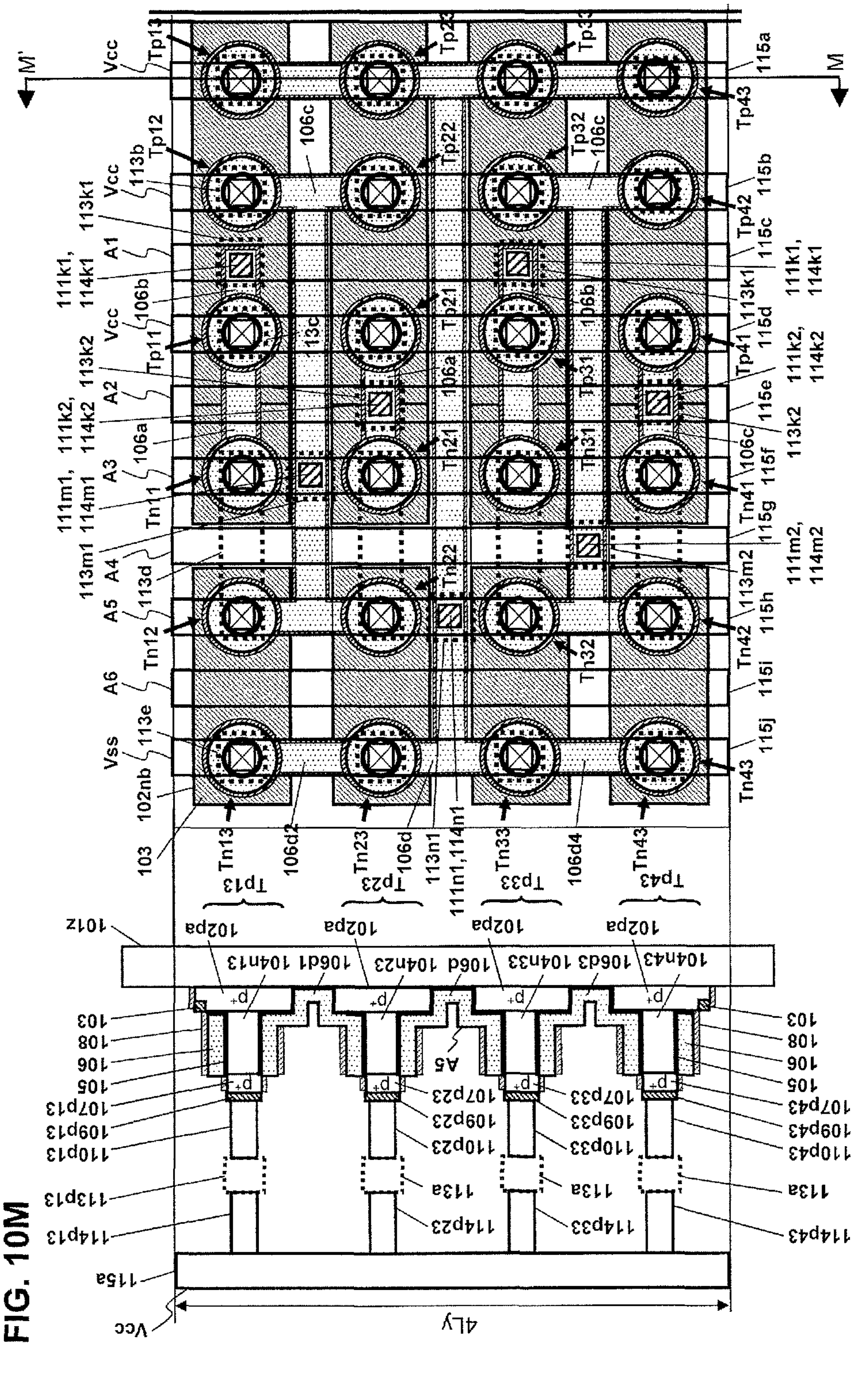
FIG. 10M is a cross-sectional view of the decoder according to the third exemplary embodiment of the present invention.

FIG. 10A is a cross-sectional view taken along the cut-line A-A' in FIG. 9A, FIG. 10B is a cross-sectional view taken along the cut-line B-B' in FIG. 9A, FIG. 10C is a cross-sectional view taken along the cut-line C-C' in FIG. 9A, FIG. 10D is a cross-sectional view taken along the cut-line D-D' in FIG. 9A, FIG. 10E is a cross-sectional view taken along the cut-line E-E' in FIG. 9B, FIG. 10F is a cross-sectional view taken along the cut-line F-F' in FIG. 9A, FIG. 10G is a cross-sectional view taken along the cut-line G-G' in FIG. 9A, FIG. 10H is a cross-sectional view taken along the cut-line H-H' in FIG. 9A, FIG. 10I is a cross-sectional view taken along the cut-line I-I' in FIG. 9A, FIG. 10J is a cross-sectional view taken along the cut-line J-J' in FIG. 9A, FIG. 10K is a cross-sectional view taken along the cut-line K-K' in FIG. 9A, FIG. 10L is a cross-sectional view taken along the cut-line L-L' in FIG. 9A, and FIG. 10M is a cross-sectional view taken along the cut-line M-M' in FIG. 9A.

FIG. 9A illustrates a decoder block 110*a* illustrated in FIG. 7, and FIG. 9B illustrates a decoder block 110*b* illustrated in FIG. 7. Although FIGS. 9A and 9B are consecutive views, separate views are presented in FIGS. 9A and 9B in enlarged scale, for convenience.

In FIG. 9A, the transistors constituting the decoder 100-1 illustrated in FIG. 7, namely, the NMOS transistor Tn14, the PMOS transistors Tp14, Tp13, Tp12, and Tp11, and the NMOS transistors Tn11, Tn12, and Tn13, are arranged in the top row of FIG. 9A in a line in the lateral direction (the first direction) from right to left in this figure.

The transistors constituting the decoder 100-2, namely, the NMOS transistor Tn24, the PMOS transistors Tp24, Tp23, Tp22, and Tp21, and the NMOS transistors Tn21, Tn22, and Tn23, are arranged in the second row from the top in FIG. 9A in a line in the lateral direction (the first direction) from right to left in this figure. Likewise, the decoder 100-3 and the decoder 100-4 are arranged in sequence from top to bottom in FIG. 9A.

The gate electrodes 106 of the PMOS transistors Tp12 and Tp22 and the NMOS transistors Tn12 and Tn22 are connected in common by using a gate line 106*c*. Since the gate line 106*c* is formed in the space (dead space) between the lower diffusion layers of the decoder 100-1 and the decoder 100-2, the size in the longitudinal direction (the second direction) can be minimized. In addition, the use of a common gate line can reduce the parasitic capacitance of lines. High-speed operation can be achieved.

Likewise, the gate electrodes 106 of the PMOS transistors Tp32 and Tp42 and the NMOS transistors Tn32 and Tn42 are connected in common by using a gate line 106*c*. The gate line 106*c* is formed in the space (dead space) between the lower diffusion layers of the decoder 100-3 and the decoder 100-4.

Further, the gate electrodes 106 of the PMOS transistors Tp13, Tp23, Tp33, and Tp43 and the NMOS transistors Tn13, Tn23, Tn33, and Tn34 are connected in common by using gate lines 106*d*, 106*d*1, 106*d*2, 106*d*3, and 106*d*4. Since the gate line 106*d* is formed in the space (dead space) between the lower diffusion layers of the decoder 100-2 and the decoder 100-3, the size in the longitudinal direction (the second direction) can be minimized. In addition, the use of a common gate line can reduce the parasitic capacitance of lines. High-speed operation can be achieved.

Also in FIG. 9B, the transistors constituting the decoder 100-5 illustrated in FIG. 7, namely, the NMOS transistor Tn54, the PMOS transistors Tp54, Tp53, Tp52, and Tp51 and the NMOS transistors Tn51, Tn52, and Tn53, are arranged in the top row of FIG. 9B in a line in the lateral direction (the first direction) from right to left in this figure.

The transistors constituting the decoder 100-6, namely, the NMOS transistor Tn64, the PMOS transistors Tp64, Tp63, Tp62, and Tp61 and the NMOS transistors Tn61, Tn62, and Tn63, are arranged in the second row from the top in FIG. 9B in a line in the lateral direction (the first direction) from right to left in this figure. Likewise, the decoder 100-7 and the decoder 100-8 are arranged in sequence from top to bottom in FIG. 9B.

The gate electrodes 106 of the PMOS transistors Tp52 and Tp62 and the NMOS transistors Tn52 and Tn62 are connected in common by using a gate line 106*c*. Since the gate line 106*c* is formed in the space (dead space) between the lower diffusion layers of the decoder 100-5 and the decoder 100-6, the size in the longitudinal direction (the second direction) can be minimized. In addition, the use of a common gate line can reduce the parasitic capacitance of lines. High-speed operation can be achieved.

Likewise, the gate electrodes 106 of the PMOS transistors Tp72 and Tp82 and the NMOS transistors Tn72 and Tn82 are connected in common by using a gate line 106*c*. The gate line 106c is formed in the space (dead space) between the lower diffusion layers of the decoder 100-7 and the decoder 100-8.

Further, the gate electrodes 106 of the PMOS transistors Tp53, Tp63, Tp73, and Tp83 and the NMOS transistors Tn53, Tn63, Tn73, and Tn83 are connected in common by using gate lines 106d, 106d1, 106d2, 106d3, and 106d4. Since the gate line 106d is formed in the space (dead space) between the lower diffusion layers of the decoder 100-6 and the decoder 100-7, the size in the longitudinal direction (the second direction) can be minimized. In addition, the use of a common gate line can reduce the parasitic capacitance of lines. High-speed operation can be achieved.

In FIGS. 9A and 9B, lines 115k, 1151, 115a, 115b, 115c, 115d, 115e, 115f, 115g, 115h, 115i, and 115j of a second metal wiring layer are arranged to extend in the longitudinal direction (the second direction) from right to left, and respectively form a reference power supply line Vss, a power supply line Vcc, a power supply line Vcc, a power supply line Vcc, the address signal line A1, a power supply line Vcc, the address signal lines A2, A3, A4, A5, and A6, and a reference power supply line Vss. Since the lines 115a to 115l of the second metal wiring layer are arranged at a minimum pitch (a minimum wiring width and a minimum wiring interval) for the second metal wiring layer, the size in the lateral direction can be minimized in the arrangement.

In FIGS. 9A to 9D and FIGS. 10A to 10M, portions having the same or substantially the same structures as those illustrated in FIGS. 2A and 2B and FIGS. 3A to 3H are denoted by equivalent reference numerals in the 100s.

The arrangement of the eight SGTs constituting the decoder 100-1, namely, the NMOS transistor Tn14, the PMOS transistors Tp14, Tp13, Tp12, and Tp11, and the NMOS transistors Tn11, Tn12, and Tn13, up to the eight SGTs constituting the decoder 100-8, namely, the NMOS transistor Tn84, the PMOS transistors Tp84, Tp83, Tp82, and Tp81, and the NMOS transistors Tn81, Tn82, and Tn83, is identical to the arrangement of the eight SGTs illustrated in FIG. 5, namely, the NMOS transistor Tn14, the PMOS transistors Tp14, Tp13, Tp12, and Tp11, and the NMOS transistors Tn11, Tn12, and Tn13. Note that FIGS. 9A and 9B are different from FIG. 5 in that since the number of address signal lines is increased from three (A1 to A3) to six (A1 to A6), the arrangement positions and connection portions of the lines of the second metal wiring layer along which address signals are supplied are changed.

In FIGS. 9A and 9B, the following connections are provided.

The line 115k of the second metal wiring layer along which the reference power supply Vss is supplied is arranged to extend in the second direction, and is connected to the sources of the NMOS transistors Tn14 and Tn24 to Tn84.

The line 115l of the second metal wiring layer along which the power supply Vcc is supplied is arranged to extend in the second direction, and is connected to the sources of the PMOS transistors Tp14 and Tp24 to Tp84.

The line 115a of the second metal wiring layer along which the power supply Vcc is supplied is arranged to extend in the second direction, and is connected to the sources of the PMOS transistors Tp13 and Tp23 to Tp83.

The line 115b of the second metal wiring layer along which the power supply Vcc is supplied is arranged to extend in the second direction, and is connected to the sources of the PMOS transistors Tp12 and Tp22 to Tp82.

The line 115c of the second metal wiring layer along which an address signal A1 is supplied is arranged to extend in the second direction, and is connected to the gate lines 106b via contacts 114k1, lines 113k1 of the first metal wiring layer, and contacts 111k1. The line 115c of the second metal wiring layer is then connected to the gate electrodes 106 of the PMOS transistors Tp11, Tp31, Tp51, and Tp71, and is also connected to the gate electrodes 106 of the NMOS transistors Tn11, Tn31, Tn51, and Tn71 via the gate lines 106a.

The line 115d of the second metal wiring layer along which the power supply Vcc is supplied is arranged to extend in the second direction, and is connected to the sources of the PMOS transistors Tp11 and Tp21 to Tp81.

The line 115e of the second metal wiring layer along which an address signal A2 is supplied is arranged to extend in the second direction, and is connected to the gate lines 106a via contacts 114k2, lines 113k2 of the first metal wiring layer, and contacts 111k2. The line 115e of the second metal wiring layer is then connected to the gate electrodes 106 of the PMOS transistor Tp21 and the NMOS transistor Tn21, the gate electrodes 106 of the PMOS transistor Tp41 and the NMOS transistor Tn41, the gate electrodes 106 of the PMOS transistor Tp61 and the NMOS transistor Tn61, and the gate electrodes 106 of the PMOS transistor Tp81 and the NMOS transistor Tn81.

The line 115f of the second metal wiring layer along which an address signal A3 is supplied is arranged to extend in the second direction, and is connected to the gate line 106c via a contact 114m1, a line 113m1 of the first metal wiring layer, and a contact 111m1. The line 115f of the second metal wiring layer is then connected to the gate electrodes 106 of the PMOS transistors Tp12 and Tp22 and the NMOS transistors Tn12 and Tn22. In addition, the line 115f of the second metal wiring layer is also connected to the gate line 106c via a contact 114m1, a line 113m1 of the first metal wiring layer, and a contact 111m1, and is then connected to the gate electrodes 106 of the PMOS transistors Tp52 and Tp62 and the NMOS transistors Tn52 and Tn62.

The line 115g of the second metal wiring layer along which an address signal A4 is supplied is arranged to extend in the second direction, and is connected to the gate line 106c via a contact 114m2, a line 113m2 of the first metal wiring layer, and a contact 111m2. The line 115g of the second metal wiring layer is then connected to the gate electrodes 106 of the PMOS transistors Tp32 and Tp42 and the NMOS transistors Tn32 and Tn42. In addition, the line 115g of the second metal wiring layer is also connected to the gate line 106c via a contact 114m2, a line 113m2 of the first metal wiring layer, and a contact 111m2, and is then connected to the gate electrodes 106 of the PMOS transistors Tp72 and Tp82 and the NMOS transistors Tn72 and Tn82.

The line 115h of the second metal wiring layer along which an address signal A5 is supplied is arranged to extend in the second direction, and is connected to the gate line 106d via a contact 114n1, a line 113n1 of the first metal wiring layer, and a contact 111n1. The line 115h of the second metal wiring layer is then connected to the gate electrodes 106 of the PMOS transistors Tp23 and Tp33 and the NMOS transistors Tn23 and Tn33. In addition, the line 115h of the second metal wiring layer is further connected to the gate electrodes 106 of the PMOS transistors Tp13 and Tp43 and the NMOS transistors Tn13 and Tn43 via the gate lines 106d1, 106d3, 106d2, and 106d4, respectively.

The line 115i of the second metal wiring layer along which an address signal A6 is supplied is arranged to extend in the second direction, and is connected to the gate line 106d via a contact 114n2, a line 113n2 of the first metal wiring layer, and a contact 111n2. The line 115i of the second metal wiring layer is then connected to the gate electrodes 106 of the PMOS transistors Tp63 and Tp73 and the NMOS transistors Tn63 and Tn73. In addition, the line 115*i* of the second metal wiring layer is further connected to the gate electrodes 106 of the PMOS transistors Tp53 and Tp83 and the NMOS transistors Tn53 and Tn83 via the gate lines 106*d*1, 106*d*3, 106*d*2, and 106*d*4, respectively.

The line 115*j* of the second metal wiring layer along which the reference power supply Vss is supplied is arranged to extend in the second direction, and is connected to the sources of the NMOS transistors Tn13 and Tn23 to Tn83.

The arrangement and connections described above can provide eight decoders with a minimum area at a minimum pitch in both the lateral direction and the longitudinal direction.

In this exemplary embodiment, the address signal lines A1 to A6 are set to provide eight decoders. The use of an increased number of address signal lines to increase the number of decoders also falls within the scope of the present invention.

According to this exemplary embodiment, a plurality of decoders, each including eight SGTs that constitute a 3-input NAND decoder and an inverter and that are arranged in a line in a first direction, are arranged adjacent to each other, and the power supply line Vcc, the reference power supply line Vss, and the address signal lines (A1 to A6) are arranged to extend in a second direction perpendicular to the first direction. This configuration provides a semiconductor device including 3-input NAND decoders and inverters with a minimum area, in such a manner that the 3-input NAND decoders and the inverters can be arranged at a minimum pitch in both the first direction and the second direction, without using any extra lines or contact regions.

Fourth Exemplary Embodiment

Equivalent Circuit Applicable to Exemplary Embodiment of Present Invention

Figure 11:
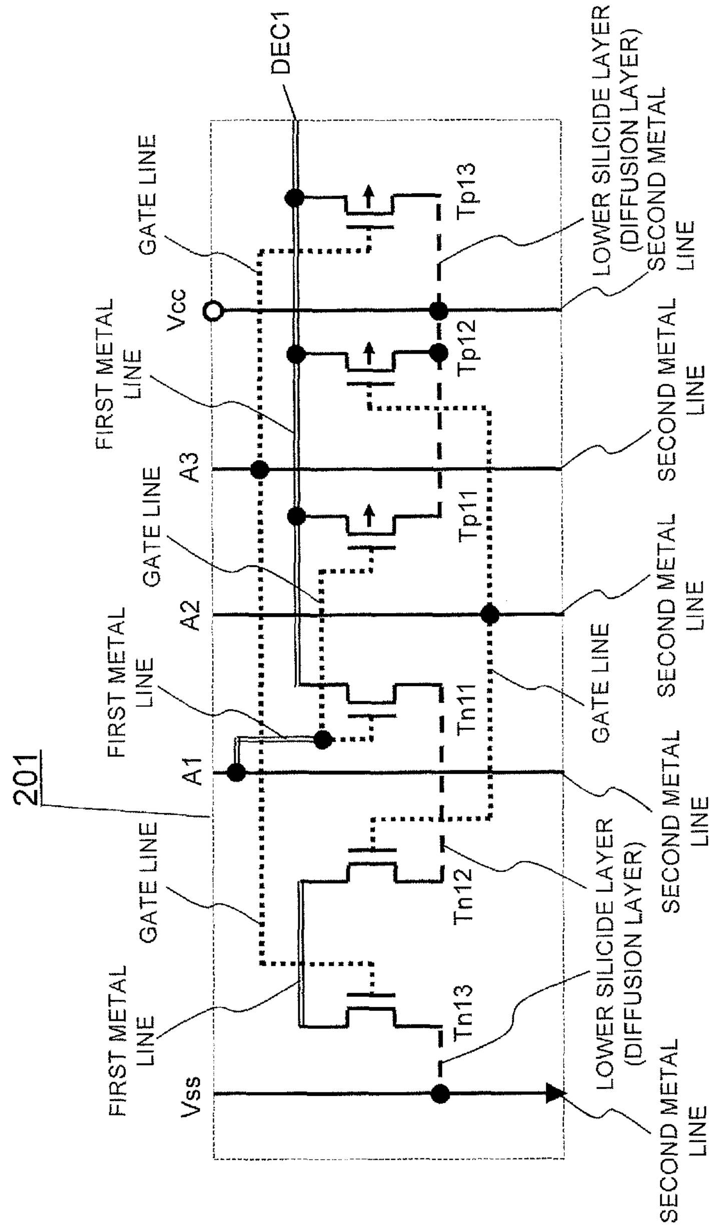
FIG. 11 is an equivalent circuit diagram illustrating a decoder according to a fourth exemplary embodiment of the present invention.

FIG. 11 illustrates an equivalent circuit diagram of a 3-input NAND decoder 201 applicable to the present invention. FIG. 11 illustrates the arrangement of transistors and a method for connecting circuits corresponding to an exemplary embodiment described below. This exemplary embodiment is different from the first exemplary embodiment described above in that the PMOS transistors Tp11, Tp12, and Tp13 and the NMOS transistors Tn11, Tn12, and Tn13 are arranged so that their sources and drains are oriented upside-down. Accordingly, the lines connecting the drains, sources, and gates of the transistors differ. In FIG. 11, the types of the lines are indicated to clearly identify how the lines are provided.

In FIG. 11, reference numerals Tp11, Tp12, and Tp13 denote PMOS transistors formed of SGTs, and reference numerals Tn11, Tn12, and Tn13 denote NMOS transistors formed of SGTs. The sources of the PMOS transistors Tp11, Tp12, and Tp13 serve as a lower diffusion layer, and are connected to lines of a first metal wiring layer via lines of a silicide layer. The sources are further connected to lines of a second metal wiring layer, and a power supply Vcc is supplied to the lines of the second metal wiring layer. The drains of the PMOS transistors Tp11, Tp12, and Tp13 and the drain of the NMOS transistor Tn11 are connected in common to an output line DEC1 formed of a line of the first metal wiring layer. The source of the NMOS transistor Tn11 is connected to the drain of the NMOS transistor Tn12 via a lower diffusion layer and a silicide layer. The source of the NMOS transistor Tn12 is connected to the drain of the NMOS transistor Tn13 via a line of the first metal wiring layer. The source of the NMOS transistor Tn13 is connected to a line of the second metal wiring layer via a lower silicide layer, and a reference power supply Vss is supplied to the line of the second metal wiring layer.

Further, an address signal line A1 is connected to the gate of the PMOS transistor Tp11 and the gate of the NMOS transistor Tn11 via a line of the second metal wiring layer, a line of the first metal wiring layer, and a gate line. An address signal line A2 is connected to the gate of the PMOS transistor Tp12 and the gate of the NMOS transistor Tn12 via a line of the second metal wiring layer, a line of the first metal wiring layer, and a gate line. An address signal line A3 is connected to the gate of the PMOS transistor Tp13 and the gate of the NMOS transistor Tn13 via a line of the second metal wiring layer, a line of the first metal wiring layer, and a gate line.

Figure 12A:
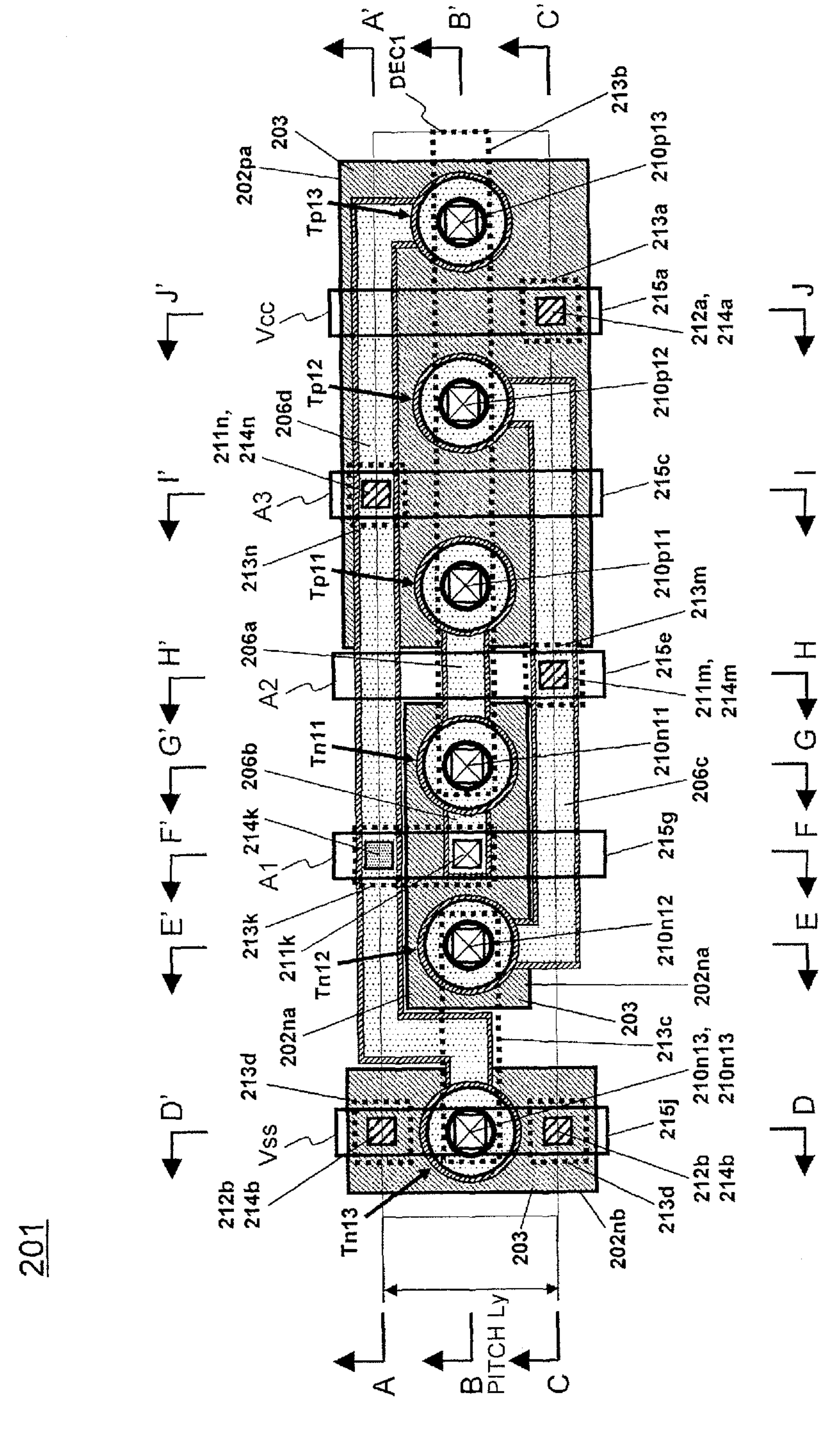
FIG. 12A is a plan view of the decoder according to the fourth exemplary embodiment of the present invention.
Figure 12B:
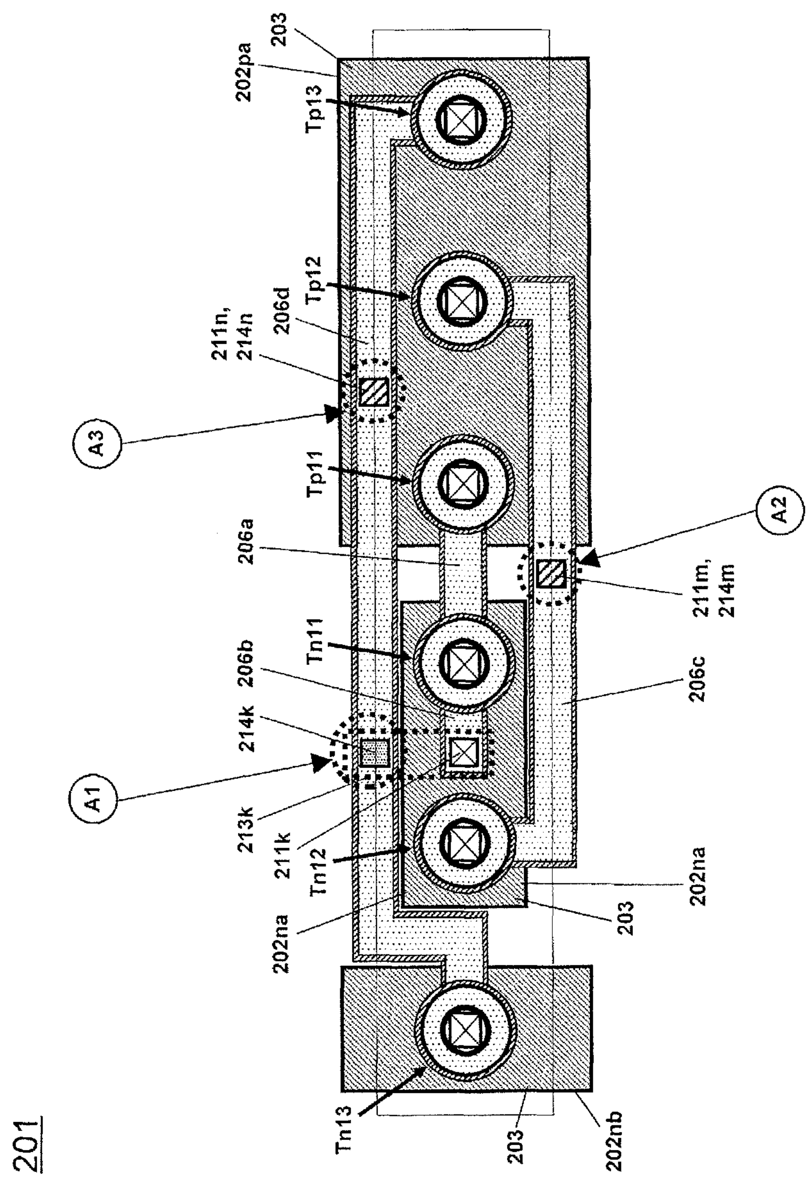
FIG. 12B is a plan view of the decoder according to the fourth exemplary embodiment of the present invention.

FIGS. 12A and 12B and FIGS. 13A to 13J illustrate a fourth exemplary embodiment as an exemplary embodiment in which the equivalent circuit illustrated in FIG. 11 is applied to the present invention. FIG. 12A is a plan view of the layout (arrangement) of a 3-input NAND decoder according to this exemplary embodiment. FIG. 12B illustrates lower diffusion layers, transistors, and gate lines depicted in the plan view of FIG. 12A to facilitate the understanding of the connections between the address signal lines and the gate lines.

Figure 13A:
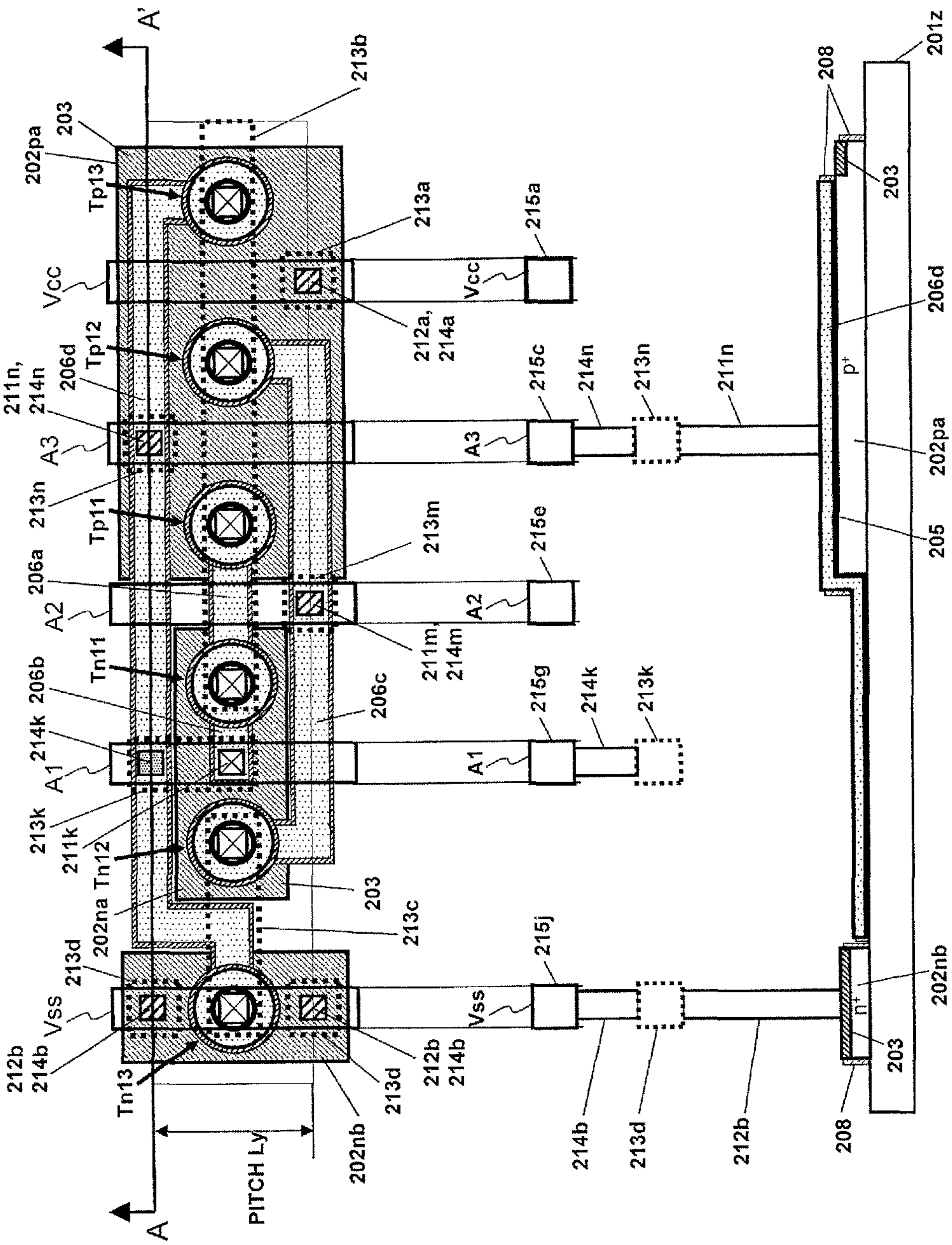
FIG. 13A is a cross-sectional view of the decoder according to the fourth exemplary embodiment of the present invention.
Figure 13B:
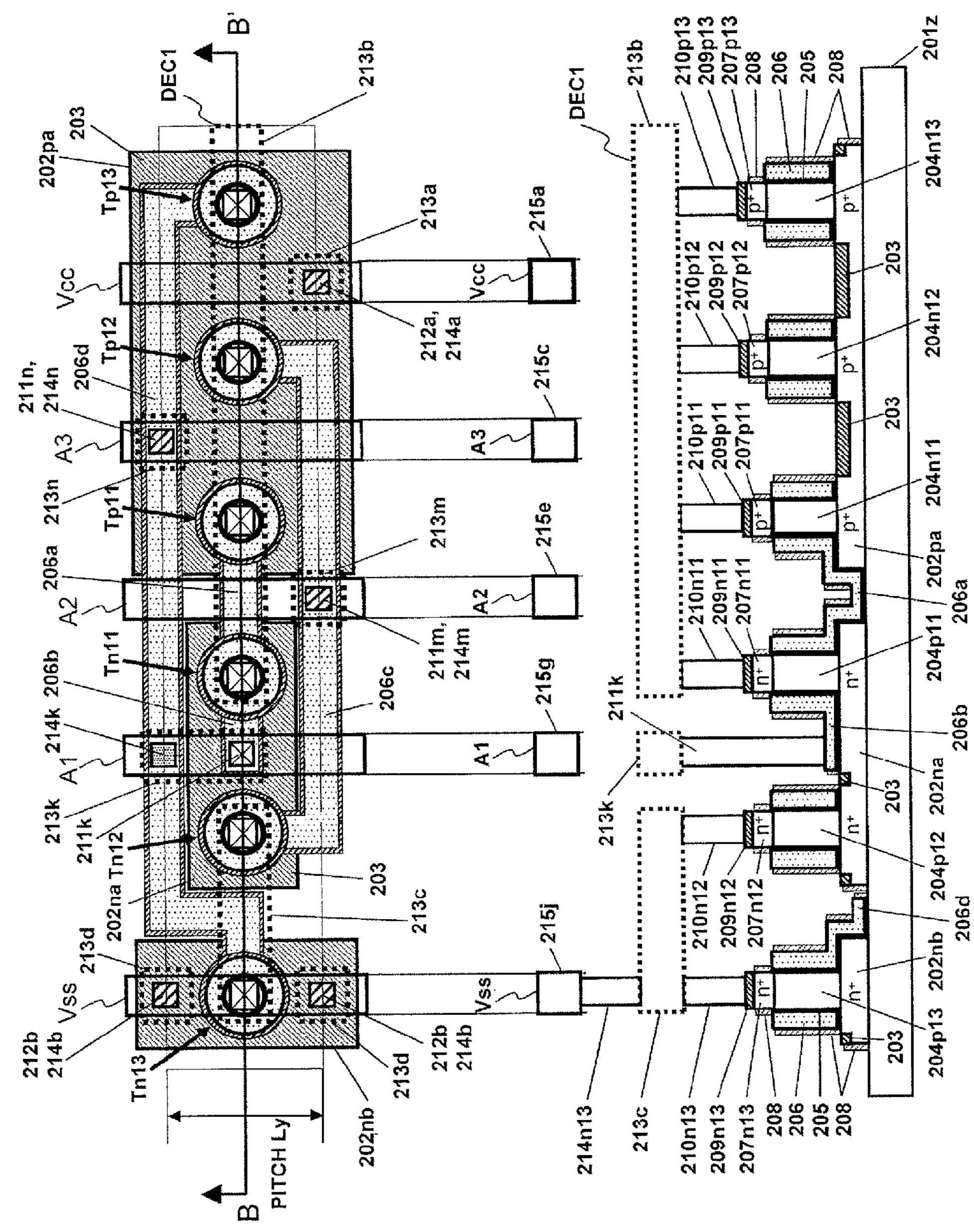
FIG. 13B is a cross-sectional view of the decoder according to the fourth exemplary embodiment of the present invention.
Figure 13C:
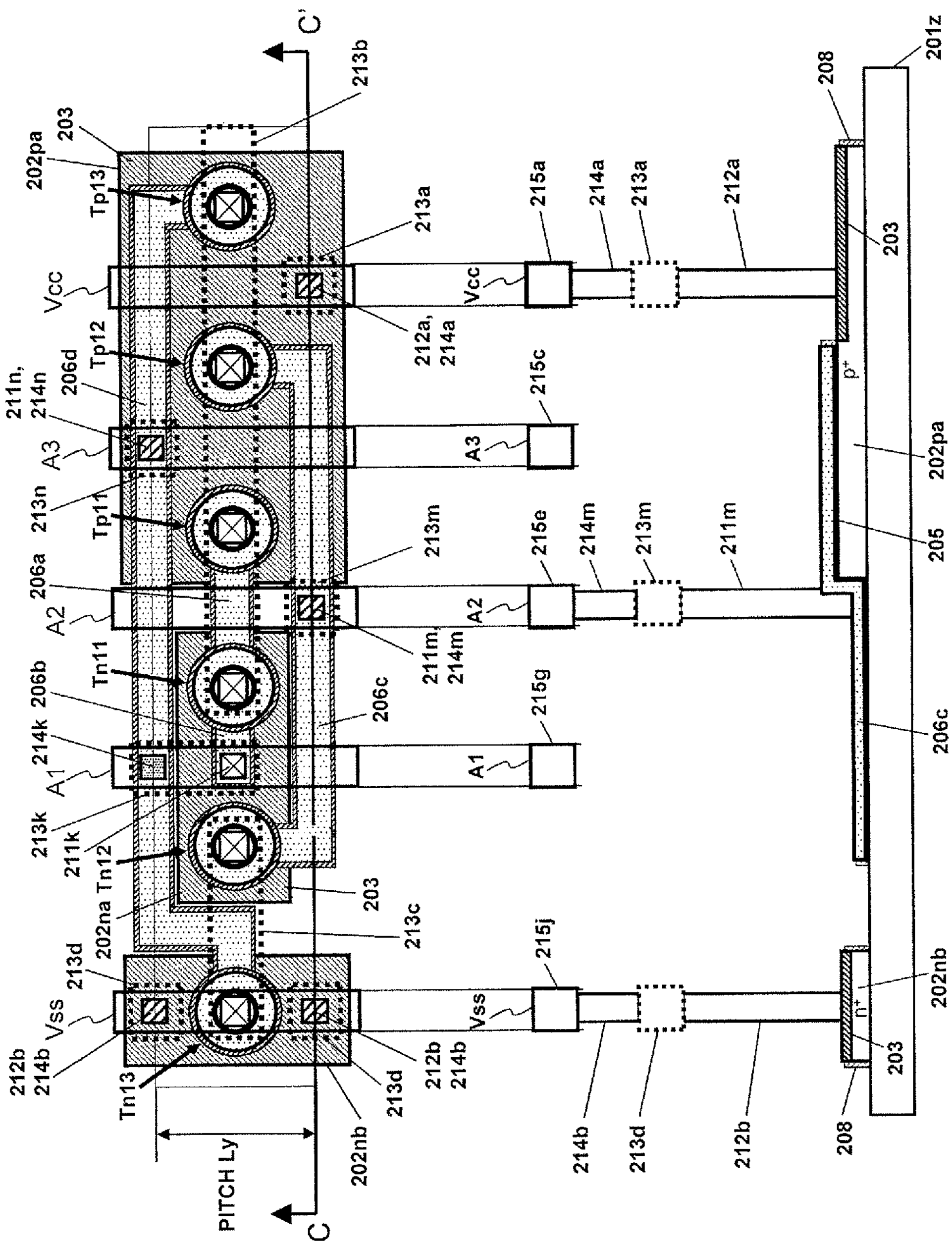
FIG. 13C is a cross-sectional view of the decoder according to the fourth exemplary embodiment of the present invention.
Figure 13D:
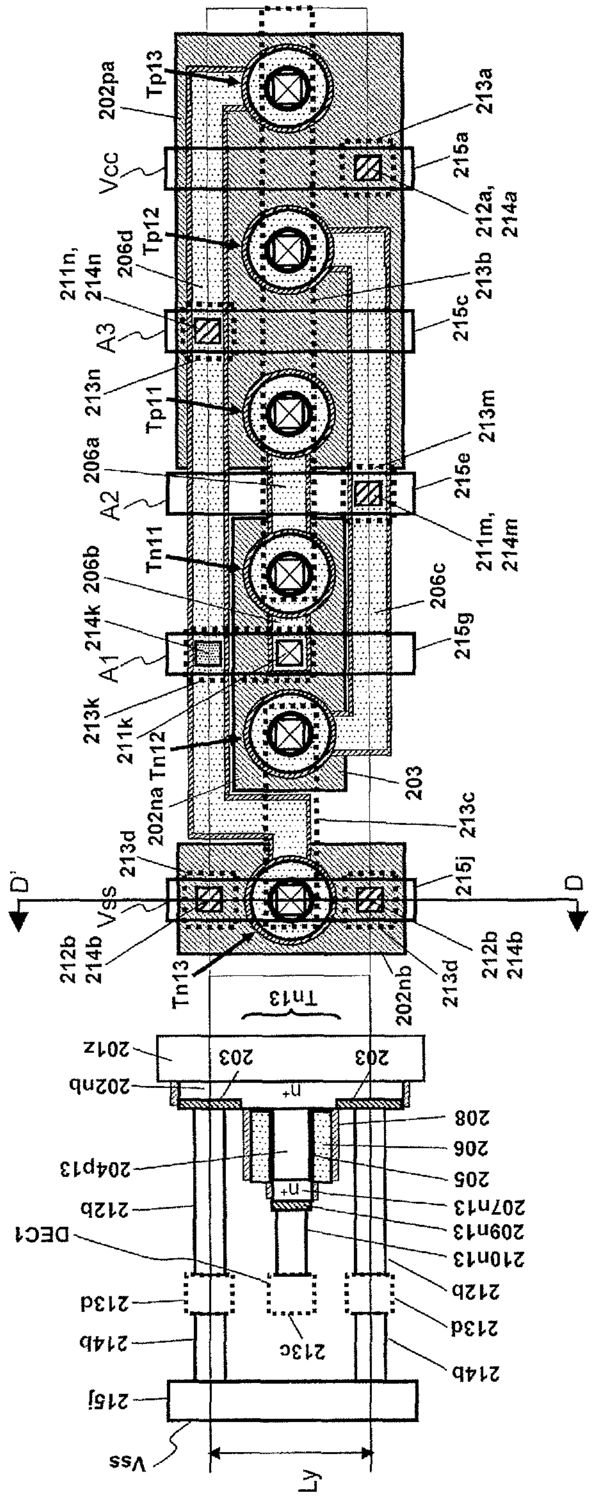
FIG. 13D is a cross-sectional view of the decoder according to the fourth exemplary embodiment of the present invention.
Figure 13E:
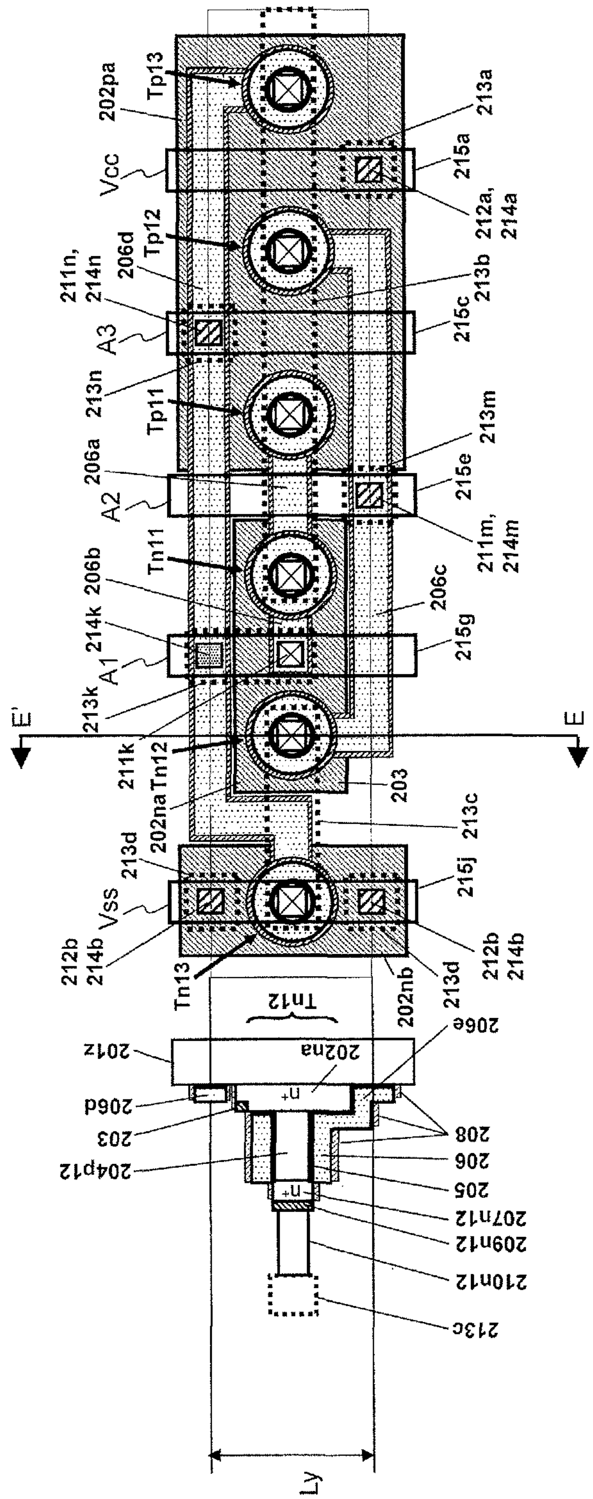
FIG. 13E is a cross-sectional view of the decoder according to the fourth exemplary embodiment of the present invention.
Figure 13F:
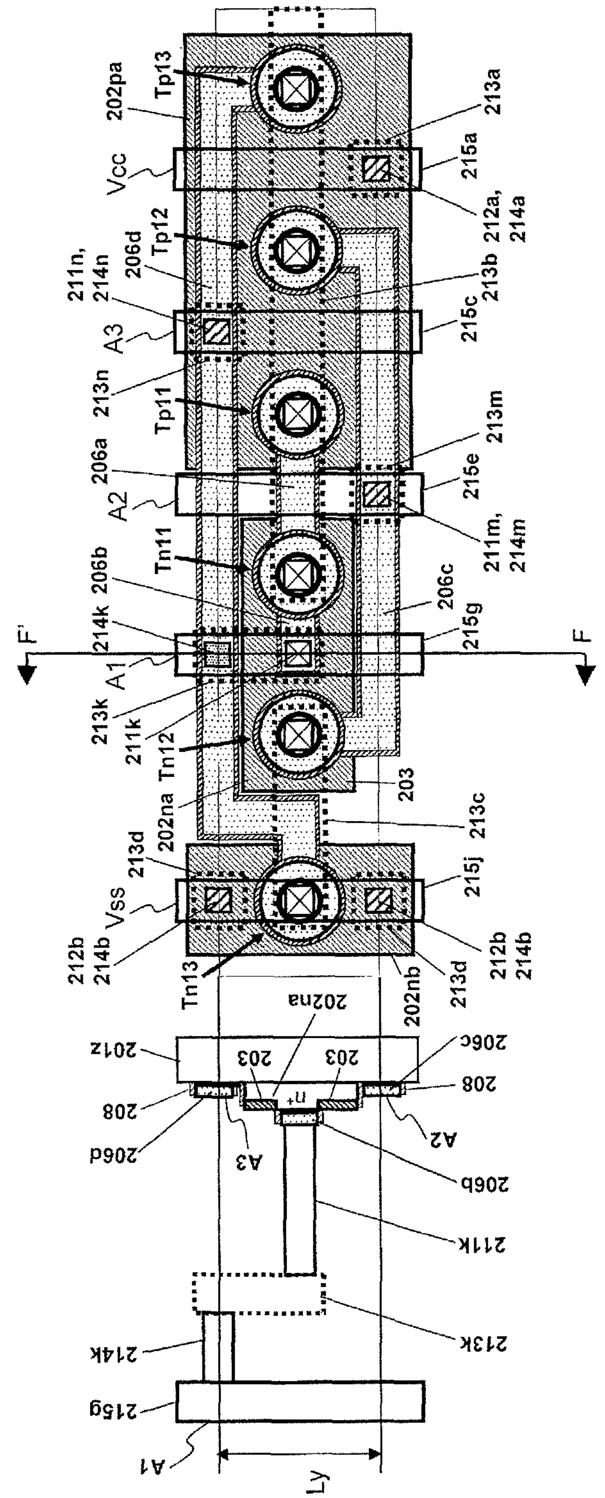
FIG. 13F is a cross-sectional view of the decoder according to the fourth exemplary embodiment of the present invention.
Figure 13G:
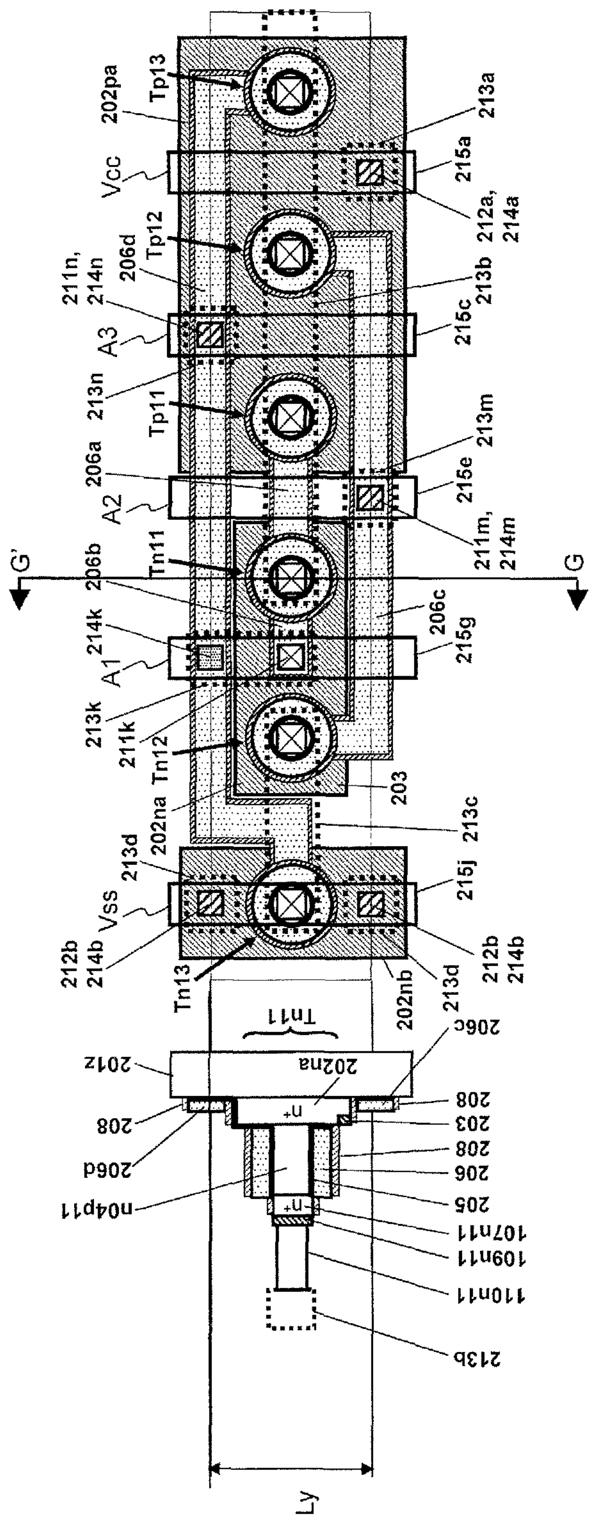
FIG. 13G is a cross-sectional view of the decoder according to the fourth exemplary embodiment of the present invention.
Figure 13H:
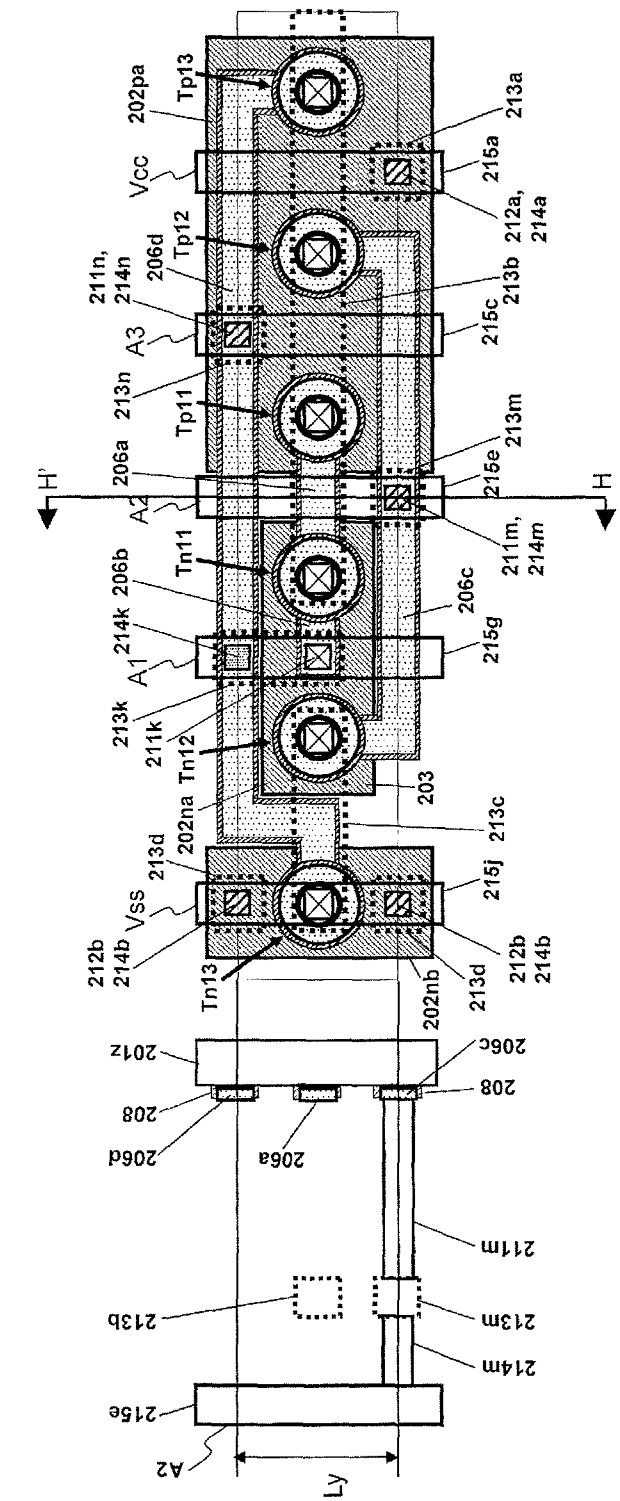
FIG. 13H is a cross-sectional view of the decoder according to the fourth exemplary embodiment of the present invention.
Figure 13I:
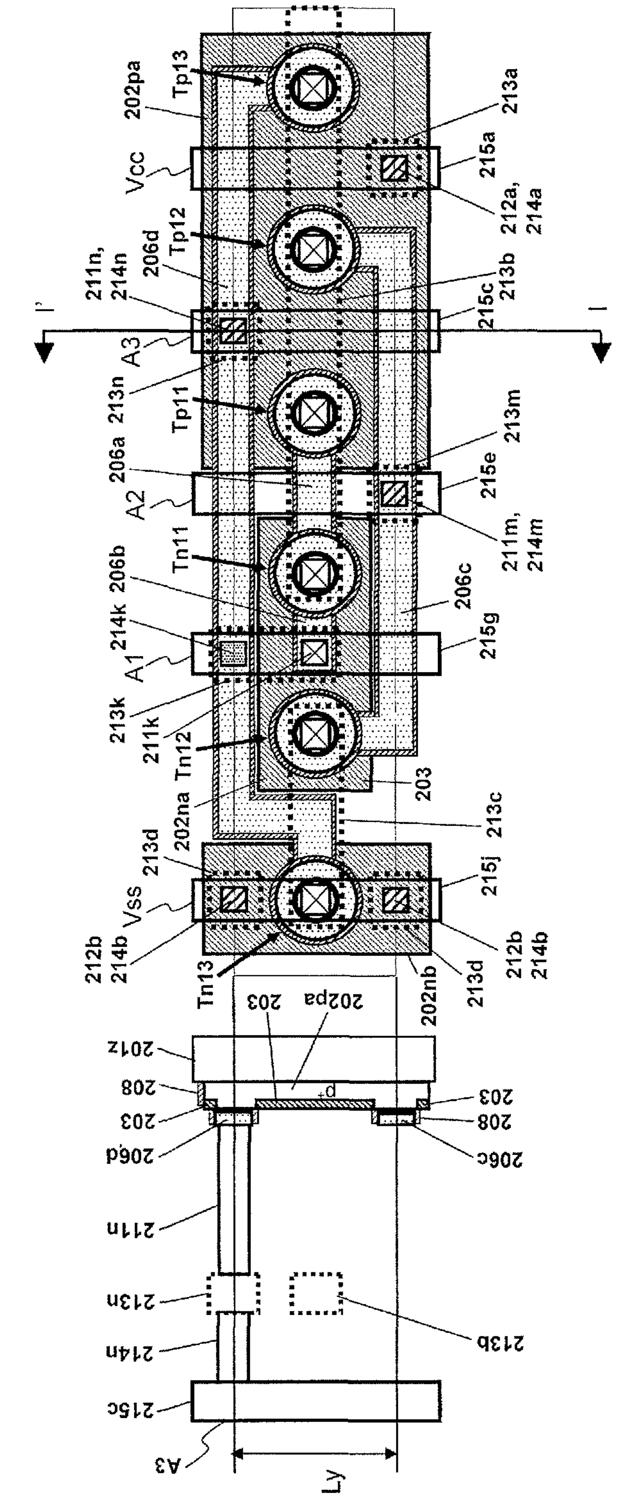
FIG. 13I is a cross-sectional view of the decoder according to the fourth exemplary embodiment of the present invention.
Figure 13J:
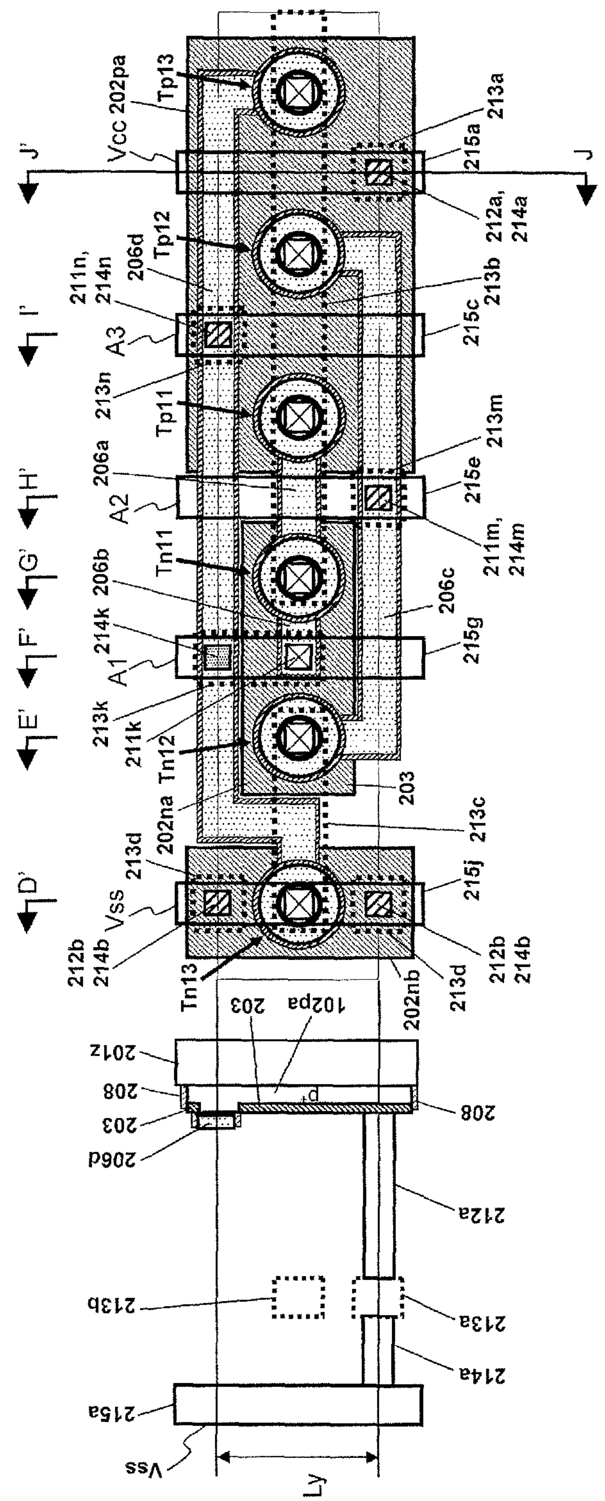
FIG. 13J is a cross-sectional view of the decoder according to the fourth exemplary embodiment of the present invention.

FIG. 13A is a cross-sectional view taken along the cut-line A-A' in FIG. 12A, FIG. 13B is a cross-sectional view taken along the cut-line B-B' in FIG. 12A, FIG. 13C is a cross-sectional view taken along the cut-line C-C' in FIG. 12A, FIG. 3D is a cross-sectional view taken along the cut-line D-D' in FIG. 12A, FIG. 13E is a cross-sectional view taken along the cut-line E-E' in FIG. 12A, FIG. 13F is a cross-sectional view taken along the cut-line F-F' in FIG. 12A, FIG. 13G is a cross-sectional view taken along the cut-line G-G' in FIG. 12A, FIG. 13H is a cross-sectional view taken along the cut-line H-H' in FIG. 12A, FIG. 13I is a cross-sectional view taken along the cut-line I-I' in FIG. 12A, and FIG. 13J is a cross-sectional view taken along the cut-line J-J' in FIG. 12A.

In FIGS. 12A and 12B and FIGS. 13A to 13J, portions having the same or substantially the same structures as those illustrated in FIGS. 2A and 2B and FIGS. 3A to 3H are denoted by equivalent reference numerals in the 200s.

In FIG. 12A, the transistors constituting the NAND decoder 201 illustrated in FIG. 11, namely, the PMOS transistors Tp13, Tp12, and Tp11 and the NMOS transistors Tn11, Tn12, and Tn13, are arranged in a line in a lateral direction (a first direction) from right to left in this figure.

Further, lines 215*a*, 215*c*, 215*e*, 215*g*, and 215*j* of the second metal wiring layer, described below, are arranged to extend in a longitudinal direction in the figure (a second direction perpendicular to the first direction) and respectively form a power supply line Vcc, address signal lines A3, A2, and A1, and a reference power supply line Vss.

A feature of this exemplary embodiment is that the address signal line A1 connected to the line 215*g* of the second metal wiring layer is temporarily replaced by a line 213*k* of the first metal wiring layer via a contact 214*k* and the line 213*k* of the first metal wiring layer is made to extend for wiring and is connected to a gate line 206*b* via a contact 211*k*. This feature is available for the arrangement of a plurality of NAND decoders 201 according to this exemplary embodiment in order to readily arrange a plurality of address signal lines without increasing the area thereof, as illustrated in other exemplary embodiments described below.

Planar silicon layers 202*pa*, 202*na*, and 202*nb* are formed on top of an insulating film such as a buried oxide (BOX) film layer 201*z* disposed on a substrate. The planar silicon layers 202*pa*, 202*na*, and 202*nb* are formed as a p+ diffusion layer, an n+ diffusion layer, and an n+ diffusion layer, respectively, through impurity implantation or the like. Reference numeral 203 denotes a silicide layer disposed on surfaces of the planar silicon layers (202*pa*, 202*na*, and 202*nb*). Reference numerals 204*n*11, 204*n*12, and 204*n*13 denote n-type silicon pillars, and reference numerals 204*p*11, 204*p*12, and 204*p*13 denote p-type silicon pillars. Reference numeral 205 denotes a gate insulating film that surrounds the silicon pillars 204*n*11, 204*n*12, 204*n*13, 204*p*11, 204*p*12, and 204*p*13. Reference numeral 206 denotes a gate electrode, and reference numerals 206*a*, 206*b*, 206*c*, and 206*d* denote gate lines. The gate insulating film 205 is also formed to underlie the gate electrode 206 and the gate lines 206*a*, 206*b*, 206*c*, and 206*d*.

In top portions of the silicon pillars 204*n*11, 204*n*12, and 204*n*13, p+ diffusion layers 207*p*11, 207*p*12, and 207*p*13 are respectively formed through impurity implantation or the like. In top portions of the silicon pillars 204*p*11, 204*p*12, and 204*p*13, n+ diffusion layers 207*n*11, 207*n*12, and 207*n*13 are respectively formed through impurity implantation or the like. Reference numeral 208 denotes a silicon nitride film for protecting the gate insulating film 205, and reference numerals 209*p*11, 209*p*12, 209*p*13, 209*n*11, 209*n*12, and 209*n*13 denote silicide layers to be respectively connected to the p+ diffusion layers 207*p*11, 207*p*12, and 207*p*13 and the n+ diffusion layers 207*n*11, 207*n*12, and 207*n*13.

Reference numerals 210*p*11, 210*p*12, 210*p*13, 210*n*11, 210*n*12, and 210*n*13 denote contacts that respectively connect the silicide layers 209*p*11, 209*p*12, 209*p*13, 209*n*11, 209*n*12, and 209*n*13 to lines 213*b*, 213*b*, 213*b*, 213*b*, 213*c*, and 213*c* of the first metal wiring layer. Reference numeral 211*k* denotes a contact that connects the gate line 206*b* to the line 213*k* of the first metal wiring layer, reference numeral 211*m* denotes a contact that connects the gate line 206*c* to a line 213*m* of the first metal wiring layer, and reference numeral 211*n* denotes a contact that connects the gate line 206*d* to a line 213*n* of the first metal wiring layer. Reference numeral 212*a* denotes a contact that connects the silicide layer 203 connected to the p+ diffusion layer 202*pa* to a line 213*a* of the first metal wiring layer, and reference numeral 212*b* denotes a contact (in FIG. 13A, an arrangement of two contacts is illustrated) that connects the silicide layer 203 connected to the n+ diffusion layer 202*nb* to a line 213*d* of the first metal wiring layer.

Reference numeral 214*a* denotes a contact that connects the line 213*a* of the first metal wiring layer to the line 215*a* of the second metal wiring layer, reference numeral 214*b* denotes a contact that connects the line 213*d* of the first metal wiring layer to the line 215*j* of the second metal wiring layer, reference numeral 214*k* denotes a contact that connects the line 213*k* of the first metal wiring layer to the line 215*g* of the second metal wiring layer, reference numeral 214*m* denotes a contact that connects the line 213*m* of the first metal wiring layer to the line 215*e* of the second metal wiring layer, and reference numeral 214*n* denotes a contact that connects the line 213*n* of the first metal wiring layer to the line 215*c* of the second metal wiring layer.

The silicon pillar 204*n*11, the lower diffusion layer 202*pa*, the upper diffusion layer 207*p*11, the gate insulating film 205, and the gate electrode 206 constitute the PMOS transistor Tp11. The silicon pillar 204*n*12, the lower diffusion layer 202*pa*, the upper diffusion layer 207*p*12, the gate insulating film 205, and the gate electrode 206 constitute the PMOS transistor Tp12. The silicon pillar 204*n*13, the lower diffusion layer 202*pa*, the upper diffusion layer 207*p*13, the gate insulating film 205, and the gate electrode 206 constitute the PMOS transistor Tp13. The silicon pillar 204*p*11, the lower diffusion layer 202*na*, the upper diffusion layer 207*n*11, the gate insulating film 205, and the gate electrode 206 constitute the NMOS transistor Tn11. The silicon pillar 204*p*12, the lower diffusion layer 202*na*, the upper diffusion layer 207*n*12, the gate insulating film 205, and the gate electrode 206 constitute the NMOS transistor Tn12. The silicon pillar 204*p*13, the lower diffusion layer 202*nb*, the upper diffusion layer 207*n*13, the gate insulating film 205, and the gate electrode 206 constitute the NMOS transistor Tn13.

Further, the gate line 206*a* is connected to the gate electrode 206 of the PMOS transistor Tp11 and the gate electrode 206 of the NMOS transistor Tn11, and the gate line 206*b* is connected to the gate electrode 206 of the NMOS transistor Tn11. The gate line 206*c* is connected to the gate electrode 206 of the PMOS transistor Tp12 and the gate electrode 206 of the NMOS transistor Tn12, and the gate line 206*d* is connected in common to the gate electrode 206 of the PMOS transistor Tp13 and the gate electrode 206 of the NMOS transistor Tn13.

The p+ diffusion layer 207*p*11, which is the drain of the PMOS transistor Tp11, the p+ diffusion layer 207*p*12, which is the drain of the PMOS transistor Tp12, the p+ diffusion layer 207*p*13, which is the drain of the PMOS transistor Tp13, and the n+ diffusion layer 207*n*11, which is the drain of the NMOS transistor Tn11, are connected in common via the line 213*b* of the first metal wiring layer to serve as an output line DEC1. The lower diffusion layer 202*pa*, which is the sources of the PMOS transistor Tp11, the PMOS transistor Tp12, and the PMOS transistor Tp13, is connected in common by using the silicide layer 203. The silicide layer 203 is connected to the line 215*a* of the second metal wiring layer via the contact 212*a*, the line 213*a* of the first metal wiring layer, and the contact 214*a*, and the power supply Vcc is supplied to the line 215*a* of the second metal wiring layer. The lower diffusion layer 202*na*, which is a source region of the NMOS transistor Tn11, is connected to a drain region of the NMOS transistor Tn12 via the silicide layer 203, and the upper diffusion layer 207*n*12, which is a source region of the NMOS transistor Tn12, is connected to the line 213*c* of the first metal wiring layer via the silicide layer 209*n*12 and the contact 210*n*12. Further, a drain region of the NMOS transistor Tn13 is connected to the line 213*c* of the first metal wiring layer via the upper diffusion layer 207*n*13, the silicide layer 209*n*13, and the contact 210*n*13. Here, the source of the NMOS transistor Tn12 and the drain of the NMOS transistor Tn13 are connected to each other via the line 213*c* of the first metal wiring layer. Further, the lower diffusion layer 202*nb*, which is a source region of the NMOS transistor Tn13, is connected to the line 215*j* of the second metal wiring layer via the silicide layer 203, the contact 212*b*, the line 213*d* of the first metal wiring layer, and the contact 214*b*, and the reference power supply Vss is supplied to the line 215*j* of the second metal wiring layer. In FIG. 12A and FIGS. 13A to 13J, the contact 212*b*, the line 213*d* of the first metal wiring layer, and the contact 214*b* are placed in each of two, upper and lower portions.

The line 215*g* of the second metal wiring layer is supplied with an address signal A1. The line 215*g* is connected to the line 213*k* of the first metal wiring layer, which is arranged to extend, via the contact 214*k*. The line 215*g* is further connected to the gate line 206*b* via the contact 211*k*, and accordingly the address signal A1 is supplied to the gate electrode 206 of the NMOS transistor Tn11. The address signal A1 is also supplied to the gate electrode 206 of the PMOS transistor Tp11 via the gate line 206*a*.

The line 215*e* of the second metal wiring layer is supplied with an address signal A2. The line 215*e* of the second metal wiring layer is connected to the gate line 206*c* via the contact 214*m*, the line 213*m* of the first metal wiring layer, and the contact 211*m*, and accordingly the address signal A2 is supplied to the gate electrode 206 of the PMOS transistor Tp12 and the gate electrode 206 of the NMOS transistor Tn12.

The line 215*c* of the second metal wiring layer is supplied with an address signal A3. The line 215*c* of the second metal wiring layer is connected to the gate line 206*d* via the contact 214*n*, the line 213*n* of the first metal wiring layer, and the contact 211*n*, and accordingly the address signal A3 is supplied to the gate electrode 206 of the PMOS transistor Tp13 and the gate electrode 206 of the NMOS transistor Tn13.

It is to be noted that, in FIG. 13A, a size in the longitudinal direction (the second direction) is a minimum processing size determined by the size of an SGT, a margin between an SGT and a lower diffusion layer, and an interval between diffusion layers, and is defined as Ly. That is, in this exemplary embodiment, 3-input NAND decoders 201 are arranged vertically in an inverted configuration, thus allowing the gate line 206*c* or 206*d* of each of the 3-input NAND decoders 201 to be shared with an adjacent 3-input NAND decoder 201. Accordingly, a plurality of 3-input NAND decoders can be arranged adjacent to one another at a minimum pitch (minimum interval) Ly.

For the address signal A1, the line 213*k* of the first metal wiring layer, which replaces the line 215*g* of the second metal wiring layer, is connected to the gate line 206*b*. This configuration allows the arrangement position of the line 215*g* of the second metal wiring layer to be moved to any appropriate position between the line 215*e* of the second metal wiring layer and the line 215*j* of the second metal wiring layer in FIG. 12A. The movement of the arrangement position of the line 215*g* of the second metal wiring layer can be achieved by making the line 213*k* of the first metal wiring layer extend in the lateral direction (the first direction).

In this exemplary embodiment, the line 213*k* of the first metal wiring layer is arranged to extend for the supply of the address signal A1. Alternatively, this technique may be applied to the supply of the address signal A2 or A3.

According to this exemplary embodiment, six SGTs constituting a 3-input NAND decoder are arranged in a line in a first direction, the source regions of the PMOS transistors Tp11, Tp12, and Tp13 are connected in common by using the lower diffusion layer (202*pa*) and the silicide layer 203, and the power supply line Vcc, the reference power supply line Vss, and the address signal lines A1, A2, and A3 are arranged to extend in a second direction perpendicular to the first direction. This configuration provides a semiconductor device including a 3-input NAND decoder with a minimum area without using any extra lines or contact regions. In addition, a line of the second metal wiring layer to which an address signal is supplied is replaced with a line of the first metal wiring layer that is arranged to extend, and the line of the first metal wiring layer is connected to a gate line, thereby increasing flexibility in how the address signal is supplied.

Fifth Exemplary Embodiment

Equivalent Circuit Applicable to Exemplary Embodiment of Present Invention

Figure 14:
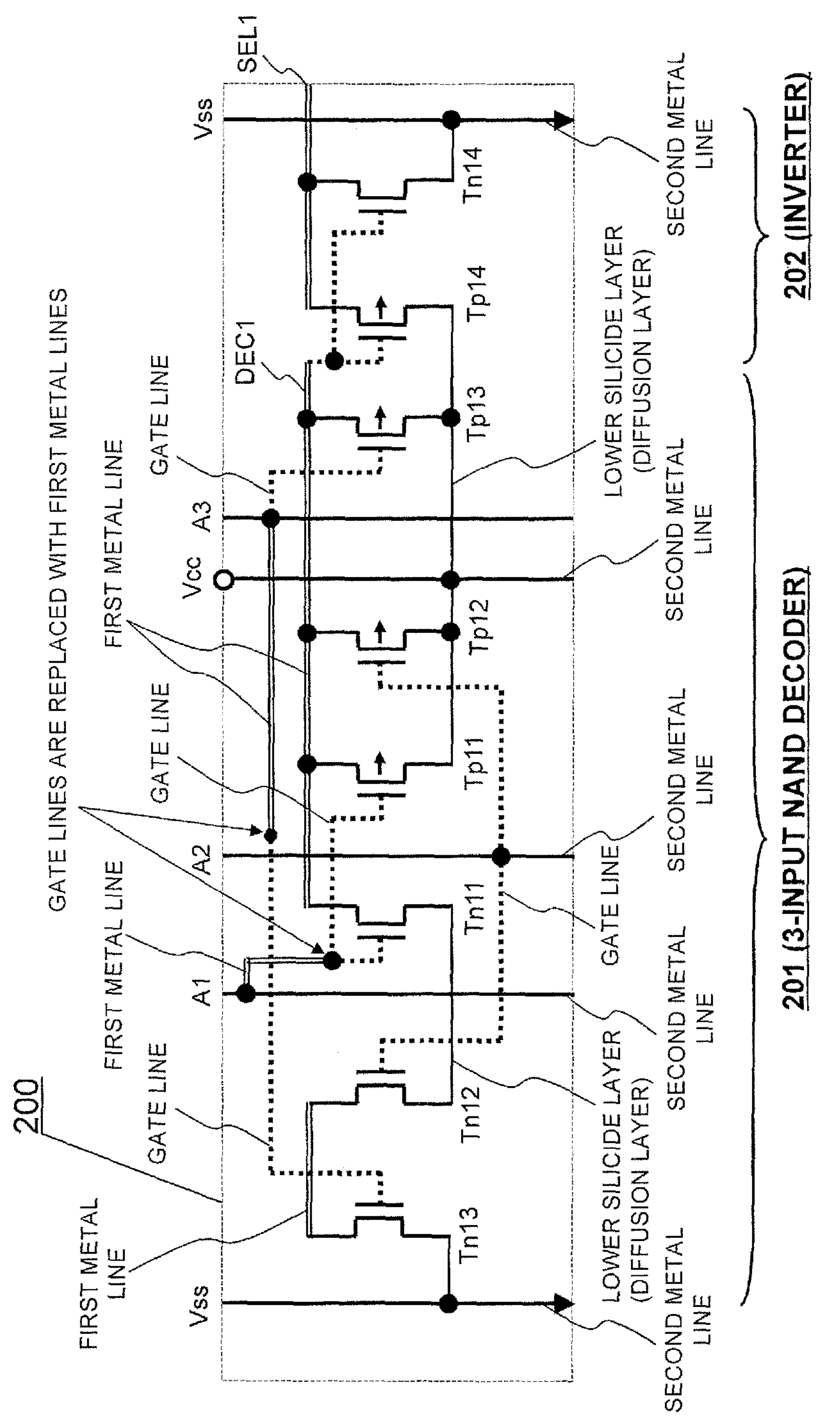
FIG. 14 is an equivalent circuit diagram illustrating a decoder according to a fifth exemplary embodiment of the present invention.

FIG. 14 illustrates a circuit diagram of a decoder arranged in accordance with an arrangement according to an exemplary embodiment. The decoder includes a 3-input NAND decoder and an inverter applicable to the present invention.

In FIG. 14, a 3-input NAND decoder 201 is the same or substantially the same as that illustrated in FIG. 11. An inverter 202 including a PMOS transistor Tp14 and an NMOS transistor Tn14 is added to the configuration illustrated in FIG. 11 to form a decoder 200. The gate of the PMOS transistor Tp14 and the gate of the NMOS transistor Tn14 are connected in common to the output line DEC1 of the 3-input NAND decoder 201. The drain of the PMOS transistor Tp14 and the drain of the NMOS transistor Tn14 are connected in common to serve as a decoder output SEL1. The source of the PMOS transistor Tp14 and the source of the NMOS transistor Tn14 are respectively connected to a power supply Vcc and reference power supply Vss.

The source of the PMOS transistor Tp14 is arranged and connected in common to those of the PMOS transistors Tp11, Tp12, and Tp13 via a lower silicide layer.

As described above, the addition of the inverter 202 to the NAND decoder 201 with a negative logic output results in the output SEL1 of the decoder 200 being a positive logic output (the output of a selected decoder is logic "1"). Here, the inverter 202 has both a logic inversion function and a buffer function (for amplifying the driving capability of the NAND decoder 201).

Figure 15A:
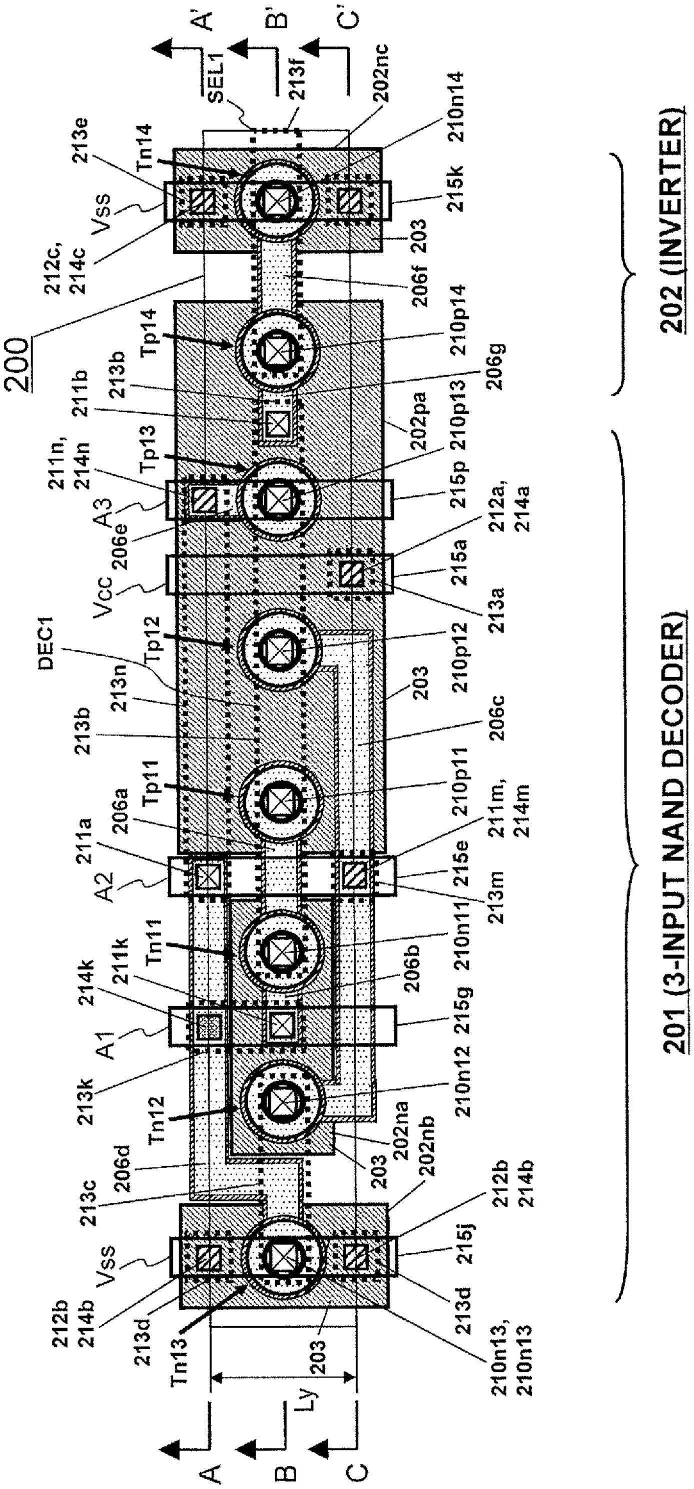
FIG. 15A is a plan view of the decoder according to the fifth exemplary embodiment of the present invention.

FIGS. 15A and 15B and FIGS. 16A, 16B, and 16C illustrate a fifth exemplary embodiment as an exemplary embodiment in which the equivalent circuit illustrated in FIG. 14 is applied to the present invention. FIG. 15A is a plan view of the layout (arrangement) of the 3-input NAND decoder 201 and the inverter 202 according to this exemplary embodiment.

Figure 15B:
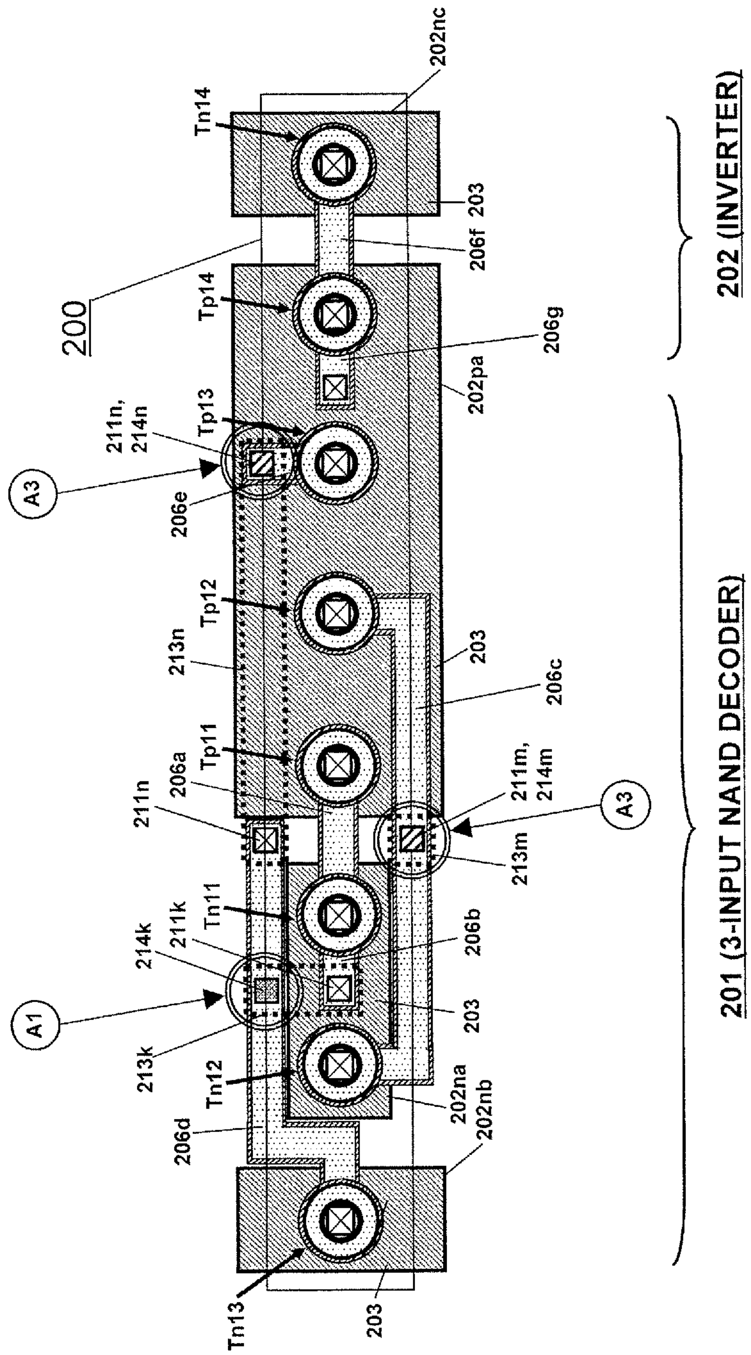
FIG. 15B is a plan view of the decoder according to the fifth exemplary embodiment of the present invention.

FIG. 15B illustrates lower diffusion layers, transistors, and gate lines depicted in the plan view of FIG. 15A to facilitate the understanding of the connections between the address signal lines and the gate lines.

Figure 16A:
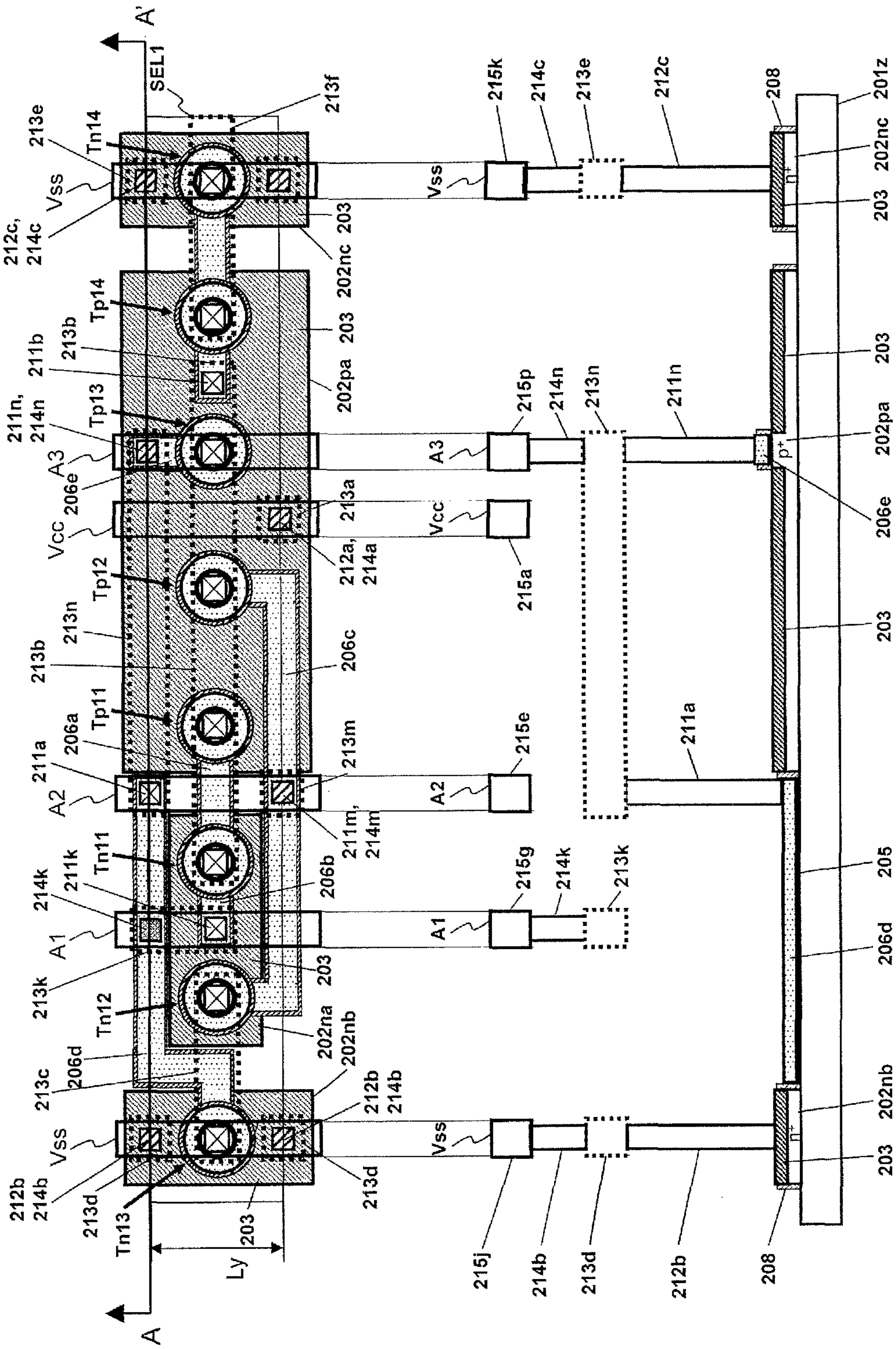
FIG. 16A is a cross-sectional view of the decoder according to the fifth exemplary embodiment of the present invention.
Figure 16B:
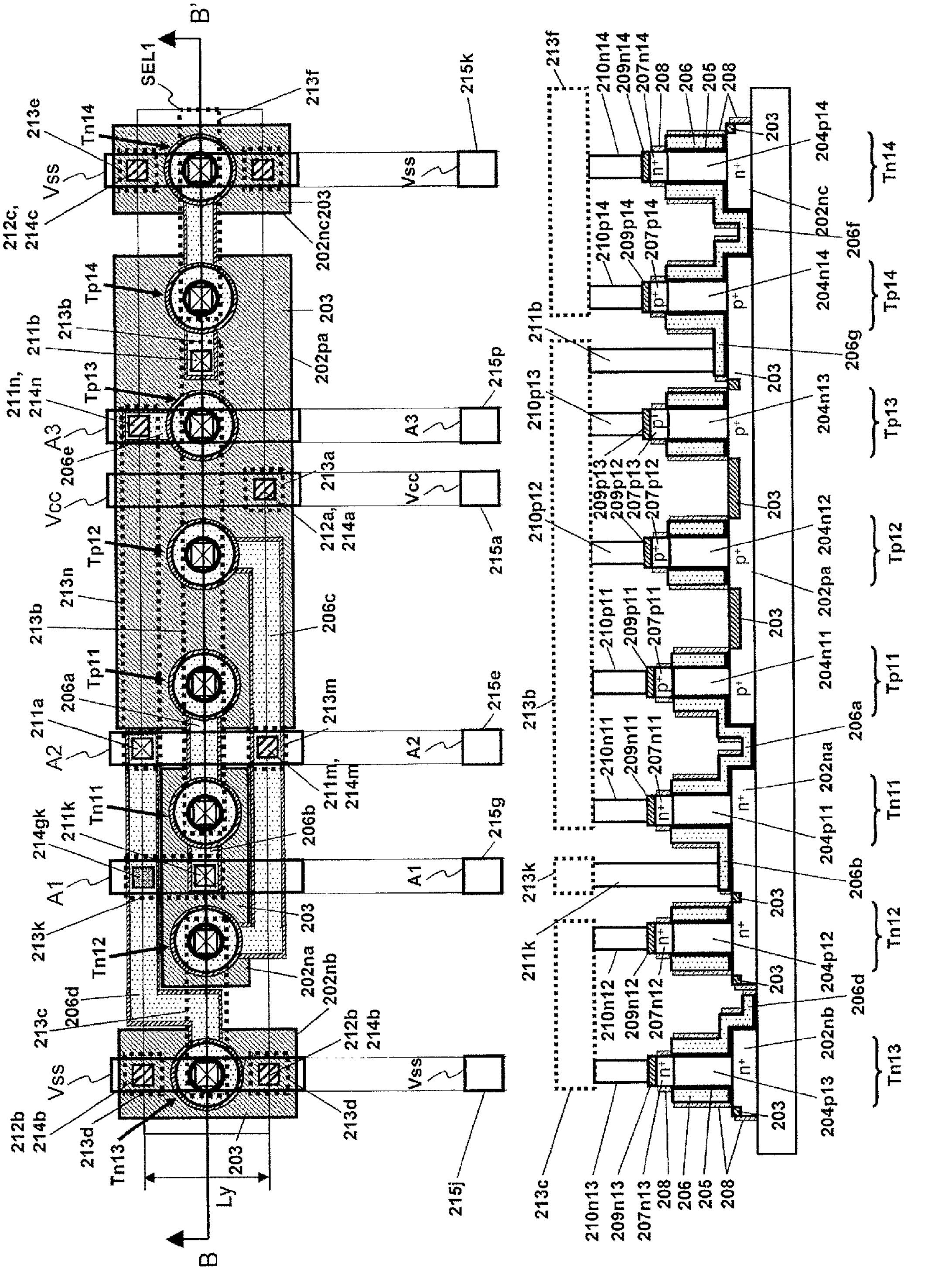
FIG. 16B is a cross-sectional view of the decoder according to the fifth exemplary embodiment of the present invention.
Figure 16C:
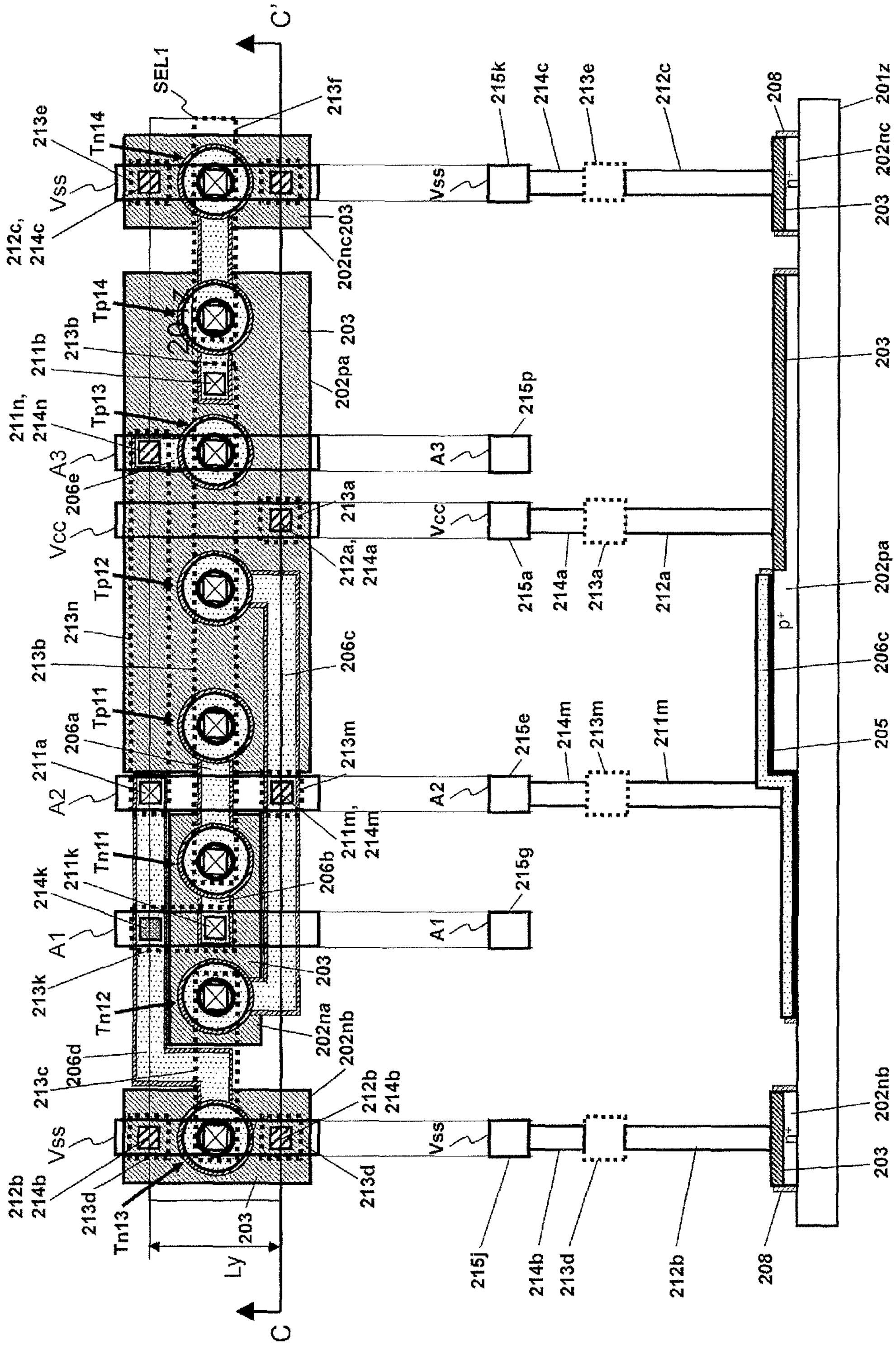
FIG. 16C is a cross-sectional view of the decoder according to the fifth exemplary embodiment of the present invention.

FIG. 16A is a cross-sectional view taken along the cut-line A-A' in FIG. 15A, FIG. 16B is a cross-sectional view taken along the cut-line B-B' in FIG. 15A, and FIG. 16C is a cross-sectional view taken along the cut-line C-C' in FIG. 15A.

FIG. 15A illustrates a configuration in which the inverter 202 including the PMOS transistor Tp14 and the NMOS transistor Tn14 is added to the configuration illustrated in FIG. 12A, and is different from FIG. 12A in the method of connecting the gate electrodes of the PMOS transistor Tp13 and the NMOS transistor Tn13. Specifically, in FIG. 12A (the fourth exemplary embodiment), the gate electrode 206 of the PMOS transistor Tp13 and the gate electrode 206 of the NMOS transistor Tn13 are connected directly to each other by using the gate line 206*d*, while, in FIG. 15A (the fifth exemplary embodiment), separate gate lines 206*d* and 206*e* are connected to each other by using a line 213*n* of the first metal wiring layer. In FIG. 15A, the line 213*n* of the first metal wiring layer is made to extend in a lateral direction (first direction). This arrangement increases the flexibility of arrangement of a line 215*p* of the second metal wiring layer along which an address signal A3 is supplied, as described below.

In FIGS. 15A and 15B and FIGS. 16A, 16B, and 16C, portions having the same or substantially the same structures as those illustrated in FIG. 12A and FIG. 13A to FIG. 13J are denoted by equivalent reference numerals in the 200s.

In FIG. 15A, the transistors constituting the NAND decoder 201 and the inverter 202 illustrated in FIG. 14, namely, the NMOS transistor Tn14, the PMOS transistor Tp14, the PMOS transistors Tp13, Tp12, and Tp11, and the NMOS transistors Tn11, Tn12, and Tn13, are arranged in a line in a lateral direction (a first direction) from right to left in this figure.

Further, lines 215*k*, 215*p*, 215*a*, 215*e*, 215*g*, and 215*j* of the second metal wiring layer are arranged to extend in a longitudinal direction (a second direction perpendicular to the first direction) and respectively form a reference power supply line Vss, an address signal line A3, a power supply line Vcc, address signal lines A2 and A1, and a reference power supply line Vss.

A feature of this exemplary embodiment is that, as in FIG. 12A, the address signal line A1 connected to the line 215*g* of the second metal wiring layer is temporarily replaced by a line 213*k* of the first metal wiring layer via a contact 214*k* and the line 213*k* of the first metal wiring layer is made to extend for wiring and is connected to the gate line 206*b* via a contact 211*k*. Another feature of this exemplary embodiment is that the address signal line A3 connected to the line 215*p* of the second metal wiring layer is temporarily replaced by the line 213*n* of the first metal wiring layer via a contact 214*n* and the line 213*n* of the first metal wiring layer is made to extend for wiring and is connected to the gate line 206*d* via a contact 211*a*. This feature is available for the arrangement of a plurality of decoders 200 according to this exemplary embodiment in order to readily arrange a plurality of address signal lines without increasing the area thereof, as illustrated in another exemplary embodiment described below. Still another feature of this exemplary embodiment is that a lower diffusion layer (202*pa*) that is a source region of the PMOS transistor Tp14 constituting the inverter 202 is made common to the lower diffusion layer (202*pa*), which is the source regions of the PMOS transistors Tp11, Tp12, and Tp13 of the 3-input NAND decoder 201, thereby allowing the line (215*a*) of the second metal wiring layer along which the power supply Vcc is supplied to be rendered common, which results in a reduction in the number of lines of the second metal wiring layer.

This configuration will be described in detail hereinafter.

Planar silicon layers 202*pa*, 202*na*, 202*nb*, and 202*nc* are formed on top of an insulating film such as a buried oxide (BOX) film layer 201*z* disposed on a substrate. The planar silicon layers 202*pa*, 202*na*, 202*nb*, and 202*nc* are formed as a p+ diffusion layer, an n+ diffusion layer, an n+ diffusion layer, and an n+ diffusion layer, respectively, through impurity implantation or the like. Reference numeral 203 denotes a silicide layer disposed on surfaces of the planar silicon layers (202*pa*, 202*na*, 202*nb*, and 202*nc*). Reference numerals 204*n*11, 204*n*12, 204*n*13, and 204*n*14 denote n-type silicon pillars, and reference numerals 204*p*11, 204*p*12, 204*p*13, and 204*p*14 denote p-type silicon pillars. Reference numeral 205 denotes a gate insulating film that surrounds the silicon pillars 204*n*11, 204*n*12, 204*n*13, 204*n*14, 204*p*11, 204*p*12, 204*p*13, and 204*p*14. Reference numeral 206 denotes a gate electrode, and reference numerals 206*a*, 206*b*, 206*c*, 206*d*, 206*e*, 206*f*, and 206*g* denote gate lines. The gate insulating film 205 is also formed to underlie the gate electrode 206 and the gate lines 206*a*, 206*b*, 206*c*, 206*d*, 206*e*, 206*f*, and 206*g*.

In top portions of the silicon pillars 204*n*11, 204*n*12, 204*n*13, and 204*n*14, p+ diffusion layers 207*p*11, 207*p*12, 207*p*13, and 207*p*14 are respectively formed through impurity implantation or the like. In top portions of the silicon pillars 204*p*11, 204*p*12, 204*p*13, and 204*p*14, n+ diffusion layers 207*n*11, 207*n*12, 207*n*13, and 207*n*14 are respectively formed through impurity implantation or the like. Reference numeral 208 denotes a silicon nitride film for protecting the gate insulating film 205, and reference numerals 209*p*11, 209*p*12, 209*p*13, 209*p*14, 209*n*11, 209*n*12, 209*n*13, and 209*n*14 denote silicide layers to be respectively connected to the p+ diffusion layers 207*p*11, 207*p*12, 207*p*13, and 207*p*14 and the n+ diffusion layers 207*n*11, 207*n*12, 207*n*13, and 207*n*14.

Reference numerals 210*p*11, 210*p*12, 210*p*13, 210*p*14, 210*n*11, 210*n*12, 210*n*13, and 210*n*14 denote contacts that respectively connect the silicide layers 209*p*11, 209*p*12, 209*p*13, 209*p*14, 209*n*11, 209*n*12, 209*n*13, and 209*n*14 to lines 213*b*, 213*b*, 213*b*, 213*f*, 213*b*, 213*c*, 213*c*, and 213*f* of the first metal wiring layer. Reference numeral 211*k* denotes a contact that connects the gate line 206*b* to the line 213*k* of the first metal wiring layer, reference numeral 211*m* denotes a contact that connects the gate line 206*c* to the line 213*m* of the first metal wiring layer, and reference numeral 211*n* denotes a contact that connects the gate line 206*e* to the line 213*n* of the first metal wiring layer. Reference numeral 211*a* denotes a contact that connects the gate line 206*d* to the line 213*n* of the first metal wiring layer, and reference numeral 211*b* denotes a contact that connects the gate line 206*g* to the line 213*b* of the first metal wiring layer. Reference numeral 212*a* denotes a contact that connects the silicide layer 203 connected to the p+ diffusion layer 202*pa* to a line 213*a* of the first metal wiring layer, reference numeral 212*b* denotes a contact (in FIG. 15A, a vertical arrangement of two contacts is illustrated) that connects the silicide layer 203 connected to the n+ diffusion layer 202*nb* to a line 213*d* of the first metal wiring layer, and reference numeral 212*c* denotes a contact (in FIG. 15A, a vertical arrangement of two contacts is illustrated) that connects the silicide layer 203 connected to the n+ diffusion layer 202*nc* to a line 213*e* of the first metal wiring layer.

Reference numeral 214*a* denotes a contact that connects the line 213*a* of the first metal wiring layer to the line 215*a* of the second metal wiring layer, reference numeral 214*b* denotes a contact that connects the line 213*d* of the first metal wiring layer to the line 215*j* of the second metal wiring layer, and reference numeral 214*c* denotes a contact that connects the line 213*e* of the first metal wiring layer to the line 215*k* of the second metal wiring layer. Reference numeral 214*k* denotes a contact that connects the line 213*k* of the first metal wiring layer to the line 215*g* of the second metal wiring layer, reference numeral 214*m* denotes a contact that connects the line 213*m* of the first metal wiring layer to the line 215*e* of the second metal wiring layer, and reference numeral 214*n* denotes a contact that connects the line 213*n* of the first metal wiring layer to the line 215*p* of the second metal wiring layer.

The silicon pillar 204*n*11, the lower diffusion layer 202*pa*, the upper diffusion layer 207*p*11, the gate insulating film 205, and the gate electrode 206 constitute the PMOS transistor Tp11. The silicon pillar 204*n*12, the lower diffusion layer 202*pa*, the upper diffusion layer 207*p*12, the gate insulating film 205, and the gate electrode 206 constitute the PMOS transistor Tp12. The silicon pillar 204*n*13, the lower diffusion layer 202*pa*, the upper diffusion layer 207*p*13, the gate insulating film 205, and the gate electrode 206 constitute the PMOS transistor Tp13. The silicon pillar 204*n*14, the lower diffusion layer 202*pa*, the upper diffusion layer 207*p*14, the gate insulating film 205, and the gate electrode 206 constitute the PMOS transistor Tp14. The silicon pillar 204*p*11, the lower diffusion layer 202*na*, the upper diffusion layer 207*n*11, the gate insulating film 205, and the gate electrode 206 constitute the NMOS transistor Tn11. The silicon pillar 204*p*12, the lower diffusion layer 202*na*, the upper diffusion layer 207*n*12, the gate insulating film 205, and the gate electrode 206 constitute the NMOS transistor Tn12. The silicon pillar 204*p*13, the lower diffusion layer 202*nb*, the upper diffusion layer 207*n*13, the gate insulating film 205, and the gate electrode 206 constitute the NMOS transistor Tn13. The silicon pillar 204*p*14, the lower diffusion layer 202*nc*, the upper diffusion layer 207*n*14, the gate insulating film 205, and the gate electrode 206 constitute the NMOS transistor Tn14.

Further, the gate line 206*a* is connected to the gate electrode 206 of the PMOS transistor Tp11 and the gate electrode 206 of the NMOS transistor Tn11, and the gate line 206*b* is further connected to the gate electrode 206 of the NMOS transistor Tn11. The gate line 206*c* is connected to the gate electrode 206 of the PMOS transistor Tp12 and the gate electrode 206 of the NMOS transistor Tn12. The gate line 206*e* is connected to the gate electrode 206 of the PMOS transistor Tp13, and the gate line 206*d* is connected to the gate electrode 206 of the NMOS transistor Tn13. The gate line 206*f* is connected to the gate electrode 206 of the PMOS transistor Tp14 and the gate electrode 206 of the NMOS transistor Tn14, and the gate line 206*g* is further connected to the gate electrode 206 of the PMOS transistor Tp14.

The p+ diffusion layer 207*p*11, which is the drain of the PMOS transistor Tp11, the p+ diffusion layer 207*p*12, which is the drain of the PMOS transistor Tp12, the p+ diffusion layer 207*p*13, which is the drain of the PMOS transistor Tp13, and the n+ diffusion layer 207*n*11, which is the drain of the NMOS transistor Tn11, are connected in common via the line 213*b* of the first metal wiring layer to serve as an output line DEC1. The lower diffusion layer 202*pa*, which is the sources of the PMOS transistor Tp11, the PMOS transistor Tp12, the PMOS transistor Tp13, and the PMOS transistor Tp14, is connected in common by using the silicide layer 203. The silicide layer 203 is connected to the line 215*a* of the second metal wiring layer via the contact 212*a*, the line 213*a* of the first metal wiring layer, and the contact 214*a*, and the power supply Vcc is supplied to the line 215*a* of the second metal wiring layer. The lower diffusion layer 202*na*, which is a source region of the NMOS transistor Tn11, is connected to a drain region of the NMOS transistor Tn12 via the silicide layer 203, and the upper diffusion layer 207*n*12, which is a source region of the NMOS transistor Tn12, is connected to the line 213*c* of the first metal wiring layer via the silicide layer 209*n*12 and the contact 210*n*12. Further, a drain region of the NMOS transistor Tn13 is connected to the line 213*c* of the first metal wiring layer via the upper diffusion layer 207*n*13, the silicide layer 209*n*13, and the contact 210*n*13. Here, the source of the NMOS transistor Tn12 and the drain of the NMOS transistor Tn13 are connected to each other via the line 213*c* of the first metal wiring layer. Further, the lower diffusion layer 202*nb*, which is a source region of the NMOS transistor Tn13, is connected to the line 215*j* of the second metal wiring layer via the silicide layer 203, the contact 212*b*, the line 213*d* of the first metal wiring layer, and the contact 214*b*, and the reference power supply Vss is supplied to the line 215*j* of the second metal wiring layer. In FIG. 15A, the contact 212*b*, the line 213*d* of the first metal wiring layer, and the contact 214*b* are placed in each of two, upper and lower portions. The lower diffusion layer 202*nc*, which is a source region of the NMOS transistor Tn14, is connected to the line 215*k* of the second metal wiring layer via the silicide layer 203, the contact 212*c*, the line 213*e* of the first metal wiring layer, and the contact 214*c*, and the reference power supply Vss is supplied to the line 215*k* of the second metal wiring layer. In FIG. 15A, the contact 212*c*, the line 213*e* of the first metal wiring layer, and the contact 214*c* are placed in each of two, upper and lower portions. The drain of the PMOS transistor Tp14 and the drain of the NMOS transistor Tn14 are connected in common to the line 213*f* of the first metal wiring layer via the upper diffusion layer 207*p*14, the silicide layer 209*p*14, and the contact 210*p*14 and via the upper diffusion layer 207*n*14, the silicide layer 209*n*14, and the contact 210*n*14, respectively, to serve as an output SEL1 of the decoder 200.

The line 215*g* of the second metal wiring layer is supplied with an address signal A1. The line 215*g* is connected to the line 213*k* of the first metal wiring layer, which is arranged to extend, via the contact 214*k*. The line 215*g* is further connected to the gate line 206*b* via the contact 211*k*, and accordingly the address signal A1 is supplied to the gate electrode 206 of the NMOS transistor Tn11. The address signal A1 is also supplied to the gate electrode 206 of the PMOS transistor Tp11 via the gate line 206*a*.

The line 215*e* of the second metal wiring layer is supplied with an address signal A2. The line 215*e* of the second metal wiring layer is connected to the gate line 206*c* via the contact 214*m*, the line 213*m* of the first metal wiring layer, and the contact 211*m*, and accordingly the address signal A2 is supplied to the gate electrode 206 of the PMOS transistor Tp12 and the gate electrode 206 of the NMOS transistor Tn12.

The line 215*p* of the second metal wiring layer is supplied with an address signal A3. The line 215*p* of the second metal wiring layer is connected to the gate line 206*e* via the contact 214*n*, the line 213*n* of the first metal wiring layer, and the contact 211*n*, and is then connected to the gate electrode 206 of the PMOS transistor Tp13. The line 213*n* of the first metal wiring layer is arranged to extend leftward and is connected to the gate line 206*d* via the contact 211*a*. The gate line 206*d* is connected to the gate electrode 206 of the NMOS transistor Tn13.

It is to be noted that, in FIG. 15A, a size in the longitudinal direction (the second direction) is a minimum processing size determined by the size of an SGT, a margin between an SGT and a lower diffusion layer, and an interval between diffusion layers, and is defined as Ly. That is, in this exemplary embodiment, decoders 200, each including the 3-input NAND decoder 201 and the inverter 202, are arranged vertically in an inverted configuration, thus allowing the gate lines 206*c*, 206*d*, and 206*e* to be shared with adjacent decoders 200. Accordingly, a plurality of decoders can be arranged adjacent to one another at a minimum pitch (minimum interval) Ly.

For the address signal A1, the line 213*k* of the first metal wiring layer, which replaces the line 215*g* of the second metal wiring layer, is connected to the gate line 206*b*. This configuration allows the arrangement position of the line 215*g* of the second metal wiring layer to be moved to any appropriate position between the line 215*e* of the second metal wiring layer and the line 215*j* of the second metal wiring layer in FIG. 15A. The movement of the arrangement position of the line 215*g* of the second metal wiring layer can be achieved by making the line 213*k* of the first metal wiring layer extend in the lateral direction (the first direction).

For the address signal A3, furthermore, the line 213*n* of the first metal wiring layer, which replaces the line 215*p* of the second metal wiring layer, is connected to the gate line 206*e* or the gate line 206*d*. This configuration allows the arrangement position of the line 215*p* of the second metal wiring layer to be moved to any appropriate position between the line 215*k* of the second metal wiring layer and the line 215*a* of the second metal wiring layer in FIG. 15A.

In this exemplary embodiment, for the address signal A2, the line 213*m* of the first metal wiring layer is not arranged to extend. The line 213*m* of the first metal wiring layer may be arranged to extend in a manner similar to that for the address signal A1 or A3.

According to this exemplary embodiment, six SGTs constituting a 3-input NAND decoder (201) and two SGTs constituting an inverter (202) are arranged in a line in a first direction, the source regions of the PMOS transistors Tp11, Tp12, Tp13, and Tp14 are connected in common via the lower diffusion layer (202*pa*) and the silicide layer 203, and the power supply line Vcc, the reference power supply line Vss, and the address signal lines A1, A2, and A3 are arranged to extend in a second direction perpendicular to the first direction. This configuration provides a semiconductor device including a decoder (200) formed of the 3-input NAND decoder and the inverter with a minimum area without using any extra lines or contact regions. In addition, a line of the second metal wiring layer to which an address signal is supplied is replaced with a line of the first metal wiring layer that is arranged to extend, and the line of the first metal wiring layer is connected to a gate line, thereby increasing flexibility in how the address signal is supplied.

Sixth Exemplary Embodiment

Equivalent Circuit Applicable to Exemplary Embodiment of Present Invention

Figure 17A:
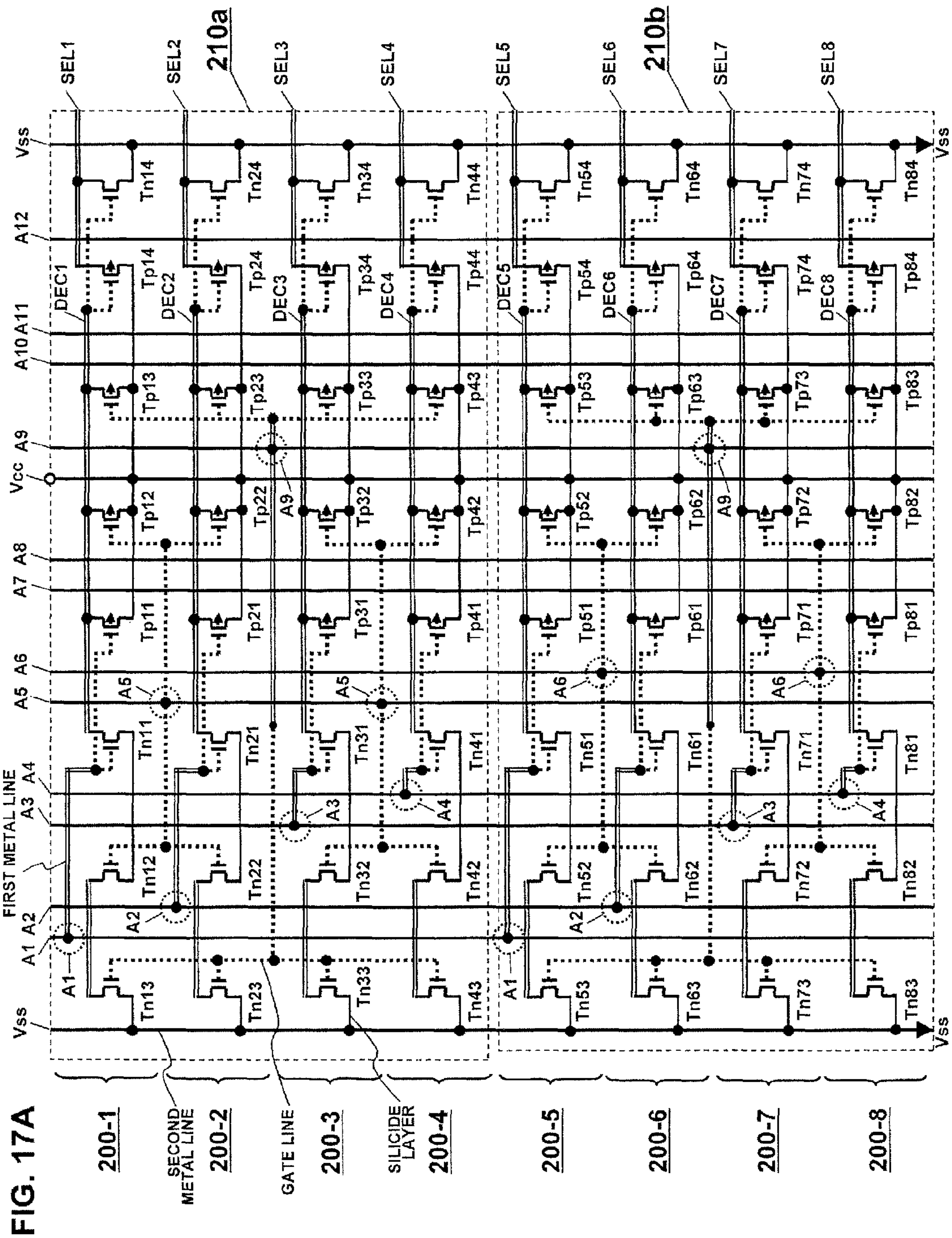
FIG. 17A is an equivalent circuit diagram illustrating a decoder according to a sixth exemplary embodiment of the present invention.
Figure 17B:
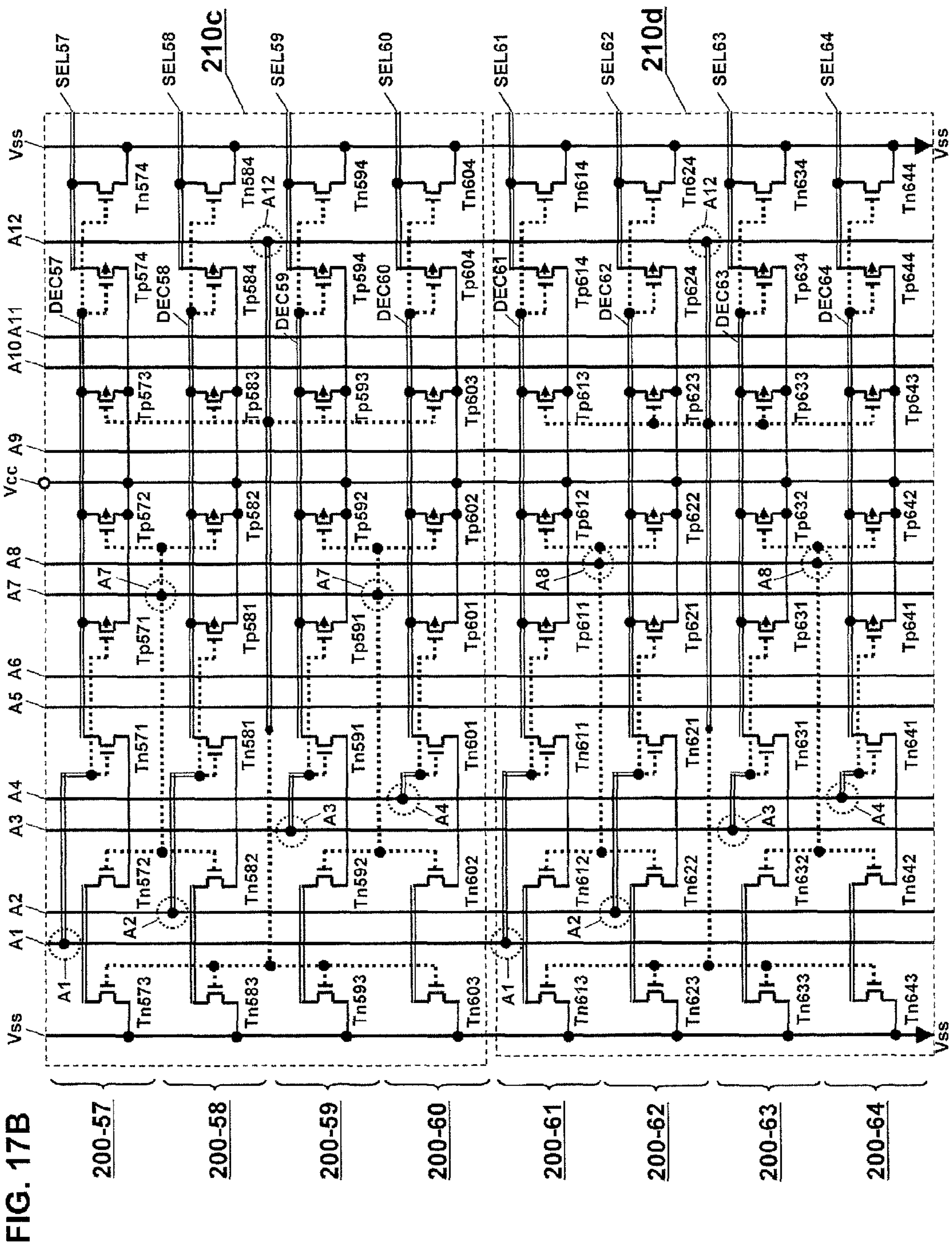
FIG. 17B is an equivalent circuit diagram illustrating the decoder according to the sixth exemplary embodiment of the present invention.

FIGS. 17A and 17B illustrate an equivalent circuit diagram of decoders, each constructed by arranging a plurality of 3-input NAND decoders and a plurality of inverters applicable to the present invention. The illustration is based on an arrangement and connection method according to an exemplary embodiment. As in FIG. 14, lines in silicide layers, gate lines, lines in the first metal wiring layer, and lines in the second metal wiring layer are distinguishably illustrated.

Twelve address signal lines A1, A2, A3, A4, A5, A6, A7, A8, A9, A10, A11, and A12 are provided, in which the address signal lines A1 to A4 are selectively connected to the gate of a PMOS transistor Tpk1 (where k denotes a natural number) and the gate of an NMOS transistor Tnk1, the address signal lines A5 to A8 are selectively connected to the gate of a PMOS transistor Tpk2 and the gate of an NMOS transistor Tnk2, and the address signal lines A9 to A12 are selectively connected to the gate of a PMOS transistor Tpk3 and the gate of an NMOS transistor Tnk3. Sixty-four decoders 200-1 to 200-64 are formed by using the twelve address signals A1 to A12.

Note that, as representatives, the eight decoders 200-1 to 200-8 are illustrated in FIG. 17A and the eight decoders 200-57 to 200-64 are illustrated in FIG. 17B since all the sixty-four decoders are difficult to depict in the drawings.

In FIG. 17A, the following connections are provided. The address signal lines A1, A5, and A9 are connected to the decoder 200-1. The address signal lines A2, A5, and A9 are connected to the decoder 200-2. The address signal lines A3, A5, and A9 are connected to the decoder 200-3. The address signal lines A4, A5, and A9 are connected to the decoder 200-4. The address signal lines A1, A6, and A9 are connected to the decoder 200-5. The address signal lines A2, A6, and A9 are connected to the decoder 200-6. The address signal lines A3, A6, and A9 are connected to the decoder 200-7. The address signal lines A4, A6, and A9 are connected to the decoder 200-8.

Further, in FIG. 17B, the following connections are provided. The address signal lines A1, A7, and A12 are connected to the decoder 200-57. The address signal lines A2, A7, and A12 are connected to the decoder 200-58. The address signal lines A3, A7, and A12 are connected to the decoder 200-59. The address signal lines A4, A7, and A12 are connected to the decoder 200-60. The address signal lines A1, A8, and A12 are connected to the decoder 200-61. The address signal lines A2, A8, and A12 are connected to the decoder 200-62. The address signal lines A3, A8, and A12 are connected to the decoder 200-63. The address signal lines A4, A8, and A12 are connected to the decoder 200-64.

Portions at which address signal lines are connected are indicated by the broken-line circles.

As described below, in FIG. 17A, the address signal line A5 is connected in common to the decoders 200-1 and 200-2 and is also connected in common to the decoders 200-3 and 200-4. The address signal line A6 is connected in common to the decoders 200-5 and 200-6 and is also connected in common to the decoders 200-7 and 200-8. Further, in FIG. 17B, the address signal line A7 is connected in common to the decoders 200-57 and 200-58 and is also connected in common to the decoders 200-59 and 200-60. The address signal line A8 is connected in common to the decoders 200-61 and 200-62 and is also connected in common to the decoders 200-63 and 200-64.

In FIGS. 17A and 17B, as described in detail below, the address signal lines A1 to A4 are temporarily connected to lines of a first metal wiring layer through lines of a second metal wiring layer arranged to extend in the longitudinal direction (the second direction), and are then connected to gate lines. Further, in FIG. 17B, the address signal line A12 is also temporarily connected to a line of the first metal wiring layer from a line of the second metal wiring layer arranged to extend in the longitudinal direction (the second direction), and is then connected to a gate line.

FIGS. 18A and 18B illustrate an address map of the sixty-four decoders according to this exemplary embodiment. An address signal line to be connected to each of the decoder outputs DEC1/SEL1 to DEC64/SEL64 is marked with a circle. Connections are made by using contacts, as described below.

Figure 19A:
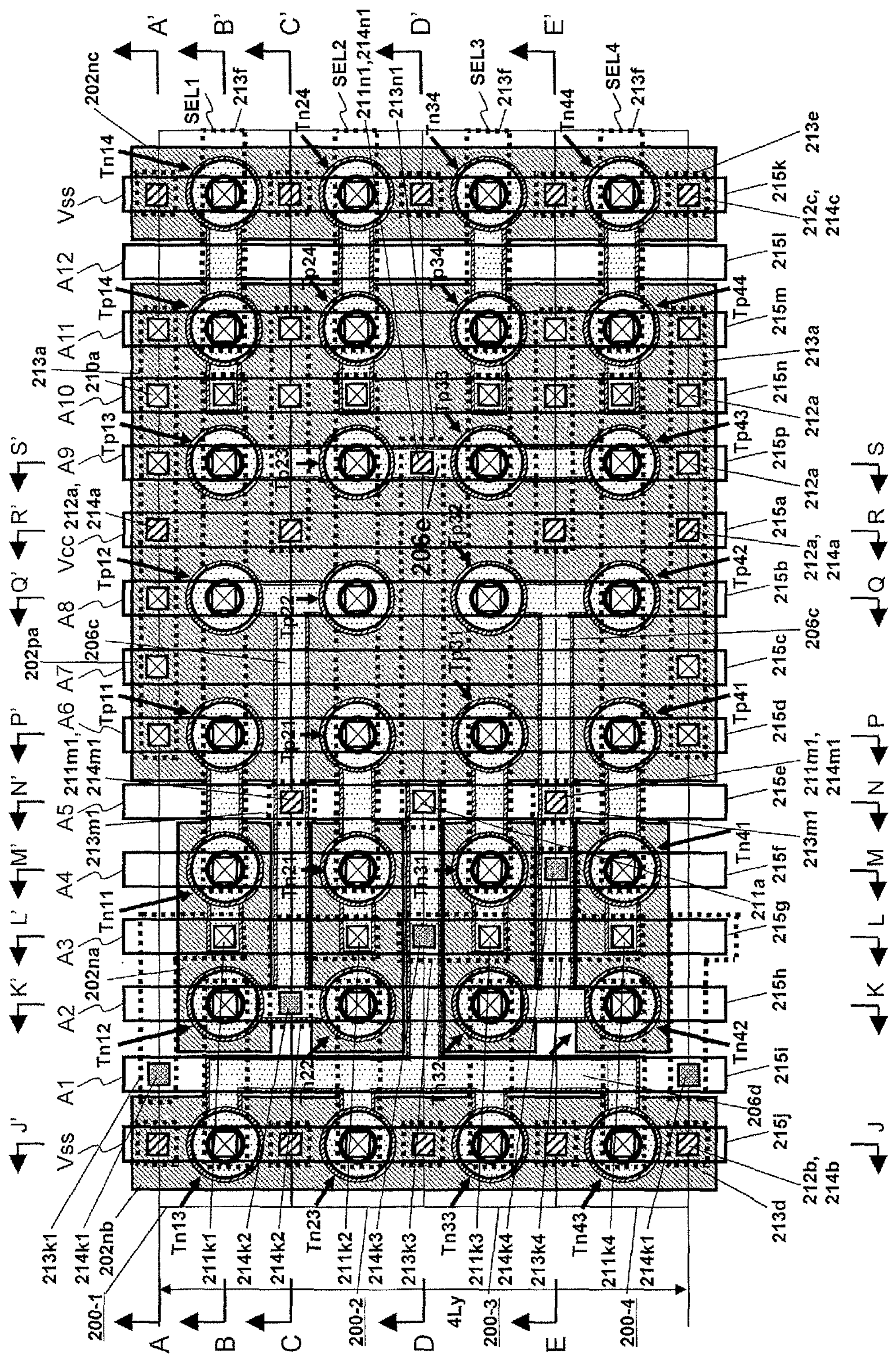
FIG. 19A is a plan view of the decoder according to the sixth exemplary embodiment of the present invention.
Figure 19B:
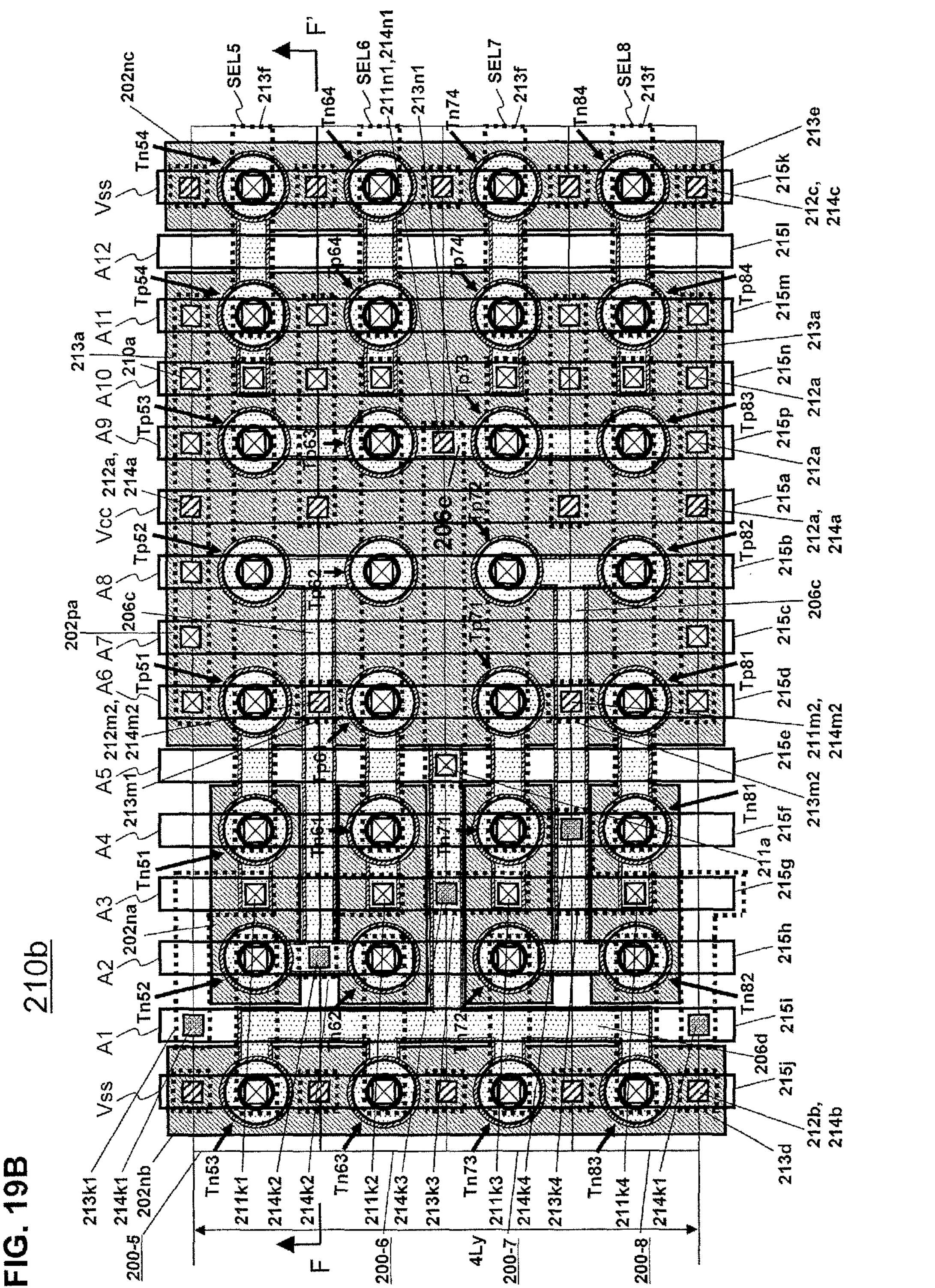
FIG. 19B is a plan view of the decoder according to the sixth exemplary embodiment of the present invention.
Figure 19C:
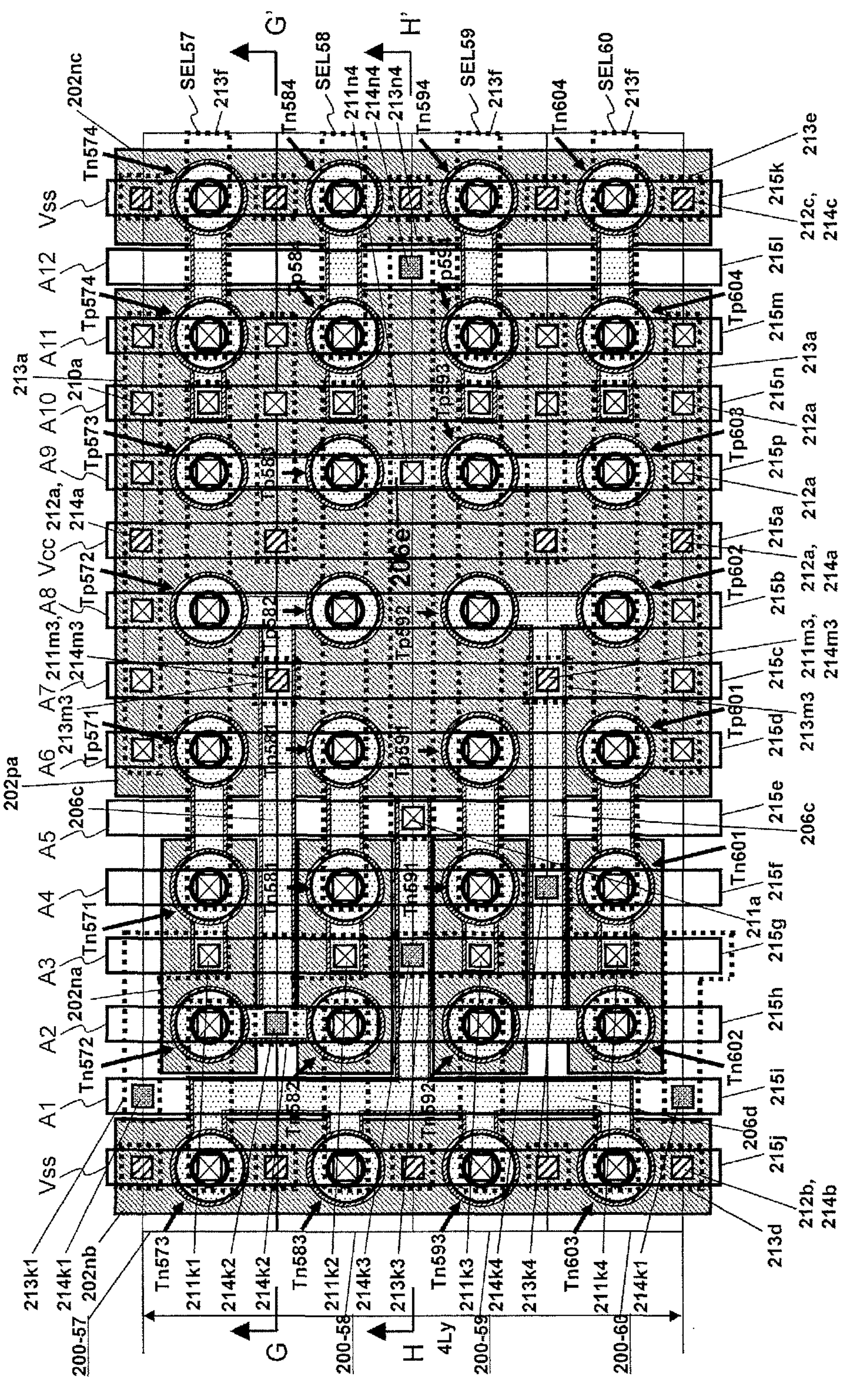
FIG. 19C is a plan view of the decoder according to the sixth exemplary embodiment of the present invention.
Figure 19D:
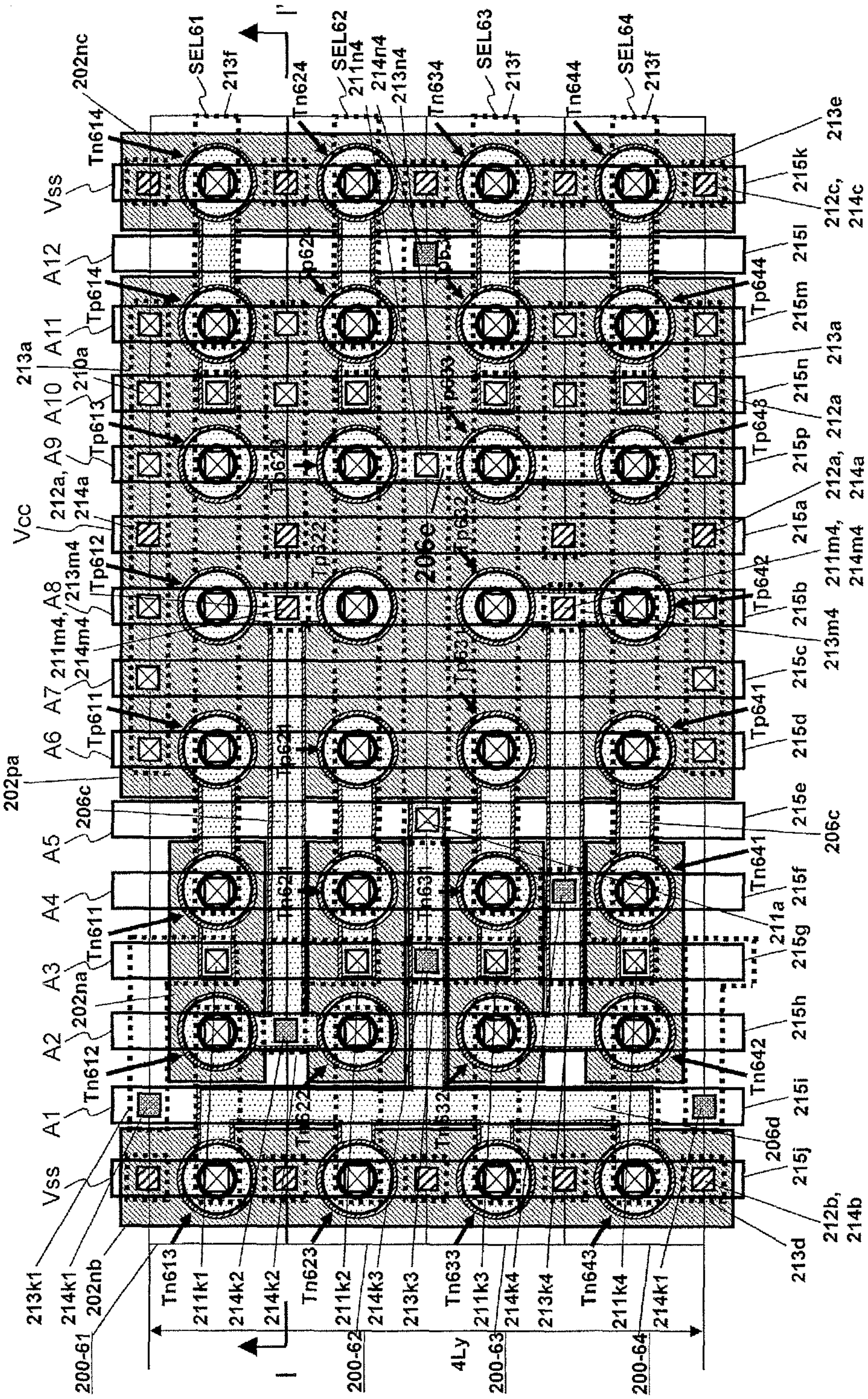
FIG. 19D is a plan view of the decoder according to the sixth exemplary embodiment of the present invention.
Figure 19E:
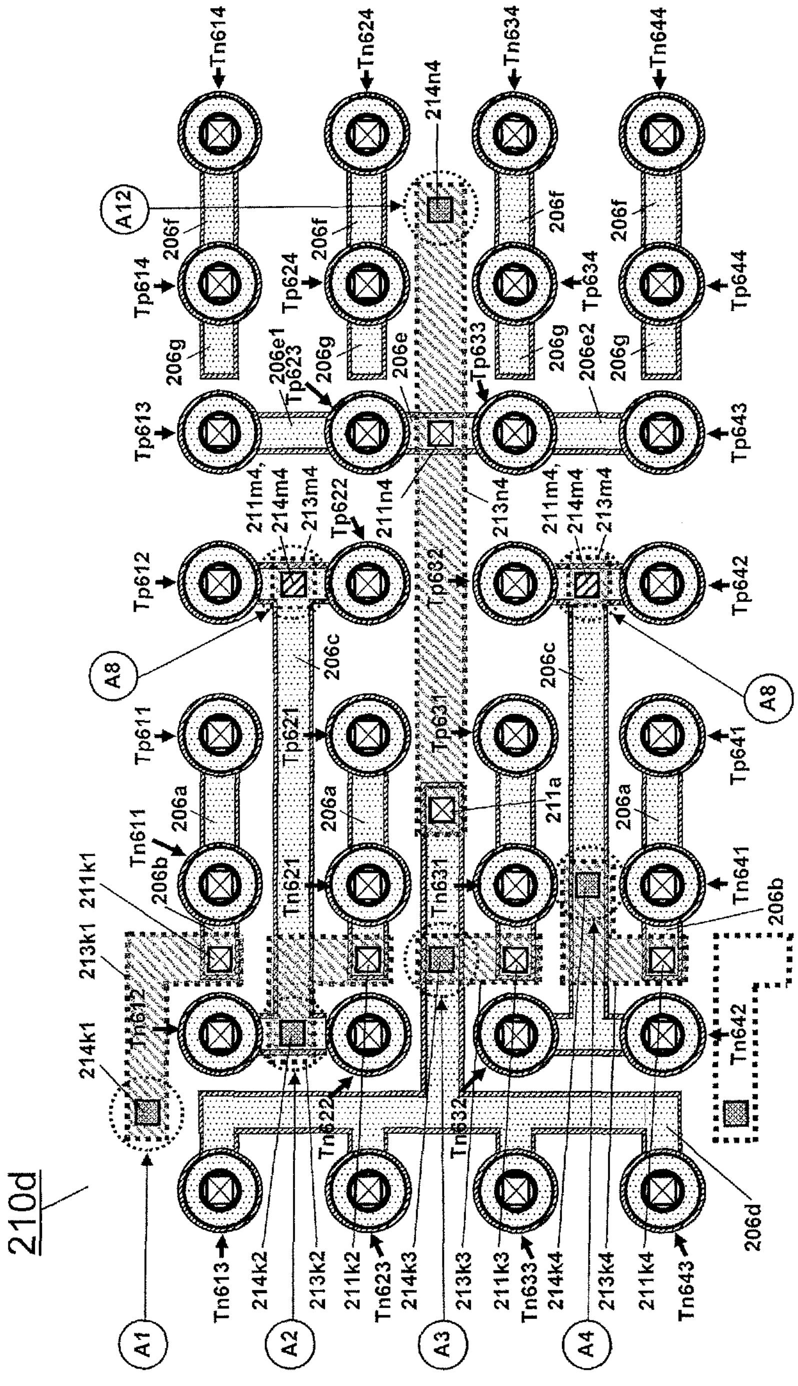
FIG. 19E is a plan view of the decoder according to the sixth exemplary embodiment of the present invention.
Figure 20A:
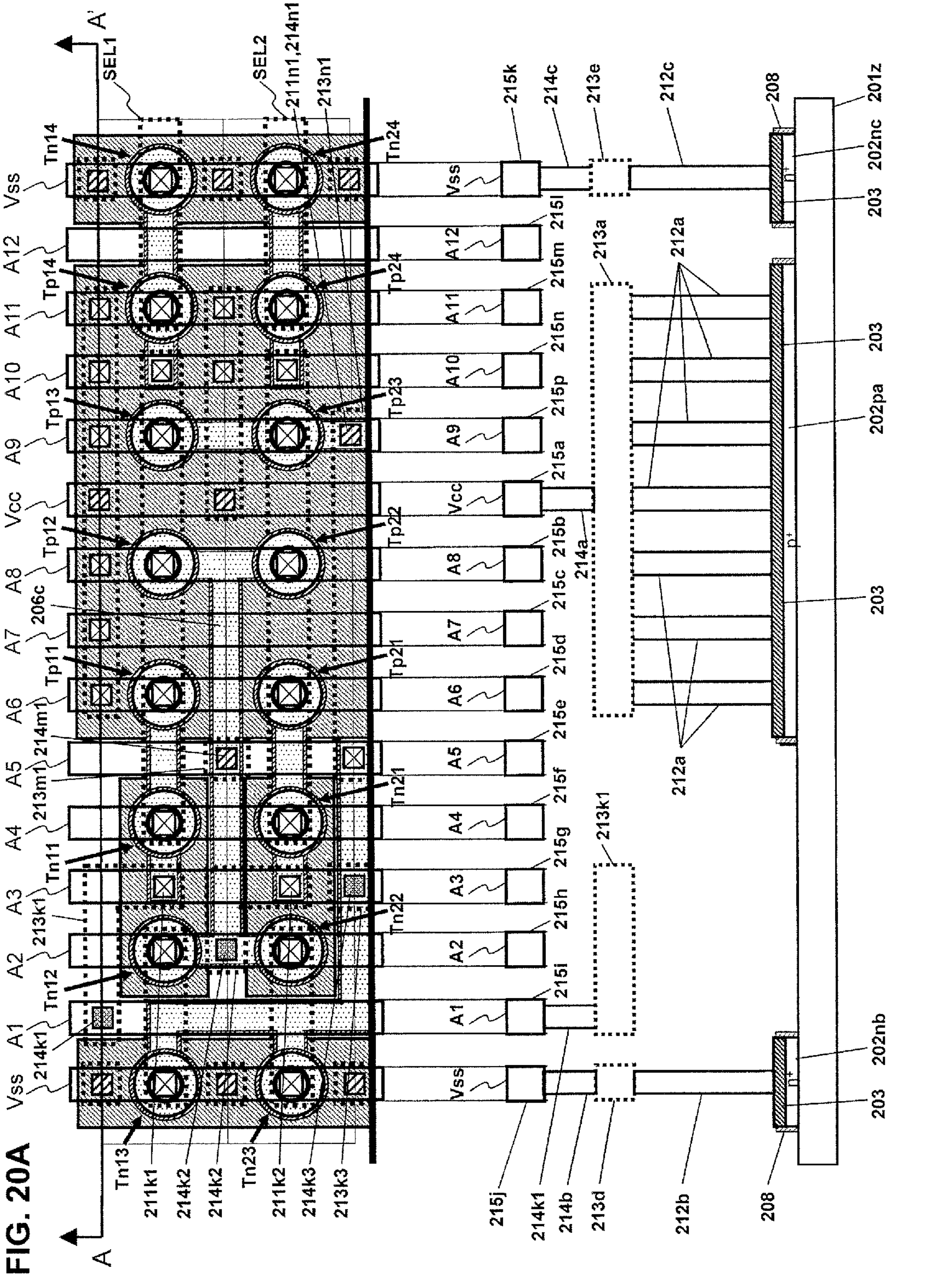
FIG. 20A is a cross-sectional view of the decoder according to the sixth exemplary embodiment of the present invention.

FIGS. 19A to 19E and FIGS. 20A to 20S illustrate a sixth exemplary embodiment. This exemplary embodiment illustrates an implementation of the equivalent circuit illustrated in FIGS. 17A and 17B, in which the sixteen decoders (200-1 to 200-8 and 200-57 to 200-64), each of which is based on the decoder according to the fifth exemplary embodiment (FIG. 15A), are arranged adjacent to one another at a minimum pitch Ly in accordance with FIGS. 17A and 17B. FIGS. 19A to 19D are plan views of the layout (arrangement) of 3-input NAND decoders 201 and inverters 202 according to the sixth exemplary embodiment of the present invention, and FIG. 19E is a plan view illustrating only the lines of the first metal wiring layer to which the SGTs, the gate lines, and the address signals A1, A2, A3, A4, A8, and A12 illustrated in FIG. 19D are connected. FIG. 20A is a cross-sectional view taken along the cut-line A-A' in FIG.

Figure 20B:
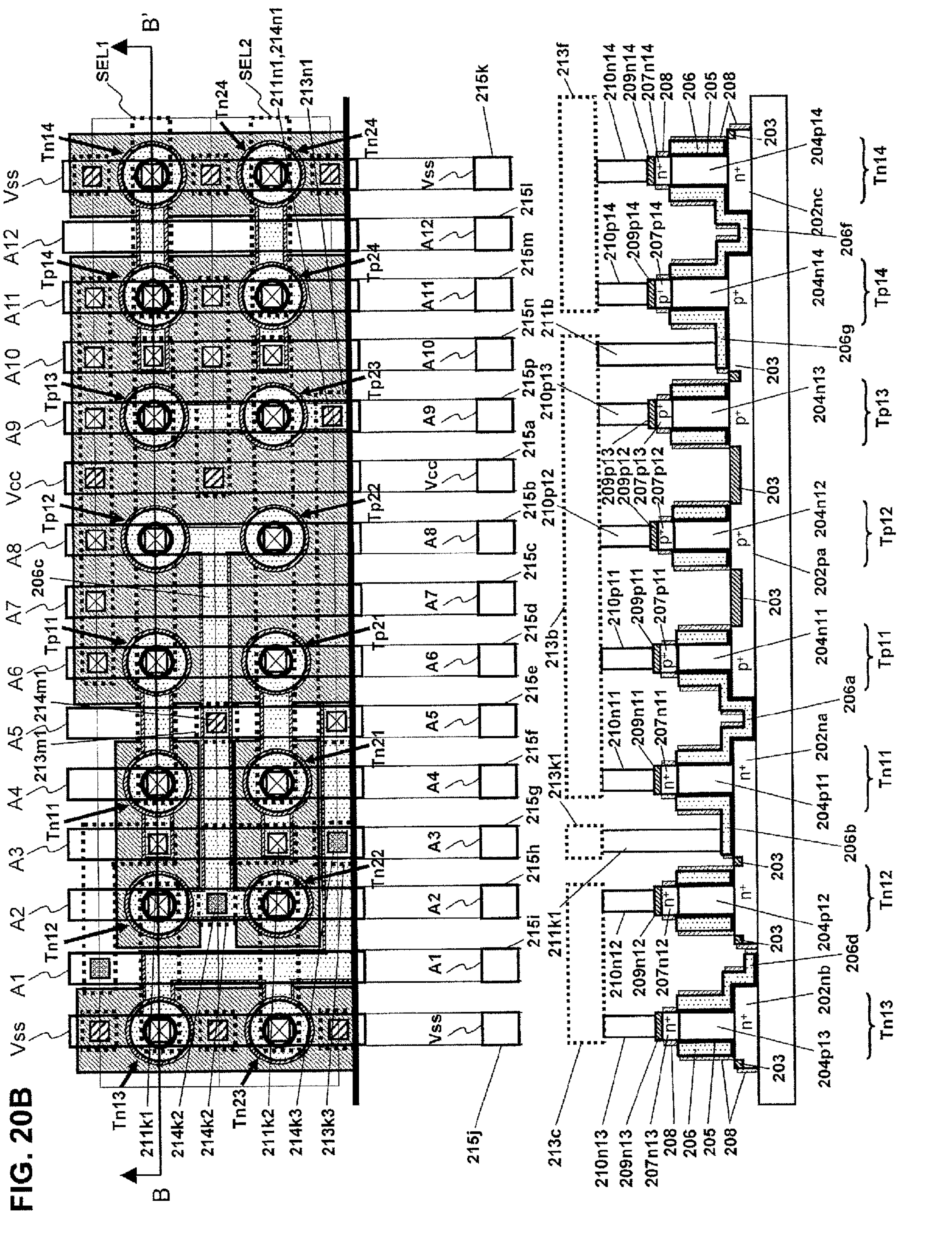
FIG. 20B is a cross-sectional view of the decoder according to the sixth exemplary embodiment of the present invention.
Figure 20C:
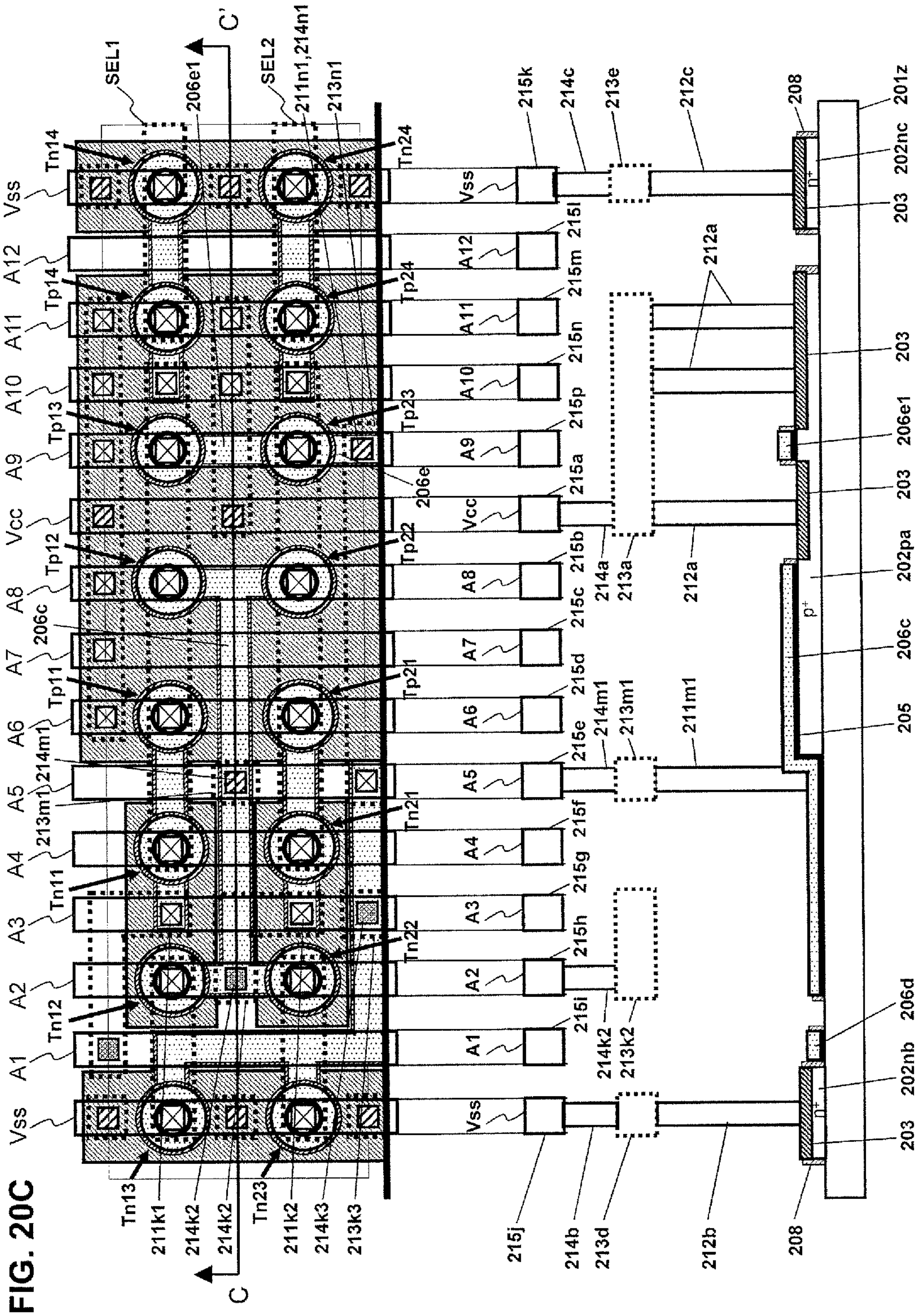
FIG. 20C is a cross-sectional view of the decoder according to the sixth exemplary embodiment of the present invention.
Figure 20D:
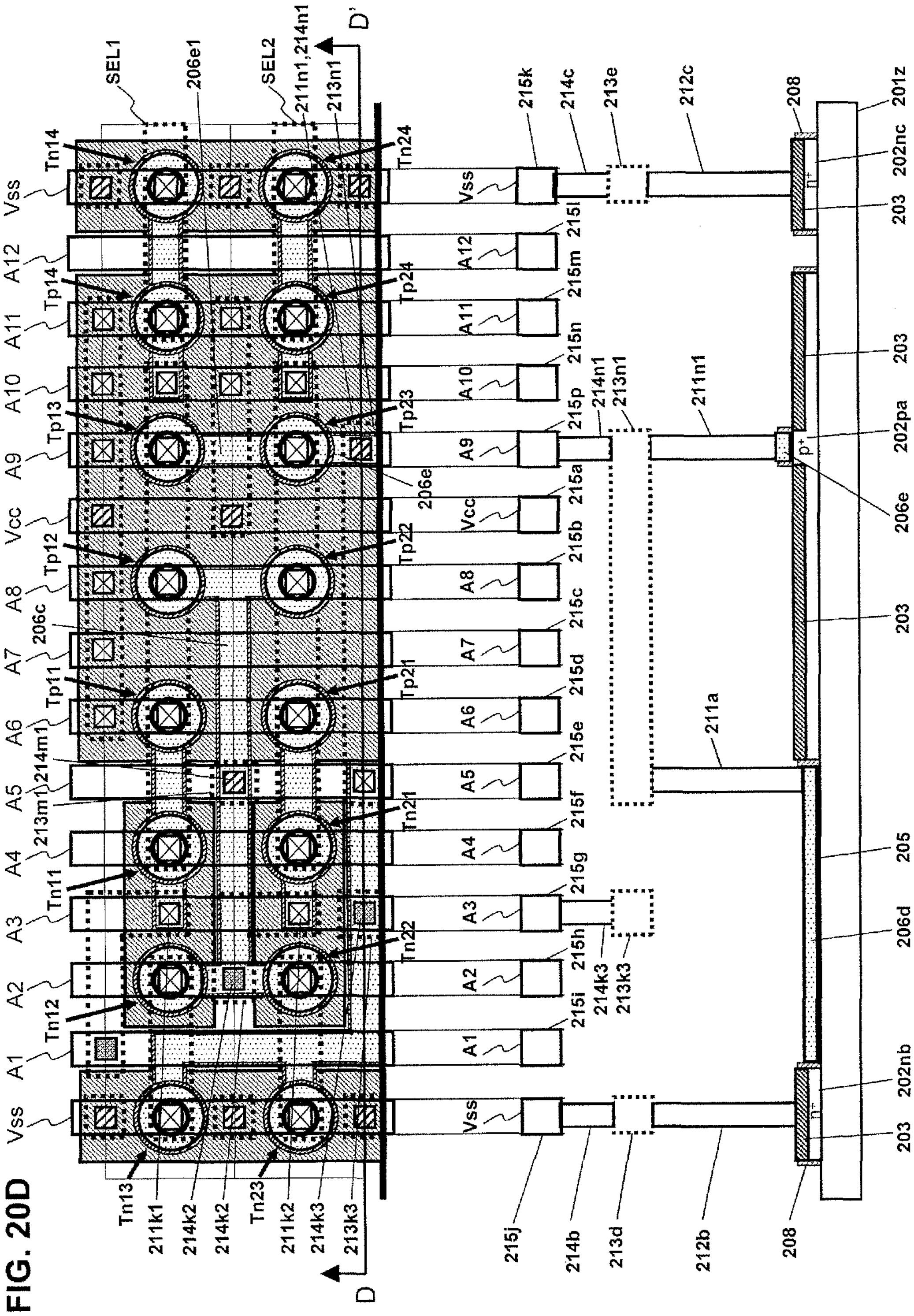
FIG. 20D is a cross-sectional view of the decoder according to the sixth exemplary embodiment of the present invention.
Figure 20E:
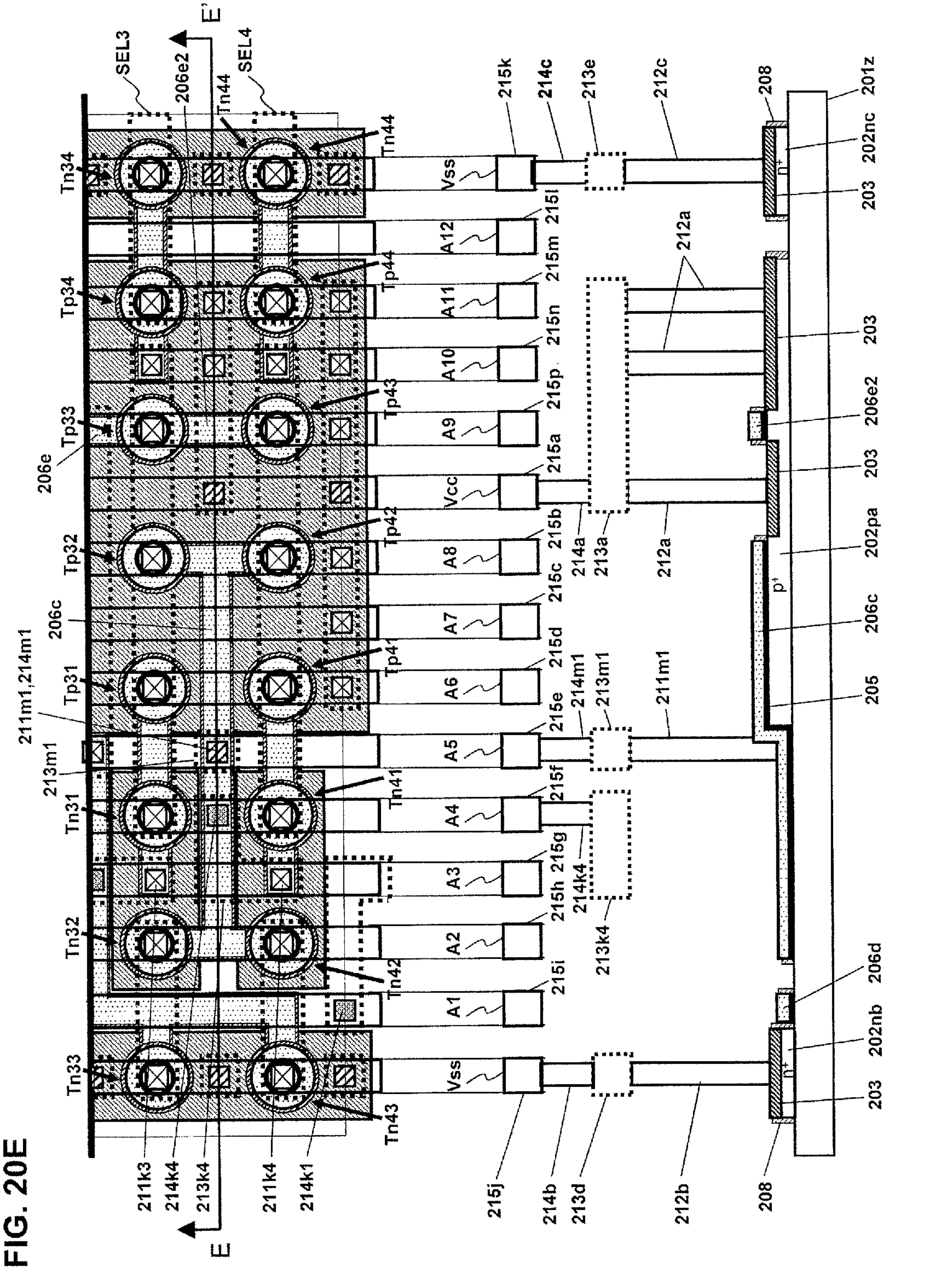
FIG. 20E is a cross-sectional view of the decoder according to the sixth exemplary embodiment of the present invention.
Figure 20F:
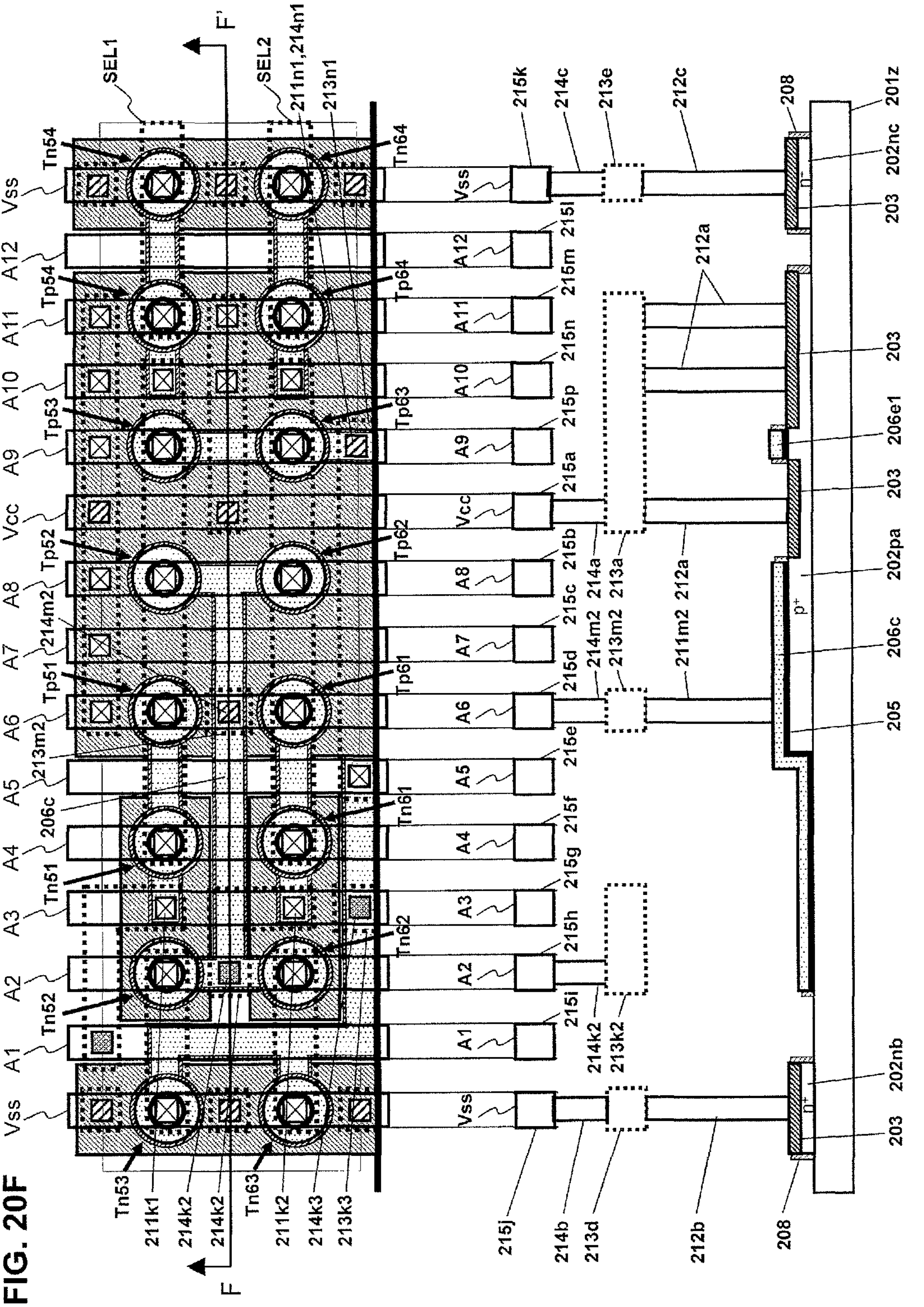
FIG. 20F is a cross-sectional view of the decoder according to the sixth exemplary embodiment of the present invention.
Figure 20G:
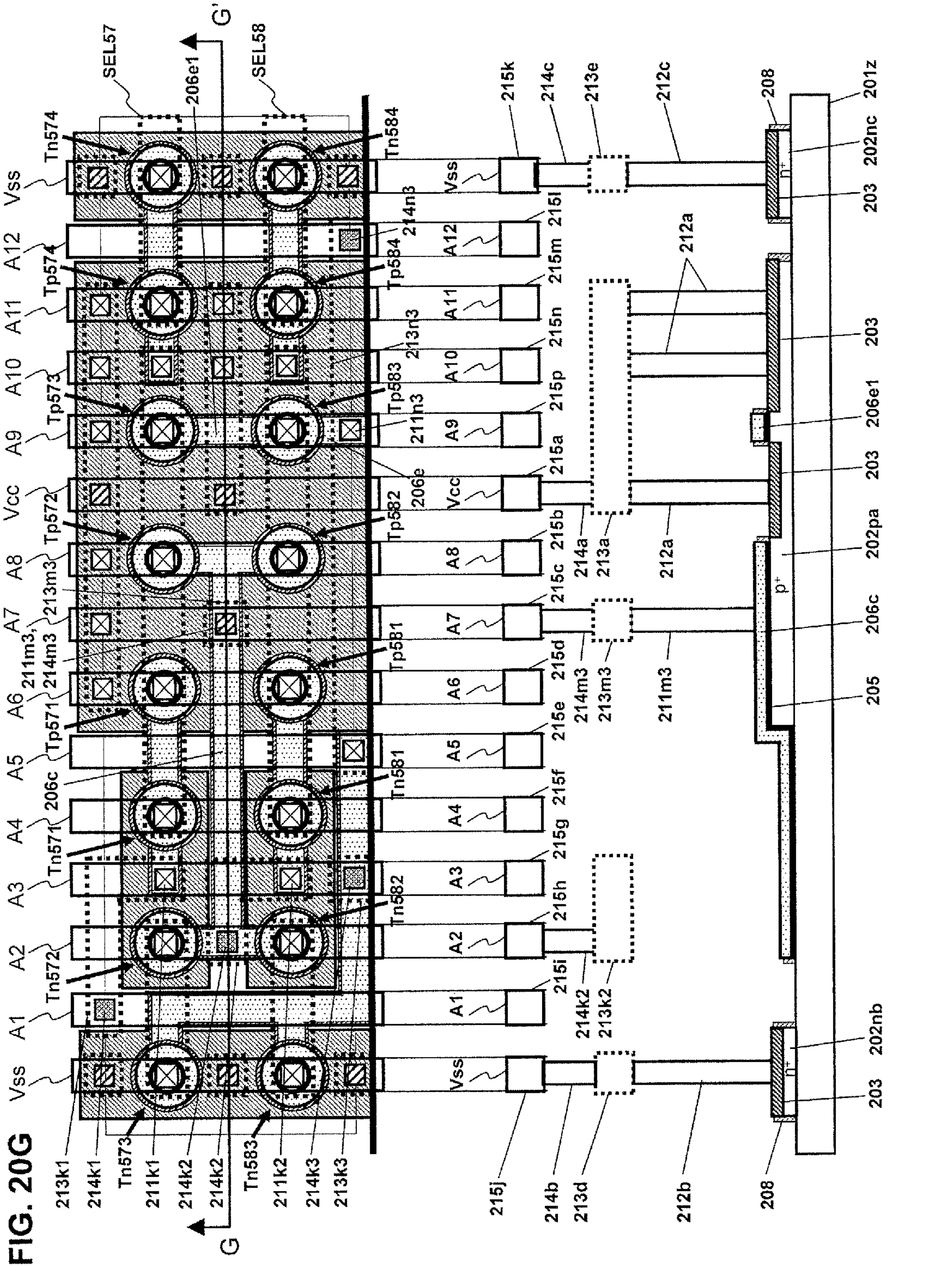
FIG. 20G is a cross-sectional view of the decoder according to the sixth exemplary embodiment of the present invention.
Figure 20H:
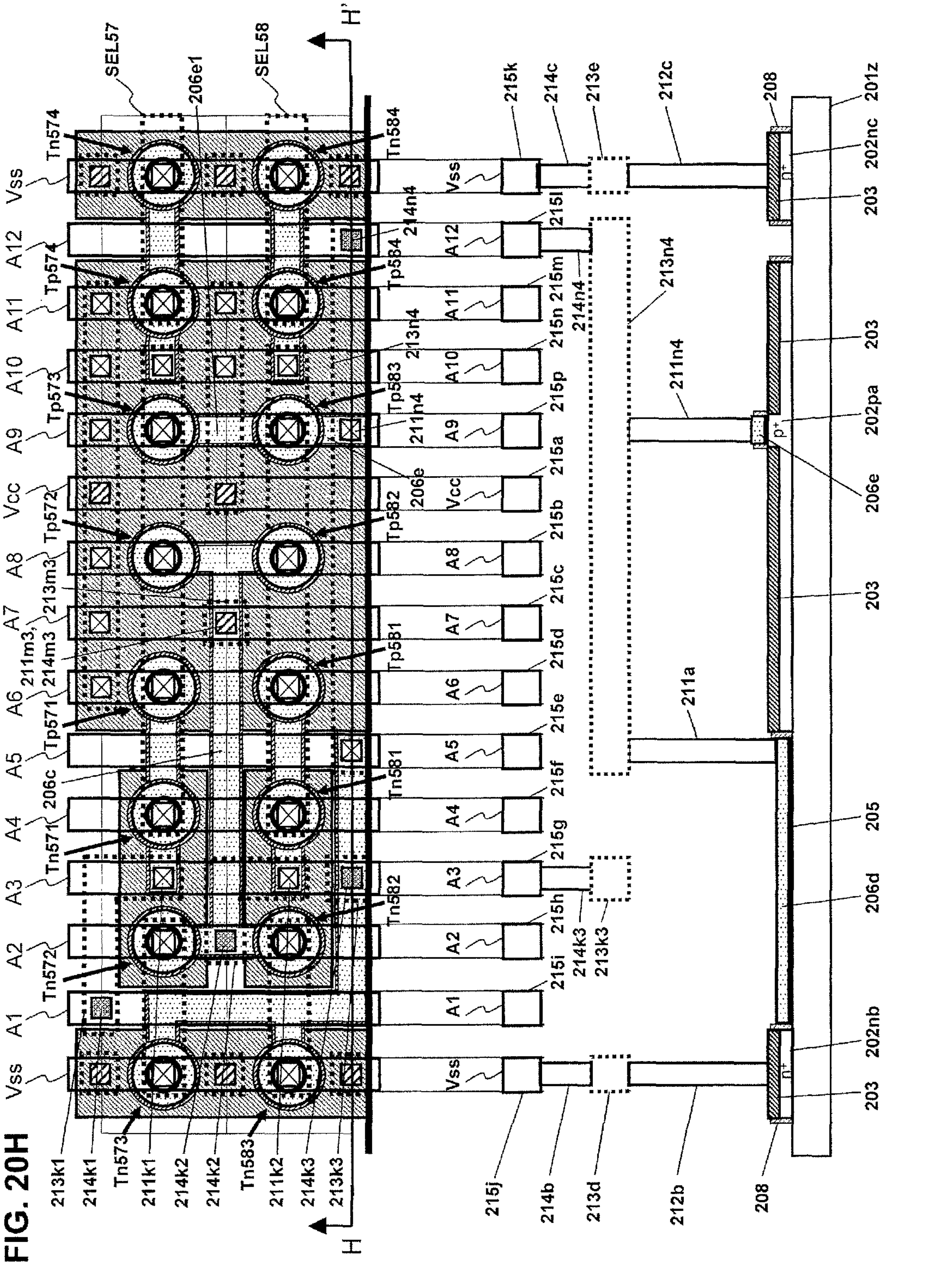
FIG. 20H is a cross-sectional view of the decoder according to the sixth exemplary embodiment of the present invention.
Figure 20I:
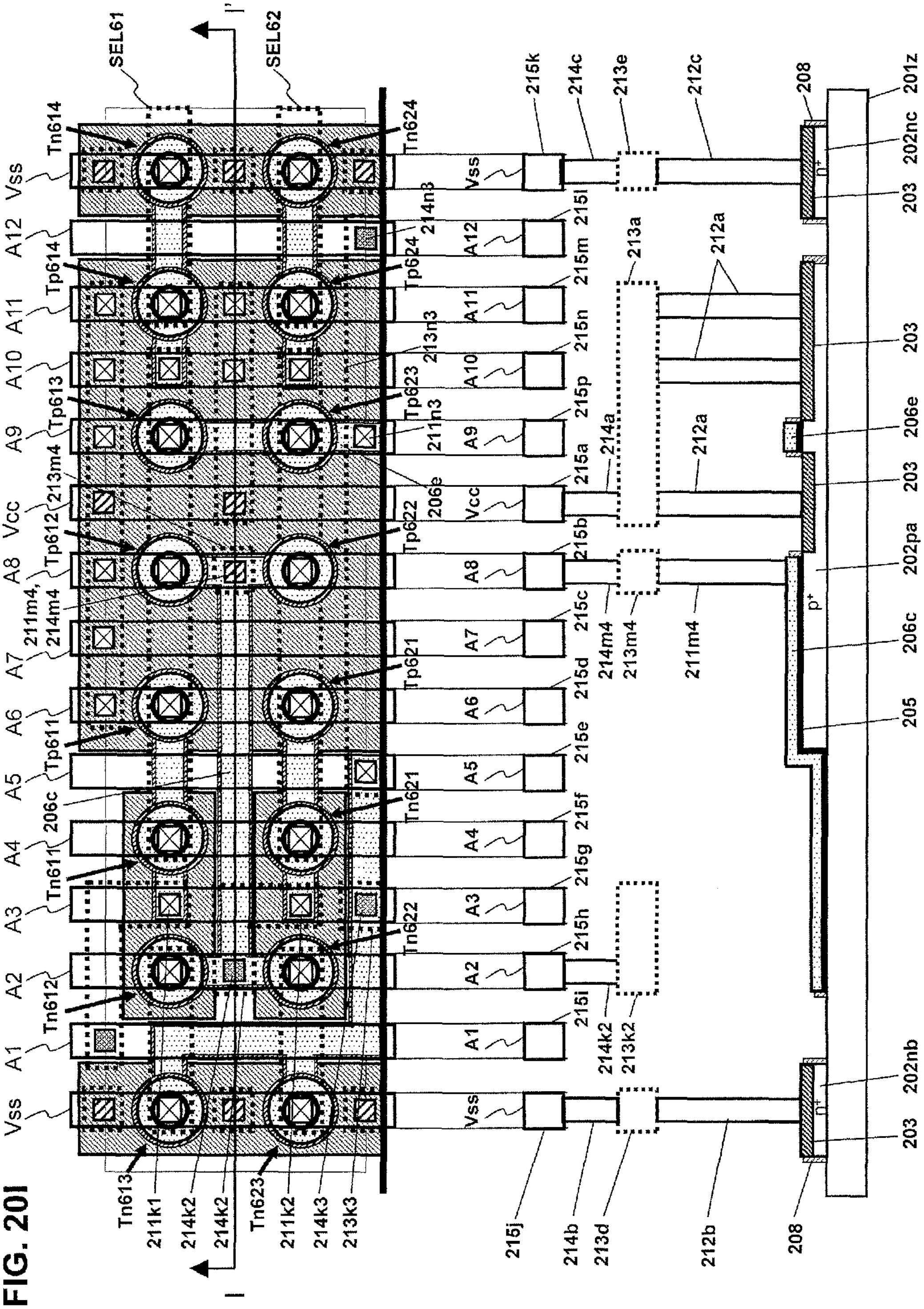
FIG. 20I is a cross-sectional view of the decoder according to the sixth exemplary embodiment of the present invention.
Figure 20J:
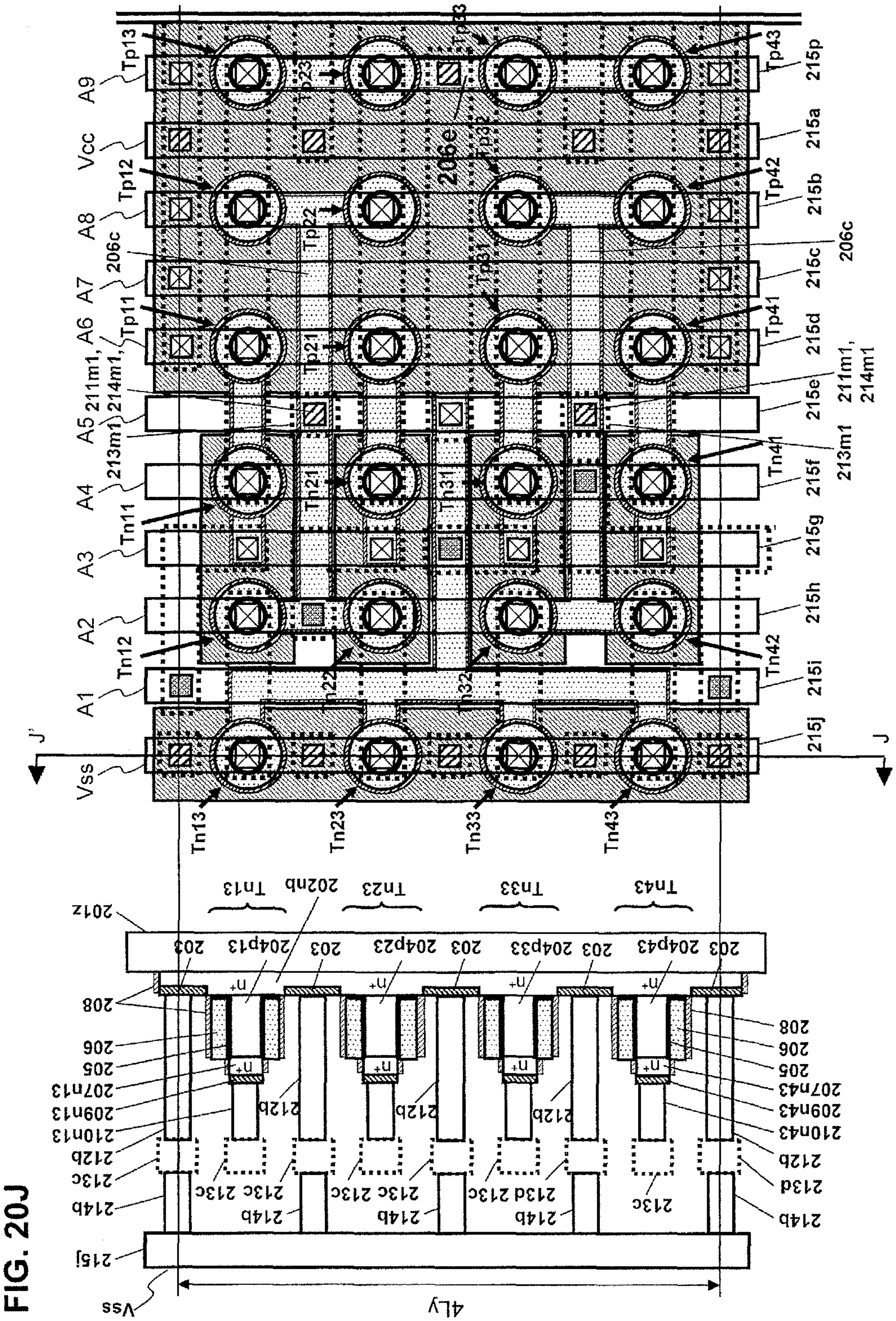
FIG. 20J is a cross-sectional view of the decoder according to the sixth exemplary embodiment of the present invention.
Figure 20K:
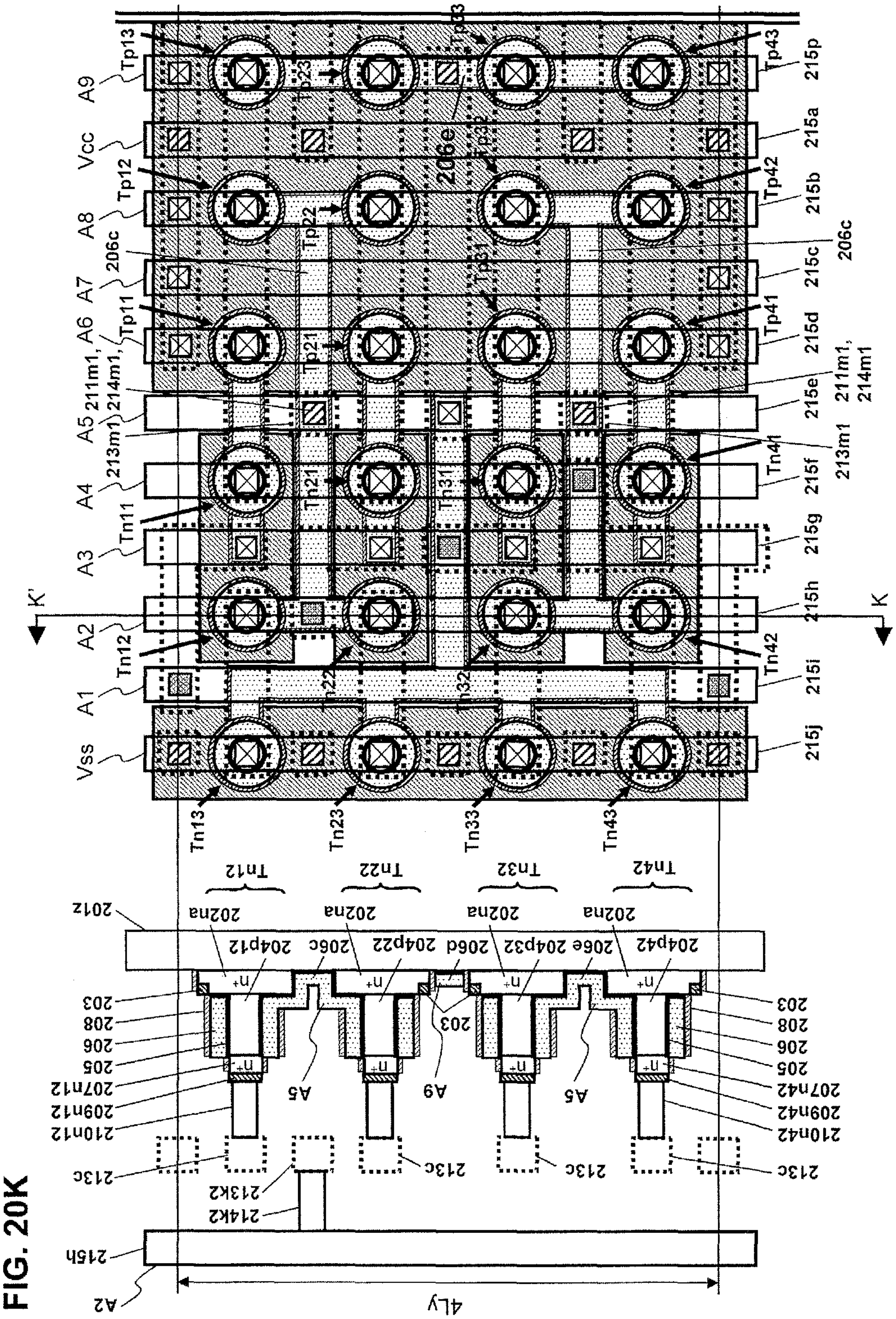
FIG. 20K is a cross-sectional view of the decoder according to the sixth exemplary embodiment of the present invention.
Figure 20L:
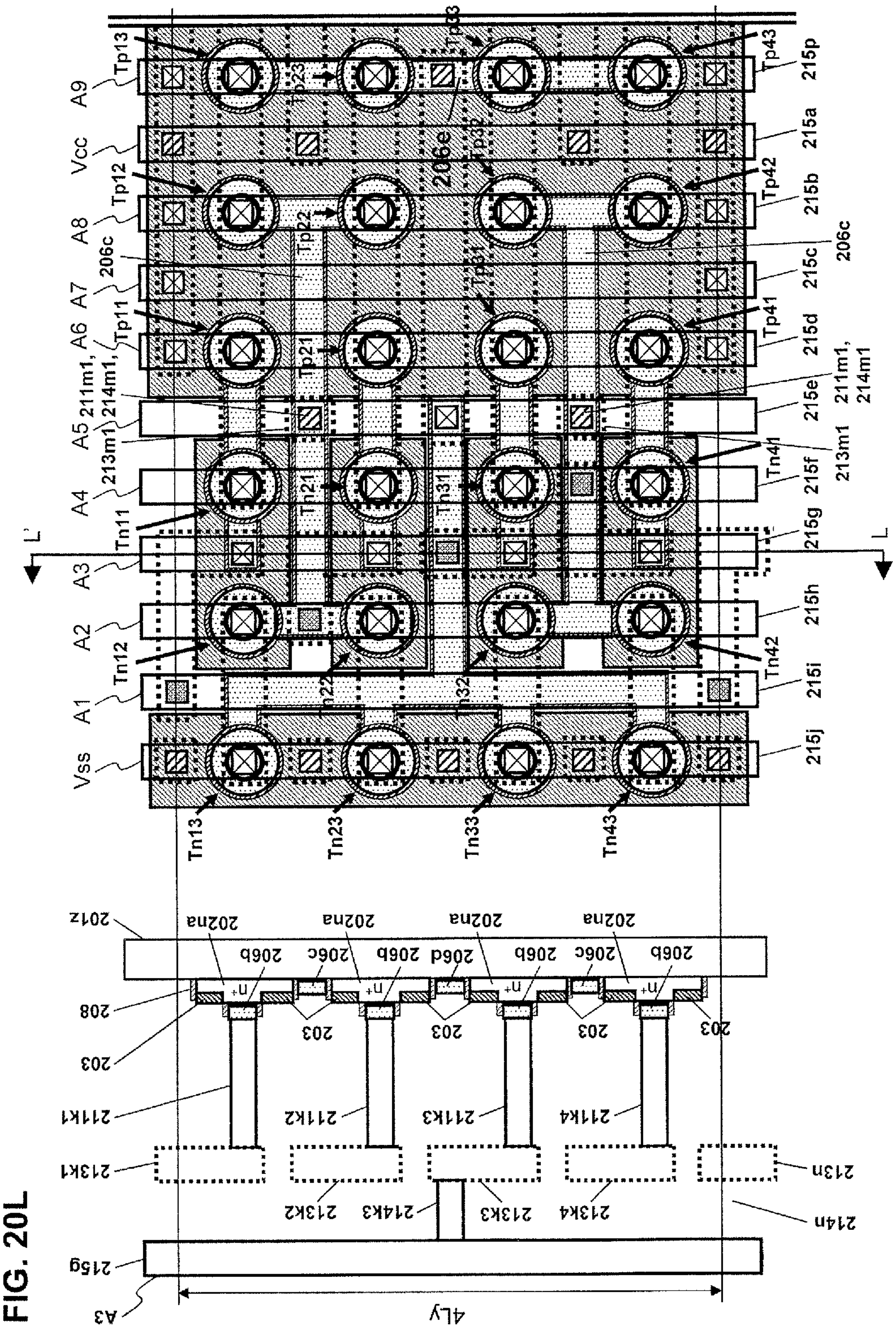
FIG. 20L is a cross-sectional view of the decoder according to the sixth exemplary embodiment of the present invention.
Figure 20M:
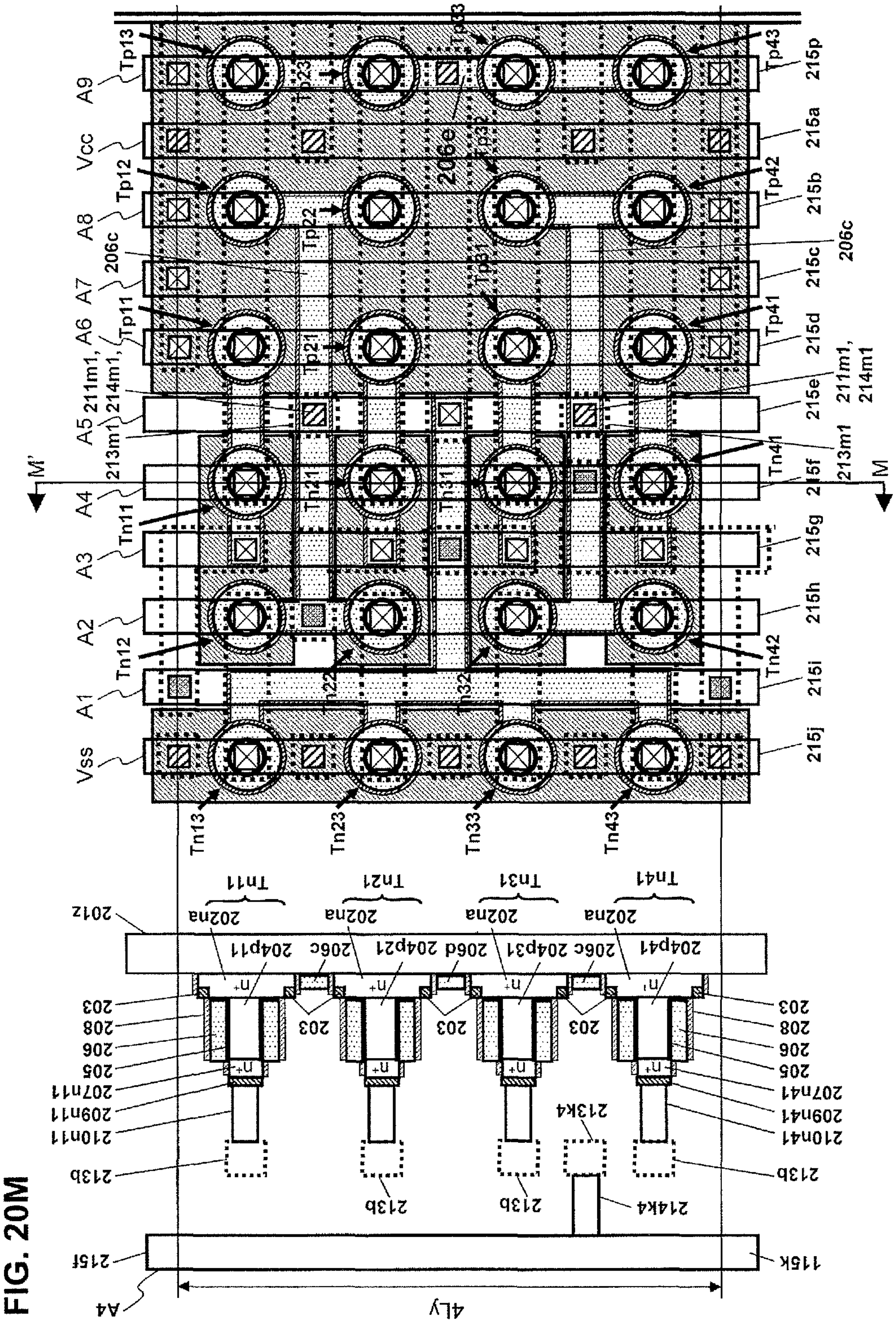
FIG. 20M is a cross-sectional view of the decoder according to the sixth exemplary embodiment of the present invention.
Figure 20N:
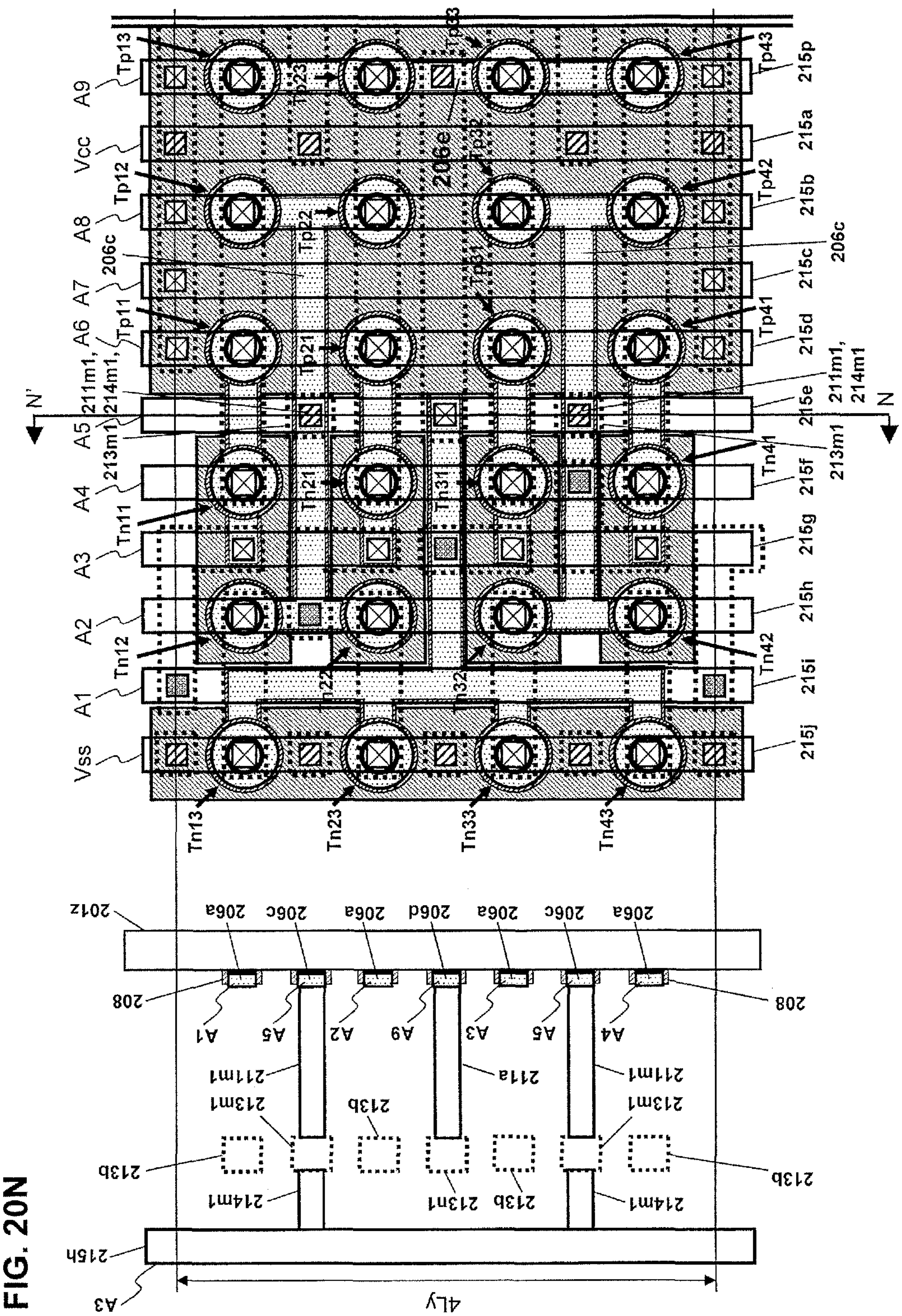
FIG. 20N is a cross-sectional view of the decoder according to the sixth exemplary embodiment of the present invention.
Figure 20P:
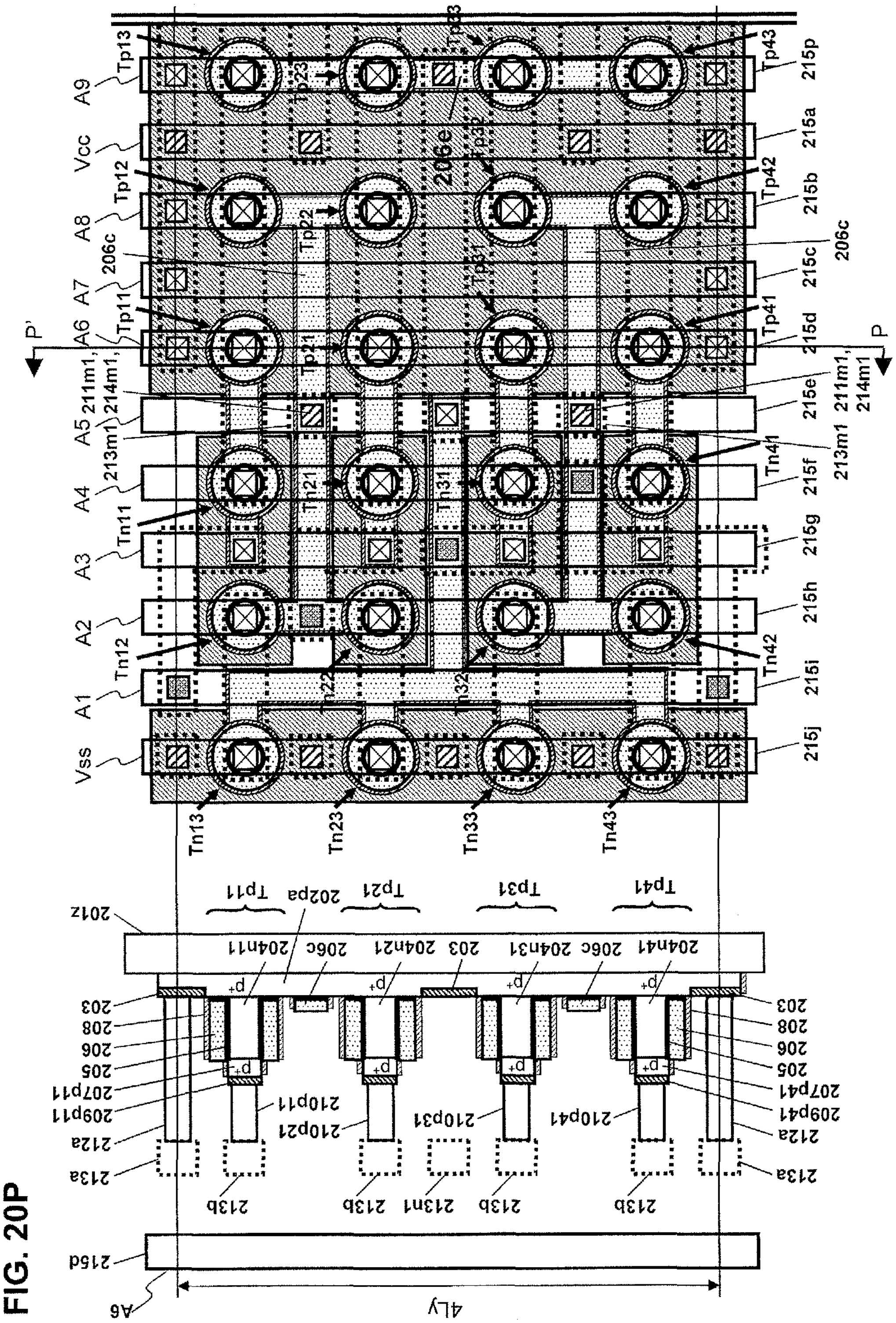
FIG. 20P is a cross-sectional view of the decoder according to the sixth exemplary embodiment of the present invention.
Figure 20Q:
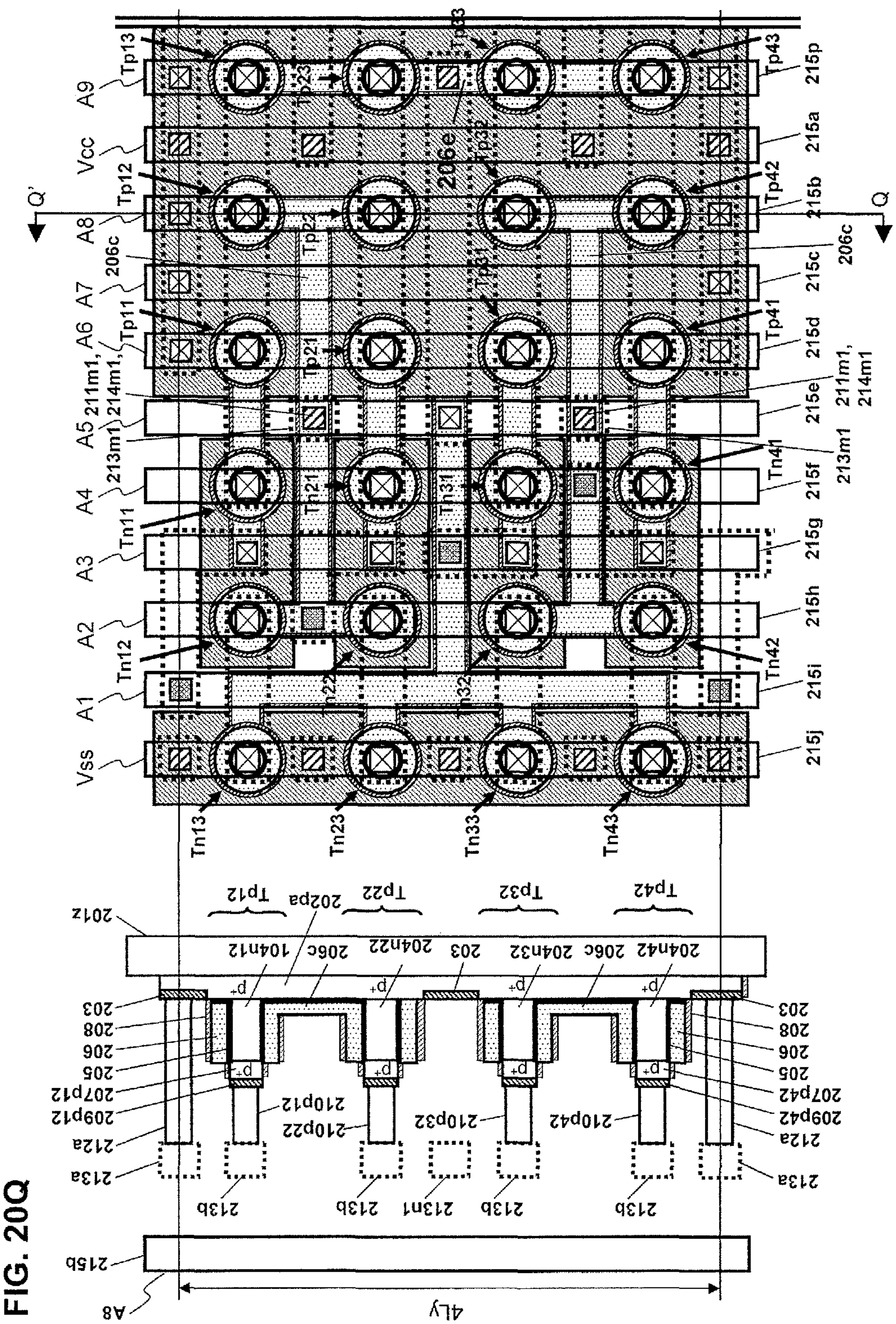
FIG. 20Q is a cross-sectional view of the decoder according to the sixth exemplary embodiment of the present invention.
Figure 20R:
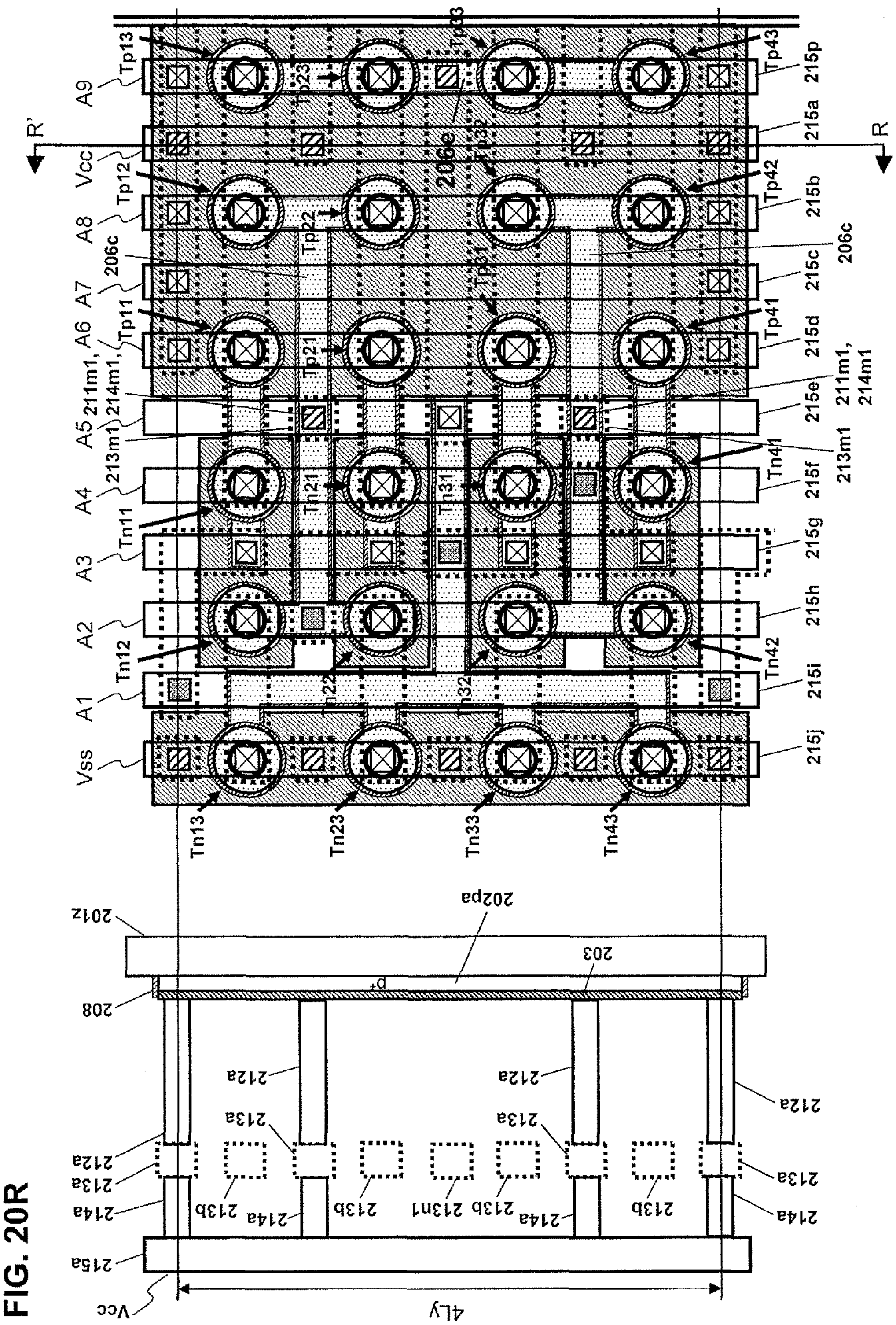
FIG. 20R is a cross-sectional view of the decoder according to the sixth exemplary embodiment of the present invention.
Figure 20S:
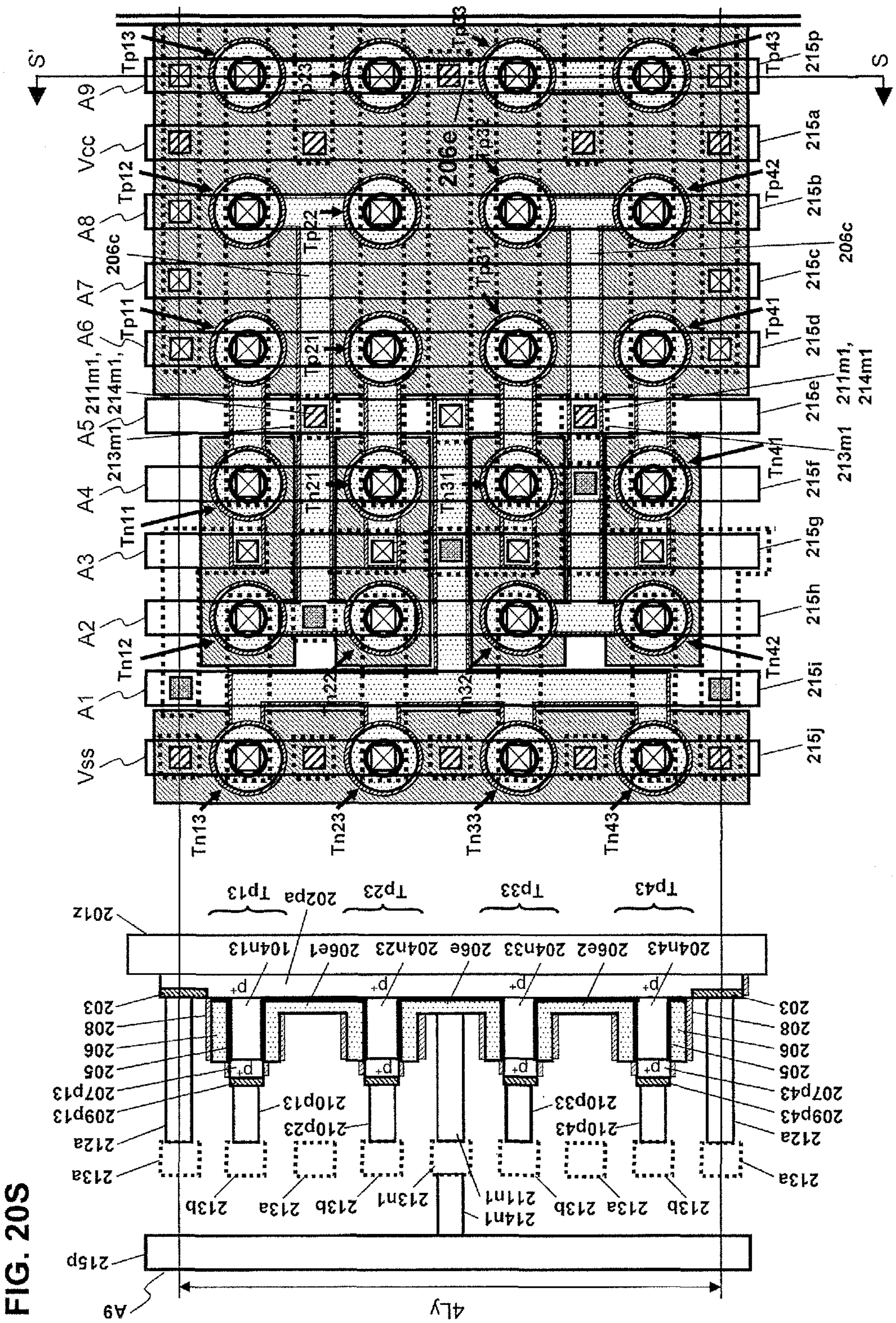
FIG. 20S is a cross-sectional view of the decoder according to the sixth exemplary embodiment of the present invention.

19A, FIG. 20B is a cross-sectional view taken along the cut-line B-B' in FIG. 19A, FIG. 20C is a cross-sectional view taken along the cut-line C-C' in FIG. 19A, FIG. 20D is a cross-sectional view taken along the cut-line D-D' in FIG. 19A, FIG. 20E is a cross-sectional view taken along the cut-line E-E' in FIG. 19A, FIG. 20F is a cross-sectional view taken along the cut-line F-F' in FIG. 19B, FIG. 20G is a cross-sectional view taken along the cut-line G-G' in FIG. 19C, FIG. 20H is a cross-sectional view taken along the cut-line H-H' in FIG. 19C, FIG. 20I is a cross-sectional view taken along the cut-line I-I' in FIG. 19D, FIG. 20J is a cross-sectional view taken along the cut-line J-J' in FIG. 19A, FIG. 20K is a cross-sectional view taken along the cut-line K-K' in FIG. 19A, FIG. 20L is a cross-sectional view taken along the cut-line L-L' in FIG. 19A, FIG. 20M is a cross-sectional view taken along the cut-line M-M' in FIG. 19A, FIG. 20N is a cross-sectional view taken along the cut-line N-N' in FIG. 19A, FIG. 20P is a cross-sectional view taken along the cut-line P-P' in FIG. 19A, FIG. 20Q is a cross-sectional view taken along the cut-line Q-Q' in FIG. 19A, FIG. 20R is a cross-sectional view taken along the cut-line R-R' in FIG. 19A, and FIG. 20S is a cross-sectional view taken along the cut-line S-S' in FIG. 19A.

FIG. 19A illustrates a decoder block 210*a* illustrated in FIG. 17A, FIG. 19B illustrates a decoder block 210*b* illustrated in FIG. 17A, FIG. 19C illustrates a decoder block 210*c* illustrated in FIG. 17B, and FIG. 19D illustrates a decoder block 210*d* illustrated in FIG. 17B. Although FIGS. 19A and 19B are consecutive views and FIGS. 19C and 19D are consecutive views, separate views are presented in FIGS. 19A to 19D in enlarged scale, for convenience.

In FIG. 19A, the transistors constituting the decoder 200-1 illustrated in FIG. 17A, namely, the NMOS transistor Tn14, the PMOS transistors Tp14, Tp13, Tp12, and Tp11, and the NMOS transistors Tn11, Tn12, and Tn13, are arranged in the top row of FIG. 19A in a line in the lateral direction (the first direction) from right to left in this figure.

The transistors constituting the decoder 200-2, namely, the NMOS transistor Tn24, the PMOS transistors Tp24, Tp23, Tp22, and Tp21, and the NMOS transistors Tn21, Tn22, and Tn23, are arranged in the second row from the top in FIG. 19A in a line in the lateral direction. Likewise, the decoder 200-3 and the decoder 200-4 are arranged in sequence from top to bottom in FIG. 19A.

The decoders 200-1 and 200-3 are each arranged in a non-inverted configuration based on the decoder illustrated in FIG. 15A. The decoders 200-2 and 200-4 are each arranged in a vertically inverted configuration.

Accordingly, a common gate line 206*c* is provided to respectively connect the PMOS transistors Tp12 and Tp22 and the NMOS transistors Tn12 and Tn22 to each other, and is formed in the space (dead space) between the lower diffusion layers of the decoder 200-1 and the decoder 200-2. This configuration can minimize the size in the longitudinal direction (the second direction). In addition, the use of a common gate line can reduce the parasitic capacitance of lines. High-speed operation can be achieved. Likewise, a common gate line 206*c* is provided to respectively connect the PMOS transistors Tp32 and Tp42 and the NMOS transistors Tn32 and Tn42 to each other.

Further, the gate electrodes 206 of the PMOS transistors Tp13, Tp23, Tp33, and Tp43 are connected to each other by using gate lines 206*e*1, 206*e*, and 206*e*2. Further, the gate electrodes 206 of the NMOS transistors Tn13, Tn23, Tn33, and Tn43 are connected in common by using a gate line 206*d*, and the gate line 206*d* is arranged in the lateral direction so as to extend in the space between the lower diffusion layers of the decoders 200-2 and 200-3. The gate line 206*d* and the gate line 206*e* are connected in common by using a line 213*n*1 of the first metal wiring layer via a contact 211*a* and a contact 211*n*1. Specifically, in FIG. 19A, the line 215*p* of the second metal wiring layer to which an address signal A9 is supplied is connected to the gate line 206*e* and the gate line 206*d* from a single point, that is, from a contact 214*n*1, via the line 213*n*1 of the first metal wiring layer and the contact 211*n*1 and via the line 213*n*1 of the first metal wiring layer and the contact 211*a*, respectively, and is then connected to the gate electrodes 206 of the PMOS transistors Tp13, Tp23, Tp33, and Tp43 and the NMOS transistors Tn13, Tn23, Tn33, and Tn43. This arrangement can reduce the area of the wiring region and can reduce the parasitic capacitance of lines. High-speed operation can be achieved.

It is to be noted here that while the decoders 200-2 and 200-4 are arranged in an inverted configuration, contacts 211*k*1 to 211*k*4, lines 213*k*1 to 213*k*4 of the first metal wiring layer, and contacts 214*k*1 to 214*k*4 via which address signals A1 to A4 are supplied are not arranged in an inverted configuration but are arranged in a non-inverted configuration. Accordingly, the address signals A1 to A4 can be separately supplied to the gate lines 206*b* for the decoders 200-1, 200-2, 200-3, and 200-4.

Also in FIGS. 19B, 19C, and 19D, the decoders 200-5 to 200-8, 200-57 to 200-60, and 200-61 to 200-64 are arranged in similar ways, respectively.

In FIGS. 19A to 19D, lines 215*k*, 2151, 215*m*, 215*n*, 215*p*, 215*a*, 215*b*, 215*c*, 215*d*, 215*e*, 215*f*, 215*g*, 215*h*, 215*i*, and 215*j* of the second metal wiring layer are arranged to extend in the longitudinal direction (the second direction), and are respectively supplied with a reference power supply Vss, address signals A12, A11, A10, and A9, a power supply Vcc, address signals A8, A7, A6, A5, A4, A3, A2, and A1, and the reference power supply Vss. The lines 215*a* to 215*p* of the second metal wiring layer described above are arranged at a minimum pitch (a minimum wiring width and a minimum wiring interval) in the second metal wiring layer, resulting in the size in the lateral direction being minimized in the arrangement.

In FIGS. 19A to 19E and FIGS. 20A to 20S, portions having the same or substantially the same structures as those illustrated in FIGS. 15A and 15B and FIGS. 16A to 16C are denoted by equivalent reference numerals in the 200s.

In FIGS. 19A to 19D and FIGS. 20A to 20S, the line 215*k* of the second metal wiring layer to which the reference power supply Vss is supplied is arranged to extend in the second direction, and is connected to the silicide layer 203, which is shared to connect the lower diffusion layers 202*nc*, which are the source regions of the NMOS transistors Tn14 to Tn84 and Tn574 to Tn644, via contacts 214*c*, lines 213*e* of the first metal wiring layer, and contacts 212*c*. Note that each of the connection portions (214*c*, 213*e*, and 212*c*) is provided at a plurality of locations. In addition, the lower diffusion layer 202*nc* and the silicide layer 203, which cover the lower diffusion layer 202*nc*, are shared by upper and lower adjacent decoders and are connected.

The line 215*l* of the second metal wiring layer to which the address signal A12 is supplied is arranged to extend in the longitudinal direction (the second direction). As illustrated in FIG. 19C and FIG. 20H, the line 215*l* of the second metal wiring layer is connected to the gate line 206*e* via a contact 214*n*4, a line 213*n*4 of the first metal wiring layer arranged to extend in the lateral direction (the first direction), and a contact 211*n*4, and is then connected to the gate electrodes 206 of the PMOS transistors Tp573, Tp583, Tp593, and Tp603. In addition, the line 215*l* of the second metal wiring layer is also connected to the gate line 206*d* via the contact 211*a*, and is then connected to the gate electrodes 206 of the NMOS transistors Tn573, Tn583, Tn593, and Tn603.

In addition, in FIG. 19D, the line 215*l* of the second metal wiring layer is connected to the gate line 206*e* via the contact 214*n*4, the line 213*n*4 of the first metal wiring layer arranged to extend in the lateral direction (the first direction), and the contact 211*n*4, and is then connected to the gate electrodes 206 of the PMOS transistors Tp613, Tp623, Tp633, and Tp643. In addition, the line 215*l* of the second metal wiring layer is also connected to the gate line 206*d* via the contact 211*a*, and is then connected to the gate electrodes 206 of the NMOS transistors Tn613, Tn623, Tn633, and Tn643.

Although not illustrated in the drawings, the address map illustrated in FIG. 18B shows that the address signal A12 is also supplied to the sixteen decoders 200-49 to 200-64 via the contacts 214*n*4, the lines 213*n*4 of the first metal wiring layer, and the contacts 211*n*4 in a way similar to that described above.

The line 215*m* of the second metal wiring layer to which the address signal A11 is supplied is arranged to extend in the longitudinal direction (the second direction). Although not illustrated in the drawings, in a way similar to that for the address signal A12, the line 215*m* of the second metal wiring layer is connected to the gate line 206*e* and the gate line 206*d* via contacts 214*n*3, lines 213*n*3 of the first metal wiring layer arranged to extend in the lateral direction (the first direction), and contacts 211*n*3, which are not illustrated in the drawings. Thus, according to the address map illustrated in FIG. 18B, the address signal A11 is supplied to the sixteen decoders 200-33 to 200-48.

The line 215*n* of the second metal wiring layer to which the address signal A10 is supplied is arranged to extend in the longitudinal direction (the second direction). Although not illustrated in the drawings, in a way similar to that for the address signal A12, the line 215*n* of the second metal wiring layer is connected to the gate line 206*e* and the gate line 206*d* via contacts 214*n*2, lines 213*n*2 of the first metal wiring layer arranged to extend in the lateral direction (the first direction), and contacts 211*n*2, which are not illustrated in the drawings. Thus, according to the address map illustrated in FIG. 18A, the address signal A10 is supplied to the sixteen decoders 200-17 to 200-32.

The line 215*p* of the second metal wiring layer to which the address signal A9 is supplied is arranged to extend in the longitudinal direction (the second direction). As illustrated in FIG. 19A and FIG. 20D, the line 215*p* of the second metal wiring layer is connected to the gate line 206*e* via the contact 214*n*1, the line 213*n*1 of the first metal wiring layer arranged to extend in the lateral direction (the first direction), and the contact 211*n*1, and is then connected to the gate electrodes 206 of the PMOS transistors Tp13, Tp23, Tp33, and Tp43. In addition, the line 215*p* of the second metal wiring layer is also connected to the gate line 206*d* via the contact 211*a*, and is then connected to the gate electrodes 206 of the NMOS transistors Tn13, Tn23, Tn33, and Tn43.

In addition, in FIG. 19B, the line 215*p* of the second metal wiring layer is connected to the gate line 206*e* via the contact 214*n*1, the line 213*n*1 of the first metal wiring layer arranged to extend in the lateral direction (the first direction), and the contact 211*n*1, and is then connected to the gate electrodes 206 of the PMOS transistors Tp53, Tp63, Tp73, and Tp83. In addition, the line 215*p* of the second metal wiring layer is also connected to the gate line 206*d* via the contact 211*a*, and is then connected to the gate electrodes 206 of the NMOS transistors Tn53, Tn63, Tn73, and Tn83.

The line 215*a* of the second metal wiring layer to which the power supply Vcc is supplied is arranged to extend in the second direction, and is connected to the silicide layer 203, which is shared to connect the lower diffusion layers 202*pa*, which are the source regions of the PMOS transistors Tp11, Tp12, Tp13, Tp14 to Tp641, Tp642, Tp643, and Tp644 of all the decoders, via contacts 214*a*, lines 213*a* of the first metal wiring layer, and contacts 212*a*. Note that each of the connection portions (214*a*, 213*a*, and 212*a*) is provided at a plurality of locations. In addition, each of the lines 213*a* of the first metal wiring layer is arranged to extend in the lateral direction (the first direction) and is provided with a plurality of contacts 212*a* to reduce the resistance of the silicide layer 203, resulting in efficient supply of the power supply Vcc to the sources of the individual PMOS transistors.

The line 215*b* of the second metal wiring layer to which the address signal A8 is supplied is arranged to extend in the longitudinal direction (the second direction). As illustrated in FIG. 19D and FIG. 20I, the line 215*b* of the second metal wiring layer is connected to the gate line 206*c* via a contact 214*m*4, a line 213*m*4 of the first metal wiring layer, and a contact 211*m*4, and is then connected to the gate electrodes of the PMOS transistors Tp612 and Tp622 and the gate electrodes of the NMOS transistors Tn612 and Tn622. Also, the line 215*b* of the second metal wiring layer is connected to the gate line 206*c* via the contact 214*m*4, the line 213*m*4 of the first metal wiring layer, and the contact 211*m*4, and is then connected to the gate electrodes of the PMOS transistors Tp632 and Tp642 and the gate electrodes of the NMOS transistors Tn632 and Tn642.

The line 215*c* of the second metal wiring layer to which the address signal A7 is supplied is arranged to extend in the longitudinal direction (the second direction). As illustrated in FIG. 19C and FIG. 20G, the line 215*c* of the second metal wiring layer is connected to the gate line 206*c* via a contact 214*m*3, a line 213*m*3 of the first metal wiring layer, and a contact 211*m*3, and is then connected to the gate electrodes of the PMOS transistors Tp572 and Tp582 and the gate electrodes of the NMOS transistors Tn572 and Tn582. Also, the line 215*c* of the second metal wiring layer is connected to the gate line 206*c* via the contact 214*m*3, the line 213*m*3 of the first metal wiring layer, and the contact 211*m*3, and is then connected to the gate electrodes of the PMOS transistors Tp592 and Tp602 and the gate electrodes of the NMOS transistors Tn592 and Tn602.

The line 215*d* of the second metal wiring layer to which the address signal A6 is supplied is arranged to extend in the longitudinal direction (the second direction). As illustrated in FIG. 19B and FIG. 20F, the line 215*d* of the second metal wiring layer is connected to the gate line 206*c* via a contact 214*m*2, a line 213*m*2 of the first metal wiring layer, and a contact 211*m*2, and is then connected to the gate electrodes of the PMOS transistors Tp52 and Tp62 and the gate electrodes of the NMOS transistors Tn52 and Tn62. Also, the line 215*d* of the second metal wiring layer is connected to the gate line 206*c* via the contact 214*m*2, the line 213*m*2 of the first metal wiring layer, and the contact 211*m*2, and is then connected to the gate electrodes of the PMOS transistors Tp72 and Tp82 and the gate electrodes of the NMOS transistors Tn72 and Tn82.

The line 215*e* of the second metal wiring layer to which the address signal A5 is supplied is arranged to extend in the longitudinal direction (the second direction). As illustrated in FIG. 19A and FIG. 20C, the line 215*e* of the second metal wiring layer is connected to the gate line 206*c* via a contact

214*m*1, a line 213*m*1 of the first metal wiring layer, and a contact 211*m*1, and is then connected to the gate electrodes of the PMOS transistors Tp12 and Tp22 and the gate electrodes of the NMOS transistors Tn12 and Tn22. Also, as illustrated in FIG. 20E, the line 215*e* of the second metal wiring layer is connected to the gate line 206*c* via the contact 214*m*1, the line 213*m*1 of the first metal wiring layer, and the contact 211*m*1, and is then connected to the gate electrodes of the PMOS transistors Tp32 and Tp42 and the gate electrodes of the NMOS transistors Tn32 and Tn42.

The line 215*f* of the second metal wiring layer to which the address signal A4 is supplied is arranged to extend in the longitudinal direction (the second direction). As illustrated in FIG. 19A and FIG. 20E, the line 215*f* of the second metal wiring layer is connected to the gate line 206*b* via the contact 214*k*4, the line 213*k*4 of the first metal wiring layer arranged to extend in the lateral direction (the first direction), and the contact 211*k*4, and is then connected to the gate electrode of the NMOS transistor Tn41. In addition, the line 215*f* of the second metal wiring layer is also connected to the gate electrode of the PMOS transistor Tp41 via the gate line 206*a*.

Likewise, as illustrated in FIG. 19B, the line 215*f* of the second metal wiring layer is connected to the gate line 206*b* via the contact 214*k*4, the line 213*k*4 of the first metal wiring layer arranged to extend in the lateral direction (the first direction), and the contact 211*k*4, and is then connected to the gate electrode of the NMOS transistor Tn81. In addition, the line 215*f* of the second metal wiring layer is also connected to the gate electrode of the PMOS transistor Tp81 via the gate line 206*a*.

Also, as illustrated in FIG. 19C, the line 215*f* of the second metal wiring layer is connected to the gate line 206*b* via the contact 214*k*4, the line 213*k*4 of the first metal wiring layer arranged to extend in the lateral direction (the first direction), and the contact 211*k*4, and is then connected to the gate electrode of the NMOS transistor Tn601. In addition, the line 215*f* of the second metal wiring layer is also connected to the gate electrode of the PMOS transistor Tp601 via the gate line 206*a*.

Further, as illustrated in FIG. 19D, the line 215*f* of the second metal wiring layer is connected to the gate line 206*b* via the contact 214*k*4, the line 213*k*4 of the first metal wiring layer arranged to extend in the lateral direction (the first direction), and the contact 211*k*4, and is then connected to the gate electrode of the NMOS transistor Tn641. In addition, the line 215*f* of the second metal wiring layer is also connected to the gate electrode of the PMOS transistor Tp641 via the gate line 206*a*.

The line 215*g* of the second metal wiring layer to which the address signal A3 is supplied is arranged to extend in the longitudinal direction (the second direction). As illustrated in FIG. 19A and FIG. 20D, the line 215*g* of the second metal wiring layer is connected to the gate line 206*b* via the contact 214*k*3, the line 213*k*3 of the first metal wiring layer arranged to extend in the longitudinal direction (the second direction), and the contact 211*k*3, and is then connected to the gate electrode of the NMOS transistor Tn31. In addition, the line 215*g* of the second metal wiring layer is also connected to the gate electrode of the PMOS transistor Tp31 via the gate line 206*a*.

Likewise, as illustrated in FIG. 19B, the line 215*g* of the second metal wiring layer is connected to the gate line 206*b* via the contact 214*k*3, the line 213*k*3 of the first metal wiring layer arranged to extend in the longitudinal direction (the second direction), and the contact 211*k*3, and is then connected to the gate electrode of the NMOS transistor Tn71. In addition, the line 215*g* of the second metal wiring layer is also connected to the gate electrode of the PMOS transistor Tp71 via the gate line 206*a*.

Also, as illustrated in FIG. 19C, the line 215*g* of the second metal wiring layer is connected to the gate line 206*b* via the contact 214*k*3, the line 213*k*3 of the first metal wiring layer arranged to extend in the lateral direction (the first direction), and the contact 211*k*3, and is then connected to the gate electrode of the NMOS transistor Tn591. In addition, the line 215*g* of the second metal wiring layer is also connected to the gate electrode of the PMOS transistor Tp591 via the gate line 206*a*.

Further, as illustrated in FIG. 19D, the line 215*g* of the second metal wiring layer is connected to the gate line 206*b* via the contact 214*k*3, the line 213*k*3 of the first metal wiring layer arranged to extend in the longitudinal direction (the second direction), and the contact 211*k*3, and is then connected to the gate electrode of the NMOS transistor Tn631. In addition, the line 215*g* of the second metal wiring layer is also connected to the gate electrode of the PMOS transistor Tp631 via the gate line 206*a*.

The line 215*h* of the second metal wiring layer to which the address signal A2 is supplied is arranged to extend in the longitudinal direction (the second direction). As illustrated in FIG. 19A and FIG. 20C, the line 215*h* of the second metal wiring layer is connected to the gate line 206*b* via the contact 214*k*2, the line 213*k*2 of the first metal wiring layer arranged to extend in the lateral direction (the first direction), and the contact 211*k*2, and is then connected to the gate electrode of the NMOS transistor Tn21. In addition, the line 215*h* of the second metal wiring layer is also connected to the gate electrode of the PMOS transistor Tp21 via the gate line 206*a*.

Likewise, as illustrated in FIG. 19B, the line 215*h* of the second metal wiring layer is connected to the gate line 206*b* via the contact 214*k*2, the line 213*k*2 of the first metal wiring layer arranged to extend in the lateral direction (the first direction), and the contact 211*k*2, and is then connected to the gate electrode of the NMOS transistor Tn61. In addition, the line 215*h* of the second metal wiring layer is also connected to the gate electrode of the PMOS transistor Tp61 via the gate line 206*a*.

Also, as illustrated in FIG. 19C, the line 215*h* of the second metal wiring layer is connected to the gate line 206*b* via the contact 214*k*2, the line 213*k*2 of the first metal wiring layer arranged to extend in the lateral direction (the first direction), and the contact 211*k*2, and is then connected to the gate electrode of the NMOS transistor Tn581. In addition, the line 215*h* of the second metal wiring layer is also connected to the gate electrode of the PMOS transistor Tp581 via the gate line 206*a*.

Further, as illustrated in FIG. 19D, the line 215*h* of the second metal wiring layer is connected to the gate line 206*b* via the contact 214*k*2, the line 213*k*2 of the first metal wiring layer arranged to extend in the lateral direction (the first direction), and the contact 211*k*2, and is then connected to the gate electrode of the NMOS transistor Tn621. In addition, the line 215*h* of the second metal wiring layer is also connected to the gate electrode of the PMOS transistor Tp621 via the gate line 206*a*.

The line 215*i* of the second metal wiring layer to which the address signal A1 is supplied is arranged to extend in the longitudinal direction (the second direction). As illustrated in FIG. 19A and FIG. 20A, the line 215*i* of the second metal wiring layer is connected to the gate line 206*b* via the contact 214*k*1, the line 213*k*1 of the first metal wiring layer arranged to extend in the lateral direction (the first direction), and the contact 211$k$1, and is then connected to the gate electrode of the NMOS transistor Tn11. In addition, the line 215$i$ of the second metal wiring layer is also connected to the gate electrode of the PMOS transistor Tp11 via the gate line 206$a$.

Likewise, as illustrated in FIG. 19B, the line 215$i$ of the second metal wiring layer is connected to the gate line 206$b$ via the contact 214$k$1, the line 213$k$1 of the first metal wiring layer arranged to extend in the lateral direction (the first direction), and the contact 211$k$1, and is then connected to the gate electrode of the NMOS transistor Tn51. In addition, the line 215$i$ of the second metal wiring layer is also connected to the gate electrode of the PMOS transistor Tp51 via the gate line 206$a$.

Also, as illustrated in FIG. 19C, the line 215$i$ of the second metal wiring layer is connected to the gate line 206$b$ via the contact 214$k$1, the line 213$k$1 of the first metal wiring layer arranged to extend in the lateral direction (the first direction), and the contact 211$k$1, and is then connected to the gate electrode of the NMOS transistor Tn571. In addition, the line 215$i$ of the second metal wiring layer is also connected to the gate electrode of the PMOS transistor Tp571 via the gate line 206$a$.

Further, as illustrated in FIG. 19D, the line 215$i$ of the second metal wiring layer is connected to the gate line 206$b$ via the contact 214$k$1, the line 213$k$1 of the first metal wiring layer arranged to extend in the lateral direction (the first direction), and the contact 211$k$1, and is then connected to the gate electrode of the NMOS transistor Tn611. In addition, the line 215$i$ of the second metal wiring layer is also connected to the gate electrode of the PMOS transistor Tp611 via the gate line 206$a$.

In FIGS. 19A to 19D, the line 215$j$ of the second metal wiring layer to which the reference power supply Vss is supplied is arranged to extend in the second direction, and is connected to the silicide layer 203, which is shared to connect the lower diffusion layers 202$nb$, which are the source regions of the NMOS transistors Tn13 to Tn83 and Tn573 to Tn643, via contacts 214$b$, lines 213$d$ of the first metal wiring layer, and contacts 212$b$. Note that each of the connection portions (214$b$, 213$d$, and 212$b$) is provided at a plurality of locations. In addition, the lower diffusion layer 202$nb$ and the silicide layer 203, which cover the lower diffusion layer 202$nb$, are shared by upper and lower adjacent decoders and are connected.

The arrangement and connections described above can provide sixty-four decoders with a minimum area at a minimum pitch in both the lateral direction and the longitudinal direction.

In this exemplary embodiment, the address signal lines A1 to A12 are set to provide sixty-four decoders. It is easy to increase the number of address signal lines to increase the number of decoders. For an additional address signal line, similarly to the address signal lines A1 to A12, a line of the second metal wiring layer is arranged to extend in the longitudinal direction (the second direction) and is connected to the gate line 206$b$, 206$c$, or 206$d$ or 206$e$ by using a line of the first metal wiring layer arranged to extend in the lateral direction (the first direction). This configuration enables the additional line of the second metal wiring layer to also be arranged at a minimum pitch that is determined by processing. Thus, large-scale decoders with a minimum area can be achieved.

In the third exemplary embodiment (FIG. 9A), the number of address signal lines A1 to A6 is set to be as small as six and no line of the first metal wiring layer extending in the lateral direction is needed to connect a line of the second metal wiring layer extending in the longitudinal direction to a gate line. In contrast, as in the sixth exemplary embodiment (FIG. 19A), when twelve or more address signal lines are set, similarly to the sixth exemplary embodiment, a line of the second metal wiring layer extending in the longitudinal direction is replaced with at least a line of the first metal wiring layer extending in the lateral direction and the line of the first metal wiring layer is connected to a gate line. This configuration enables the number of address signal lines to be readily increased.

According to this exemplary embodiment, a plurality of decoders (200), each including eight SGTs that constitute a 3-input NAND decoder (201) and an inverter (202) and that are arranged in a line in a first direction, are arranged adjacent to each other, the power supply line Vcc, the reference power supply line Vss, and the address signal lines (A1 to A12) are arranged to extend in a second direction perpendicular to the first direction, and any one of the address signal lines (A1 to A12) is connected to a gate line of a 3-input NAND decoder at least via a line of a first metal wiring layer arranged to extend in the first direction. This configuration provides a semiconductor device including 3-input NAND decoders and inverters with a minimum area, which can be arranged at a minimum pitch in both the first direction and the second direction without any limitation as to the number of input address signal lines and also without using any extra lines or contact regions.

While in this exemplary embodiment, eight SGTs are arranged such that the NMOS transistor Tn14, the PMOS transistors Tp14, Tp13, Tp12, and Tp11, and the NMOS transistors Tn11, Tn12, and Tn13 are arranged in order from right to left, the essence of the present invention is that eight SGTs constituting a 3-input NAND decoder and an inverter are arranged in a line to provide a decoder with a minimum area, in which connections to lines of lower diffusion layers (silicide layers), lines of upper metal layers, and gate lines are made by effectively using lines of a second metal wiring layer and lines of a first metal wiring layer. The arrangement of the SGTs, the method for providing gate lines, the positions of the gate lines, the method for providing lines of metal wiring layers, the positions of the lines of the metal wiring layers, and so on not illustrated in the drawings of the exemplary embodiments also fall within the technical scope of the present invention so long as these are based on the arrangement methods disclosed herein.

In this exemplary embodiment, a NAND decoder including six SGTs and an inverter including two SGTs, which is also used as a buffer, are combined to provide an eight-SGT positive logic decoder. The essence of the present invention is that a 3-input NAND decoder including six SGTs is efficiently arranged to have a minimum wiring area, and includes the layout arrangement of a NAND decoder including six SGTs. In this case, a decoder with a negative logic output (the output of a selected decoder is logic "0") is provided.

While the foregoing exemplary embodiments have been described as adopting the BOX structure, the exemplary embodiments may be easily achieved by using a typical CMOS structure and are not limited to the BOX structure.

In the exemplary embodiments, for convenience of description, a silicon pillar of a PMOS transistor is defined as being formed of an n-type silicon layer and a silicon pillar of an NMOS transistor is defined as being formed of a p-type silicon layer. In a process for miniaturization, however, it is difficult to control densities through impurity implantation. Thus, a so-called neutral (or intrinsic) semiconductor with no impurity implantation is used for silicon pillars of both a PMOS transistor and an NMOS transistor, and differences in work function that is unique to a metal gate material may be used for channel control, that is, thresholds of PMOS and NMOS transistors.

In the exemplary embodiments, furthermore, lower diffusion layers or upper diffusion layers are covered with silicide layers. Silicide is used to make resistance low and any other low-resistance material may be used. A general term of metal composites is defined as silicide.

What is claimed is:

1. A semiconductor device comprising:

a NAND decoder including six transistors, each having a source, a drain, and a gate layered in a direction perpendicular to a substrate, the six transistors on the substrate in a line extending in a first direction, each of the six transistors including a silicon pillar, an insulator surrounding a side surface of the silicon pillar, a gate surrounding the insulator, a source region in an upper portion or a lower portion of the silicon pillar, and a drain region in the upper portion or the lower portion of the silicon pillar, the drain region located on a side of the silicon pillar opposite to the source region, the six transistors comprising:

a first p-channel MOS transistor, a second p-channel MOS transistor, a third p-channel MOS transistor, a first n-channel MOS transistor, a second n-channel MOS transistor, and a third n-channel MOS transistor, the gate of the first p-channel MOS transistor and the gate of the first n-channel MOS transistor connected to each other by a first gate line, the gate of the second p-channel MOS transistor and the gate of the second n-channel MOS transistor connected to each other by a second gate line, the gate of the third p-channel MOS transistor and the gate of the third n-channel MOS transistor connected to each other by a third gate line, the drain regions of the first p-channel MOS transistor, the second p-channel MOS transistor, the third p-channel MOS transistor, and the first n-channel MOS transistor located closer to the substrate than the silicon pillars of the first p-channel MOS transistor, the second p-channel MOS transistor, the third p-channel MOS transistor, and the first n-channel MOS transistor, respectively, and connected to one another at an output terminal, the source region of the second n-channel MOS transistor and the drain region of the third n-channel MOS transistor located closer to the substrate than the silicon pillars of the second n-channel MOS transistor and the third n-channel MOS transistor, the source region of the first n-channel MOS transistor connected to the drain region of the second n-channel MOS transistor, the source region of the second n-channel MOS transistor connected to the drain region of the third n-channel MOS transistor, the source regions of the first p-channel MOS transistor, the second p-channel MOS transistor, and the third p-channel MOS transistor connected to a power supply line, the source region of the third n-channel MOS transistor connected to a reference power supply line, the NAND decoder further including a first address signal line, a second address signal line, and a third address signal line, the first gate line of the first p-channel MOS transistor and the first n-channel MOS transistor connected to the first address signal line, the second gate line of the second p-channel MOS transistor and the second n-channel MOS transistor connected to the second address signal line, the third gate line of the third p-channel MOS transistor and the third n-channel MOS transistor connected to the third address signal line, the first, second, and third gate lines extending the first direction, and the power supply line, the reference power supply line, the first address signal line, the second address signal line, and the third address signal line in a second direction perpendicular to the first direction.

2. The semiconductor device according to claim 1, wherein the drain regions of the first p-channel MOS transistor, the second p-channel MOS transistor, the third p-channel MOS transistor, and the first n-channel MOS transistor are connected to one another via silicide regions at the output terminal, the source region of the first n-channel MOS transistor is connected to the drain region of the second n-channel MOS transistor via a contact, the source region of the second n-channel MOS transistor is connected to the drain region of the third n-channel MOS transistor via a lower diffusion layer and a silicide layer, the source regions of the first p-channel MOS transistor, the second p-channel MOS transistor, and the third p-channel MOS transistor are connected to the power supply line via contacts, and the source region of the third n-channel MOS transistor is connected to the reference power supply line via a contact.

3. The semiconductor device according to claim 2, wherein the six transistors are in a line in order of the third p-channel MOS transistor, the second p-channel MOS transistor, the first p-channel MOS transistor, the first n-channel MOS transistor, the second n-channel MOS transistor, and the third n-channel MOS transistor.

4. The semiconductor device according to claim 2, wherein at least the gates of the first p-channel MOS transistor and the first n-channel MOS transistor, the gates of the second p-channel MOS transistor and the second n-channel MOS transistor, or the gates of the third p-channel MOS transistor and the third n-channel MOS transistor are connected to a corresponding one of the first to third address signal lines, each of which comprises a line of a second metal wiring layer extending in the second direction, at least via a line of a first metal wiring layer extending in the first direction.

5. A semiconductor device comprising:

a number of first address signal lines (a);

a number of second address signal lines (b);

a number of third address signal lines (c) and a×b×c NAND decoders, each of the a×b×c NAND decoders including six transistors, each having a source, a drain, and a gate layered in a direction perpendicular to a substrate, the six transistors on the substrate in a line extending in a first direction, each of the six transistors including
a silicon pillar,
an insulator surrounding a side surface of the silicon pillar,
a gate surrounding the insulator,
a source region in an upper portion or a lower portion of the silicon pillar, and
a drain region in the upper portion or the lower portion of the silicon pillar, the drain region located on a side of the silicon pillar opposite to the source region,
the six transistors at least including
a first p-channel MOS transistor,
a second p-channel MOS transistor,
a third p-channel MOS transistor,
a first n-channel MOS transistor,
a second n-channel MOS transistor, and
a third n-channel MOS transistor,
the gate of the first p-channel MOS transistor and the gate of the first n-channel MOS transistor connected to each other by a first gate line,
the gate of the second p-channel MOS transistor and the gate of the second n-channel MOS transistor connected to each other by a second gate line,
the gate of the third p-channel MOS transistor and the gate of the third n-channel MOS transistor connected to each other by a third gate line,
the drain regions of the first p-channel MOS transistor, the second p-channel MOS transistor, the third p-channel MOS transistor, and the first n-channel MOS transistor located closer to the substrate than the silicon pillars of the first p-channel MOS transistor, the second p-channel MOS transistor, the third p-channel MOS transistor, and the first n-channel MOS transistor, respectively, and connected to one another at an output terminal,
the source region of the second n-channel MOS transistor and the drain region of the third n-channel MOS transistor located closer to the substrate than the silicon pillars of the second n-channel MOS transistor and the third n-channel MOS transistor,
the source region of the first n-channel MOS transistor connected to the drain region of the second n-channel MOS transistor,
the source region of the second n-channel MOS transistor connected to the drain region of the third n-channel MOS transistor,
the source regions of the first p-channel MOS transistor, the second p-channel MOS transistor, and the third p-channel MOS transistor being connected to a power supply line,
the source region of the third n-channel MOS transistor connected to a reference power supply line,
each of the a×b×c NAND decoders configured such that
the first gate line of the first p-channel MOS transistor and the first n-channel MOS transistor connected to any one of the a first address signal lines,
the second gate line of the second p-channel MOS transistor and the second n-channel MOS transistor connected to any one of the second address signal lines, and
the third gate line of the third p-channel MOS transistor and the third n-channel MOS transistor connected to any one of the third address signal lines,
the first, second, and third gate lines extending in the first direction, and the power supply line, the reference power supply line, the first address signal lines, the second address signal lines, and the third address signal lines extending in a second direction perpendicular to the first direction.

6. The semiconductor device according to claim 5, wherein the drain regions of the first p-channel MOS transistor, the second p-channel MOS transistor, the third p-channel MOS transistor, and the first n-channel MOS transistor are connected to one another via silicide regions at the output terminal,
the source region of the first n-channel MOS transistor is connected to the drain region of the second n-channel MOS transistor via a contact,
the source region of the second n-channel MOS transistor is connected to the drain region of the third n-channel MOS transistor via a lower diffusion layer and a silicide layer,
the source regions of the first p-channel MOS transistor, the second p-channel MOS transistor, and the third p-channel MOS transistor are connected to the power supply line via contacts, and
the source region of the third n-channel MOS transistor is connected to the reference power supply line via a contact.

7. The semiconductor device according to claim 6, wherein the six transistors are arranged in a line in order of the third p-channel MOS transistor, the second p-channel MOS transistor, the first p-channel MOS transistor, the first n-channel MOS transistor, the second n-channel MOS transistor, and the third n-channel MOS transistor.

8. The semiconductor device according to claim 6, wherein, in each of the a×b×c NAND decoders, at least the gates of the first p-channel MOS transistor and the first n-channel MOS transistor, the gates of the second p-channel MOS transistor and the second n-channel MOS transistor, or the gates of the third p-channel MOS transistor and the third n-channel MOS transistor are connected to a corresponding one of the first to third address signal lines, each of which comprises a line of a second metal wiring layer extending in the second direction, at least via a line of a first metal wiring layer extending in the first direction.

9. A semiconductor device comprising:
a NAND decoder including six transistors, each having a source, a drain, and a gate layered in a direction perpendicular to a substrate, the six transistors on the substrate in a line extending in a first direction,
each of the six transistors including
a silicon pillar,
an insulator surrounding a side surface of the silicon pillar,
a gate surrounding the insulator,
a source region in an upper portion or a lower portion of the silicon pillar, and
a drain region in the upper portion or the lower portion of the silicon pillar, the drain region located on a side of the silicon pillar opposite to the source region,
the six transistors comprising:
a first p-channel MOS transistor,
a second p-channel MOS transistor,
a third p-channel MOS transistor,
a first n-channel MOS transistor,
a second n-channel MOS transistor, and
a third n-channel MOS transistor,
the gate of the first p-channel MOS transistor and the gate of the first n-channel MOS transistor connected to each other by a first gate line, the gate of the second p-channel MOS transistor and the gate of the second n-channel MOS transistor connected to each other by a second gate line, the gate of the third p-channel MOS transistor and the gate of the third n-channel MOS transistor connected to each other by a third gate line, the source regions of the first p-channel MOS transistor, the second p-channel MOS transistor, the third p-channel MOS transistor, and the first n-channel MOS transistor located closer to the substrate than the silicon pillars of the first p-channel MOS transistor, the second p-channel MOS transistor, the third p-channel MOS transistor, and the first n-channel MOS transistor, the drain region of the second n-channel MOS transistor and the source region of the third n-channel MOS transistor located closer to the substrate than the silicon pillars of the second n-channel MOS transistor and the third n-channel MOS transistor, the drain regions of the first p-channel MOS transistor, the second p-channel MOS transistor, the third p-channel MOS transistor, and the first n-channel MOS transistor connected to one another at an output terminal, the source regions of the first p-channel MOS transistor, the second p-channel MOS transistor, and the third p-channel MOS transistor connected to a power supply line, the source region of the first n-channel MOS transistor connected to the drain region of the second n-channel MOS transistor, the source region of the second n-channel MOS transistor connected to the drain region of the third n-channel MOS transistor, the source region of the third n-channel MOS transistor connected to a reference power supply line, the NAND decoder further including a first address signal line, a second address signal line, and a third address signal line, the first gate of the first p-channel MOS transistor and the first n-channel MOS transistor connected to the first address signal line, the second gate line of the second p-channel MOS transistor and the second n-channel MOS transistor connected to the second address signal line, the third gate line of the third p-channel MOS transistor and the third n-channel MOS transistor connected to the third address signal line, the first, second, and third gate lines extending in the first direction, and the power supply line, the reference power supply line, the first address signal line, the second address signal line, and the third address signal line extending in a second direction perpendicular to the first direction.

10. The semiconductor device according to claim 9, wherein the drain regions of the first p-channel MOS transistor, the second p-channel MOS transistor, the third p-channel MOS transistor, and the first n-channel MOS transistor are connected to one another via contacts at the output terminal, the source regions of the first p-channel MOS transistor, the second p-channel MOS transistor, and the third p-channel MOS transistor are connected to the power supply line via lower diffusion layers and silicide regions, the source region of the first n-channel MOS transistor is connected to the drain region of the second n-channel MOS transistor via a lower diffusion layer and a silicide region, the source region of the second n-channel MOS transistor is connected to the drain region of the third n-channel MOS transistor via a contact, and the source region of the third n-channel MOS transistor is connected to the reference power supply line via a lower diffusion layer and a silicide region.

11. The semiconductor device according to claim 10, wherein the six transistors extend in a line in order of the third p-channel MOS transistor, second p-channel MOS transistor, the first p-channel MOS transistor, the first n-channel MOS transistor, the second n-channel MOS transistor, and the third n-channel MOS transistor.

12. The semiconductor device according to claim 10, wherein at least the gates of the first p-channel MOS transistor and the first n-channel MOS transistor, the gates of the second p-channel MOS transistor and the second n-channel MOS transistor, or the gates of the third p-channel MOS transistor and the third n-channel MOS transistor are connected to a corresponding one of the first to third address signal lines, each of which is in a line of a second metal wiring layer extending in the second direction, at least via a line of a first metal wiring layer extending in the first direction.

13. A semiconductor device comprising:

first address signal lines (a);

second address signal lines (b);

third address signal lines (c); and a×b×c NAND decoders, each of the a×b×c NAND decoders including six transistors, each having a source, a drain, and a gate layered manner in a direction perpendicular to a substrate, the six transistors on the substrate in a line in a first direction, each of the six transistors including a silicon pillar, an insulator surrounding a side surface of the silicon pillar, a gate surrounding the insulator, a source region in an upper portion or a lower portion of the silicon pillar, and a drain region in the upper portion or the lower portion of the silicon pillar, the drain region on a side of the silicon pillar opposite to the source region, the six transistors at least including a first p-channel MOS transistor, a second p-channel MOS transistor, a third p-channel MOS transistor, a first n-channel MOS transistor, a second n-channel MOS transistor, and a third n-channel MOS transistor, the gate of the first p-channel MOS transistor and the first n-channel MOS transistor connected to each other by a first gate line, the gate of the second p-channel MOS transistor and the gate of the second n-channel MOS transistor connected to each other by a second gate line, the gate of the third p-channel MOS transistor and the gate of the third n-channel MOS transistor connected to each other by a third gate line, the source regions of the first p-channel MOS transistor, the second p-channel MOS transistor, the third p-channel MOS transistor, and the first n-channel MOS transistor located closer to the substrate than the silicon pillars of the first p-channel MOS transistor, the second p-channel MOS transistor, the third p-channel MOS transistor, and the first n-channel MOS transistor, the drain region of the second n-channel MOS transistor and the source region of the third n-channel MOS transistor closer to the substrate than the silicon pillars of the second n-channel MOS transistor and the third n-channel MOS transistor, the drain regions of the first p-channel MOS transistor, the second p-channel MOS transistor, the third p-channel MOS transistor, and the first n-channel MOS transistor connected to one another at an output terminal, the source regions of the first p-channel MOS transistor, the second p-channel MOS transistor, and the third p-channel MOS transistor connected to a power supply line, the source region of the first n-channel MOS transistor connected to the drain region of the second n-channel MOS transistor, the source region of the second n-channel MOS transistor connected to the drain region of the third n-channel MOS transistor, the source region of the third n-channel MOS transistor connected to a reference power supply line, each of the a×b×c NAND decoders configured such that the first gate line of the first p-channel MOS transistor and the first n-channel MOS transistor, connected to any one of the first address signal lines, the second gate line of the second p-channel MOS transistor and the second n-channel MOS transistor connected to any one of the second address signal lines, and the third gate line of the third p-channel MOS transistor and the gate of the third n-channel MOS transistor connected to any one of the third address signal lines, the first, second, and third gate lines extending in the first direction, and the power supply line, the reference power supply line, the first address signal lines, the second address signal lines, and the third address signal lines extending in a second direction perpendicular to the first direction.

14. The semiconductor device according to claim 13, wherein the drain regions of the first p-channel MOS transistor, the second p-channel MOS transistor, the third p-channel MOS transistor, and the first n-channel MOS transistor are connected to one another via contacts at the output terminal, the source regions of the first p-channel MOS transistor, the second p-channel MOS transistor, and the third p-channel MOS transistor are connected to the power supply line via lower diffusion layers and silicide layers, the source region of the first n-channel MOS transistor is connected to the drain region of the second n-channel MOS transistor via a lower diffusion layer and a silicide layer, the source region of the second n-channel MOS transistor is connected to the drain region of the third n-channel MOS transistor via a contact, and the source region of the third n-channel MOS transistor is connected to the reference power supply line via a lower diffusion layer and a silicide layer.

15. The semiconductor device according to claim 14, wherein the six transistors extend in a line in order of the third p-channel MOS transistor, the second p-channel MOS transistor, the first p-channel MOS transistor, the first n-channel MOS transistor, the second n-channel MOS transistor, and the third n-channel MOS transistor.

16. The semiconductor device according to claim 14, wherein the source regions of the first p-channel MOS transistors, the second p-channel MOS transistors, and the third p-channel MOS transistors in the a×b×c NAND decoders are connected in common via a silicide layer.

17. The semiconductor device according to claim 14, wherein, in each of the a×b×c NAND decoders, at least the gates of the first p-channel MOS transistor and the first n-channel MOS transistor, the gates of the second p-channel MOS transistor and the second n-channel MOS transistor, or the gates of the third p-channel MOS transistor and the third n-channel MOS transistor are connected to the corresponding one of the first to third address signal lines, each of which is in a line of a second metal wiring layer extending in the second direction, at least via a line of a first metal wiring layer extending in the first direction.

18. A semiconductor device comprising:

a NAND decoder; and an inverter, the NAND decoder and the inverter including eight transistors, each having a source, a drain, and a gate layered in a direction perpendicular to a substrate, the eight transistors on the substrate in a line extending in a first direction, each of the eight transistors including a silicon pillar, an insulator surrounding a side surface of the silicon pillar, a gate surrounding the insulator, a source region in an upper portion or a lower portion of the silicon pillar, and a drain region in the upper portion or the lower portion of the silicon pillar, the drain region on a side of the silicon pillar opposite to the source region, the eight transistors including a first p-channel MOS transistor, a second p-channel MOS transistor, a third p-channel MOS transistor, a fourth p-channel MOS transistor, a first n-channel MOS transistor, a second n-channel MOS transistor, a third n-channel MOS transistor, and a fourth n-channel MOS transistor, the NAND decoder including the first p-channel MOS transistor, the second p-channel MOS transistor, the third p-channel MOS transistor, the first n-channel MOS transistor, the second n-channel MOS transistor, and the third n-channel MOS transistor, the inverter including the fourth p-channel MOS transistor, and the fourth n-channel MOS transistor, the gate of the first p-channel MOS transistor and the gate of the first n-channel MOS transistor connected to each other by a first gate line, the gate of the second p-channel MOS transistor and the gate of the second n-channel MOS transistor connected to each other by a second gate line, the gate of the third p-channel MOS transistor and the gate of the third n-channel MOS transistor connected to each other by a third gate line, the drain regions of the first p-channel MOS transistor, the second p-channel MOS transistor, the third p-channel MOS transistor, and the first n-channel MOS transistor located closer to the substrate than the silicon pillars of the first p-channel MOS transistor, the second p-channel MOS transistor, the third p-channel MOS transistor, and the first n-channel MOS transistor, respectively, and connected to one another at a first output terminal, the source region of the second n-channel MOS transistor and the drain region of the third n-channel MOS transistor closer to the substrate than the silicon pillars of the second n-channel MOS transistor and the third n-channel MOS transistor, the source regions of the first p-channel MOS transistor, the second p-channel MOS transistor, and the third p-channel MOS transistor connected to a power supply line, the source region of the first n-channel MOS transistor connected to the drain region of the second n-channel MOS transistor, the source region of the second n-channel MOS transistor connected to the drain region of the third n-channel MOS transistor, the source region of the third n-channel MOS transistor connected to a reference power supply line, the gate of the fourth p-channel MOS transistor and the gate of the fourth n-channel MOS transistor connected to the first output terminal, the drain region of the fourth p-channel MOS transistor and the drain region of the fourth n-channel MOS transistor connected at a second output terminal, the source region of the fourth p-channel MOS transistor and the source region of the fourth n-channel MOS transistor respectively connected to the power supply line and the reference power supply line, the NAND decoder further including a first address signal line, a second address signal line, and a third address signal line, the first gate line of the first p-channel MOS transistor and the first n-channel MOS transistor connected to the first address signal line, the second gate line of the second p-channel MOS transistor and the second n-channel MOS transistor connected to the second address signal line, the third gate of the third p-channel MOS transistor and the third n-channel MOS transistor connected to the third address signal line, the first, second, and third gate lines extending in the first direction, and the power supply line, the reference power supply line, the first address signal line, the second address signal line, and the third address signal line extending in a second direction perpendicular to the first direction.

19. The semiconductor device according to claim 18, wherein the drain regions of the first p-channel MOS transistor, the second p-channel MOS transistor, the third p-channel MOS transistor, and the first n-channel MOS transistor are located closer to the substrate than the silicon pillars of the first p-channel MOS transistor, the second p-channel MOS transistor, the third p-channel MOS transistor, and the first n-channel MOS transistor, respectively, and are connected to one another via silicide layers at the first output terminal, the source regions of the first p-channel MOS transistor, the second p-channel MOS transistor, and the third p-channel MOS transistor are connected to the power supply line via contacts, the source region of the first n-channel MOS transistor is connected to the drain region of the second n-channel MOS transistor via a contact, the source region of the second n-channel MOS transistor is connected to the drain region of the third n-channel MOS transistor via a silicide layer, and the source region of the third n-channel MOS transistor is connected to the reference power supply line via a contact.

20. The semiconductor device according to claim 19, wherein the eight transistors extending in a line in order of one of the fourth n-channel MOS transistor and the fourth p-channel MOS transistor, the other of the fourth n-channel MOS transistor and the fourth p-channel MOS transistor, the third p-channel MOS transistor, the second p-channel MOS transistor, the first p-channel MOS transistor, the first n-channel MOS transistor, the second n-channel MOS transistor, and the third n-channel MOS transistor.

21. The semiconductor device according to claim 19, wherein at least the gates of the first p-channel MOS transistor and the first n-channel MOS transistor, the gates of the second p-channel MOS transistor and the second n-channel MOS transistor, or the gates of the third p-channel MOS transistor and the third n-channel MOS transistor are connected to a corresponding one of the first to third address signal lines, each of which in a line of a second metal wiring layer extending in the second direction, at least via a line of a first metal wiring layer extending in the first direction.

22. A semiconductor device comprising:

first address signal lines (a);

second address signal lines (b);

third address signal lines (c); and a×b×c pairs of NAND decoders and inverters, each of the a×b×c pairs of NAND decoders and inverters including eight transistors, each having a source, a drain, and a gate layered in a direction perpendicular to a substrate, the eight transistors on the substrate in a line extending in a first direction, each of the eight transistors including a silicon pillar, an insulator surrounding a side surface of the silicon pillar, a gate surrounding the insulator, a source region in an upper portion or a lower portion of the silicon pillar, and a drain region in the upper portion or the lower portion of the silicon pillar, the drain region on a side of the silicon pillar opposite to the source region, the eight transistors including a first p-channel MOS transistor, a second p-channel MOS transistor, a third p-channel MOS transistor, a fourth p-channel MOS transistor, a first n-channel MOS transistor, a second n-channel MOS transistor, a third n-channel MOS transistor, and a fourth n-channel MOS transistor, the decoder at least including the first p-channel MOS transistor, the second p-channel MOS transistor, the third p-channel MOS transistor, the first n-channel MOS transistor, the second n-channel MOS transistor, and the third n-channel MOS transistor, the inverter including the fourth p-channel MOS transistor, and the fourth n-channel MOS transistor, the gate of the first p-channel MOS transistor and the gate of the first n-channel MOS transistor connected to each other by a first gate line, the gate of the second p-channel MOS transistor and the gate of the second n-channel MOS transistor connected to each other by a second gate line, the gate of the third p-channel MOS transistor and the gate of the third n-channel MOS transistor connected to each other by a third gate line, the drain regions of the first p-channel MOS transistor, the second p-channel MOS transistor, the third p-channel MOS transistor, and the first n-channel MOS transistor closer to the substrate than the silicon pillars of the first p-channel MOS transistor, the second p-channel MOS transistor, the third p-channel MOS transistor, and the first n-channel MOS transistor, respectively, and jointly connected at a first output terminal, the source region of the second n-channel MOS transistor and the drain region of the third n-channel MOS transistor closer to the substrate than the silicon pillars of the second n-channel MOS transistor and the third n-channel MOS transistor, the source regions of the first p-channel MOS transistor, the second p-channel MOS transistor, and the third p-channel MOS transistor connected to a power supply line, the source region of the first n-channel MOS transistor connected to the drain region of the second n-channel MOS transistor, the source region of the second n-channel MOS transistor connected to the drain region of the third n-channel MOS transistor, the source region of the third n-channel MOS transistor connected to a reference power supply line, the gate of the fourth p-channel MOS transistor and the gate of the fourth n-channel MOS transistor jointly connected at the first output terminal, the drain region of the fourth p-channel MOS transistor and the drain region of the fourth n-channel MOS transistor jointly connected at a second output terminal, the source region of the fourth p-channel MOS transistor and the source region of the fourth n-channel MOS transistor being respectively connected to the power supply line and the reference power supply line, each of the a×b×c pairs of NAND decoders and inverters configured such that the first gate line of the first p-channel MOS transistor and the first n-channel MOS transistor connected to any one of the first address signal lines, the second gate line of the second p-channel MOS transistor and the second n-channel MOS transistor connected to any one of the second address signal lines, and the third gate line of the third p-channel MOS transistor and the gate of the third n-channel MOS transistor connected to any one of the third address signal lines, the first, second, and third gate lines extending in the first direction, and the power supply line, the reference power supply line, the first address signal lines, the second address signal lines, and the third address signal lines extending in a second direction perpendicular to the first direction.

23. The semiconductor device according to claim 22, wherein the drain regions of the first p-channel MOS transistor, the second p-channel MOS transistor, the third p-channel MOS transistor, and the first n-channel MOS transistor are closer to the substrate than the silicon pillars of the first p-channel MOS transistor, the second p-channel MOS transistor, the third p-channel MOS transistor, and the first n-channel MOS transistor, respectively, and jointly connected via silicide layers at the first output terminal, the source regions of the first p-channel MOS transistor, the second p-channel MOS transistor, and the third p-channel MOS transistor are connected to the power supply line via contacts, the source region of the first n-channel MOS transistor is connected to the drain region of the second n-channel MOS transistor via a contact, the source region of the second n-channel MOS transistor is connected to the drain region of the third n-channel MOS transistor via a silicide layer, and the source region of the third n-channel MOS transistor is connected to the reference power supply line via a contact.

24. The semiconductor device according to claim 23, wherein the eight transistors are in a line in order of one of the fourth n-channel MOS transistor and the fourth p-channel MOS transistor, the other of the fourth n-channel MOS transistor and the fourth p-channel MOS transistor, the third p-channel MOS transistor, the second p-channel MOS transistor, the first p-channel MOS transistor, first n-channel MOS transistor, the second n-channel MOS transistor, and the third n-channel MOS transistor.

25. The semiconductor device according to claim 23, wherein in each of the a×b×c pairs of NAND decoders and inverters, at least the gates of the first p-channel MOS transistor and the first n-channel MOS transistor, the gates of the second p-channel MOS transistor and the second n-channel MOS transistor, or the gates of the third p-channel MOS transistor and the third n-channel MOS transistor are connected to the corresponding one of the first to third address signal lines, each of which is in a line of a second metal wiring layer extending in the second direction, at least via a line of a first metal wiring layer extending in the first direction.

26. A semiconductor device comprising:

a NAND decoder; and an inverter, the NAND decoder and the inverter including eight transistors, each having a source, a drain, and a gate layered in a direction perpendicular to a substrate, the eight transistors on the substrate in a line extending in a first direction, each of the eight transistors including a silicon pillar, an insulator surrounding a side surface of the silicon pillar, a gate surrounding the insulator, a source region disposed in an upper portion or a lower portion of the silicon pillar, and a drain region in the upper portion or the lower portion of the silicon pillar, the drain region located on a side of the silicon pillar opposite to the source region, the eight transistors including a first p-channel MOS transistor, a second p-channel MOS transistor, a third p-channel MOS transistor, a fourth p-channel MOS transistor, a first n-channel MOS transistor, a second n-channel MOS transistor, a third n-channel MOS transistor, and a fourth n-channel MOS transistor, the NAND decoder including the first p-channel MOS transistor, the second p-channel MOS transistor, the third p-channel MOS transistor, the first n-channel MOS transistor, the second n-channel MOS transistor, and
the third n-channel MOS transistor,
the inverter including
the fourth p-channel MOS transistor, and
the fourth n-channel MOS transistor,
the gate of the first p-channel MOS transistor and the gate of the first n-channel MOS transistor connected to each other by a first gate line,
the gate of the second p-channel MOS transistor and the gate of the second n-channel MOS transistor connected to each other by a second gate line,
the gate of the third p-channel MOS transistor and the gate of the third n-channel MOS transistor connected to each other by a third gate line,
the source regions of the first p-channel MOS transistor, the second p-channel MOS transistor, the third p-channel MOS transistor, and the first n-channel MOS transistor being closer to the substrate than the silicon pillars of the first p-channel MOS transistor, the second p-channel MOS transistor, the third p-channel MOS transistor, and the first n-channel MOS transistor,
the drain region of the second n-channel MOS transistor and the source region of the third n-channel MOS transistor located closer to the substrate than the silicon pillars of the second n-channel MOS transistor and the third n-channel MOS transistor,
the drain regions of the first p-channel MOS transistor, the second p-channel MOS transistor, the third p-channel MOS transistor, and the first n-channel MOS transistor jointly connected at a first output terminal,
the source regions of the first p-channel MOS transistor, the second p-channel MOS transistor, and the third p-channel MOS transistor connected to a power supply line,
the source region of the first n-channel MOS transistor connected to the drain region of the second n-channel MOS transistor,
the source region of the second n-channel MOS transistor connected to the drain region of the third n-channel MOS transistor,
the source region of the third n-channel MOS transistor connected to a reference power supply line,
the gate of the fourth p-channel MOS transistor and the gate of the fourth n-channel MOS transistor jointly connected to the first output terminal,
the drain region of the fourth p-channel MOS transistor and the drain region of the fourth n-channel MOS transistor jointly connected at a second output terminal,
the source region of the fourth p-channel MOS transistor and the source region of the fourth n-channel MOS transistor respectively connected to the power supply line and the reference power supply line,
the NAND decoder further including
a first address signal line,
a second address signal line, and
a third address signal line,
the first gate line of the first p-channel MOS transistor and the first n-channel MOS transistor connected to the first address signal line,
the second gate line of the second p-channel MOS transistor and the second n-channel MOS transistor connected to the second address signal line,
the third gate line of the third p-channel MOS transistor and the third n-channel MOS transistor connected to the third address signal line,
the first, second, and third gate lines extending in the first direction, and the power supply line, the reference power supply line, the first address signal line, the second address signal line, and the third address signal line extending in a second direction perpendicular to the first direction.

27. The semiconductor device according to claim 26, wherein the drain regions of the first p-channel MOS transistor, the second p-channel MOS transistor, the third p-channel MOS transistor, and the first n-channel MOS transistor are connected to one another via contacts at the first output terminal,
the source regions of the first p-channel MOS transistor, the second p-channel MOS transistor, and the third p-channel MOS transistor are connected to the power supply line via silicide regions,
the source region of the first n-channel MOS transistor is connected to the drain region of the second n-channel MOS transistor via a silicide layer,
the source region of the second n-channel MOS transistor is connected to the drain region of the third n-channel MOS transistor via a contact, and
the source region of the third n-channel MOS transistor is connected to the reference power supply line via a silicide layer.

28. The semiconductor device according to claim 27, wherein the eight transistors are in a line in order of one of the fourth n-channel MOS transistor and the fourth p-channel MOS transistor, the other of the fourth n-channel MOS transistor and the fourth p-channel MOS transistor, the third p-channel MOS transistor, the second p-channel MOS transistor, the first p-channel MOS transistor, the first n-channel MOS transistor, the second n-channel MOS transistor, and the third n-channel MOS transistor.

29. The semiconductor device according to claim 27, wherein the source regions of the fourth p-channel MOS transistor and the fourth n-channel MOS transistor are closer to the substrate than the silicon pillars of the fourth p-channel MOS transistor and the fourth n-channel MOS transistor, and
the eight transistors are in a line in order of the fourth n-channel MOS transistor, the fourth p-channel MOS transistor, the third p-channel MOS transistor, the second p-channel MOS transistor, the first p-channel MOS transistor, the first n-channel MOS transistor, the second n-channel MOS transistor, and the third n-channel MOS transistor.

30. The semiconductor device according to claim 27, wherein at least the gates of the first p-channel MOS transistor and the first n-channel MOS transistor, the gates of the second p-channel MOS transistor and the second n-channel MOS transistor, or the gates of the third p-channel MOS transistor and the third n-channel MOS transistor are connected to the corresponding one of the first to third address signal lines, each of which is in a line of a second metal wiring layer extending in the second direction, at least via a line of a first metal wiring layer arranged to extend in the first direction.

31. A semiconductor device comprising:
first address signal lines (a);
second address signal lines (b);
third address signal lines (c); and
a×b×c pairs of NAND decoders and inverters,
each of the a×b×c pairs of NAND decoders and inverters including eight transistors, each having a source, a drain, and a gate arranged in a layered manner in a direction perpendicular to a substrate, the eight transistors on the substrate in a line extending in a first direction, each of the eight transistors including a silicon pillar, an insulator surrounding a side surface of the silicon pillar, a gate surrounding the insulator, a source region in an upper portion or a lower portion of the silicon pillar, and a drain region in the upper portion or the lower portion of the silicon pillar, the drain region on a side of the silicon pillar opposite to the source region, the eight transistors including a first p-channel MOS transistor, a second p-channel MOS transistor, a third p-channel MOS transistor, a fourth p-channel MOS transistor, a first n-channel MOS transistor, a second n-channel MOS transistor, a third n-channel MOS transistor, and a fourth n-channel MOS transistor, each of the a×b×c NAND decoders including the first p-channel MOS transistor, the second p-channel MOS transistor, the third p-channel MOS transistor, the first n-channel MOS transistor, the second n-channel MOS transistor, and the third n-channel MOS transistor, each of the a×b×c inverters including the fourth p-channel MOS transistor, and the fourth n-channel MOS transistor, the gate of the first p-channel MOS transistor and the gate of the first n-channel MOS transistor connected to each other by a first gate line, the gate of the second p-channel MOS transistor and the gate of the second n-channel MOS transistor connected to each other by a second gate line, the gate of the third p-channel MOS transistor and the gate of the third n-channel MOS transistor connected to each other by a third gate line, the source regions of the first p-channel MOS transistor, the second p-channel MOS transistor, the third p-channel MOS transistor, and the first n-channel MOS transistor located closer to the substrate than the silicon pillars of the first p-channel MOS transistor, the second p-channel MOS transistor, the third p-channel MOS transistor, and the first n-channel MOS transistor, the drain region of the second n-channel MOS transistor and the source region of the third n-channel MOS transistor located closer to the substrate than the silicon pillars of the second n-channel MOS transistor and the third n-channel MOS transistor, the drain regions of the first p-channel MOS transistor, the second p-channel MOS transistor, the third p-channel MOS transistor, and the first n-channel MOS transistor jointly connected at a first output terminal, the source regions of the first p-channel MOS transistor, the second p-channel MOS transistor, and the third p-channel MOS transistor connected to a power supply line, the source region of the first n-channel MOS transistor connected to the drain region of the second n-channel MOS transistor, the source region of the second n-channel MOS transistor connected to the drain region of the third n-channel MOS transistor, the source region of the third n-channel MOS transistor connected to a reference power supply line, the gate of the fourth p-channel MOS transistor and the gate of the fourth n-channel MOS transistor jointly connected to the first output terminal, the drain region of the fourth p-channel MOS transistor and the drain region of the fourth n-channel MOS transistor connected at a second output terminal, the source region of the fourth p-channel MOS transistor and the source region of the fourth n-channel MOS transistor respectively connected to the power supply line and the reference power supply line, each of the a×b×c pairs of NAND decoders and inverters configured such that, the first gate line of the first p-channel MOS transistor and the first n-channel MOS transistor connected to any one of the a first address signal lines, the second gate line of the second p-channel MOS transistor and the second n-channel MOS transistor connected to any one of the second address signal lines, and the third gate line of the third p-channel MOS transistor and the third n-channel MOS transistor connected to any one of the third address signal lines, the first, second, and third gate lines extending in the first direction, and the power supply line, the reference power supply line, the first address signal lines, the second address signal lines, and the third address signal lines extending in a second direction perpendicular to the first direction.

32. The semiconductor device according to claim 31, wherein the drain regions of the first p-channel MOS transistor, the second p-channel MOS transistor, the third p-channel MOS transistor, and the first n-channel MOS transistor are jointly via contacts at the first output terminal, the source regions of the first p-channel MOS transistor, the second p-channel MOS transistor, and the third p-channel MOS transistor are connected to the power supply line via silicide regions, the source region of the first n-channel MOS transistor is connected to the drain region of the second n-channel MOS transistor via a silicide layer, the source region of the second n-channel MOS transistor is connected to the drain region of the third n-channel MOS transistor via a contact, and the source region of the third n-channel MOS transistor is connected to the reference power supply line via a silicide layer.

33. The semiconductor device according to claim 32, wherein the eight transistors are in a line in order of one of the fourth n-channel MOS transistor and the fourth p-channel MOS transistor, the other of the fourth n-channel MOS transistor and the fourth p-channel MOS transistor, the third p-channel MOS transistor, the second p-channel MOS transistor, the first p-channel MOS transistor, the first n-channel MOS transistor, the second n-channel MOS transistor, and the third n-channel MOS transistor.

34. The semiconductor device according to claim 32, wherein, in each of the a×b×c pairs of NAND decoders and inverters, the source regions of the fourth p-channel MOS transistor and the fourth n-channel MOS transistor are closer to the substrate than the silicon pillars of the fourth p-channel MOS transistor and the fourth n-channel MOS transistor, and the eight transistors are in a line in order of the fourth n-channel MOS transistor, the fourth p-channel MOS transistor, the third p-channel MOS transistor, the second p-channel MOS transistor, the first p-channel MOS transistor, the first n-channel MOS transistor, the second n-channel MOS transistor, and the third n-channel MOS transistor.

35. The semiconductor device according to claim 32, wherein the source regions of the first p-channel MOS transistors, the second p-channel MOS transistors, the third p-channel MOS transistors, and the fourth p-channel MOS transistors in the a×b×c NAND decoders and the a×b×c inverters are jointly connected via a silicide layer.

36. The semiconductor device according to claim 32, wherein, in each of the a×b×c pairs of NAND decoders and inverters, at least the gates of the first p-channel MOS transistor and the first n-channel MOS transistor, the gates of the second p-channel MOS transistor and the second n-channel MOS transistor, or the gates of the third p-channel MOS transistor and the third n-channel MOS transistor are connected to the corresponding one of the first to third address signal lines, each of which is in a line of a second metal wiring layer extending in the second direction, at least via a line of a first metal wiring layer extending in the first direction.

* * * * *